(12) United States Patent
Finkeldey et al.

(10) Patent No.: US 9,957,190 B2
(45) Date of Patent: May 1, 2018

(54) THIN THERMALLY AND CHEMICALLY STRENGTHENED GLASS-BASED ARTICLES

(71) Applicant: Corning Incorporated, Corning, NY (US)

(72) Inventors: John Philip Finkeldey, Westfield, PA (US); Linda Gaskill, Painted Post, NY (US); Timothy Michael Gross, Corning, NY (US); Peter Joseph Lezzi, Corning, NY (US); Richard Orr Maschmeyer, Corning, NY (US); Charlene Marie Smith, Corning, NY (US); John Christopher Thomas, Elmira, NY (US); Kevin Lee Wasson, Elmira, NY (US)

(73) Assignee: Corning Incorporated, Corning, NY (US)

( * ) Notice: Subject to any disclaimer, the term of this patent is extended or adjusted under 35 U.S.C. 154(b) by 0 days. days.

(21) Appl. No.: 15/418,241

(22) Filed: Jan. 27, 2017

(65) Prior Publication Data

US 2017/0197870 A1   Jul. 13, 2017

Related U.S. Application Data

(62) Division of application No. 15/404,823, filed on Jan. 12, 2017.

(Continued)

(51) Int. Cl.
*B32B 17/06* (2006.01)
*C03C 3/097* (2006.01)
(Continued)

(52) U.S. Cl.
CPC ........ *C03C 3/097* (2013.01); *B32B 17/10036* (2013.01); *B32B 17/10045* (2013.01);
(Continued)

(58) Field of Classification Search
USPC .................................................. 428/410, 426
See application file for complete search history.

(56) References Cited

U.S. PATENT DOCUMENTS

| | | | | |
|---|---|---|---|---|
| 3,287,200 A | * | 11/1966 | Hess | ........................ C03B 27/03 351/159.57 |
| 3,445,316 A | | 5/1969 | Megles | |

(Continued)

FOREIGN PATENT DOCUMENTS

| | | |
|---|---|---|
| CN | 104144877 A | 11/2014 |
| CN | 104295448 A | 1/2015 |

(Continued)

OTHER PUBLICATIONS

D.R.Tallant, T.A. Michalske, and W.L. Smith, "The effects of tensile stress on the Raman spectrum of silica glass," J. Non-Cryst. Solids, 106 380-383 (1988).

*Primary Examiner* — Lauren R Colgan
(74) *Attorney, Agent, or Firm* — Jeffrey A. Schmidt

(57) ABSTRACT

Embodiments of thermally and chemically strengthened glass-based articles are disclosed. In one or more embodiments, the glass-based articles may include a first surface and a second surface opposing the first surface defining a thickness (t), a first CS region comprising a concentration of a metal oxide that is both non-zero and varies along a portion of the thickness, and a second CS region being substantially free of the metal oxide of the first CS region, the second CS region extending from the first surface to a depth of compression of about 0.17·t or greater. In one or more embodiments, the first surface is flat to 100 μm total indicator run-out (TIR) along any 50 mm or less profile of the first surface. Methods of strengthening glass sheets are also disclosed, along with consumer electronic products, laminates and vehicles including the same are also disclosed.

30 Claims, 59 Drawing Sheets

Related U.S. Application Data

(60) Provisional application No. 62/303,608, filed on Mar. 4, 2016, provisional application No. 62/288,827, filed on Jan. 29, 2016, provisional application No. 62/277,579, filed on Jan. 12, 2016.

(51) Int. Cl.

| | | |
|---|---|---|
| *B32B 17/10* | (2006.01) | |
| *B60J 1/20* | (2006.01) | |
| *C03B 27/00* | (2006.01) | |
| *C03C 3/087* | (2006.01) | |
| *C03C 3/091* | (2006.01) | |
| *C03C 4/18* | (2006.01) | |
| *C03C 21/00* | (2006.01) | |
| *H05K 5/00* | (2006.01) | |
| *H05K 5/03* | (2006.01) | |

(52) U.S. Cl.
CPC .. *B32B 17/10091* (2013.01); *B32B 17/10137* (2013.01); *B32B 17/10761* (2013.01); *B60J 1/2094* (2013.01); *C03B 27/00* (2013.01); *C03C 3/087* (2013.01); *C03C 3/091* (2013.01); *C03C 4/18* (2013.01); *C03C 21/002* (2013.01); *H05K 5/0013* (2013.01); *H05K 5/03* (2013.01); *B32B 2307/54* (2013.01); *B32B 2457/20* (2013.01); *B32B 2605/006* (2013.01); *C03C 2204/00* (2013.01)

(56) References Cited

U.S. PATENT DOCUMENTS

| | | | |
|---|---|---|---|
| 4,471,024 A * | 9/1984 | Pargamin | C03C 21/00 174/137 B |
| 8,713,972 B2 | 5/2014 | Lakota et al. | |
| 8,854,623 B2 | 10/2014 | Fontaine et al. | |
| 9,003,835 B2 | 4/2015 | Lock | |
| 9,145,329 B2 | 9/2015 | Drake et al. | |
| 9,296,638 B2 | 3/2016 | Lezzi et al. | |
| 2005/0099618 A1 | 5/2005 | DiFoggio et al. | |
| 2012/0052271 A1* | 3/2012 | Gomez | C03C 3/091 428/213 |
| 2014/0141217 A1 | 5/2014 | Gulati et al. | |
| 2014/0230492 A1 | 8/2014 | Murata | |
| 2014/0331716 A1 | 11/2014 | Ahmed et al. | |
| 2014/0356605 A1* | 12/2014 | Adib | C03C 21/001 428/220 |
| 2014/0370302 A1* | 12/2014 | Amin | C03C 21/005 428/426 |
| 2015/0027169 A1 | 1/2015 | Fredholm | |
| 2015/0030827 A1 | 1/2015 | Gomez et al. | |
| 2015/0052949 A1 | 2/2015 | Bayne et al. | |
| 2015/0166390 A1 | 6/2015 | Cha et al. | |
| 2015/0246846 A1 | 9/2015 | Choju et al. | |
| 2015/0329406 A1 | 11/2015 | Kawamoto et al. | |

FOREIGN PATENT DOCUMENTS

| | | |
|---|---|---|
| CN | 104379532 A | 2/2015 |
| CN | 104541233 A | 4/2015 |
| CN | 104619662 A | 5/2015 |
| CN | 104781201 A | 7/2015 |
| EP | 2876092 A1 | 5/2015 |
| GB | 1026770 A | 4/1966 |
| IN | 201407444 P1 | 2/2012 |
| IN | 201404365 P1 | 2/2015 |
| JP | 2014166938 A | 9/2014 |
| JP | 05614607 B2 | 10/2014 |
| JP | 05622069 B2 | 11/2014 |
| JP | 2015006650 A | 1/2015 |
| JP | 2015034123 A | 2/2015 |
| JP | 2015054790 A | 3/2015 |
| JP | 2015061808 A | 4/2015 |
| JP | 2015112929 A | 6/2015 |
| JP | 2015151329 A | 8/2015 |
| JP | 2015163574 A | 9/2015 |
| KR | 2015002816 A | 1/2015 |
| KR | 2015013166 A | 2/2015 |
| KR | 2015051166 A | 5/2015 |
| KR | 2015129302 A | 11/2015 |
| KR | 2015129703 A | 11/2015 |
| WO | 2013078039 A1 | 5/2013 |
| WO | 2013130665 A2 | 9/2013 |
| WO | 2014182641 A1 | 11/2014 |
| WO | 2015031148 A1 | 3/2015 |
| WO | 2015088010 A1 | 6/2015 |
| WO | 2015125584 A1 | 8/2015 |
| WO | 2015156262 A1 | 10/2015 |

\* cited by examiner

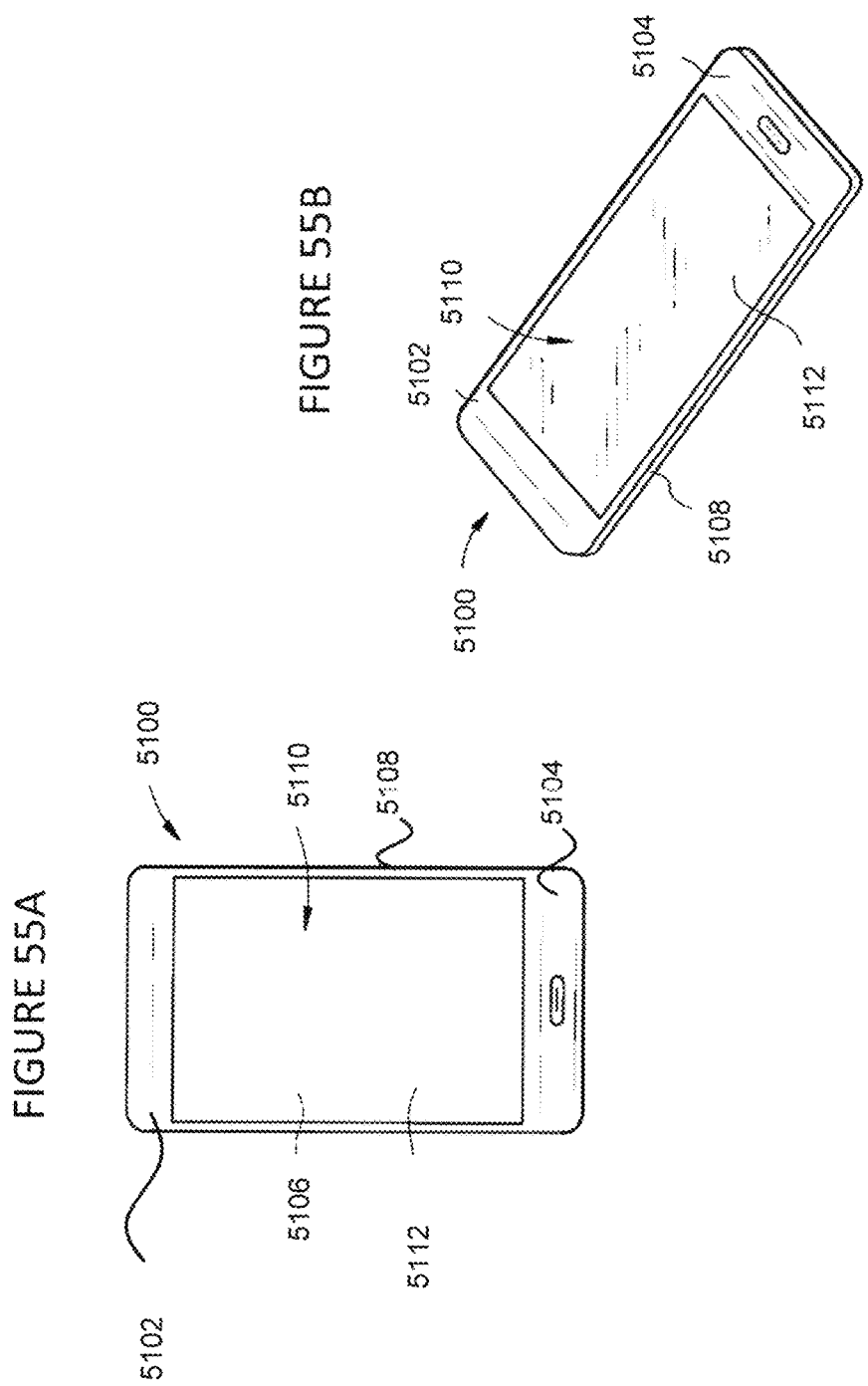

THIN THERMALLY AND CHEMICALLY STRENGTHENED GLASS-BASED ARTICLES

CROSS-REFERENCE TO RELATED APPLICATIONS

This application claims the benefit of priority of U.S. application Ser. No. 15/404,823 filed on Jan. 12, 2017, U.S. Provisional Application Ser. No. 62/303,608 filed on Mar. 4, 2016, U.S. Provisional Application Ser. No. 62/288,827 filed on Jan. 29, 2016 and U.S. Provisional Application Ser. No. 62/277,579 filed on Jan. 12, 2016, the contents of each of which are relied upon and incorporated herein by reference in their entireties.

BACKGROUND

The disclosure relates to improved and thin thermally and chemically strengthened glass articles and improved methods for strengthening glass substrates, and relates more particularly to thin glass articles simultaneously exhibiting a deep depth of compression and high surface compressive stress.

Thermally strengthened glass articles are strengthened by heating a glass substrate to an elevated temperature above the glass transition temperature of the glass, and cooling the surfaces of the substrate rapidly ("quenching"), while the inner regions of the substrate, insulated by the thickness and fairly low thermal conductivity of the glass, are cooled at a slower rate. This differential cooling produces a residual compressive stress (CS) in the surface regions of the thermally strengthened glass article, balanced by a residual tensile stress in the central region thereof.

Thermal strengthening is distinguished from chemical strengthening processes, in which surface compressive stresses are generated by changing the chemical composition of the glass in regions near the surface by a process such as ion diffusion. In some ion diffusion based processes, exterior portions of the resulting glass article may be strengthened by exchanging larger ions for smaller ions near the surface to impart a CS (also called negative tensile stress) on or near the surface.

Thermal strengthening and chemical strengthening processes are distinguished from mechanical glass strengthening processes in which exterior portions of the glass article are strengthened or arranged by combining two types of glass. In such processes, layers of glass compositions that have differing coefficients of thermal expansion are combined or laminated together while hot. For example, by sandwiching molten glass with a higher coefficient of thermal expansion (CTE) between layers of molten glass with a lower CTE, positive tension in the interior glass compresses the outer layers when the glasses cool, again forming CS on the surface to balance the positive tensile stress.

Strengthened glass articles have advantages relative to unstrengthened glass articles. The surface compressive stress of the strengthened glass articles provides greater resistance to fracture than unstrengthened glass. The increase in strength generally is proportional to the amount of surface compression. If a glass article possesses a sufficient level of strengthening, relative to its thickness, then when and if the sheet is broken, it will divide into small fragments with dull edges rather than into large or elongated fragments with sharp edges. Glass that breaks into sufficiently small fragments, or "dices," as defined by various established standards, may be known as safety glass, and is often referred to as "fully tempered" glass, or sometimes simply "tempered" glass.

With at least thermally strengthened glass articles, because the degree of strengthening depends on the temperature difference between the surface and center of the glass sheet, thinner glasses require higher cooling rates to achieve a given stress. Also, thinner glass generally requires higher final values of surface CS and central tensile stresses or central tension (CT) to achieve dicing into small particles upon breaking. Accordingly, achieving desirable dicing behavior in thin glass articles (i.e., articles with a thickness of around 3 mm or less) using known thermal strengthening processes alone or in combination with other strengthening process has been exceedingly challenging if not impossible. Moreover, such thin glass articles often do not exhibit high surface compressive stresses, which prevent flaw or crack nucleation and/or growth. Accordingly, there is a need for thin glass articles exhibit deep depths of compression while also exhibiting high surface compressive stresses.

SUMMARY

A first aspect of this disclosure pertains to thermally strengthened and chemically strengthened glass-based articles. In this disclosure glass-based substrates are generally unstrengthened and glass-based articles generally refer to glass-based substrates that have been strengthened (by, for example, thermal strengthening and/or chemical strengthening).

In one or more embodiments, the glass-based article includes a first surface and a second surface opposing the first surface defining a thickness (t). The first and second opposing surfaces may include opposing major surfaces of the article. In some embodiments, the thickness of the glass-based article t is less than about 2 mm or less than about 1.2 mm. In some instances, the glass-based article comprises a glass sheet having a length, expressed in millimeters, of l, and a width, expressed in millimeters, of w, wherein the thickness t is less than l and less than w, and l and w are each at least 10 mm. In some instances, either one or both l and w are at least 40 mm. The ratio l/t and the ratio w/t each are equal to 10/1 or greater, in accordance with one or more embodiments.

In one or more embodiments, the glass-based article includes a first CS region comprising a concentration of a metal oxide that is both non-zero and varies along a portion of the thickness, and a second CS region. In one or more embodiments, the metal oxide having a varying concentration in the first CS region generates a stress along the specified thickness range. In some embodiments, this metal oxide may have the largest ionic diameter of all of the total metal oxides in the glass-based article. In other words, the metal oxide having a varying concentration may be the metal oxide that is ion exchanged into the glass-based article. In one or more embodiments, the second CS region may include a constant metal oxide concentration region or, in other words, is substantially free of the metal oxide that is non-zero and varies along the first CS region. As used herein, the phrase "substantially free of the metal oxide that is non-zero and varies along the first CS region" means that less than about 0.1 mol % of the metal oxide is present in the second CS region. In some embodiments, the composition of the second CS is substantially constant throughout the thickness of the second CS region. In one or more embodiments, the second CS region extends from the first CS region to a depth of compression (DOC), wherein the DOC is about 0.17·t or greater. In some embodiments, the concentration of the metal oxide is both non-zero and varies along the portion of the thickness from the first surface to a depth in the range from greater than about 0·t to less than about 0.17·t or in the range from greater than about 0.01·t to about 0.1·t.

In one or more embodiments, the glass-based article includes a thermally strengthened region extending from the first surface to a DOC and a chemically strengthened region extending from the first surface to a depth of layer (DOL). As used herein, the term "thermally strengthened region" includes a region exhibiting a compressive stress primarily due to a thermal strengthening process. Such thermally strengthened regions may also exhibit some stress due to chemical strengthening (e.g., the penetration of metal ions into deeper regions of the glass-based article which may contribute some stress, but such stress is not the primary contribution to the total compressive stress in the region). As used herein, the term "chemically strengthened region" includes a region exhibiting a compressive stress generated at least in part to a chemical strengthening process. Such chemically strengthened regions may also exhibit some stress due to thermal strengthening process. The DOC of some embodiments is greater than DOL and DOC is greater than or equal to about 0.17·t.

As used herein, DOC refers to the depth at which the stress within the glass-based article changes from compressive to tensile stress. DOL refers to the stress generated as a result of chemical strengthening. At the DOC, the stress crosses from a compressive stress to a tensile stress and thus exhibits a stress value of zero.

According to the convention normally used in the art, compression is expressed as a negative (<0) stress and tension is expressed as a positive (>0) stress; however, throughout this description, CS is expressed as a positive or absolute value—i.e., as recited herein, CS=|CS|, and CT is also expressed as an absolute value, i.e., as recited herein, CT=|CT|.

In some embodiments, the surface CS of the glass-based article may be about 400 MPa or greater, or about 600 MPa or greater. In one or more embodiments, the surface CS may be about 1 GPa or greater. In some embodiments, the glass-based article exhibits a maximum CT of about 75 MPa or greater, or even 80 MPa or greater. In one or more embodiments, the glass-based article includes a stored tensile energy of about 6 $J/m^2$ or greater or about 10 $J/m^2$ or greater.

The glass-based article of one or more embodiments may exhibit a CS value at a depth equal to the DOL of about 150 MPa or greater. In one or more specific embodiments, the DOL at which the CS is about 150 MPa or greater, may be about 10 micrometers or greater (or about 0.01·t or greater).

In one or more embodiments, the glass-based article includes a first surface that is flat to 100 μm total indicator run-out (TIR) along any 50 mm or less profile of a first surface. In one or more embodiments, the first surface has a roughness in the range of from 0.2 to 1.5 nm Ra over an area of 10×10 μm.

In some embodiments, the glass-based article comprises a glass having a softening temperature, expressed in units of ° C., of $T_{soft}$ and an annealing temperature, expressed in units of ° C., of $T_{anneal}$, and a surface fictive temperature measured on the first surface represented by Tfs, when expressed in units of ° C. and a non-dimensional surface fictive temperature parameter θs given by $(Tfs-T_{anneal})/(T_{soft}-T_{anneal})$, wherein the parameter θs is in the range of from 0.20 to 0.9.

In some embodiments, the Tfs measured on the first surface is at least 50° C. above a glass transition temperature of the glass. In one or more embodiments, the Tfs measured on the first surface is at least 75° C. above a glass transition temperature of the glass.

The glass-based articles described herein may include a composition including $P_2O_5$, $Li_2O$, $B_2O_3$ or various combinations of $P_2O_5$, $Li_2O$ and $B_2O_3$.

A second aspect of this disclosure pertains to a method for strengthening a glass-based sheet. In one or more embodiments, the method includes cooling a glass sheet having a transition temperature, from a temperature greater than the transition temperature to a temperature less than the transition temperature by transferring thermal energy from the glass sheet to a heat sink by conduction across a gap that is free of solid or liquid matter to thermally strengthen the glass sheet, and then chemically strengthening the thermally strengthened glass sheet. In one or more embodiments, the method includes transferring thermal energy from the glass sheet to a heat sink by conduction across the gap such that more than 20%, more than 30%, more than 40% or more than 50% of the thermal energy leaving the glass sheet crosses the gap and is received by the heat sink.

In one or more embodiments, the method includes supporting at least a portion of a glass-based sheet on a first surface thereof, at least in part, by a flow or a pressure of a gas delivered to a gap between the first surface and a first heat sink, wherein the sheet comprises a glass having a transition temperature and the sheet is at a temperature greater than the transition temperature of the glass, cooling the glass-based sheet, by thermal conduction more than by convection, from the first surface of the sheet through the gas to a heat sink to provide a thermally strengthened glass-based sheet, and chemically strengthening the thermally strengthened glass-based sheet.

In one or more embodiments, the thermally strengthened glass-based sheet is chemically strengthened without removing any portion of the thermally strengthened glass-based sheet. In some instances, the thermally strengthened glass-based sheet is chemically strengthened without removing 3% or more of the thickness of the thermally strengthened glass-based sheet. Cooling the glass-based sheet may include cooling at a rate of about −270° C./second or greater.

In one or more embodiments, chemically strengthening the thermally strengthened glass-based sheet includes generating a chemically strengthened region that extends from a first surface of the glass-based layer to a DOL that is greater than or equal to about 10 micrometers (or greater than about 0.01·t). In some embodiments, chemically strengthening the thermally strengthened glass-based sheet comprises immersing the thermally strengthened glass-based sheet in a molten salt bath comprising any one or more of $KNO_3$, $NaNO_3$, and $LiNO_3$. In some embodiments, the molten salt bath includes a combination of $KNO_3$ and $NaNO_3$ and has a temperature in the range from about 380° C. to about 430° C.

A third aspect of this disclosure pertains to a consumer electronic product. In one or more embodiments, the consumer electronic product may include a housing having a front surface, a back surface and side surfaces, electrical components disposed at least partially inside or internal to the housing, and a cover article provided at or over the front surface of the housing. In one or more embodiments, the electrical components include at least a controller, a memory, and a display disposed at or adjacent the front surface of the housing. In some embodiments, the cover article is disposed over the display and is a thermally and chemically strengthened glass-based article, as described herein. In one or more embodiments, the consumer electronic product is a mobile phone, portable media player, notebook computer or tablet computer.

A fourth aspect of this disclosure pertains to a laminate comprising a first glass-based substrate, a second glass-based substrate and an interlayer disposed between the first glass-based substrate and the second glass-based substrate. In one or more embodiments, either one or both the first and second glass-based substrate is a thermally and chemically strengthened glass article as described herein.

In one or more embodiments of the laminate, one of the first glass-based substrate and the second glass-based substrate is cold-formed.

In one or more embodiments of the laminate, the first glass-based substrate is complexly-curved and has at least one concave surface providing a first surface of the laminate and at least one convex surface to provide a second surface of the laminate opposite the first surface. In one or more embodiments, the second glass-based substrate of the laminate is complexly-curved and has at least one concave surface to provide a third surface of the laminate and at least one convex surface to provide a fourth surface of the laminate opposite the third surface, wherein the third and fourth surfaces respectively have CS values such that the fourth surface has a CS value that is greater than the CS value of the third surface. In some embodiments, the fourth surface of the laminate has a greater CS than the fourth surface has in a flat state and the laminate is free from optical distortions when viewed with the naked eye.

In one or more embodiments, one of the first glass-based substrate or the second glass-based substrate of the laminate has a thickness in the range of about 0.2 mm to about 0.7 mm.

In one or more embodiments of the laminate, a peripheral portion of the second glass-based substrate exerts a compressive force against the interlayer, and a center portion of the second glass-based substrate exerts a tensile force against the interlayer. In one or more embodiments, the second glass-based substrate conforms to the first glass-based substrate to provide a substantially uniform distance between the convex surface of the second glass-based substrate and the concave surface of the first glass-based substrate, which is filled by the intervening interlayer.

A fifth aspect of this disclosure pertains to a vehicle comprising an opening; and a laminate (as described herein) disposed in the opening.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

BRIEF DESCRIPTION OF THE DRAWINGS

FIG. 55A is a plan view of an exemplary electronic device incorporating any of the strengthened articles disclosed herein; and FIG. 55B is a perspective view of the exemplary electronic device of FIG. 55A.

DETAILED DESCRIPTION

Figure 1:
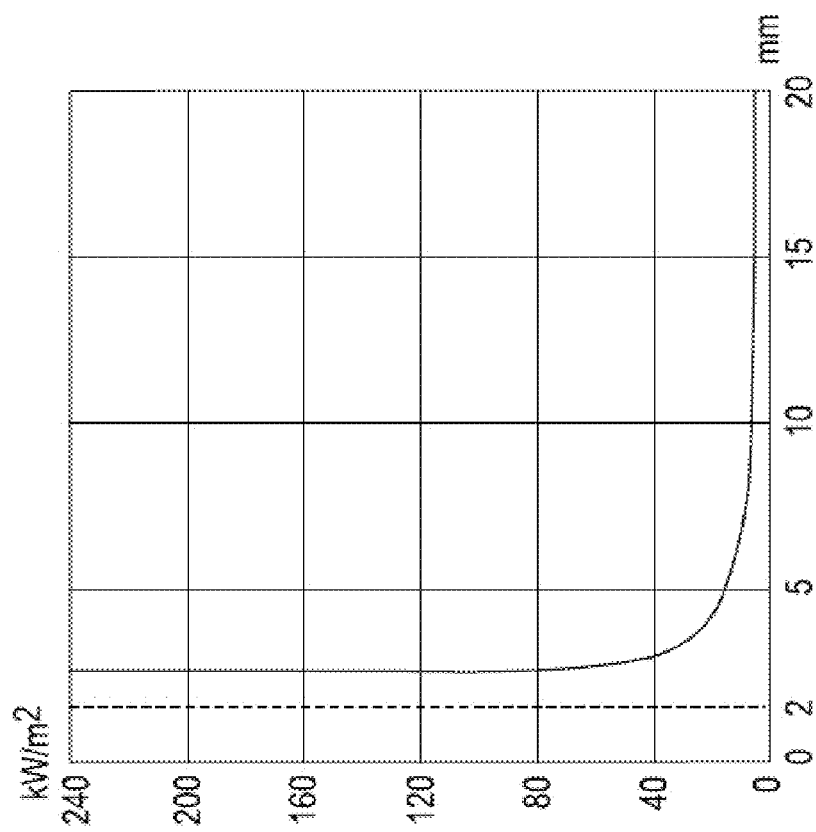
FIG. 1 is a graph of blower power required for known full tempering processes as a function of glass article thickness.

Traditional thermal glass strengthening methods are typically limited to thicker glass articles (typically sheets) because the level of strengthening depends on the temperature difference created between the surface and the center of the glass article during quenching. Due to thermal conduction rate limitations of traditional strengthening methods, it is difficult to achieve significant temperature differences between the surface and the center of a thin glass article due to the relatively even cooling that typically occurs throughout a thin glass article. Moreover, although traditional thermally strengthened glass articles exhibit a DOC or a large CS region, such articles do not exhibit sufficiently high surface CS values needed for certain applications. Specifically, traditional thermally strengthened glass articles can achieve DOC values of about 21% of the thickness of such articles, but typically exhibit surface CS values of less than about 200 MPa.

Conventional industrial processes for thermally strengthening glass involve heating glass substrates (typically sheets) in a radiant energy furnace or a convection furnace (or a "combined mode" furnace using both techniques) to a predetermined temperature, then gas cooling ("quenching"), typically via convection by blowing large amounts of ambient air against or along the glass surface. This gas cooling process is predominantly convective, whereby the heat transfer is by mass motion (collective movement) of the fluid, via diffusion and advection, as the gas carries heat away from the hot glass substrate.

In conventional thermal strengthening processes, certain factors can restrict the degree of strengthening in glass substrates, particularly in thin glass substrates. Limitations exist, in part, because the amount of CS on the strengthened article is related directly to the magnitude in temperature differential between the surface and the center of the article, achieved during quenching; however, a temperature differential during quenching that is too large is likely to cause the glass to break during quenching. Breakage can be reduced, for a given rate of cooling, by starting the quench from a higher initial glass temperature. Moreover, greater strengthening can be achieved by quenching from a higher temperature; however, increasing the temperature of the article at the start of the quench can lead to excessive and undesirable deformation of the article as it becomes softer.

In conventional thermal strengthening processes, substrate thickness also imposes significant limits on the achievable temperature differential during quenching. The thinner the substrate, the lower the temperature differential between the surface and the center for a given cooling rate during quenching. This is because there is less glass thickness to thermally insulate the center from the surface. Accordingly, thermal strengthening of thin glass substrates typically requires higher cooling rates (as compared to thermal strengthening of thicker glass substrates) and, thus, faster removal of heat from the external surfaces of the glass substrates typically requires significant energy consumption in order to generate strengthening levels of differential temperature between the inner and outer portions of the glass sheet.

By way of example, FIG. 1 shows the power required by air blowers (in kilowatts per square meter of glass substrate area) employed to blow sufficient ambient air to "fully temper" soda-lime glass ("SLG") substrate in sheet form, as a function of glass thickness in millimeters, based on industry standard thermal strengthening processes developed 35 years ago. The power required increases exponentially as the glass used gets thinner. Thus, glass substrates of about 3 mm in thickness were the thinnest fully thermally tempered commercial glass available for many years.

In conventional glass thermal strengthening processes, which use convective gas, higher rates of cooling are achieved by increasing the rate of air flow, decreasing the distance of air nozzle openings to the glass sheet surface, increasing the temperature of the glass (at the start of cooling), and optionally, decreasing the temperature of the cooling air.

Figure 2:
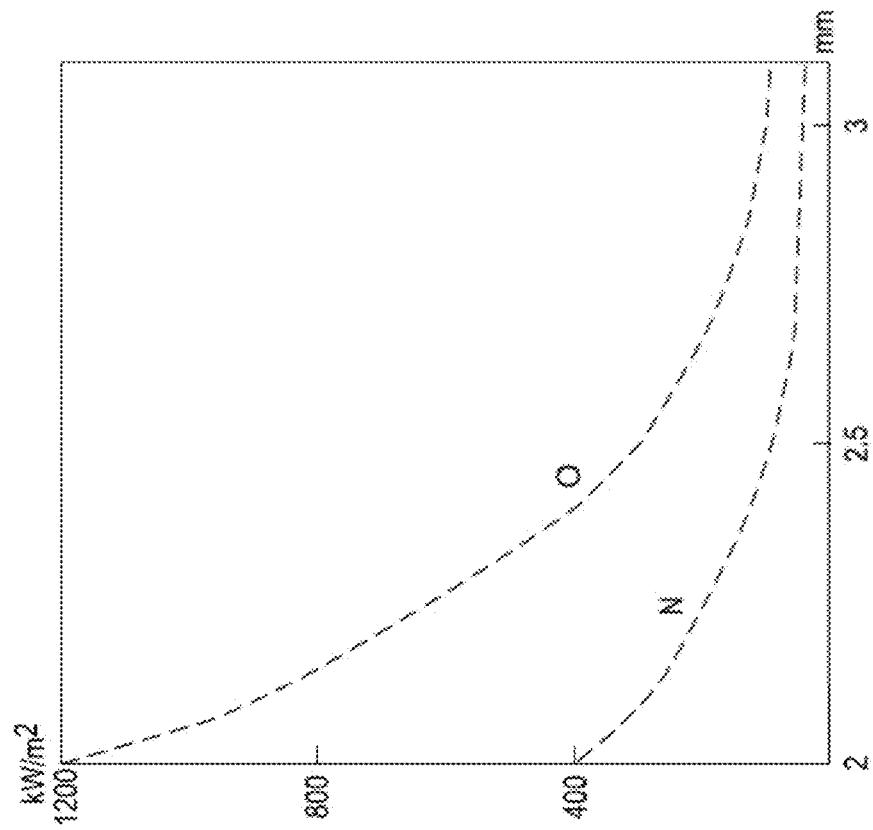
FIG. 2 is a graph of blower power required for "full tempering" as a function of glass article thickness for an old and known process or machine O and a newer and known process or machine N.

As a more recent example, the performance curves of FIG. 2 (Prior Art) were published using state of the art glass thermal strengthening equipment. This improved equipment continues to use traditional air blown convective processes to cool the glass, but replaces rollers used to support the glass during heating with a system that utilizes air to support the glass during at least the last stages of heating. Without roller contact, the glass can be heated to higher temperatures (and higher softness/lower viscosity) prior to quenching, reportedly allowing the production of fully tempered glass at 2 mm thickness. As shown in FIG. 2, the reported blower power required to strengthen a 2 mm thick sheet is reduced from 1200 kW/m$^2$ to 400 kW/m$^2$ at the higher temperatures enabled by using air to support the glass (curve N) as compared to using rollers (curve O).

Figure 3:
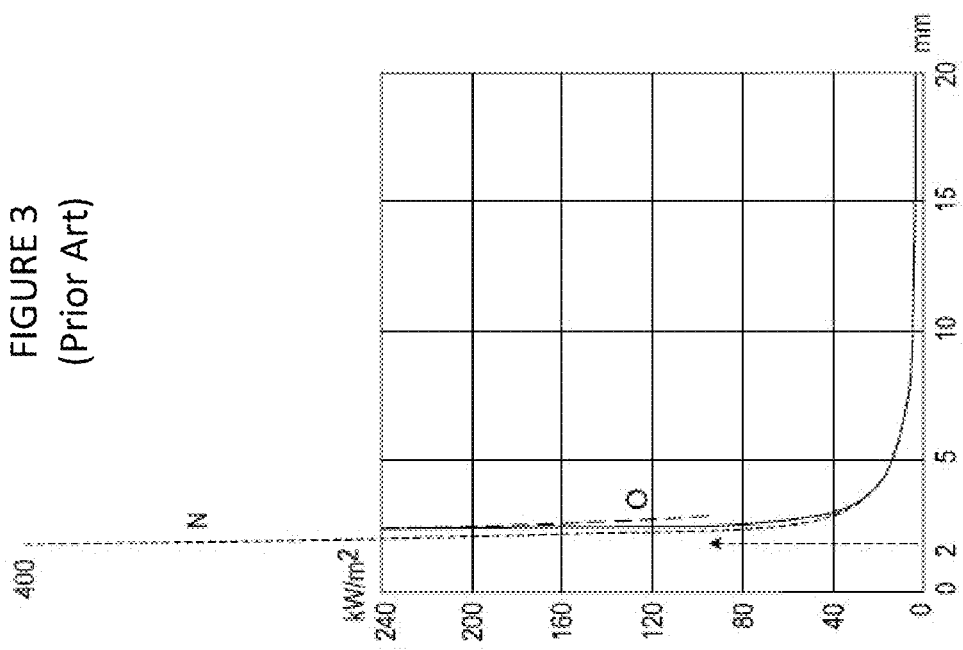
FIG. 3 is a graph of the curve O and the curve N of FIG. 2 scaled to match and superimposed upon the graph of FIG. 1.

Although it represents progress to be able to produce fully tempered 2 mm thick glass, scaling the old and new curves O and N of FIG. 2 to match the scale of FIG. 1, as shown in FIG. 3 (Prior Art), shows that the improvement in performance achieved by the state of the art convective tempering process (shown in FIG. 2) is relatively small and simply an incremental change in the previous understanding of the energy needs in convective strengthening of glass sheets. In FIG. 3 the old and new curves O and N of FIG. 2 are scaled to match the graph of FIG. 1, and overlaid thereon (with the old curve O truncated at the top at 240 kW/m$^2$ for easier viewing of the new curve N). From FIG. 3 it is apparent that the technology represented by the curve N changes only slightly the performance curve of convective gas quenching processes as glass thickness is decreased from 3 mm to 2 mm. The high operating point (400 kW/m$^2$ of blower power for glass having a thickness of 2 mm) shows the extreme increase in power still required to process thinner glass by this method. The sharp increase in airflow and, thus, power needed suggests the difficulty, as a matter of both engineering practice and economics, with providing fully tempered glass having a thickness less than about 2 mm using conventional convective gas strengthening methods. Additionally, the very high airflows needed also could deform the shape of thinner substrates.

Alternative thermal strengthening methods to current commercial convective gas strengthening have been tried as well, but each has certain drawbacks relative to convective gas strengthening. In particular, typical alternative thermal strengthening methods that achieve higher cooling rates generally require at least some liquid or solid contact with the glass surfaces, rather than gas contact only. Such contact with the glass substrate can adversely affect glass surface quality, glass flatness, and/or evenness of the strengthening process. These defects sometimes can be perceived by the human eye, particularly when viewed in reflected light. As described in more detail below, at least in some embodiments, the conductive thermal tempering system of the present disclosure reduces or eliminates such contact-related defects.

Liquid contact strengthening, in the form of immersion in liquid baths or flowing liquids, as well as in the form of spraying, has been used to achieve higher cooling rates than convective gas strengthening, but has the drawback of causing excessive thermal variations across a sheet during the cooling process. In immersion or immersion-like spraying or flowing of liquids, large thermal variations over small areas can occur due to convection currents that arise spontaneously within the liquid bath or liquid flow. In finer spraying, the discrete spray droplets and the effects of nozzle spray patterns also produce significant thermal variations. Excessive thermal variations tend to cause glass breakage during thermal strengthening by liquid contact, which can be mitigated by limiting the cooling rates, but limiting cooling rates also lowers the resulting strengths that can be achieved. Further, the necessary handling of the sheet (to position or hold it within the liquid bath or liquid flow or liquid spray) also causes physical stress and excessive thermal variations from physical contact with the sheet, tending also to cause breakage during strengthening and limiting the cooling rates and resulting strengths. Finally, some liquid cooling methods, such as high cooling rate quenching by oil immersion and various spraying techniques, can alter the glass surface during such cooling, requiring later removal of glass material from the sheet surface to produce a satisfactory finish.

Solid contact thermal strengthening involves contacting the surface of the hot glass with a cooler solid surface. As with liquid contact strengthening, excessive thermal variations, like those seen in liquid contact strengthening, can easily arise during the quenching process. Any imperfection in the surface finish of the glass substrate, in the quenching surfaces, or in the consistency of the thickness of the substrate, results in imperfect contact over some area of the substrate, and this imperfect contact may cause large thermal variations that tend to break the glass during processing and may also cause unwanted birefringence if the sheet survives. Additionally, contacting the hot glass sheet with a solid object can lead to the formation of surface defects, such as chips, checks, cracks, scratches, and the like. Achieving good physical contact over the entirety of the surfaces of a glass substrate also can become increasing difficult as the dimensions of the sheet increase. Physical contact with a solid surface also can mechanically stress the sheet during quenching, adding to the likelihood of breaking the sheet during the process. Further, the extreme high rate temperature changes at the initiation of contact can cause breakage during sheet processing and, as such, contact cooling of thin glass substrates has not been commercially viable.

Figure 4:
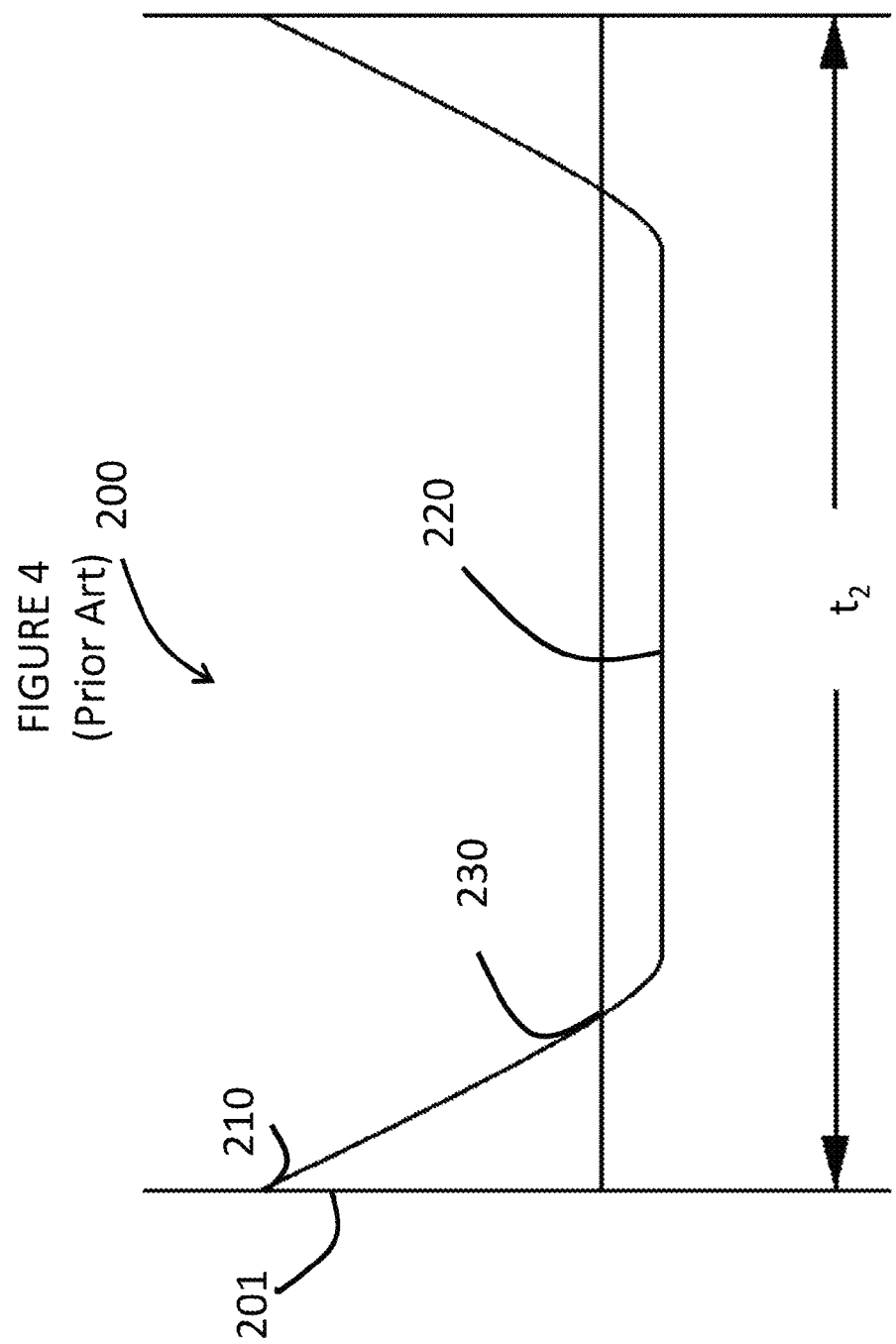
FIG. 4 is a cross-sectional view across a thickness of a known, chemically strengthened glass-based article.

Although chemical strengthening is not limited by the thickness of the glass-based article in the same manner as thermal strengthening processes, known chemically strengthened glass-based articles do not exhibit the stress profile (i.e., stress as a function of thickness of depth from a major surface) of thermally tempered glass-based articles. An example of a stress profile generated by chemical strengthening (e.g., by an ion exchange process), is shown in FIG. 4. In FIG. 4, the chemically strengthened glass-based article 200 includes a first surface 201, a thickness $t_2$ and a surface CS 210. The glass-based article 200 exhibits a CS that decreases generally from the first surface 201 to a DOC 230, as defined herein, at which depth the stress changes from compressive to tensile stress and then reaches a maximum CT 220. As shown in FIG. 4, such profiles exhibit a substantially flat CT region or a CT region with a constant or near constant tensile stress along at least a portion of the CT region. Known chemically strengthened glass-based articles exhibit a significantly lower DOC value and can often exhibit a lower maximum CT value, as compared to known thermally strengthened glass-based articles. Deeper DOC values may be obtainable but only after long ion exchange processes, which can also cause stress relaxation and thus lower surface CS values.

Embodiments of the present disclosure include thin glass-based articles that exhibit a DOC that is comparable or even greater than thick glass articles that are thermally strengthened using conventional thermal strengthening processes, while exhibiting a high surface CS (e.g., greater than about 200 MPa, greater than about 300 MPa or greater than about 400 MPa, as described herein). This combination of high surface CS values and deep DOC is not exhibited by glass articles strengthened using known thermal strengthening processes alone or in combination with chemical strengthening. More particularly, the thermal strengthening process described herein generates a deep parabolic stress profile which prevents penetration of deep flaws and fatigue (i.e., repeated damage) of the glass-based article. In addition, the subsequent chemical strengthening process generates a large or high surface compression, which is unachievable by thermal tempering. A high surface CS value prevents formation and penetration of surface flaws, scratching, and perhaps crack initiation. If performed correctly, the combination of the thermal strengthening process described herein and chemical strengthening provides a large surface compression to a depth sufficient to cover edge flaws, while the thermal strengthening process allows the compression to extend to 20% or more of the glass-based article thickness and provide protection against flaw growth as a result of repeated damage. Moreover, such glass-based articles may be thermally strengthened using the processes and systems described herein in less than 1 minute or even less than 30 seconds, and chemically strengthened in about 3 hours or less.

The present disclosure surpasses the traditional processes described above to effectively, efficiently, and evenly thermally strengthen and chemically strengthened thin glass substrates at commercial scales without generating various flaws common in conventional thermal strengthening processes, e.g., without damaging the surface of the glass, without inducing birefringence, without uneven strengthening, and/or without causing unacceptable breakage, etc.

The thermal strengthening systems and processes discussed herein utilize very high heat transfer rates (h in units of $cal/cm^2$-s-$C°$) in a precise manner, with good physical control and gentle handling of the glass. In particular embodiments, the thermal strengthening processes and systems discussed herein utilize a small-gap, gas bearing in the cooling/quenching section that allows processing thin glass substrates at higher relative temperatures at the start of cooling, resulting in higher thermal strengthening levels. As described below, this small-gap, gas bearing cooling/quenching section achieves very high heat transfer rates via conductive heat transfer to heat sink(s) across the gap, rather than using high air flow based convective cooling. This high rate conductive heat transfer is achieved while not contacting the glass with liquid or solid material, by supporting the glass substrate on gas bearings within the gap.

In one or more embodiments, the resulting thermally strengthened glass-based articles exhibit higher levels of permanent thermally induced stresses than previously known. Without wishing to be bound by theory, it is believed that the achieved levels of thermally induced stress are obtainable for a combination of reasons. The high uniformity of the heat transfer in the processes detailed herein reduces or removes physical and unwanted thermal stresses in the glass, allowing glass substrates to be tempered at higher heat transfer rates without breaking. Further, the present methods can be performed at lower glass substrate viscosities (higher initial temperatures at the start of quench), while still preserving the desired glass flatness and form, which provides a much greater change in temperature in the cooling process, thus increasing the heat strengthening levels achieved.

The thermally strengthened glass-based articles are then chemically strengthened in a molten salt bath to generate a high surface CS. Without being bound by theory, the chemical strengthening process can be tailored to provide a "spike" or to increase the slope of the stress profile at or near the surface of the resulting glass-based article to provide a high surface CS, which complements the deep DOC generated by the thermal strengthening process described herein.

As used herein, embodiments of the chemical strengthening include an ion exchange process. In this process, ions at or near the surface of the glass-based substrate or thermally strengthened glass-based article are replaced by—or exchanged with—larger ions having the same valence or oxidation state. In those embodiments in which the glass-based substrate or thermally strengthened glass-based article comprises an alkali aluminosilicate glass, ions in the surface layer of the glass and the larger ions are monovalent alkali metal cations, such as $Li^+$ (when present in the glass-based substrate or thermally strengthened glass-based article), $Na^+$, $K^+$, $Rb^+$, and $Cs^+$. Alternatively, monovalent cations in the surface layer may be replaced with monovalent cations other than alkali metal cations, such as $Ag^+$ or the like.

Ion exchange processes are typically carried out by immersing a glass-based substrate or thermally strengthened glass-based article in a molten salt bath (or two or more molten salt baths) containing the larger ions to be exchanged with the smaller ions in the glass-based substrate or thermally strengthened glass-based article. It should be noted that aqueous salt baths may also be utilized. In some instances, a spray process can be used to apply a salt solution to the glass-based substrate or a thermally strengthened glass-based article, which is then heated to promote ion exchange. The composition of the bath(s) and/or solutions may include more than one type of larger ion (e.g., Na+ and K+) or a single larger ion. It will be appreciated by those skilled in the art that parameters for the ion exchange process, including, but not limited to, bath/spray solution composition and temperature, immersion time, the number of immersions of the glass-based article in a salt bath (or baths), number of applications of salt solutions, use of multiple salt baths or solutions, additional steps such as annealing, washing, and the like, are generally determined by the composition of the glass-based substrate and/or article (including the structure of the article and any crystalline phases present) and the desired DOL, DOC, CT and/or surface CS of the glass-based article that results from strengthening. By way of example, ion exchange of thermally strengthened glass-based articles may be achieved by immersion of the glass-based substrates in at least one molten bath containing a salt such as, but not limited to, nitrates, sulfates, and chlorides of the larger alkali metal ion. Typical nitrates include $KNO_3$, $NaNO_3$, and $LiNO_3$, and combinations thereof. The temperature of the molten salt bath typically is in a range from about 380° C. up to about 450° C., while immersion times range from about 10 minutes up to about 5 hours (e.g., from about 10 minutes to about 1 hour) depending on glass thickness, bath temperature and glass diffusivity. However, temperatures and immersion times different from those described above may also be used.

In one or more embodiments, the thermally strengthened glass-based article may be immersed in a molten salt bath of 100% $KNO_3$ having a temperature from about 370° C. to about 480° C. (e.g., 410° C.). In one or more embodiments, the thermally strengthened glass-based article may be immersed in a molten salt bath of 100% $NaNO_3$ having a temperature from about 370° C. to about 480° C. In some embodiments, the thermally strengthened glass-based article may be immersed in a molten mixed salt bath including from about 5% to about 90% $KNO_3$ and from about 10% to about 95% $NaNO_3$. In some instances, the molten mixed salt bath may include form about 50% to about 100% $NaNO_3$, with the balance (if any) including $KNO_3$. The mixed salt bath may have a temperature in the range from about 380° C. to about 420° C. In some embodiments, the thermally strengthened glass-based article may be immersed in a molten mixed salt bath including $Na_2SO_4$ and $NaNO_3$ and have a wider temperature range (e.g., up to about 500° C.). In one or more embodiments, the glass-based article may be immersed in a second bath, after immersion in a first bath. Immersion in a second bath may include immersion in a molten salt bath including 100% $KNO_3$ for 15 minutes to 8 hours.

In one or more embodiments, the thermally strengthened glass-based article may be immersed in a molten, mixed salt bath including $NaNO_3$ and $KNO_3$ (e.g., 49% $NaNO_3$/51% $KNO_3$, 50% $NaNO_3$/50% $KNO_3$, 51% $NaNO_3$/49% $KNO_3$, 95% $KNO_3$/5% $NaNO_3$, 90% $KNO_3$/10% $NaNO_3$, or 80% $KNO_3$/20% $NaNO_3$) having a temperature less than about 420° C. (e.g., about 400° C. or about 380° C.) for less than about 5 hours, or even about 4 hours or less.

In some embodiments, chemical strengthening may be performed by ion implantation processes. For example, the thermally strengthened glass-based article may be placed in a vacuum chamber and subjected to an ion implantation process by which a strengthening ion or an ion that is capable of generating a compressive stress in the glass is implanted into the thermally strengthened glass-based article. The implantation depth would correlate to the DOL values recited herein. In one or more embodiments, the strengthening ion may be any ion that creates a crowding effect that generates a compressive stress.

Figure 5:
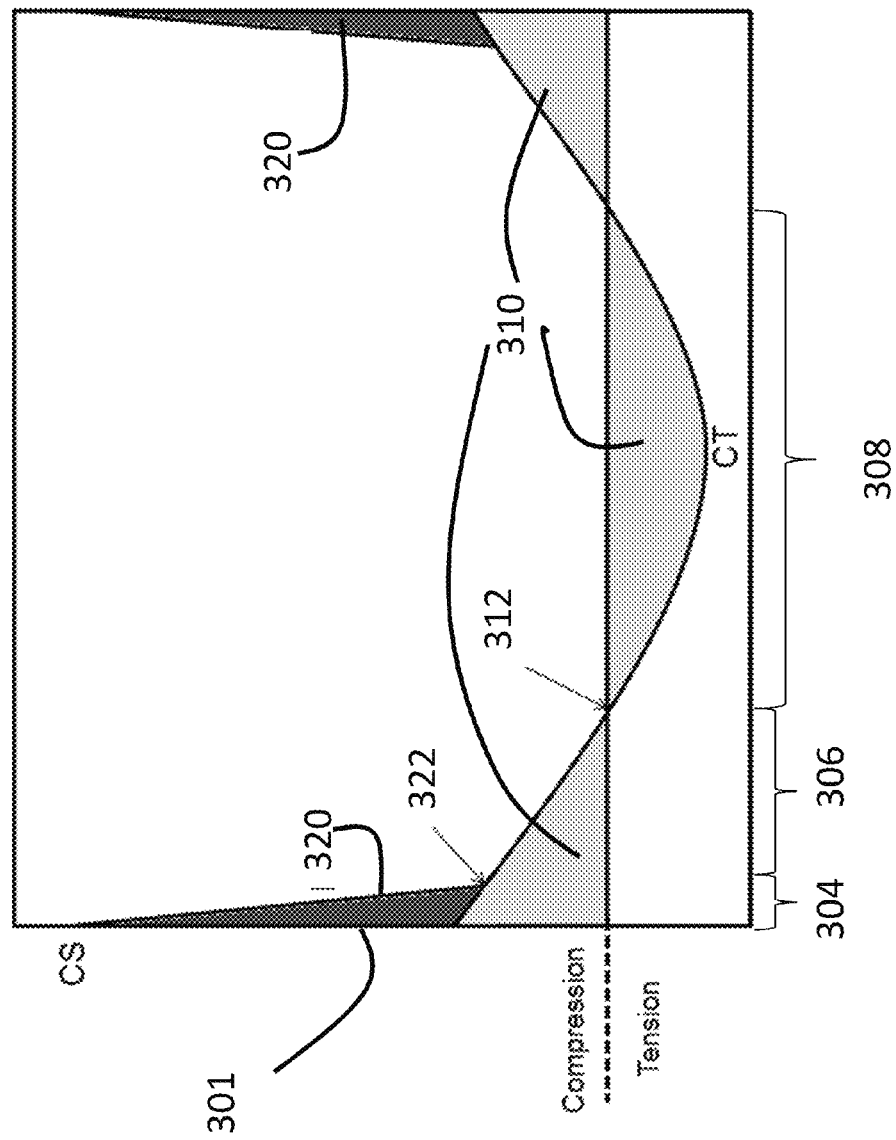
FIG. 5 is a graph illustrating a stress profile as a function of glass-based article thickness according to one or more embodiments of this disclosure.

The resulting stress profile generated by the thermal strengthening process and the subsequent chemical strengthening process described herein is illustrated in FIG. 5. The glass-based article of one or more embodiments includes a thermally strengthened region 310 including a stress induced by thermal strengthening and a chemically strengthened region 320 including a stress induced by chemical strengthening. The surface CS is generated by the combination of stress induced by thermal strengthening and stress induced by chemical strengthening. The stress induced by thermal strengthening (or the thermally strengthened region) extends to the DOC indicated by 312. The stress induced by chemical strengthening (or the chemically strengthened region) extends to a DOL indicated by 322 (in some instances, this DOL is referred to as a "knee" of the stress profile). The CT balances the CS portions of the stress profile.

In some embodiments, the stress profile exhibits a parabolic-like shape. In one or more embodiments, the parabolic-like shape is exhibited along the stress profile region or depth of the glass-based article exhibiting tensile stress. In one or more specific embodiments, the stress profile is free of a flat stress (i.e., compressive or tensile) portion or a portion that exhibits a substantially constant stress (i.e., compressive or tensile). In some embodiments, the CT region exhibits a stress profile that is substantially free of a flat stress or free of a substantially constant stress. In one or more embodiments, all points of the stress profile 312 between the entire thickness or along a thickness range from about 0·t up to about 0.2·t and greater than 0.8·t (or from about 0·t to about 0.3·t and greater than 0.7·t) comprise a tangent that is less than about −0.1 MPa/micrometers or greater than about 0.1 MPa/micrometers. In some embodiments, the tangent may be less than about −0.2 MPa/micrometers or greater than about 0.2 MPa/micrometers. In some more specific embodiments, the tangent may be less than about −0.3 MPa/micrometers or greater than about 0.3 MPa/micrometers. In even more specific embodiments, the tangent may be less than about −0.5 MPa/micrometers or greater than about 0.5 MPa/micrometers. In other words, the stress profile of one or more embodiments along these thickness ranges (i.e., the entire thickness, along the range from about 0·t up to about 0.2·t and greater than 0.8t, or along the range from about 0t to about 0.3·t and 0.7·t or greater) exclude points having a tangent, as described herein. Without being bound by theory, known error function or quasi-linear stress profiles have points along these thickness ranges (i.e., from about 0·t up to about 2·t and greater than 0.8·t, or from about 0·t to about 0.3·t and 0.7·t or greater) that have a tangent that is flat or has zero slope stress profile along a substantial portion of such thickness ranges, as shown in FIG. 4, 220). The glass-based articles of one or more embodiments of this disclosure do not exhibit such a stress profile having a flat or zero slope stress profile along these thickness ranges, as shown in FIG. 5.

In one or more embodiments, the glass-based article exhibits a stress profile in a thickness range from about 0.1·t to 0.3·t and from about 0.7·t to 0.9·t that comprises a maximum tangent and a minimum tangent. In some instances, the difference between the maximum tangent and the minimum tangent is about 3.5 MPa/micrometers or less, about 3 MPa/micrometers or less, about 2.5 MPa/micrometers or less, or about 2 MPa/micrometers or less.

In one or more embodiments, the glass-based article includes a stress profile that is substantially free of any flat segments that extend in a depth direction or along at least a portion of the thickness t of the glass-based article. In other words, the stress profile is substantially continuously increasing or decreasing along the thickness t. In some embodiments, the stress profile is substantially free of any flat segments in a depth direction having a length of about 10 micrometers or more, about 50 micrometers or more, or about 100 micrometers or more, or about 200 micrometers or more. As used herein, the term "flat" refers to a slope having a magnitude of less than about 5 MPa/micrometer, or less than about 2 MPa/micrometer along the linear segment. In some embodiments, one or more portions of the stress profile that are substantially free of any flat segments in a depth direction are present at depths within the glass-based article of about 5 micrometers or greater (e.g., 10 micrometers or greater, or 15 micrometers or greater) from either one or both the first surface or the second surface. For example, along a depth of about 0 micrometers to less than about 5 micrometers from the first surface, the stress profile may include linear segments, but from a depth of about 5 micrometers or greater from the first surface, the stress profile may be substantially free of flat segments.

In some embodiments, the stress profile may include linear segments at depths from about 0t up to about 0.1t and may be substantially free of flat segments at depths of about 0.1t to about 0.4t. In some embodiments, the stress profile from a thickness in the range from about 0t to about 0.1t may have a slope in the range from about 20 MPa/microns to about 200 MPa/microns. As will be described herein, such embodiments may be formed using a single ion-exchange process by which the bath includes two or more alkali salts or is a mixed alkali salt bath or multiple (e.g., 2 or more) ion exchange processes.

In some embodiments, the glass-based articles exhibit the stress profiles described herein, while still exhibiting a deep DOC and high surface CS.

In some embodiments, the chemically induced CS region is referred to as a first CS region that includes a concentration of a metal oxide that is both non-zero and varies along a portion of the thickness of the glass-based article. In one or more embodiments, the thermally induced CS region is referred to as a second CS region. Referring to FIG. 5, in one or more embodiments, the first CS region 304 extends from a first surface 301 to the second CS region 306. The second CS region 306 extends from the first CS region 304 to the DOC 312. In some instances, the second CS region 306 is between the first CS region 304 and the CT region 308. In some embodiments, the entire second CS region includes a constant metal oxide concentration region. In some embodiments, only a portion of the second CS region includes a constant metal oxide region, while the remaining portion includes a varying metal oxide concentration. In one or more embodiments, the metal oxide having a varying concentration in the first CS region and/or the second CS region generates a stress along the specified thickness range or beyond the specified thickness range along which the concentration metal oxide varies. In other words, the stress profile along the chemically induced CS region may be generated due to a non-zero concentration of a metal oxide(s) that varies along a portion of the thickness. In some embodiments, this metal oxide may have the largest ionic diameter of all of the total metal oxides in the glass-based article. In other words, the metal oxide having a varying concentration may be the metal oxide that is ion exchanged into the glass-based article. The metal oxide that is non-zero in concentration and varies along a portion of the thickness may be described as generating a stress in the glass-based article.

The variation in concentration of metal oxide may be continuous along the above-referenced thickness ranges. Variation in concentration may include a change in metal oxide concentration of about 0.2 mol % or greater along a thickness segment of about 100 micrometers. This change may be measured by known methods in the art including microprobe.

The variation in concentration of metal oxide may be continuous along the above-referenced thickness ranges. In some embodiments, the variation in concentration may be continuous along thickness segments in the range from about 10 micrometers to about 30 micrometers. In some embodiments, the concentration of the metal oxide decreases from the first surface to a point between the first surface and the second surface.

The concentration of metal oxide may include more than one metal oxide (e.g., a combination of $Na_2O$ and $K_2O$). In some embodiments, where two metal oxides are utilized and where the respective diameters of the ions differ from one or another, the concentration of ions having a larger diameter is greater than the concentration of ions having a smaller diameter at shallow depths, while the at deeper depths, the concentration of ions having a smaller diameter is greater than the concentration of ions having larger diameter. For example, where a single Na- and K-containing bath is used in the ion exchange process, the concentration of K+ ions in the glass-based article is greater than the concentration of Na+ ions at shallower depths, while the concentration of Na+ is greater than the concentration of K+ ions at deeper depths. This is due, in part, due to the size of the ions. In such glass-based articles, the area at or near the surface comprises a greater CS due to the greater amount of larger ions (i.e., K+ ions) at or near the surface. This greater CS may be exhibited by a stress profile having a steeper slope at or near the surface (i.e., a spike in the stress profile at the surface).

The concentration gradient or variation of one or more metal oxides is created by chemically strengthening a glass-based substrate, as previously described herein, in which a plurality of first metal ions in the glass-based substrate is exchanged with a plurality of second metal ions (i.e., the second metal ions are ion exchanged into the glass-based substrate during chemical strengthening). The first ions may be ions of lithium, sodium, potassium, and rubidium. The second metal ions may be ions of one of sodium, potassium, rubidium, and cesium, with the proviso that the second alkali metal ion has an ionic diameter greater than the ionic diameter of the first alkali metal ion. The second metal ion, which is ion exchanged into the glass-based substrate after chemical strengthening, is present in the glass-based substrate as an oxide thereof (e.g., $Na_2O$, $K_2O$, $Rb_2O$, $Cs_2O$ or a combination thereof). The second metal ion generates the stress in the glass-based article.

Where two metal ions are exchanged into the glass-based article (i.e., where a mixed salt bath or more than one salt bath is used during the chemical strengthening process), one metal ion may extend along a first CS region, while the second metal ion may extend along the first CS region and a second CS region, such that the second CS region is substantially free of the first metal ion (or a concentration gradient thereof). In the glass-based article, this differential diffusion is detected by a non-zero and varying concentration of an oxide of the first metal ion (i.e., a first metal oxide) along the first CS region only and the second CS region being substantially free of the first metal oxide. One way to describe this type of compositional difference is to characterize the relative sizes of the first metal ion and the second metal ion. For example, the first metal ion may have a diameter that is larger than the second metal ion, and may have a diameter that is the largest of all the metal ions in the glass-based article. Accordingly, the second CS region may be free of the metal ions having this largest diameter. In some embodiments, first CS region may have a different composition from the second CS region due to the presence of both the first metal ion (or oxide thereof) and second metal ion (or oxide thereof) in the first CS region, while the second CS region only includes the second metal ion (or oxide thereof). In some embodiments, the glass-based article includes a central tension region that also has a different composition from the first CS region. In some embodiments, the central tension region and the second CS region have the same composition as one another, which differs from the composition of the first CS region. In such embodiments, the first metal oxide may include $Na_2O$, $K_2O$, $Rb_2O$ or $Cs_2O$, while the second metal oxide may include $Li_2O$, $Na_2O$, $K_2O$, or $Rb_2O$ as long as the second metal ion of the second metal oxide has a diameter that is smaller than the first metal ion of the first metal oxide.

In one or more embodiments, the concentration of the varying and strengthening metal oxide is about 0.5 mol % or greater. In some embodiments, the concentration of the metal oxide may be about 0.5 mol % or greater (e.g., about 1 mol % or greater) along the entire thickness of the glass-based article, and is greatest at the first surface and/or the second surface and decreases substantially constantly to a point between the first surface and the second surface. The total concentration of the particular metal oxide in the glass-based article may be in the range from about 1 mol % to about 20 mol %.

The concentration of the metal oxide may be determined from a baseline amount of the metal oxide in the glass-based article prior to being chemically strengthened to include the concentration gradient of such metal oxide.

The combination of deep DOC and high surface CS values is not exhibited by known thermally and chemically strengthened glass-based articles because the subsequent chemical strengthening processes causes stress relaxation or release, which causes a decrease in the DOC. Without being bound by theory, a higher fictive temperature in a thermally strengthened glass-based article would cause more rapid stress relaxation and thus, a decrease in DOC after subsequent chemical strengthening. Surprisingly, the thermal strengthening process described herein generates an even higher fictive temperature in the thermally strengthened glass-based article (due to the use of very high heat transfer rates), which enables maintenance of the DOC after subsequent chemical strengthening. In known thermal strengthening processes, the resulting DOC level is shown to decrease significantly after subsequent chemical strengthening due to stress relaxation because the DOC achieved through conventional thermal strengthening is not as great as is achieved by the thermal strengthening methods described herein. In some instances, the properties of the glass-based article after thermal strengthening as described herein also enable generation of DOC in the glass-based substrate beyond depths of ion penetration. For example, the DOC is greater than 20% or up to and including about 24% of the thickness, whereas the ion penetration from the subsequent chemical strengthening is less than the DOC. In some instances, some ions penetrate to the DOC and may contribute some stress.

The thermal strengthening process described herein increases the fictive temperature of the resulting glass article and creates a more open structure (when compared to the glass substrate prior to thermal strengthening). This allows for an increased rate of chemical strengthening (and in particular ion exchange), leading to a deeper DOL. In some embodiments, a deeper DOL may result in a lower surface CS generated by chemical strengthening, but this lower surface CS is compensated by the initial CS generated and present from the thermal strengthening process. As the two strengthening mechanisms work by fundamentally different processes, they are not mutually exclusive, and the strengthening effects can be added together. In known thermal and chemical strengthened glass articles, the strengthening mechanisms influence each other and the later chemical strengthening process reduces the strength imparted by the earlier thermal strengthening process. In some embodiments, the surface CS exhibited by the glass-based articles described herein can even exceed the surface CS generated by known chemical strengthening processes alone.

The glass-based articles described herein also exhibit higher damage tolerance or resistance. In particular, the glass-based articles exhibit a higher fictive temperature and more open structure after being subjected to the thermal strengthening process described herein, which each or both increase the indentation cracking threshold of the glass-based article. In some embodiments, the chemical strengthening process is performed such that the fictive temperature does not significantly relax during such treatment, and thus, this benefit of a high fictive temperature can carry over to the finished thermally strengthened and chemically strengthened glass-based article.

Moreover, in one or more embodiments, the glass-based article can be strengthened at a significantly lower cost and more quickly than known strengthening processes. In particular, the thermal strengthening processes described herein promote faster ionic diffusion during the subsequent chemical strengthening process. Accordingly, much shorter chemical strengthening processes can be utilized to achieve a desired DOL. In addition, glasses in which it would typically not be considered ideal for chemical strengthening processes, such as in soda-lime silicate glass or some alkali aluminosilicate glasses, can now be chemically strengthened to a desired performance level. For example, a known alkali aluminosilicate glass having a nominal composition of 69 mol % $SiO_2$, 8.5 mol % $Al_2O_3$, 14 mol % $Na_2O$, 1.2 mol % $K_2O$, 6.5 mol % MgO, 0.5 mol % CaO, and 0.2 mol % $SnO_2$ requires 5.5 hours of chemical strengthening in a 420° C. molten salt bath for sufficient strengthening (i.e., such that the resulting glass-based article exhibits a surface CS in excess of 700 MPa and a DOL in the range from about 42 micrometers to about 44 micrometers). The same glass having the same thickness can be thermally strengthened using the process described herein according to one or more embodiments for about 15 seconds and then chemically strengthened in a 410° C. molten salt bath, resulting in a glass-based article exhibiting superior strengthening and performance compared to the glass-based article that is subjected to 5.5 hours of chemical strengthening alone.

Figure 6:
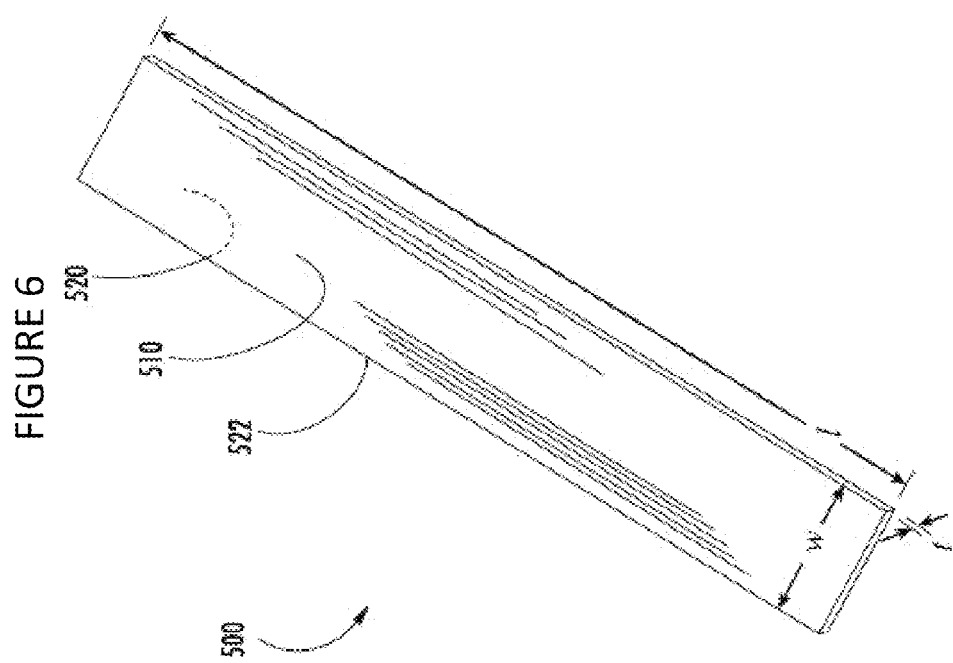
FIG. 6 is a perspective view of a thermally and chemically strengthened glass-based article according to an exemplary embodiment.
Figure 7:
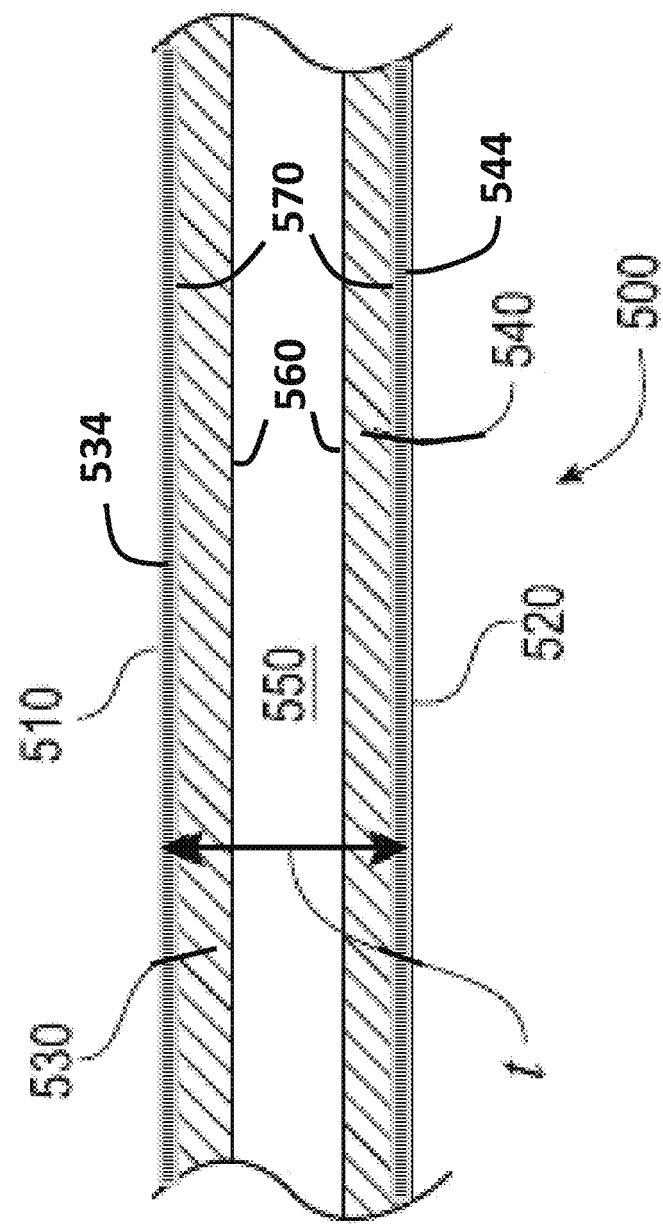
FIG. 7 is a diagrammatic partial cross-section of a thermally and chemically strengthened glass-based article of FIG. 6 according an exemplary embodiment.

Referring to FIGS. 6 and 7, a thermally strengthened and chemically strengthened glass-based article a high surface CS and deep DOC is shown according to an exemplary embodiment. FIG. 6 shows a perspective view of the thermally strengthened and chemically strengthened glass-based article 500, and FIG. 7 a diagrammatic partial cross-section of thermally strengthened glass sheet 500 according to one or more embodiments.

As shown in FIG. 6, a thermally strengthened and chemically strengthened glass-based article 500 (e.g., sheet, beam, plate), includes a first surface 510, a second surface 520 (dotted line to back side of the sheet 500, which may be translucent as disclosed herein), and a body 522 extending therebetween. The second surface 520 is on an opposite side of the body 522 from the first surface 510 such that a thickness t of the strengthened glass-based article 500 is defined as a distance between the first and second surfaces 510, 520, where the thickness t is also a dimension of depth. A width, w, of the strengthened glass-based article 500 is defined as a first dimension of one of the first or second surfaces 510, 520 orthogonal to the thickness t. A length, l, of the strengthened glass or glass-ceramic sheet 500 is defined as a second dimension of one of the first or second surfaces 510, 520 orthogonal to both the thickness t and the width w.

In exemplary embodiments, thickness t of glass-based article 500 is less than length l of glass-based article 500. In other exemplary embodiments, thickness t of glass-based article 500 is less than width w of glass-based article 500. In yet other exemplary embodiments, thickness t of glass-based article 500 is less than both length l and width w of glass sheet 500. As shown in FIG. 7, glass-based article 500 further has regions of permanent thermally induced CS 530 and 540 at and/or near the first and second surfaces 510, 520 extending to a DOC 560, regions of chemically induced CS 534 and 544 at and/or near the first and second surfaces 510, 520 extending to a DOL 570 and balanced by a region of permanent thermally induced central tensile stress 550 (i.e., tension) in the central portion of the sheet.

In various embodiments, thickness t of the glass-based article 500 ranges from 0.1 mm to 5.7 or 6.0 mm, including, in addition to the end point values, 0.2 mm, 0.28 mm, 0.4 mm, 0.5 mm, 0.55 mm, 0.7 mm, 1 mm, 1.1 mm, 1.5 mm, 1.8 mm, 2 mm, and 3.2 mm. Contemplated embodiments include thermally strengthened glass sheets 500 having thicknesses t in ranges from 0.1 to 20 mm, from 0.1 to 16 mm, from 0.1 to 12 mm, from 0.1 to 8 mm, from 0.1 to 6 mm, from 0.1 to 4 mm, from 0.1 to 3 mm, from 0.1 to 2 mm, from 0.1 to less than 2 mm, from 0.1 to 1.5 mm, from 0.1 to 1 mm, from 0.1 to 0.7 mm, from 0.1 to 0.5 mm and from 0.1 to 0.3 mm.

In some embodiments, glass-based article of 3 mm or less in thickness are used. In some embodiments, the glass-based article thickness is about (e.g., plus or minus 1%) 8 mm or less, about 6 mm or less, about 3 mm or less, about 2.5 mm or less, about 2 mm or less, about 1.8 mm or less, about 1.6 mm or less, about 1.4 mm or less, about 1.2 mm or less, about 1 mm or less, about 0.8 mm or less, about 0.7 mm or less, about 0.6 mm or less, about 0.5 mm or less, about 0.4 mm or less, about 0.3 mm or less, or about 0.28 mm or less.

In some embodiments, thermally strengthened and chemically strengthened glass-based article have high aspect ratios—i.e., the length and width to thickness ratios are large. Because the thermal strengthening processes discussed herein do not rely on high pressures or large volumes of air, desirable surface roughness and flatness, can be maintained after tempering without contact between one or both major surfaces of the glass-based article and a solid or liquid (e.g., by including a gap between the one or both major surfaces of the glass-based article and a solid or liquid, wherein the gap is free of solid matter or includes a gas), and by the use of high thermal transfer rate systems discussed herein. Similarly, the thermal and chemical strengthening processes discussed herein allow high aspect ratio glass sheets (i.e., glass sheets with high ratio of length to thickness, or of width to thickness, or both) to be strengthened while retaining the desired or necessary shape. Specifically, glass-based articles can include sheets with length to thickness and/or width to thickness ratios ("aspect ratios") of approximately at least 10:1, at least 20:1, and up to and over 1000:1 can be strengthened. In contemplated embodiments, sheets with aspect ratios of at least 200:1, at least 500:1, at least 1000:1, at least 2000:1, at least 4000:1 can be strengthened.

According to an exemplary embodiment, the length l of the thermally strengthened and chemically strengthened glass-based article 500 is greater than or equal to the width w, such as greater than twice the width w, greater than five times the width w, and/or no more than fifty times the width w. In some such embodiments, the width w of the thermally strengthened and chemically strengthened glass-based article 500 is greater than or equal to the thickness t, such as greater than twice the thickness t, greater than five times the thickness t, and/or no more than fifty times the thickness t.

In some embodiments, the length l of the thermally strengthened and chemically strengthened glass-based article 500 is at least 1 cm, such as at least 3 cm, at least 5 cm, at least 7.5 cm, at least 20 cm, at least 50 cm, and/or no more than 50 m, such as no more than 10 m, no more than 7.5 m, no more than 5 m. In some such embodiments, the width w of the thermally strengthened and chemically strengthened glass-based article 500 is at least 1 cm, such as at least 3 cm, at least 5 cm, at least 7.5 cm, at least 20 cm, at least 50 cm, and/or no more than 50 m, such as no more than 10 m, no more than 7.5 m, no more than 5 m. Referring to FIG. 6, the thermally strengthened and chemically strengthened glass-based article is in the form of a sheet 500 has a thickness t that is thinner than 5 cm, such as 2.5 cm or less, 1 cm or less, 5 mm or less, 2.5 mm or less, 2 mm or less, 1.7 mm or less, 1.5 mm or less, 1.2 mm or less, or even 1 mm or less in contemplated embodiments, such as 0.8 mm or less, such as 0.7 mm or less, such as 0.6 mm or less, such as 0.5 mm or less, such as 0.4 mm or less, such as 0.3 mm or less, such as 0.28 mm or less; and/or the thickness t is at least 10 µm, such as at least 50 µm, at least 100 µm, at least 300 µm.

In other contemplated embodiments, the thermally strengthened and chemically strengthened glass-based article may be sized other than as disclosed herein. In contemplated embodiments, the length l, width w, and/or thickness t of the thermally strengthened and chemically strengthened glass-based article may vary, such as for more complex geometries, where dimensions disclosed herein at least apply to aspects of the corresponding glass or glass-ceramic articles having the above-described definitions of length l, width w, and thickness t with respect to one another.

In some embodiments, at least one of the first or second surfaces 510, 520 of thermally strengthened and chemically strengthened glass-based article 500 has a relatively large surface area. In various embodiments, first and/or second surfaces 510, 520 having areas of 100 $mm^2$ or greater, such about 900 $mm^2$ or greater, about 2500 $mm^2$ or greater, 5000 $mm^2$ or greater, about 100 $cm^2$ or greater, about 500 $cm^2$ or greater, about 900 $cm^2$ or greater, about 2500 $cm^2$ or greater, or about 5000 $cm^2$ or greater. The upper limit of the first or second surfaces 510, 520 is not particularly limited. In some embodiments, the first or second surfaces 510, 520 may have a surface area of no more than 2500 m², no more than 100 m², no more than 5000 cm², no more than 2500 cm², no more than 1000 cm², no more than 500 cm², or no more than 100 cm². As such, the thermally strengthened and chemically strengthened glass-based article 500 may have a relatively large surface area; which, except by methods and systems disclosed herein, may be difficult or impossible to thermally strengthen particularly while having the thicknesses, surface qualities, and/or strain homogeneities of the glass sheets discussed herein. Further, except by methods and systems disclosed herein, it may be difficult or impossible to achieve the stress profile, particularly the negative tensile stress portion of the stress profile (see generally FIG. 5), without relying upon ion-exchange or a change in the type of glass.

As noted above, the thermally strengthened and chemically strengthened glass-based article discussed herein may have surprisingly high surface CS values, surprisingly high central tensile stresses, surprisingly deep DOC values, and/or unique stress profiles (see FIG. 5). This is particularly true considering the low thickness and/or other unique physical properties (e.g., very low roughness, high degree of flatness, various optical properties, fictive temperature properties, etc.) of thermally strengthened and chemically strengthened glass-based article 500 as discussed herein.

CS values of the thermally strengthened and chemically strengthened glass-based articles described herein (e.g., in regions 530, 540 shown in FIG. 5) can vary as a function of thickness t of the glasses. In various embodiments, the thermally strengthened and chemically strengthened glass-based article may have a thickness of 3 mm or less (e.g., 2 mm or less, 1.2 mm or less, 1 mm or less, 0.9 mm or less, 0.8 mm or less, 0.7 mm or less, 0.6 mm or less, 0.5 mm or less, 0.4 mm or less, 0.3 mm or less, or 0.28 mm or less) and a surface CS of about 300 MPa or greater, about 400 MPa or greater, 500 MPa or greater, 600 MPa or greater, about 700 MPa or greater, about 800 MPa or greater, about 900 MPa or greater, or even about 1 GPa or greater. The upper limit of the surface CS may be about 2 GPa. In some embodiments, the thermally strengthened and chemically strengthened glass-based article exhibits a CS value at the depth equal to the DOL (or a "knee stress" or "knee CS") of about 150 MPa or greater (e.g., about 175 MPa or greater, about 200 MPa or greater or about 225 MPa or greater). In such embodiments, the DOL at which the knee stress is 150 MPa or greater may be about 10 micrometers or greater (e.g., 12 micrometers or greater, 14 micrometers or greater, 15 micrometers or greater, or 17 micrometers or greater, or 19 micrometers or greater or 21 micrometers or greater, or 24 micrometers or greater). The DOL at which the knee stress is 150 MPa or greater may be expressed as a function of thickness of the glass-based article. In such embodiments, the DOL at which the knee stress is 150 MPa or greater may be about 0.01·t or greater. CS and DOL may be measured using an FSM technique as described herein.

In various embodiments, the thermally strengthened and chemically strengthened glass-based article may have a CT of about 30 MPa or greater, about 40 MPa or greater, about 50 MPa or greater, about 60 MPa or greater, about 70 MPa or greater or about 80 MPa or greater. These CT values may be present while the thermally and chemically strengthened glass-based article has a thickness of 3 mm or less (e.g., 2 mm or less, 1.2 mm or less, 1 mm or less, 0.9 mm or less, 0.8 mm or less, 0.7 mm or less, 0.6 mm or less, 0.5 mm or less, 0.4 mm or less, 0.3 mm or less, or 0.28 mm or less). As used herein, CT refers to the absolute maximum CT in the glass-based article. In one or more specific embodiments, the CT value of the glass-based article may be greater than about 100 MPa. In other embodiments, the CT of the thermally strengthened and chemically strengthened glass-based article may be less than 400 MPa, or less than 300 MPa. In some embodiments, the CT may be from about 30 MPa to about 300 MPa, about 60 MPa to about 200 MPa, about 70 MPa to about 150 MPa, or about 80 MPa to about 140 MPa. Because very high-heat transfer rates can be applied via the systems and methods discussed herein, significant thermal effects, for example CT values of at least 10 or even at least 20 MPa, can be produced in sheets of SLG of less than 0.3 mm thickness. In fact, very thin sheets, sheets at least as thin as 0.1 mm, can be thermally and chemically strengthened. In one or more embodiments, CT values may be measured using a scattered light polariscope (SCALP), using techniques known in the art.

Believed unique to the present disclosure, given relatively large surface areas and/or thin thicknesses of the thermally strengthened and chemically strengthened glass-based article 500 as disclosed herein, tensile stress in the stress profile 560 sharply transitions between the positive tensile stress of the interior portion 550 and the negative tensile stress of the portions 530, 540 exterior to and adjoining the interior portion 550. This sharp transition may be understood as a rate of change (i.e., slope) of the tensile stress which may be expressed as a magnitude of stress (e.g., 100 MPa, 200 MPa, 250 MPa, 300 MPa, 400 MPa, a difference in peak values of the positive and negative tensile stresses +σ, −σ) divided by a distance of thickness over which the change occurs, such as a distance of 1 mm, such as a distance of 500 μm, 250 μm, 100 μm (which is the distance used to quantify a rate of change, which may be a portion of article thickness, and not necessarily a dimension of the article geometry). In contemplated embodiments, the difference in peak values of the positive and negative tensile stresses is at least 50 MPa, such as at least 100 MPa, at least 150 MPa, at least 200 MPa, at least 250 MPa, at least 300 MPa, at least 400 MPa, at least 500 MPa, and/or no more than 5 GPa. In contemplated embodiments, the glass-based article 500 has a peak negative tensile stress of at least 50 MPa in magnitude, such as at least 100 MPa, at least 150 MPa, at least 200 MPa, at least 250 MPa, at least 300 MPa, at least 400 MPa, at least 500 MPa. The steep tensile curve transitions generated by the system and method discussed herein are believed to be indicative of the ability to achieve higher magnitudes of negative tensile stress at a surface of a thermally strengthened and chemically strengthened glass-based article for a given thickness and/or to manufacture thinner glass articles to a higher degree of negative tensile stress, such as to achieve a fragmentation potential for dicing as disclosed herein. Conventional thermal strengthening approaches may be unable to achieve such steep tensile stress curves.

According to an exemplary embodiment, the high rate of change of tensile stress is at least one of the above-described magnitudes or greater sustained over a thickness-wise stretch of the stress profile 560 that is at least 2% of the thickness, such as at least 5% of the thickness, at least 10% of the thickness, at least 15% of the thickness, or at least 25% of the thickness of thermally strengthened and chemically strengthened glass-based article 500. In contemplated embodiments, the strengthening extends deep into the thermally strengthened and chemically strengthened glass-based article 500 such that the thickness-wise stretch with the high rate of change of tensile stress is centered at a depth of between 20% and 80% into the thickness from the first surface.

In one or more embodiments the DOC (or depth of the thermally induced stress region) extends from a surface of the glass-based article to a depth of about 0.1·t or greater, 0.12·t or greater, 0.14·t or greater, 0.15·t or greater, 0.16·t or greater, 0.17·t or greater, 0.18·t or greater, 0.19·t or greater, 0.20·t or greater, 0.21·t or greater, 0.22·t or greater, or 0.23·t or greater. The upper limit of the DOC may be about 0.3·t. In one or more embodiments, DOC may be measured using a scattered light polariscope (SCALP), using techniques known in the art.

In one or more embodiments, the DOL that results from chemical strengthening may extend from a surface of the glass-based article to a non-zero depth of up to about 0.1t. In some embodiments, the DOL may include a non-zero depth up to about 0.05·t, 0.06·t, 0.07·t, 0.08·t, 0.09·t or 0.095·t. In some embodiments, the DOL may be in the range from about 0.001·t to about 0.1·t, from about 0.001·t to about 0.9·t, from about 0.001·t to about 0.8·t, from about 0.001·t to about 0.7·t, from about 0.001·t to about 0.6·t, from about 0.001·t to about 0.5·t, from about 0.001·t to about 0.4·t, from about 0.01·t to about 0.1·t, from about 0.015·t to about 0.1·t, from about 0.02·t to about 0.1·t, from about 0.03·t to about 0.1·t, from about 0.04·t to about 0.1·t, or from about 0.05·t to about 0.1·t.

DOL is defined as the depth to which the largest metal oxide or metal ion penetrates due to chemical strengthening, as measured by microprobe, polarimetry methods such as FSM technique (described below), and the like. In some embodiments, when chemical strengthening includes exchange of sodium ions into the glass-based article, and thus the presence of Na$_2$O at depths of up to about 0.5t, the penetration depth of sodium cannot be readily measured by FSM technique, but can be measured by microprobe, SCALP, or refracted near-field (RNF) measurement (as described in U.S. Pat. No. 8,854,623, entitled "Systems and methods for measuring a profile characteristic of a glass sample", which is incorporated herein by reference in its entirety). In some embodiments, when chemical strengthening includes exchange of potassium ions into the glass-based article, and thus the presence of K$_2$O, the penetration depth of potassium may be measured by FSM technique.

Compressive stress (including surface CS) is measured by surface stress meter (FSM) using commercially available instruments such as the FSM-6000, manufactured by Orihara Industrial Co., Ltd. (Japan). Surface stress measurements rely upon the accurate measurement of the stress optical coefficient (SOC), which is related to the birefringence of the glass. SOC in turn is measured according to Procedure C (Glass Disc Method) described in ASTM standard C770-16, entitled "Standard Test Method for Measurement of Glass Stress-Optical Coefficient," the contents of which are incorporated herein by reference in their entirety. Refracted near-field (RNF) method or SCALP may be used to measure the stress profile. When the RNF method is utilized to measure the stress profile, the maximum CT value provided by SCALP is utilized in the RNF method. In particular, the stress profile measured by RNF is force balanced and calibrated to the maximum CT value provided by a SCALP measurement. The RNF method is described in U.S. Pat. No. 8,854,623, entitled "Systems and methods for measuring a profile characteristic of a glass sample", which is incorporated herein by reference in its entirety. In particular, the RNF method includes placing the glass article adjacent to a reference block, generating a polarization-switched light beam that is switched between orthogonal polarizations at a rate of between 1 Hz and 50 Hz, measuring an amount of power in the polarization-switched light beam and generating a polarization-switched reference signal, wherein the measured amounts of power in each of the orthogonal polarizations are within 50% of each other. The method further includes transmitting the polarization-switched light beam through the glass sample and reference block for different depths into the glass sample, then relaying the transmitted polarization-switched light beam to a signal photodetector using a relay optical system, with the signal photodetector generating a polarization-switched detector signal. The method also includes dividing the detector signal by the reference signal to form a normalized detector signal and determining the profile characteristic of the glass sample from the normalized detector signal. Maximum CT values are measured using a scattered light polariscope (SCALP) technique known in the art.

In at least some contemplated embodiments, the thermally strengthened and chemically strengthened glass-based article includes a change in the composition thereof in terms of ion content along at least a portion of the thickness. In one or more embodiments, the change in composition includes a change in the concentration of metal oxide that is both non-zero and varying along least a portion of the thickness, and more particularly, along at least a portion of the DOL or the entire DOL. In some embodiments, the DOL is greater than the depth along which the metal oxide concentration varies. In some embodiments, the thermally strengthened and chemically strengthened glass-based article includes a first CS region including a concentration of metal oxide that is both non-zero and varies along a portion of the thickness. In some embodiments, the concentration of the metal oxide is both non-zero and varies along the portion of the thickness from first and/or second surface to a depth in the range from greater than about 0·t to less than about 0.17·t, or in the range from greater than about 0.01·t to about 0.1t.

In one or more embodiments, the composition of the thermally strengthened and chemically strengthened glass-based article 500 in such embodiments includes exchanged or implanted ions that influence the stress profile 560. In some such embodiments, the exchanged or implanted ions do not extend fully through the portions 530, 540 of the strengthened thermally strengthened and chemically strengthened glass-based article 500 because such portions are a result of the thermal strengthening as disclosed herein, instead of chemical strengthening. In some embodiments, the DOL extends deeper than the exchanged or implanted ions. In some embodiments, the DOL extends to a depth equal to the depth of the exchanged or implanted ions.

The stress profiles and attributes of the stress profiles of the thermally and chemically strengthened glass-based articles described herein may be present or exhibited at the edge of the articles (i.e., along the minor surfaces instead of the major surfaces). Referring to FIG. 6, the major surfaces 510, 520 may be masked or maintained unexposed to the thermal or chemical strengthening process(es) so that one or more of the minor surfaces are exposed to the thermal and/or chemical strengthening process(es). The stress profile on such minor surfaces may be tailored for a desired performance or end use.

In one or more embodiments, the first surface 510 and the second surface 520 may have stress profiles that differ from one another. For example any one or more of the surface CS, CS at DOL, DOL, or DOC of the first surface 510 may differ from that of the second surface 520. For example, in some instances, the first surface 510 requires a greater surface CS value than the second surface 520. In another example, the first surface 510 has a greater DOC value than the DOC value of the second surface 520. In some instances, such differences in any one or more of the surface CS, CS at DOL, DOL, or DOC between the first surface 510 and the second surface 520 may be described as an asymmetrical stress profile. Such asymmetry may be imparted by modifying the thermal strengthening, the chemical strengthening or both the thermal and chemical strengthening processes used to form the glass-based articles described herein. As will be described below, asymmetry in the stress profile may also be generated or enhanced by cold forming the glass-based articles described herein to a curved sheet or article.

The thermally and chemically strengthened glass-based articles described herein may exhibit a stored tensile energy in the range from greater than 0 J/m$^2$ to about 40 J/m$^2$. In some instances, the stored tensile energy may be in the range from about 5 J/m$^2$ to about 40 J/m$^2$, from about 10 J/m$^2$ to about 40 J/m$^2$, from about 15 J/m$^2$ to about 40 J/m$^2$, from about 20 J/m$^2$ to about 40 J/m$^2$, from about 1 J/m$^2$ to about 35 J/m$^2$, from about 1 J/m$^2$ to about 30 J/m$^2$, from about 1 J/m$^2$ to about 25 J/m$^2$, from about 1 J/m$^2$ to about 20 J/m$^2$, from about 1 J/m$^2$ to about 15 J/m$^2$, from about 1 J/m$^2$ to about 10 J/m$^2$, from about 10 J/m$^2$ to about 30 J/m$^2$, from about 10 J/m$^2$ to about 25 J/m$^2$, from about 15 J/m$^2$ to about 30 J/m$^2$, from about 15 J/m$^2$ to about 25 J/m$^2$, from about 18 J/m$^2$ to about 22 J/m$^2$, from about 25 J/m$^2$ to about 40 J/m$^2$, or from about 25 J/m$^2$ to about 30 J/m$^2$. The thermally and chemically strengthened glass-based articles of one or more embodiments may exhibit a stored tensile energy of about 6 J/m$^2$ or greater, about 10 J/m$^2$ or greater, about 15 J/m$^2$ or greater, or about 20 J/m$^2$ or greater. The stored tensile energy may be calculated using the following equation: stored tensile energy (J/m$^2$)=[(1−ν)/E]∫(σ$^2$) (dt), where ν is Poisson's ratio, E is the Young's modulus (in MPa), σ is stress (in MPa) and the integration is computed across the thickness (in microns) of the tensile region only.

In various embodiments, the thermally strengthened and chemically strengthened glass-based article 500, have both the stress profile described herein and a low, as-formed surface roughness. The processes and methods disclosed herein can thermally strengthen and chemically strengthen glass-based articles (which may be in sheet form) without increasing the surface roughness of the as-formed surfaces. For example, incoming float glass air-side surfaces and incoming fusion formed glass surfaces were characterized by atomic force microscopy (AFM) before and after processing. $R_a$ surface roughness was less than 1 nm (0.6-0.7 nm) for incoming 1.1 mm soda-lime float glass, and the $R_a$ surface roughness was not increased by thermal strengthening according to the present processes. Similarly, an $R_a$ surface roughness of less than 0.3 nm (0.2-0.3) for 1.1 mm sheets of fusion-formed glass was maintained by thermal strengthening and/or chemical strengthening according to this disclosure. Accordingly, thermally strengthened and chemical strengthened glass-based articles according one or more embodiments have a surface roughness on at least a first surface in the range from 0.2 to 1.5 nm $R_a$ roughness, 0.2 to 0.7 nm, 0.2 to 0.4 nm or even such as 0.2 to 0.3 nm, over at least an area of 10×10 µm. Surface roughness may be measured over an area of 10×10 µm in exemplary embodiments, or in some embodiments, 15×15 µm.

In another embodiment, the thermally strengthened and chemically strengthened glass-based articles described herein have high flatness. In various embodiments, the strengthening system discussed herein utilizes controlled gas bearings to support the glass-based substrate during transporting and heating, and in some embodiments, can be used to assist in controlling and/or improving the flatness of the resulting glass-based article, resulting in a higher degree of flatness than previously obtainable, particularly for thin and/or highly strengthened glass-based articles. For example, glass-based articles in sheet form having a thickness of about 0.6 mm or greater can be strengthened with improved post-strengthening flatness. The flatness of various embodiments of the thermally strengthened and chemically strengthened glass-based article can comprise 100 µm or less total indicator run-out (TIR) along any 50 mm length along one of the first or second surfaces thereof, 300 µm TIR or less within a 50 mm length on one of the first or second surfaces, 200 µm TIR or less, 100 µm TIR or less, or 70 µm TIR or less within a 50 mm length on one of the first or second surfaces. In exemplary embodiments, flatness is measured along any 50 mm or less profile of the glass-based article. In contemplated embodiments, glass-based articles, which may be in sheet form, with thickness disclosed herein have flatness of 200 µm TIR or less within a 20 mm length on one of the first or second surfaces (e.g., flatness of 100 µm TIR or less, flatness 70 µm TIR or less, or flatness 50 µm TIR or less). Flatness, as used herein, was measured on a Tropel® FlatMaster® System available from Corning Incorporated (Corning, N.Y.).

According to contemplated embodiments, the thermally and chemically strengthened glass-based articles according to one or more embodiments have a high-degree of dimensional consistency such that the thickness t thereof along a 1 cm lengthwise stretch of the body 522 (in FIG. 6) does not change by more than 50 µm, such as, by not more than 10 µm, not more than 5 µm, not more than 2 µm. Such dimensional consistency may not be achievable for given thicknesses, areas, and/or magnitudes of negative tensile stress, as disclosed herein, by solid quenching due to practical considerations, such as cooling plate alignment and/or surface irregularities that may distort the dimensions.

According to contemplated embodiments, the thermally and chemically strengthened glass-based articles according to one or more embodiments have at least one surface (e.g., first and second surfaces 510, 520 in FIG. 6) that is flat such that a 1 cm lengthwise profile therealong stays within 50 µm of a straight line, such as within 20 µm, 10 µm, 5 µm, 2 µm; and/or a 1 cm widthwise profile therealong stays within 50 µm of a straight line, such as within 20 µm, 10 µm, 5 µm, 2 µm. Such high flatness may not be achievable for given thicknesses, areas, and/or magnitudes of negative tensile stress, as disclosed herein, by liquid quenching due to practical considerations, such as warping or bending of the glass strengthened in these processes due to convective currents and associated forces of the liquid. In various embodiments, the thermally and chemically strengthened glass-based articles according to one or more embodiments have high fictive temperatures. It will be understood that in various embodiments, high fictive temperatures relate to the high level of thermal strengthening, high central tensile stresses and/or high compressive surface stress of the resulting glass-based article 500. Surface fictive temperatures may be determined by any suitable method, including differential scanning calorimetry, Brillouin spectroscopy, or Raman spectroscopy.

According to an exemplary embodiment, the thermally and chemically strengthened glass-based articles according to one or more embodiments has a portion thereof, such as at or near the first and/or second surfaces 510, 520, that has a particularly high fictive temperature, such as at least 500° C., such as at least 600° C., or even at least 700° C. in some embodiments. In some embodiments, the glass-based article that exhibits such fictive temperatures may include a soda-lime glass. According to an exemplary embodiment, the thermally and chemically strengthened glass-based articles according to one or more embodiments has a portion thereof, such as at or near the first and/or second surfaces 510, 520, that has a particularly high fictive temperature relative to annealed glass of the same chemical composition. For example, in some embodiments, the thermally and chemically strengthened glass-based article exhibits a fictive temperature that is least 10° C. greater, at least 30° C. greater, at least 50° C. greater, at least 70° C. greater, or even at least 100° C. greater than the fictive temperature of an annealed glass of the same chemical composition (i.e., a glass that is and has not been thermally strengthened according to the process described herein). High fictive temperature may be achieved by a rapid transition from the hot to the cooling zones in the thermal strengthening system. Without being bound by theory, glass-based articles with high fictive temperature exhibit increased damage resistance.

In some methods of determining surface fictive temperatures, it may be necessary to break the glass-based article to relieve the "temper stresses" induced by the heat strengthening process in order to measure fictive temperature with reasonably accuracy. It is well known that characteristic structure bands measured by Raman spectroscopy shift in a controlled manner both with respect to the fictive temperature and with respect to applied stress in silicate glasses. This shift can be used to non-destructively measure the fictive temperature if the temper stress is known.

Figure 8:
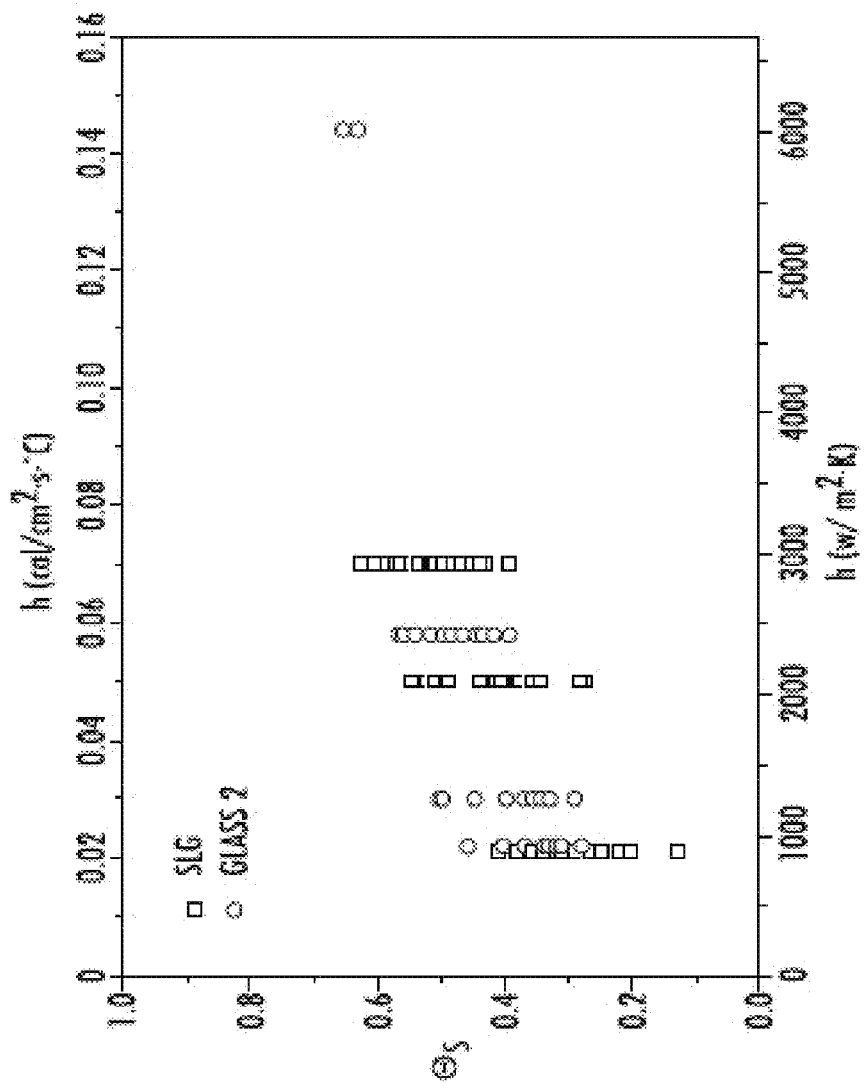
FIG. 8 is a plot of the non-dimensional surface fictive temperature parameter θs for fictive temperatures obtained by one or more embodiments.

Referring generally to FIG. 8, determination of fictive temperature for several exemplary glass articles is shown. Stress effects on the Raman spectrum of silica glass are reported in D. R. Tallant, T. A. Michalske, and W. L. Smith, "The effects of tensile stress on the Raman spectrum of silica glass," *J. Non-Cryst. Solids,* 106 380-383 (1988). Commercial glasses of 65 wt. % silica or more have substantially the same response. Although the reported stress response is for uniaxial stress, in the case of a unibiaxial stress state such as that which is observed in tempered glass, $\sigma_{xx}=\sigma_{yy}$, the peak can be expected to shift by twice that expected by a uniaxial stress. The peak near 1090 cm$^{-1}$ in soda-lime glass and in glass 2 corresponds to the 1050 cm$^{-1}$ peak observed in silica glass. The effects of stress on the 1050 cm$^{1}$ peak in silica, and on the corresponding peak in SLG and other silicate glasses can be expressed, as a function of stress $\sigma$ in MPa, by equation a) $\omega(\text{cm}^{-1})=1054.93-0.00232\cdot\sigma$.

A calibration curve was produced of Raman band positions as a function of the fictive temperature for SLG and another glass, glass 2. Glass samples were heat-treated for various times, 2-3 times longer than the structural relaxation times calculated by $\tau=10*\eta/G$, where $\eta$ is the viscosity, and G the shear modulus. After heat-treatment, the glasses were quenched in water to freeze the fictive temperature at the heat-treatment temperature. The glass surfaces were then measured by micro Raman at 50× magnification and a 1-2 µm spot size using a 442 nm laser, 10-30 s exposure time, and 100% power, over the range of 200-1800 cm$^{-1}$. The position of the peak at 1000-1200 cm$^{-1}$ was fit using computer software, Renishaw WiRE version 4.1, in this case. A good fit of the 1090 cm$^{-1}$ Raman peak measured in SLG on the air side as a function of fictive temperature Tf (in ° C.) is given by equation b) $\omega(\text{cm}^{-1})=1110.66-0.0282\cdot\text{Tf}$. For glass 2, a good fit is given by equation c) $\omega(\text{cm}^{-1})=1102.00-0.0231\cdot\text{Tf}$.

Using the relationships established in equations a), b), and c), it is possible to express the fictive temperature of the glass as a function of a measured Raman peak position with a correction factor due to surface CS. A CS of 100 MPa, $\sigma_c$, shifts the Raman band position equivalent to approximately a 15 to 20 degree Celsius reduction in the fictive temperature. The following equation is applicable to SLG:

$$T_f(°C.) = \left[\frac{\omega(\text{cm}^{-1}) - 1110.66(\text{cm}^{-1})}{-0.0282\left(\frac{\text{cm}^{-1}}{°C.}\right)}\right] + 2[0.082 * \sigma_c(MPa)] \quad (1)$$

The equation applicable to glass 2 is:

$$T_f(°C.) = \left[\frac{\omega(\text{cm}^{-1}) - 1102(\text{cm}^{-1})}{-0.0231\left(\frac{\text{cm}^{-1}}{°C.}\right)}\right] + 2[0.0996 * \sigma_c(MPa)] \quad (2)$$

In these equations, $\omega$ is the measured peak wavenumber for the peak near 1090 cm$^{-1}$, $\sigma_c$ is the surface CS measured by any suitable technique, yielding stress-corrected measurement of fictive temperature in ° C. As a demonstration of increased damage resistance related to the determined fictive temperature, four glass sheet samples were prepared, two 6 mm soda-lime glass (SLG) sheets by conventional tempering methods to approximately 70 and 110 MPa surface CS (CS), and two 1.1 mm SLG sheets by the methods and systems disclosed herein to about the same levels of CS. Two additional sheets, one of each thickness were used as controls. The surfaces of each test sheet were subjected to standard Vicker's indentation. Various levels of force were applied, for 15 seconds each, and after a 24 hour wait, indentations were each examined. As shown in Table 1, the 50% cracking threshold (defined as the load at which the average number of cracks appearing is two out of the four points of the indenter at which cracks tend to initiate) was determined for each sample.

Table 1 shows that the Vicker's crack initiation threshold for SLG processed by conventional convective gas tempering (as reflected in the 6 mm sheet) is essentially the same as that for annealed or as-delivered SLG sheets, rising from between zero and one newton (N) to about one to less than two newtons. This correlates with the relatively modest rise in surface fictive temperature ($T_{fs}$ or $Tf_{surface}$) of ~25 to 35° C. relative to glass transition temperature ($T_g$=550° C. for SLG, defined as $\eta=10^{12-13.3}$ Poise) that was provided by conventional tempering. In contrast, by tempering using the present methods and systems, the Vicker's crack initiation threshold improved to greater than 10 N, a 10-fold increase over the Vicker's damage resistance imparted by conventional tempering. In the embodied glasses, the $T_{fs}$ minus $T_g$ was at least 50° C., or at least 75° C., or at least 90° C., or in the range of from approximately 75° C. to 100° C. Even in embodiments comprising lower levels of heat strengthening, the embodied glasses can still provide increased resistance, at levels such as 5 N, for instance. In certain contemplated embodiments, the 50% cracking threshold after a 15 second Vicker's crack initiation test may be equal to or greater than 5 N, 10 N, 20 N, or 30 N.

TABLE 1

| Sample | Thickness (mm) | CS (MPa) | Surface $T_f$ (° C.) | Cracking Threshold (N) |
|---|---|---|---|---|
| Control | 1.1 | Annealed | ~$T_g$ (550) | 0-1 |
| Control | 6 | Annealed | ~$T_g$ (550) | 0-1 |
| Thin low strength | 1.1 | −72 | 626 | 10-20 |

TABLE 1-continued

| Sample | Thickness (mm) | CS (MPa) | Surface $T_f$ (° C.) | Cracking Threshold (N) |
|---|---|---|---|---|
| Thick low strength | 6 | −66 | 575 | 1-2 |
| Thin medium strength | 1.1 | −106 | 642 | 10-20 |
| Thick medium strength | 6 | −114 | 586 | 1-2 |

Figure 10:
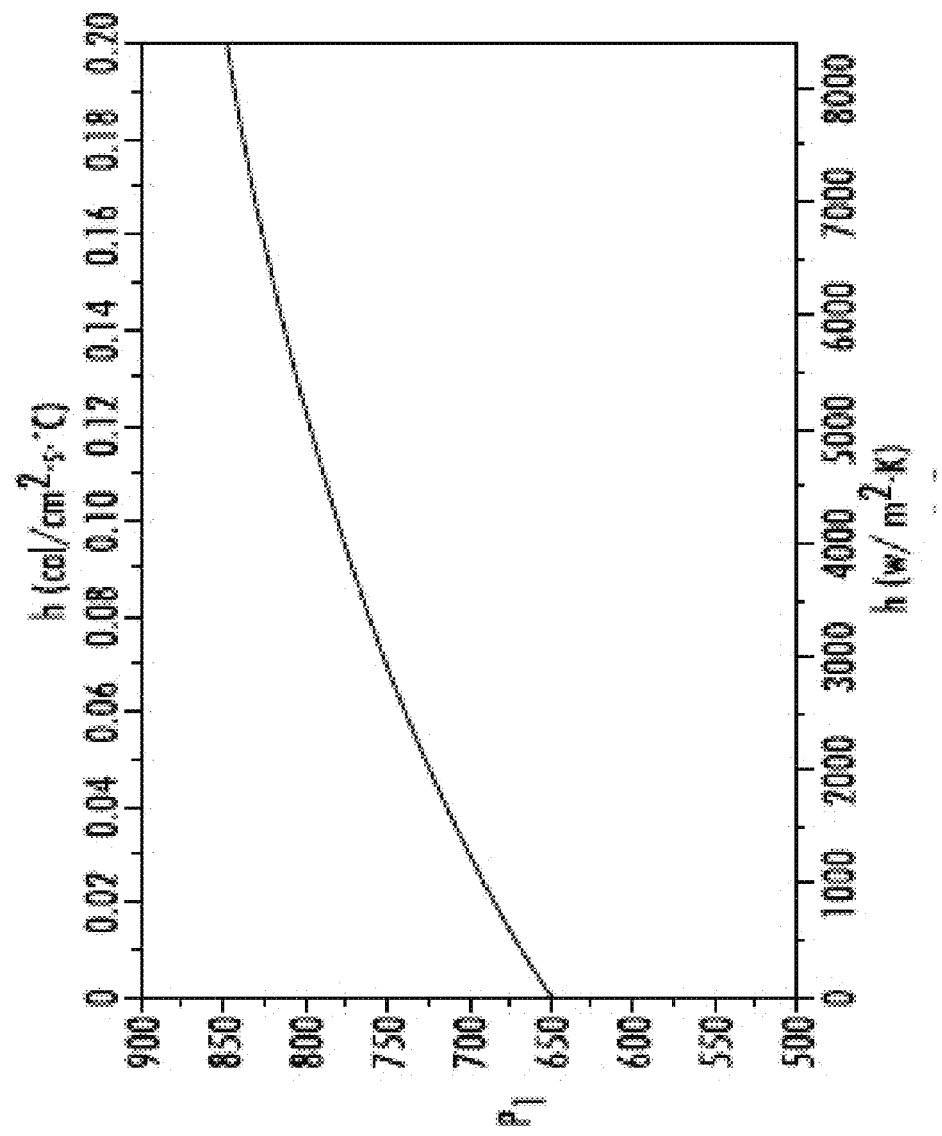
FIG. 10 is a graph of parameter $P_1$ as a function of heat transfer coefficient h.

The following non-dimensional fictive temperature parameter θ can be used to compare the relative performance of a thermal strengthening process in terms of the fictive temperature produced. Given in terms of surface fictive temperature θs in this case:

$$\theta s = (T_{fs} - T_{anneal})/(T_{soft} - T_{anneal}) \quad (3)$$

where $T_{fs}$ is the surface fictive temperature, $T_{anneal}$ (the temperature of the glass at a viscosity of η=$10^{13.2}$ Poise) is the annealing point and $T_{soft}$ (the temperature of the glass at a viscosity of η=$10^{7.6}$ Poise) is the softening point of the glass of the sheet. FIG. 10 is a plot of θs for measured surface fictive temperatures as a function of heat transfer rate, h, applied during thermal strengthening for two different glasses. As shown in FIG. 10, the results for the two different glasses overlie each other fairly closely. This means that parameter θ provides a means to compare the fictive temperatures of different glasses compared directly, in relation to the heat transfer rate h required to produce them. The vertical range of results at each h corresponds to variation in the value of $T_0$, the initial temperature at the start of quenching. In embodiments, parameter θs comprises from about (e.g., plus or minus 10%) 0.2 to about 0.9, or 0.21 to 0.09, or 0.22 to 0.09, or 0.23 to 0.09, or 0.24 to 0.09, or 0.25 to 0.09, or 0.30 to 0.09, or 0.40 to 0.09, or 0.5 to 0.9, or 0.51 to 0.9, or 0.52 to 0.9, or 0.53 to 0.9, or 0.54 to 0.9, or 0.54 to 0.9, or 0.55 to 0.9, or 0.6 to 0.9, or even 0.65 to 0.9.

At higher thermal transfer rates (such as at about 800 W/m²K and above, for example), however, the high temperature or "liquidus" CTE of the glass begins to affect tempering performance. Therefore, under such conditions, the temperability parameter Ψ, based on an approximation of integration over the changing CTE values across the viscosity curve, is found to be useful:

$$\Psi = E \cdot [T_{strain} \cdot \alpha_{CTE}^s + \alpha_{CTE}^L \cdot (T_{soft} - T_{strain})] \quad (5)$$

where $\alpha_{CTE}^S$ is the low temperature linear CTE (equivalent to the average linear expansion coefficient from 0-300° C. for the glass), expressed in 1/C (° C.$^{-1}$), $\alpha_{CTE}^L$ is the high temperature linear CTE (equivalent to the high-temperature plateau value which is observed to occur somewhere between the glass transition and softening point), expressed in 1/° C. (° C.$^{-1}$), E is the elastic modulus of the glass, expressed in GPa (not MPa) (which allows values of the (non-dimensional) parameter Ψ to range generally between 0 and 1), $T_{strain}$ is the strain point temperature of the glass, (the temperature of the glass at a viscosity of η=$10^{14.7}$ Poise) expressed in ° C., and $T_{soft}$ is the softening point of the glass (the temperature of the glass at a viscosity of η=$10^{7.6}$ Poise), expressed in ° C.

The thermal strengthening process and resulting surface CS values were modeled for glasses having varying properties to determine the tempering parameter, Ψ. The glasses were modeled at the same starting viscosity of $10^{8.2}$ Poise and at varying heat transfer coefficients. The properties of the various glasses are shown in Table 2, together with the temperature for each glass at $10^{8.2}$ Poise and the calculated value of the temperability parameter Ψ for each.

TABLE 2

| Glass | Modulus | CTE low | CTE high | $10^{8.2}$ Poise ° C. | Softening Point ° C. | Strain Point ° C. | Ψ |
|---|---|---|---|---|---|---|---|
| SLG | 72 | 8.8 | 27.61 | 705 | 728 | 507 | 0.76 |
| 2 | 73.3 | 8.53 | 20.49 | 813 | 837 | 553 | 0.77 |
| 3 | 65.5 | 8.26 | 26 | 821 | 862 | 549 | 0.83 |
| 4 | 65 | 8.69 | 20.2 | 864 | 912 | 608 | 0.74 |
| 5 | 63.9 | 10.61 | 22 | 849 | 884 | 557 | 0.84 |
| 6 | 58.26 | 3.5 | 20.2 | 842 | 876 | 557 | 0.49 |
| 7 | 73.6 | 3.6 | 13.3 | 929 | 963 | 708 | 0.44 |
| 8 | 81.1 | 3.86 | 12.13 | 968 | 995 | 749 | 0.48 |

Figure 9:
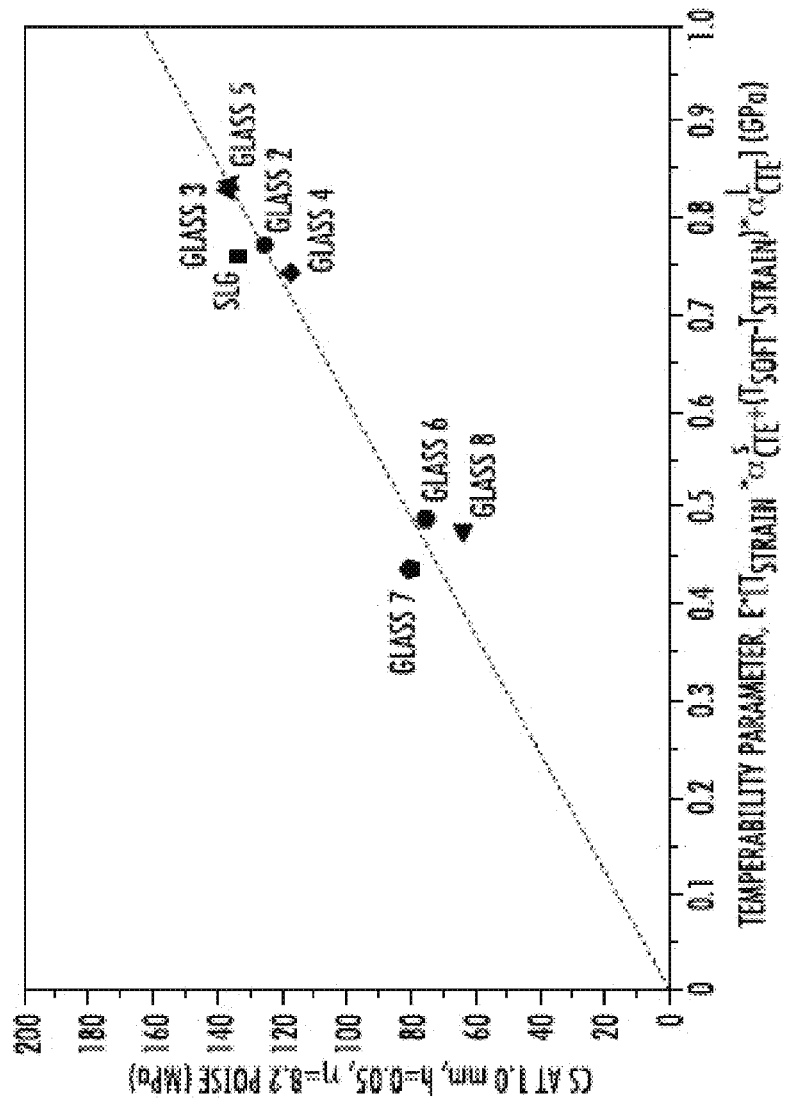
FIG. 9 is a plot of surface CS values calculated by simulation for differing glass compositions, plotted against a proposed temperability parameter Ψ for the various compositions shown.

The results in Table 2 show that Ψ is proportional to the thermal strengthening performance of the glass. This correlation is further shown in FIG. 9, which provides an embodied example for a high heat transfer rate (a heat transfer coefficient of 2093 W/m²K (0.05 cal/s·cm²·° C.)) and a glass sheet thickness of only 1 mm. As seen in the figure, the variation in the seven differing glasses' resulting CS correlates well with the variation in the proposed temperability parameter Ψ.

In another aspect, it has been found that for any glass, at any given value of the heat transfer coefficient, h (expressed in cal/cm²-s-° C.), the curves of surface CS ($\sigma_{CS}$, in MPa) vs. thickness (t, in mm) can be fit (over the range of t from 0 to 6 mm) by the hyperbola, where $P_1$ and $P_2$ are functions of h such that:

$$\sigma_{CS}(\text{Glass}, h, t) = C(h, t) * \Psi(\text{Glass}) = \frac{P_1(h) * t}{(P_2(h) + t)} * \Psi(\text{Glass}) \quad (6)$$

or with the expression for Ψ substituted in, the curve of CS $\sigma_{CS}$(Glass, h, t) is given by:

$$\frac{P_1(h) * t}{(P_2(h) + t)} \cdot E \cdot [T_{strain} \cdot \alpha_{CTE}^E + \alpha_{CTE}^L \cdot (T_{soft} - T_{strain})] \quad (7)$$

where the constants $P_1$, $P_2$, in either (6) or (7) above, are each continuous functions of the heat transfer value, h, given by:

$$P_1 = 910.2 - 259.2 \cdot \exp\left(-\frac{h}{0.143}\right) \quad (8)$$

and $$P_2 = 2.53 \left| \frac{23.65}{\left(1 + \left(\frac{h}{0.00738}\right)^{1.58}\right)} \right| \quad (9)$$

Figure 11:
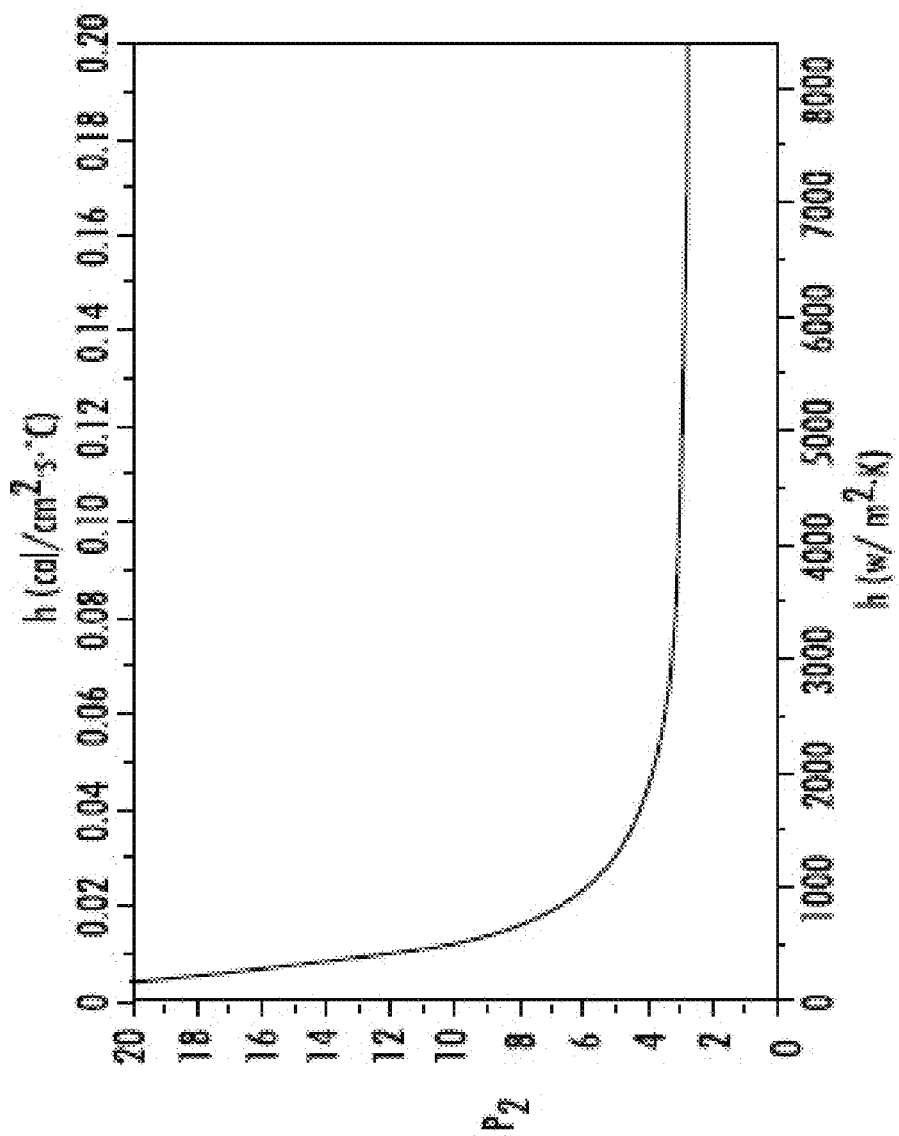
FIG. 11 is a graph of parameter $P_2$ as a function of heat transfer coefficient h.

The constants $P_1$, $P_2$, are graphed as functions of h in FIGS. 10 and 11, respectively. Accordingly, by using a value of $P_1$, for a given h and the corresponding $P_2$, for that same h in expression (6) or (7) above, a curve is specified corresponding to the surface CS (CS) obtainable at that h, as a function of thickness t.

In some embodiments, a similar expression may be used to predict the CT of a thermally strengthened glass sheet, particularly at a thickness of 6 mm and less, and the thermal transfer coefficient, such as 800 W/m²K and up, by simply dividing the CS predicted under the same conductions by 2. Thus, expected CT may be given by $$\frac{P_{1CT}(h_{CT}) * t}{(P_{2CT}(h_{CT}) + t)} \cdot E \cdot [T_{strain} \cdot \alpha_{CTE}^s + \alpha_{CTE}^l \cdot (T_{soft} - T_{strain})] \quad (10)$$

Where $P_{1CT}$ and $P_{2CT}$ are given as follows:

$$P_{1CT} = 910.2 - 259.2 \cdot \exp\left(-\frac{h_{CT}}{0.143}\right) \quad (11)$$

and $$P_{2CT} = 2.53 + \frac{23.65}{\left(1 + \left(\frac{h_{CT}}{0.00738}\right)^{1.58}\right)} \quad (12)$$

In some embodiments, h and $h_{CT}$, may have the same value for a given physical instance of thermal strengthening. However, in some embodiments, they may vary, and providing separate variables and allowing variation between them allows for capturing, within descriptive performance curves, instances in which the typical ratio of 2:1 CS/CT does not hold.

One or more embodiments of the currently disclosed processes and systems have produced thermally strengthened SLG sheets at all of the heat transfer rate values (h and $h_{CT}$) shown in Table 3.

TABLE 3 h and $h_{CT}$ values according to exemplary embodiments

| cal/s · cm² · ° C. | W/m²K |
|---|---|
| 0.010 | 418.68 |
| 0.013 | 544.284 |
| 0.018 | 753.624 |
| 0.019 | 795.492 |
| 0.020 | 837.36 |
| 0.021 | 879.228 |
| 0.022 | 921.096 |
| 0.023 | 962.964 |
| 0.027 | 1130.436 |
| 0.028 | 1172.304 |
| 0.029 | 1214.172 |
| 0.030 | 1256.04 |
| 0.031 | 1297.908 |
| 0.033 | 1381.644 |
| 0.034 | 1423.512 |
| 0.038 | 1590.984 |
| 0.040 | 1674.72 |
| 0.041 | 1716.588 |
| 0.042 | 1758.456 |
| 0.045 | 1884.06 |
| 0.047 | 1967.796 |
| 0.048 | 2009.664 |
| 0.049 | 2051.532 |
| 0.050 | 2093.4 |
| 0.051 | 2135.268 |
| 0.052 | 2177.136 |
| 0.053 | 2219.004 |
| 0.054 | 2260.872 |
| 0.055 | 2302.74 |
| 0.060 | 2512.08 |
| 0.061 | 2553.948 |
| 0.062 | 2595.816 |
| 0.063 | 2637.684 |
| 0.065 | 2721.42 |
| 0.067 | 2805.156 |
| 0.069 | 2888.892 |
| 0.070 | 2930.76 |
| 0.071 | 2972.628 |
| 0.078 | 3265.704 |
| 0.080 | 3349.44 |
| 0.081 | 3391.308 |
| 0.082 | 3433.176 |

TABLE 3-continued h and $h_{CT}$ values according to exemplary embodiments

| cal/s · cm² · ° C. | W/m²K |
|---|---|
| 0.095 | 3977.46 |
| 0.096 | 4019.328 |
| 0.102 | 4270.536 |
| 0.104 | 4354.272 |
| 0.105 | 4396.14 |
| 0.127 | 5317.236 |
| 0.144 | 6028.992 |
| 0.148 | 6196.464 |
| 0.149 | 6238.332 |
| 0.184 | 7703.712 |

In some embodiments, the heat transfer value rates (h and $h_{CT}$) may be from about 0.024 to about 0.15, about 0.026 to about 0.10, or about 0.026 to about 0.075 cal/s·cm²·° C.

Figure 12:
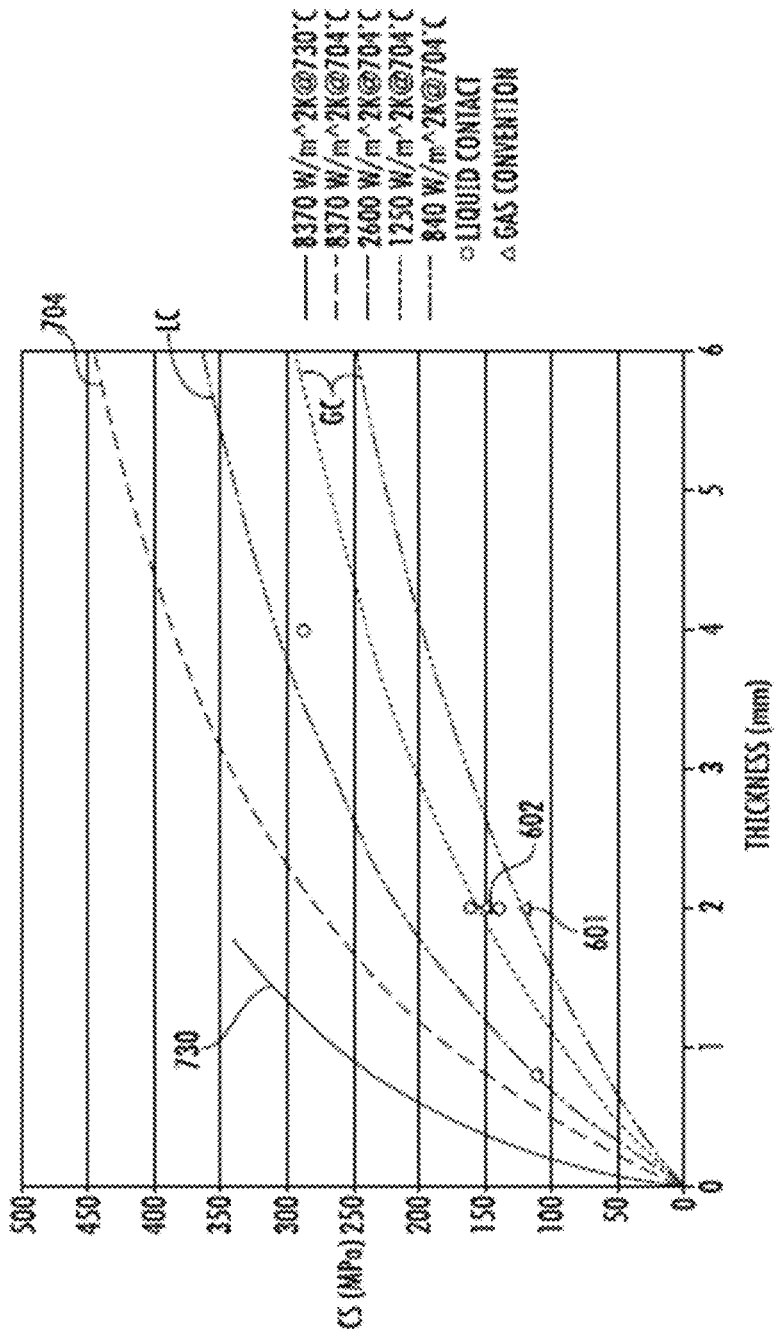
FIG. 12 is a graph of surface CS values of a glass-based article as a function of thickness t, according to one or more embodiments of the present disclosure.

FIG. 12 shows the newly opened performance space in MPa of surface compression of a glass sheet as a function of thickness t (in mm), by a graph of C(h,t)·Ψ(SLG) for selected values of h according to equations 6-9 above, with Ψ(SLG) corresponding to the value of Ψ for SLG in Table 2. The traces labeled GC represent the estimated range of maximum stresses versus thinness of SLG sheets achievable by gas convective tempering, from 0.02 cal/s·cm²·° C. (or 840 W/m²K) to 0.03 cal/s·cm²·° C. or 1250 W/m²K, assuming that these levels of heat transfer coefficient can be employed in that process at a heated glass viscosity of $10^{8.2}$ Poises or about 704° C., a temperature above the capability of convective gas processes.

Examples of highest reported sheet CS values based on gas convective tempering processes are shown by the triangle markers labeled Gas in the legend. The value 601 represents advertised product performance capability of commercial equipment, while the value 602 is based on an oral report at a glass processing conference. The trace labeled LC represents the curve of maximum stresses versus thinness of SLG sheets estimated to be achievable by liquid contact tempering, given by a heat transfer rate h of 0.0625 cal/s·cm²·° C. (or about 2600 W/m²K), also assuming processing at an initial heated glass viscosity of $10^{8.2}$ Poises or about 704° C. Examples of highest reported sheet CS values based on liquid contact tempering processes are shown by the circle markers labeled Liquid in the legend. The higher of the two values at 2 mm thickness is based on a report of tempering of a borosilicate glass sheet, and the stress achieved has been scaled for the figure by $(\Psi_{SLG})/(\Psi_{borosilicate})$ for scaled direct comparison.

The trace labeled 704 represents stresses achievable by one or more embodiments of the presently disclosed methods and systems at a heat transfer rate of 0.20 cal/s·cm²·° C. (or about 8370 W/m²K) and an initial temperature, just before quenching, of 704° C. The level of stress on the glass sheet thus achievable represents almost the same scope of improvement over liquid tempering strength levels as liquid tempering represents over state of the art gas convective tempering. But the trace labeled 704 is not an upper limit— embodiments have been shown to be viable above this value due to the good control of form and flatness achievable in a small-gap gas bearing thermal strengthening at even higher temperatures (at lower viscosities of the glass). The trace labeled 730 shows some of the additional strengthening performance achieved by a heat transfer rate of 0.20 cal/s·cm²·° C. (or about 8370 W/m²K) at a starting temperature for a SLG sheet of 730° C., very near or above the softening point of the glass. Significant improvements in CS and thus in glass sheet strength are thus achieved particularly by the combination of high heat transfer rate and the use of high initial temperatures enabled by the good handling and control of sheet flatness and form in a tight gas bearing—and the improvements are particularly striking at thickness 2 mm and below.

Figure 13:
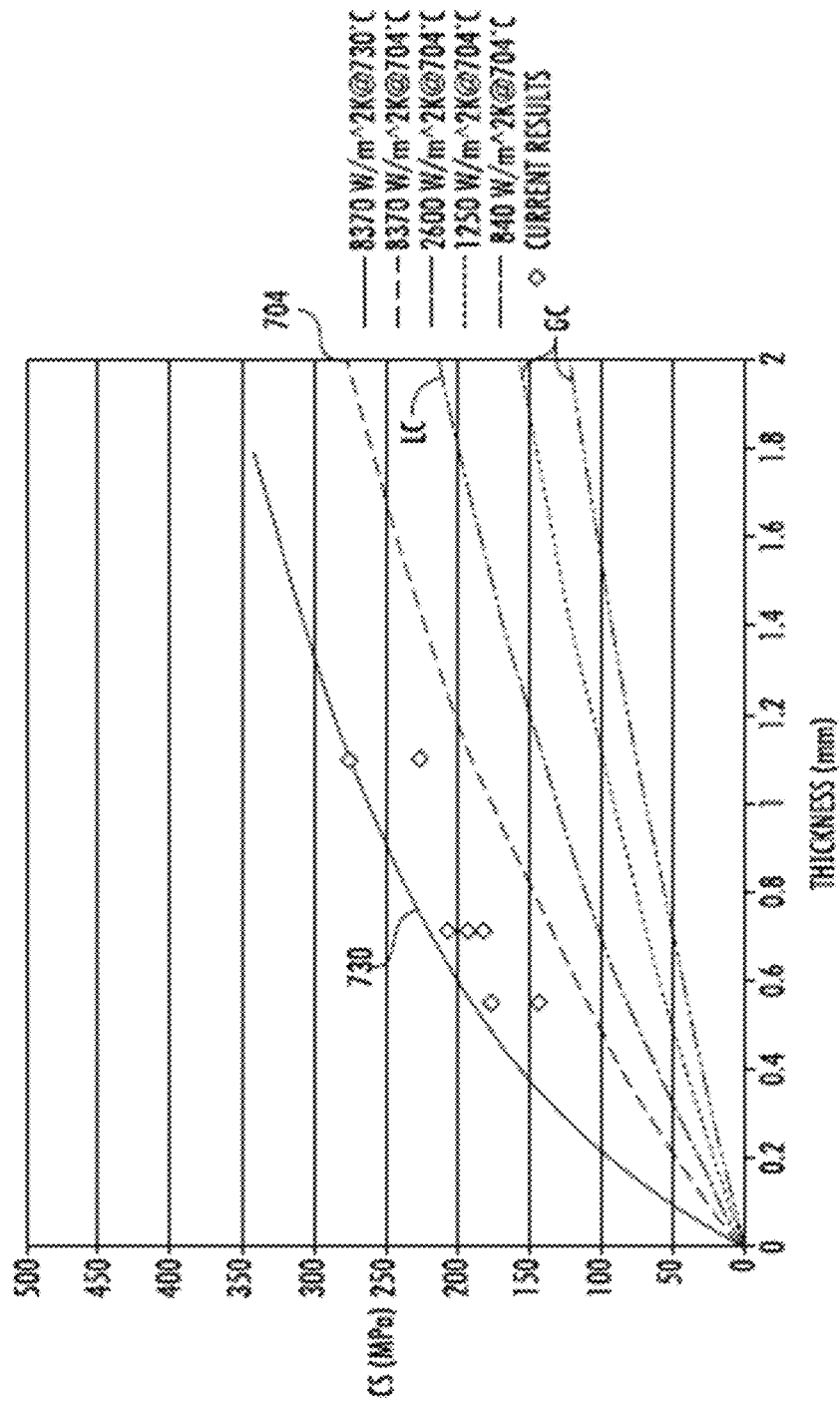
FIG. 13 is a graph showing CS as a function of thickness plotted for selected exemplary embodiments of glass-based article, after thermal strengthening.

FIG. 13 shows the traces of FIG. 12 explained above, at 2 mm and below, but with CS as a function of thickness plotted for selected examples of thermally strengthened glass-based articles by one or more embodiments of the present disclosure, showing the extreme combination of thermal strengthening levels and thinness enabled by the present disclosure.

In one or more embodiments, the thermally strengthened and chemically strengthened glass-based article includes a low coefficient of thermal expansion (CTE) glass. As discussed above (see e.g., equations 7 and 10), thermal strengthening effects are significantly dependent upon the CTE of the glass of which the glass sheet is comprised. However, thermal strengthening of low CTE glasses may provide strengthened glass compositions having advantageous properties, such as increased chemical resistance, or better compatibility with electronic devices due to low alkali content. Glass having CTEs of 65, 60, 55, 50, 45, 40, and even $35 \times 10^{-6 \circ}$ C.$^{-1}$ and below are capable of safety-glass like break patterns ("dicing") at thicknesses of less than 4 mm, less than 3.5 mm, less than 3 mm, and even at 2 mm or less. Glasses having CTE values of $40 \times 10^{-6 \circ}$ C.$^{-1}$ and below can be strengthened using the processes described herein.

In one or more embodiments, the thermally strengthened and chemically strengthened glass-based article includes a glass composition having moderate to high CTE values. Example glasses include alkali aluminosilicates, boroaluminosilicates, and soda-lime glasses. In some embodiments, the glasses having CTEs greater than 40, greater than 50, greater than 60, greater than 70, greater than 80, or greater than $90 \times 10^{-7}$/° C. maybe thermally and chemically strengthened as described herein. Some such CTEs may be particularly low for thermal tempering as disclosed herein, where the degree of negative tensile stress is no more than 50 MPa and/or at least 10 MPa.

In one or more embodiments, the thermally strengthened and chemically strengthened glass-based article exhibits superior performance as measured by a Knoop scratch threshold test and/or a Vicker's crack initiation threshold test. For example, in one or more embodiments, the thermally strengthened and chemically strengthened glass-based article exhibits a Knoop scratch threshold (as measured by the Knoop scratch threshold test) of about 8 N or greater (e.g., 9 N or greater, 10 N or greater, 11 N or greater, 12 N or greater, 13 N or greater or 14 N or greater). In some instances the upper limit of the Knoop scratch threshold may be about 20 N. In one or more embodiments, the thermally strengthened and chemically strengthened glass-based article exhibits a Vicker's crack initiation threshold (as measured by the Vicker's crack initiation threshold test) of about 120 N or greater. For example, the Vicker's crack initiation threshold may be about 125 N or greater, 130 N or greater, 135 N or greater, 140 N or greater, 145 N or greater, 150 N or greater, 155 N or greater or about 160 N or greater. The upper limit of the Vicker's crack initiation threshold may be about 180 N.

In some applications and embodiments, the thermally strengthened and chemically strengthened glass-based articles may have a composition configured for chemical durability. In some such embodiments, the composition comprises at least 70% silicon dioxide by weight, and/or at least 10% sodium oxide by weight, and/or at least 7% calcium oxide by weight. Conventional articles of such compositions may be difficult to chemically temper to a deep depth, and/or may be difficult, if not impossible, to thermally temper by conventional processes to a sufficient magnitude of negative surface tensile stress for thin thicknesses, such as due to fragility and forces of conventional processes.

In some contemplated embodiments, glass-based substrates strengthened via the processes and systems discussed herein (such as glass sheet 500) may include an amorphous substrate, a crystalline substrate or a combination thereof, such as a glass-ceramic substrate. Glass-based substrates strengthened via the processes and systems discussed herein may include an alkali aluminosilicate glass, alkali containing borosilicate glass, alkali aluminophosphosilicate glass or alkali aluminoborosilicate glass. In one or more embodiments, glass-based substrates may include a glass having a composition, in mole percent (mol %), including: $SiO_2$ in the range from about (e.g., plus or minus 1%) 40 to about 80 mol %, $Al_2O_3$ in the range from about 10 to about 30 mol %, $B_2O_3$ in the range from about 0 to about 10 mol %, $R_2O$ in the range from about 0 to about 20 mol %, and/or RO in the range from about 0 to about 15 mol %. In some contemplated embodiments, the composition may include either one or both of $ZrO_2$ in the range from about 0 to about 5 mol % and $P_2O_5$ in the range from about 0 to about 15 mol %. In some contemplated embodiments, $TiO_2$ can be present from about 0 to about 2 mol %.

In one or more embodiments, the glass-based article or substrate (prior to being chemically strengthened as described herein) may include a glass composition, in mole percent (mole %), including:
$SiO_2$ in the range from about 40 to about 80, $Al_2O_3$ in the range from about 10 to about 30, $B_2O_3$ in the range from about 0 to about 10, $R_2O$ in the range from about 0 to about 20, and RO in the range from about 0 to about 15. As used herein, $R_2O$ refers to alkali metal oxides such as $Li_2O$, $Na_2O$, $K_2O$, $Rb_2O$, and $Cs_2O$. As used herein RO refers to MgO, CaO, SrO, BaO, ZnO and the like. In some instances, the composition may include either one or both of $ZrO_2$ in the range from about 0 mol % to about 5 mol % and $P_2O_5$ in the range from about 0 to about 15 mol %. TiO2 can be present from about 0 mol % to about 2 mol %.

In some embodiments, the glass composition may include $SiO_2$ in an amount, in mol %, in the range from about 45 to about 80, from about 45 to about 75, from about 45 to about 70, from about 45 to about 65, from about 45 to about 60, from about 45 to about 65, from about 45 to about 65, from about 50 to about 70, from about 55 to about 70, from about 60 to about 70, from about 70 to about 75, from about 70 to about 72, from about 50 to about 65, or from about 60 to about 65.

In some embodiments, the glass composition may include $Al_2O_3$ in an amount, in mol %, in the range from about 5 to about 28, from about 5 to about 26, from about 5 to about 25, from about 5 to about 24, from about 5 to about 22, from about 5 to about 20, from about 6 to about 30, from about 8 to about 30, from about 10 to about 30, from about 12 to about 30, from about 14 to about 30, 15 to about 30, or from about 12 to about 18.

In one or more embodiments, the glass composition may include $B_2O_3$ in an amount, in mol %, in the range from about 0 to about 8, from about 0 to about 6, from about 0 to about 4, from about 0.1 to about 8, from about 0.1 to about 6, from about 0.1 to about 4, from about 1 to about 10, from about 2 to about 10, from about 4 to about 10, from about 2 to about 8, from about 0.1 to about 5, or from about 1 to about 3. In some instances, the glass composition may be substantially free of $B_2O_3$. As used herein, the phrase "substantially free" with respect to the components of the glass composition means that the component is not actively or intentionally added to the glass compositions during initial batching or subsequent ion exchange, but may be present as an impurity. For example, a glass may be describe as being substantially free of a component, when the component is present in an amount of less than about 0.1001 mol %. Without being bound by theory, the addition of boron increases the high temperature coefficient of thermal expansion of the glass composition, which can result in a thermally and chemically strengthened glass-based article that exhibits a greater CT value, after thermal strengthening. In some embodiments, this higher CT value is substantially maintained or even increased after chemical strengthening.

In some embodiments, the glass composition may include one or more alkali earth metal oxides, such as MgO, CaO and ZnO. In some embodiments, the total amount of the one or more alkali earth metal oxides may be a non-zero amount up to about 15 mol %. In one or more specific embodiments, the total amount of any of the alkali earth metal oxides may be a non-zero amount up to about 14 mol %, up to about 12 mol %, up to about 10 mol %, up to about 8 mol %, up to about 6 mol %, up to about 4 mol %, up to about 2 mol %, or up about 1.5 mol %. In some embodiments, the total amount, in mol %, of the one or more alkali earth metal oxides may be in the range from about 0.01 to 10, from about 0.01 to 8, from about 0.01 to 6, from about 0.01 to 5, from about 0.05 to 10, from about 0.05 to 2, or from about 0.05 to 1. The amount of MgO may be in the range from about 0 mol % to about 5 mol % (e.g., from about 0.001 to about 1, from about 0.01 to about 2, or from about 2 mol % to about 4 mol %). The amount of ZnO may be in the range from about 0 to about 2 mol % (e.g., from about 1 mol % to about 2 mol %). The amount of CaO may be from about 0 mol % to about 2 mol %. In one or more embodiments, the glass composition may include MgO and may be substantially free of CaO and ZnO. In one variant, the glass composition may include any one of CaO or ZnO and may be substantially free of the others of MgO, CaO and ZnO. In one or more specific embodiments, the glass composition may include only two of the alkali earth metal oxides of MgO, CaO and ZnO and may be substantially free of the third of the earth metal oxides.

The total amount, in mol %, of alkali metal oxides $R_2O$ in the glass composition may be in the range from about 5 to about 20, from about 5 to about 18, from about 5 to about 16, from about 5 to about 15, from about 5 to about 14, from about 5 to about 12, from about 5 to about 10, from about 5 to about 8, from about 5 to about 20, from about 6 to about 20, from about 7 to about 20, from about 8 to about 20, from about 9 to about 20, from about 10 to about 20, from about 11 to about 20, from about 12 to about 18, or from about 14 to about 18.

In one or more embodiments, the glass composition includes $Na_2O$ in an amount in the range from about 0 mol % to about 18 mol %, from about 0 mol % to about 16 mol % or from about 0 mol % to about 14 mol %, from about 0 mol % to about 12 mol %, from about 2 mol % to about 18 mol %, from about 4 mol % to about 18 mol %, from about 6 mol % to about 18 mol %, from about 8 mol % to about 18 mol %, from about 8 mol % to about 14 mol %, from about 8 mol % to about 12 mol %, or from about 10 mol % to about 12 mol %. In some embodiments, the composition may include at least about 4 mol % $Na_2O$. In some embodiments, the composition may include less than about 4 mol % $Na_2O$.

In some embodiments, the amount of $Li_2O$ and $Na_2O$ is controlled to a specific amount or ratio to balance formability and ion exchangeability. For example, as the amount of $Li_2O$ increases, the liquidus viscosity may be reduced, thus preventing some forming methods from being used; however, such glass compositions are ion exchanged to deeper DOC levels, as described herein. The amount of $Na_2O$ can modify liquidus viscosity but can inhibit ion exchange to deeper DOC levels.

In one or more embodiments, the glass composition may include $K_2O$ in an amount less than about 5 mol %, less than about 4 mol %, less than about 3 mol %, less than about 2 mol %, or less than about 1 mol %. In one or more alternative embodiments, the glass composition may be substantially free, as defined herein, of $K_2O$.

In one or more embodiments, the glass composition may include $Li_2O$ in an amount about 0 mol % to about 18 mol %, from about 0 mol % to about 15 mol % or from about 0 mol % to about 10 mol %, from about 0 mol % to about 8 mol %, from about 0 mol % to about 6 mol %, from about 0 mol % to about 4 mol % or from about 0 mol % to about 2 mol %. In some embodiments, the glass composition may include $Li_2O$ in an amount about 2 mol % to about 10 mol %, from about 4 mol % to about 10 mol %, from about 6 mol % to about 10 mol, or from about 5 mol % to about 8 mol %. In one or more alternative embodiments, the glass composition may be substantially free, as defined herein, of $Li_2O$.

In one or more embodiments, the glass composition may include $Fe_2O_3$. In such embodiments, $Fe_2O_3$ may be present in an amount less than about 1 mol %, less than about 0.9 mol %, less than about 0.8 mol %, less than about 0.7 mol %, less than about 0.6 mol %, less than about 0.5 mol %, less than about 0.4 mol %, less than about 0.3 mol %, less than about 0.2 mol %, less than about 0.1 mol % and all ranges and sub-ranges therebetween. In one or more alternative embodiments, the glass composition may be substantially free, as defined herein, of $Fe_2O_3$.

In one or more embodiments, the glass composition may include $ZrO_2$. In such embodiments, $ZrO_2$ may be present in an amount less than about 1 mol %, less than about 0.9 mol %, less than about 0.8 mol %, less than about 0.7 mol %, less than about 0.6 mol %, less than about 0.5 mol %, less than about 0.4 mol %, less than about 0.3 mol %, less than about 0.2 mol %, less than about 0.1 mol % and all ranges and sub-ranges therebetween. In one or more alternative embodiments, the glass composition may be substantially free, as defined herein, of $ZrO_2$.

In one or more embodiments, the glass composition may include $P_2O_5$ in a range from about 0 mol % to about 10 mol %, from about 0 mol % to about 8 mol %, from about 0 mol % to about 6 mol %, from about 0 mol % to about 4 mol %, from about 0.1 mol % to about 10 mol %, from about 0.1 mol % to about 8 mol %, from about 2 mol % to about 8 mol %, from about 2 mol % to about 6 mol % or from about 2 mol % to about 4 mol %. In some instances, the glass composition may be substantially free of $P_2O_5$.

In one or more embodiments, the glass composition may include $TiO_2$. In such embodiments, $TiO_2$ may be present in an amount less than about 6 mol %, less than about 4 mol %, less than about 2 mol %, or less than about 1 mol %. In one or more alternative embodiments, the glass composition may be substantially free, as defined herein, of $TiO_2$. In some embodiments, $TiO_2$ is present in an amount in the range from about 0.1 mol % to about 6 mol %, or from about 0.1 mol % to about 4 mol %.

In some embodiments, glass composition may be substantially free of nucleating agents. Examples of typical nucleating agents are $TiO_2$, $ZrO_2$ and the like. Nucleating agents may be described in terms of function in that nucleating agents are constituents in the glass can initiate the formation of crystallites in the glass.

In some contemplated embodiments, compositions used for the glass-based substrates or articles discussed herein may be batched with 0-2 mol % of at least one fining agent selected from any one or more of $Na_2SO_4$, NaCl, NaF, NaBr, $K_2SO_4$, KCl, KF, KBr, $As_2O_3$, $Sb_2O_3$, and $SnO_2$. The glass composition according to one or more embodiments may further include $SnO_2$ in the range from about 0 to about 2 mol %, from about 0 to about 1 mol %, from about 0.1 to about 2 mol %, from about 0.1 to about 1 mol %, or from about 1 to about 2 mol %. Glass compositions disclosed herein for the glass-based substrates or articles may be substantially free of $As_2O_3$ and/or $Sb_2O_3$, in some embodiments.

In one or more embodiments, the composition of the glass-based substrates or articles described herein may specifically include from about 62 mol % to about 75 mol % $SiO_2$; from about 10.5 mol % to about 17 mol % $Al_2O_3$; from about 5 mol % to about 13 mol % $Li_2O$; from about 0 mol % to about 4 mol % ZnO; from about 0 mol % to about 8 mol % MgO; from about 2 mol % to about 5 mol % $TiO_2$; from about 0 mol % to about 4 mol % $B_2O_3$; from about 0 mol % to about 5 mol % $Na_2O$; from about 0 mol % to about 4 mol % $K_2O$; from about 0 mol % to about 2 mol % $ZrO_2$; from about 0 mol % to about 7 mol % $P_2O_5$; from about 0 mol % to about 0.3 mol % $Fe_2O_3$; from about 0 mol % to about 2 mol % MnOx; and from about 0.05 mol % to about 0.2 mol % $SnO_2$.

In one or more embodiments, the composition of the glass-based substrates or articles described herein may include from about 67 mol % to about 74 mol % $SiO_2$; from about 11 mol % to about 15 mol % $Al_2O_3$; from about 5.5 mol % to about 9 mol % $Li_2O$; from about 0.5 mol % to about 2 mol % ZnO; from about 2 mol % to about 4.5 mol % MgO; from about 3 mol % to about 4.5 mol % $TiO_2$; from about 0 mol % to about 2.2 mol % $B_2O_3$; from about 0 mol % to about 1 mol % $Na_2O$; from about 0 mol % to about 1 mol % $K_2O$; from about 0 mol % to about 1 mol % $ZrO_2$; from about 0 mol % to about 4 mol % $P_2O_5$; from about 0 mol % to about 0.1 mol % $Fe_2O_3$; from about 0 mol % to about 1.5 mol % MnOx; and from about 0.08 mol % to about 0.16 mol % $SnO_2$.

In one or more embodiments, the composition of the glass-based substrates or articles described herein may include from about 70 mol % to 75 mol % $SiO_2$; from about 10 mol % to about 15 mol % $Al_2O_3$; from about 5 mol % to about 13 mol % $Li_2O$; from about 0 mol % to about 4 mol % ZnO; from about 0.1 mol % to about 8 mol % MgO; from about 0 mol % to about 5 mol % $TiO_2$; from about 0.1 mol % to about 4 mol % $B_2O_3$; from about 0.1 mol % to about 5 mol % $Na_2O$; from about 0 mol % to about 4 mol % $K_2O$; from about 0 mol % to about 2 mol % $ZrO_2$; from about 0 mol % to about 7 mol % $P_2O_5$; from about 0 mol % to about 0.3 mol % $Fe_2O_3$; from about 0 mol % to about 2 mol % MnOx; and from about 0.05 mol % to about 0.2 mol % $SnO_2$.

In one or more embodiments, the composition of the glass-based substrates or articles described herein may include from about 52 mol % to about 65 mol % $SiO_2$; from about 14 mol % to about 18 mol % $Al_2O_3$; from about 5.5 mol % to about 7 mol % $Li_2O$; from about 1 mol % to about 2 mol % ZnO; from about 0.01 mol % to about 2 mol % MgO; from about 4 mol % to about 12 mol % $Na_2O$; from about 0.1 mol % to about 4 mol % $P_2O_5$; and from about 0.01 mol % to about 0.16 mol % $SnO_2$. In some embodiments, the composition may be substantially free of any one or more of $B_2O_3$, $TiO_2$, $K_2O$ and $ZrO_2$.

In one or more embodiments, the composition of the glass-based substrates or articles described herein may include at least 0.5 mol % $P_2O_5$, $Na_2O$ and, optionally, $Li_2O$, where $Li_2O$(mol %)/$Na_2O$(mol %)<1. In addition, these compositions may be substantially free of $B_2O_3$ and $K_2O$. In some embodiments, the composition may include ZnO, MgO, and $SnO_2$.

In some embodiments, the composition of the glass-based substrates or articles described herein may comprise: from about 58 mol % to about 65 mol % $SiO_2$; from about 11 mol % to about 19 mol % $Al_2O_3$; from about 0.5 mol % to about 3 mol % $P_2O_5$; from about 6 mol % to about 18 mol % $Na_2O$; from 0 mol % to about 6 mol % MgO; and from 0 mol % to about 6 mol % ZnO. In certain embodiments, the composition may comprise from about 63 mol % to about 65 mol % $SiO_2$; from 11 mol % to about 17 mol % $Al_2O_3$; from about 1 mol % to about 3 mol % $P_2O_5$; from about 9 mol % to about 20 mol % $Na_2O$; from 0 mol % to about 6 mol % MgO; and from 0 mol % to about 6 mol % ZnO.

In some embodiments, the composition of the glass-based substrates or articles described herein may include the following compositional relationships $R_2O$(mol %)/$Al_2O_3$ (mol %)<2, where $R_2O$=$Li_2O$+$Na_2O$. In some embodiments, 65 mol %<$SiO_2$(mol %)+$P_2O_5$(mol %)<67 mol %. In certain embodiments, $R_2O$(mol %)+R'O(mol %)−$Al_2O_3$ (mol %)+$P_2O_5$(mol %)>−3 mol %, where $R_2O$=$Li_2O$+$Na_2O$ and R'O is the total amount of divalent metal oxides present in the composition.

In contemplated embodiments, the glass-based substrates or articles may include alkali aluminosilicate glass compositions or alkali aluminoborosilicate glass compositions. One example glass composition comprises $SiO_2$, $B_2O_3$ and $Na_2O$, where ($SiO_2$+$B_2O_3$)≥66 mol. %, and/or $Na_2O$≥9 mol. %. In an embodiment, the glass composition includes at least 6 wt. % aluminum oxide. In a further embodiment, the glass-based substrates or articles discussed herein may include a glass composition with one or more alkaline earth oxides, such that a content of alkaline earth oxides is at least 5 wt. %. Suitable glass compositions, in some embodiments, further comprise at least one of $K_2O$, MgO and CaO. In a particular embodiment, the glass compositions used in the strengthened glass or glass-ceramic sheet or article discussed herein can comprise 61-75 mol. % $SiO_2$; 7-15 mol. % $Al_2O_3$; 0-12 mol. % $B_2O_3$; 9-21 mol. % $Na_2O$; 0-4 mol. % $K_2O$; 0-7 mol. % MgO; and/or 0-3 mol. % CaO.

A further example glass composition suitable for the glass-based substrates or articles discussed herein comprises: 60-70 mol. % $SiO_2$; 6-14 mol. % $Al_2O_3$; 0-15 mol. % $B_2O_3$; 0-15 mol. % $Li_2O$; 0-20 mol. % $Na_2O$; 0-10 mol. % $K_2O$; 0-8 mol. % MgO; 0-10 mol. % CaO; 0-5 mol. % $ZrO_2$; 0-1 mol. % $SnO_2$; 0-1 mol. % $CeO_2$; less than 50 ppm $As_2O_3$; and less than 50 ppm $Sb_2O_3$; where 12 mol. %≤($Li_2O$+$Na_2O$+$K_2O$)≤20 mol. % and/or 0 mol. %≤(MgO+CaO)≤10 mol. %. A still further example glass composition suitable for the glass-based substrates or articles discussed herein comprises: 63.5-66.5 mol. % $SiO_2$; 8-12 mol. % $Al_2O_3$; 0-3 mol. % $B_2O_3$; 0-5 mol. % $Li_2O$; 8-18 mol. % $Na_2O$; 0-5 mol. % $K_2O$; 1-7 mol. % MgO; 0-2.5 mol. % CaO; 0-3 mol. % $ZrO_2$; 0.05-0.25 mol. % $SnO_2$; 0.05-0.5 mol. % $CeO_2$; less than 50 ppm $As_2O_3$; and less than 50 ppm $Sb_2O_3$; where 14 mol. % ≤ ($Li_2O+Na_2O+K_2O$) ≤ 18 mol. % and/or 2 mol. % ≤ (MgO+CaO) ≤ 7 mol. %.

In particular contemplated embodiments, an alkali aluminosilicate glass composition suitable for the glass-based substrates or articles discussed herein comprises alumina, at least one alkali metal and, in some embodiments, greater than 50 mol. % $SiO_2$, in other embodiments at least 58 mol. % $SiO_2$, and in still other embodiments at least 60 mol. % $SiO_2$, wherein the ratio ($Al_2O_3+B_2O_3$)/Σmodifiers (i.e., sum of modifiers) is greater than 1, where in the ratio the components are expressed in mol. % and the modifiers are alkali metal oxides. This glass composition, in particular embodiments, comprises: 58-72 mol. % $SiO_2$; 9-17 mol. % $Al_2O_3$; 2-12 mol. % $B_2O_3$; 8-16 mol. % $Na_2O$; and/or 0-4 mol. % $K_2O$, wherein the ratio ($Al_2O_3+B_2O_3$)/Σmodifiers (i.e., sum of modifiers) is greater than 1. In still another embodiment, the glass-based substrates or articles may include an alkali aluminosilicate glass composition comprising: 64-68 mol. % $SiO_2$; 12-16 mol. % $Na_2O$; 8-12 mol. % $Al_2O_3$; 0-3 mol. % $B_2O_3$; 2-5 mol. % $K_2O$; 4-6 mol. % MgO; and 0-5 mol. % CaO, wherein: 66 mol. % ≤ $SiO_2$+$B_2O_3$+CaO ≤ 69 mol. %; $Na_2O+K_2O+B_2O_3+MgO+CaO+SrO$ > 10 mol. %; 5 mol. % ≤ MgO+CaO+SrO ≤ 8 mol. %; ($Na_2O+B_2O_3$)−$Al_2O_3$ ≤ 2 mol. %; 2 mol. % ≤ $Na_2O$−$Al_2O_3$ ≤ 6 mol. %; and 4 mol. % ≤ ($Na_2O+K_2O$)−$Al_2O_3$ ≤ 10 mol. %. In an alternative embodiment, the glass-based substrates or articles discussed herein may comprise an alkali aluminosilicate glass composition comprising: 2 mol. % or more of $Al_2O_3$ and/or $ZrO_2$, or 4 mol. % or more of $Al_2O_3$ and/or $ZrO_2$.

In one or more embodiments, the glass substrates may exhibit a strain point of about 500° C. or greater. For example, the strain point may be about 550° C. or greater, about 600° C. or greater, or about 650° C. or greater.

In contemplated embodiments, examples of suitable glass ceramics for the glass-based substrates or articles discussed herein may include $Li_2O$—$Al_2O_3$—$SiO_2$ system (i.e. LAS-System) glass ceramics, MgO—$Al_2O_3$—$SiO_2$ system (i.e. MAS-System) glass ceramics, and/or glass ceramics that include a predominant crystal phase including β-quartz solid solution, β-spodumene ss, cordierite, and lithium disilicate. The glass-based substrates or articles discussed herein may be characterized by the manner in which it is formed. For instance, the strengthened glass or glass-ceramic sheet or article discussed herein may be characterized as float-formable (i.e., formed by a float process), down-drawable and, in particular, fusion-formable or slot-drawable (i.e., formed by a down draw process such as a fusion draw process or a slot draw process).

A float-formable glass-based substrates or articles may be characterized by smooth surfaces and consistent thickness, and is made by floating molten glass on a bed of molten metal, typically tin. In an example process, molten glass that is fed onto the surface of the molten tin bed forms a floating glass or glass-ceramic ribbon. As the glass ribbon flows along the tin bath, the temperature is gradually decreased until the glass ribbon solidifies into a solid glass-based that can be lifted from the tin onto rollers. Once off the bath, the glass-based substrate can be cooled further and annealed to reduce internal stress. Where the glass-based article is a glass ceramic, the glass substrate formed from the float process may be subjected to a ceramming process by which one or more crystalline phases are generated.

Down-draw processes produce glass-based substrates having a consistent thickness that possess relatively pristine surfaces. Because the average flexural strength of the glass-based substrates is controlled by the amount and size of surface flaws, a pristine surface that has had minimal contact has a higher initial strength. When this high strength glass-based substrates is then further strengthened as described herein, the resultant strength can be higher than that of a glass-based substrate with a surface that has been lapped and polished. Down-drawn glass-based substrates may be drawn to a thickness of less than about 2 mm (for example 1.5 mm, 1 mm, 0.75 mm, 0.6 mm, 0.5 mm, 0.4 mm, 0.3 mm, 0.2 mm, 0.1 mm, 0.075 mm, 0.050 mm). In addition, down-drawn glass-based substrates have a very flat, smooth surface that can be used in its final application without costly grinding and polishing. Where the glass-based substrates is a glass ceramic, the glass-based substrates formed from the down-draw process may be subjected to a ceramming process by which one or more crystalline phases are generated.

The fusion draw process, for example, uses a drawing tank that has a channel for accepting molten glass raw material. The channel has weirs that are open at the top along the length of the channel on both sides of the channel. When the channel fills with molten material, the molten glass overflows the weirs. Due to gravity, the molten glass flows down the outside surfaces of the drawing tank as two flowing glass films. These outside surfaces of the drawing tank extend down and inwardly so that they join at an edge below the drawing tank. The two flowing glass films join at this edge to fuse and form a single flowing glass article. The fusion draw method offers the advantage that, because the two glass films flowing over the channel fuse together, neither of the outside surfaces of the resulting glass article comes in contact with any part of the apparatus. Thus, the surface properties of the fusion drawn glass-based substrate are not affected by such contact. Where the glass-based substrates is a glass ceramic, the glass-based substrates formed from the fusion process may be subjected to a ceramming process by which one or more crystalline phases are generated.

The slot draw process is distinct from the fusion draw method. In slot draw processes, the molten raw material glass is provided to a drawing tank. The bottom of the drawing tank has an open slot with a nozzle that extends the length of the slot. The molten glass flows through the slot/nozzle and is drawn downward as a continuous glass-based substrate and into an annealing region. Where the glass-based substrate is a glass ceramic, the glass-based substrate formed from the slot draw process may be subjected to a ceramming process by which one or more crystalline phases are generated.

In some embodiments, the glass-based substrate may be formed using a thin rolling process, as described in U.S. Pat. No. 8,713,972, U.S. Pat. No. 9,003,835, U.S. Patent Publication No. 2015/0027169, and U.S. Patent Publication No. 20050099618, the contents of which are incorporated herein by reference in their entirety. More specifically the glass or glass-ceramic article may be formed by supplying a vertical stream of molten glass, forming the supplied stream of molten glass or glass-ceramic with a pair of forming rolls, maintained at a surface temperature of about 500° C. or higher or about 600° C. or higher, to form a formed glass ribbon having a formed thickness, sizing the formed ribbon of glass with a pair of sizing rolls, maintained at a surface temperature of about 400° C. or lower to produce a sized glass ribbon having a desired thickness less than the formed thickness and a desired thickness consistency. The apparatus used to form the glass ribbon may include a glass feed device for supplying a supplied stream of molten glass; a pair of forming rolls maintained at a surface temperature of about 500° C. or higher, the forming rolls being spaced closely adjacent each other, defining a glass forming gap between the forming rolls with the glass forming gap located vertically below the glass feed device for receiving the supplied stream of molten glass and thinning the supplied stream of molten glass between the forming rolls to form a formed glass ribbon having a formed thickness; and a pair of sizing rolls maintained at a surface temperature of about 400° C. or lower, the sizing rolls being spaced closely adjacent each other, defining a glass sizing gap between the sizing rolls with the glass sizing gap located vertically below the forming rolls for receiving the formed glass ribbon and thinning the formed glass ribbon to produce a sized glass ribbon having a desired thickness and a desired thickness consistency.

In some instances, the thin rolling process may be utilized where the viscosity of the glass does not permit use of fusion or slot draw methods. For example, thin rolling can be utilized to form the glass or glass-ceramic articles when the glass exhibits a liquidus viscosity less than 100 kP. The glass or glass-ceramic article may be acid polished or otherwise treated to remove or reduce the effect of surface flaws.

In contemplated embodiments, the glass-based substrates or articles discussed herein has a composition that differs by side surface. On one side of the glass or glass-ceramic sheet 500, an exemplary composition is: 69-75 wt. % $SiO_2$, 0-1.5 wt. % $Al_2O_3$, 8-12 wt. % CaO, 0-0.1 wt. % Cl, 0-500 ppm Fe, 0-500 ppm K, 0.0-4.5 wt. % MgO, 12-15 wt. % $Na_2O$, 0-0.5 wt. % $SO_3$, 0-0.5 wt. % $SnO_2$, 0-0.1 wt. % SrO, 0-0.1 wt. % $TiO_2$, 0-0.1 wt. % ZnO, and/or 0-0.1 wt. % $ZrO_2$. On the other side of the glass-based substrates or articles discussed herein an exemplary composition is: 73.16 wt. % $SiO_2$, 0.076 wt. % $Al_2O_3$, 9.91 wt. % CaO, 0.014 wt. % Cl, 0.1 wt. % $Fe_2O_3$, 0.029 wt. % $K_2O$, $_{2.792}$ wt. % MgO, 13.054 wt. % $Na_2O$, 0.174 wt. % $SO_3$, 0.001 $SnO_2$, 0.01 wt. % SrO, 0.01 wt. % $TiO_2$, 0.002 wt. % ZnO, and/or 0.005 wt. % $ZrO_2$.

In other contemplated embodiments, composition of the glass-based substrates or articles discussed herein includes $SiO_2$ 55-85 wt. %, $Al_2O_3$ 0-30 wt. %, $B_2O_3$ 0-20 wt. %, $Na_2O$ 0-25 wt. %, CaO 0-20 wt. %, $K_2O_0$-20 wt. %, MgO 0-15 wt. %, BaO 5-20 wt. %, $Fe_2O_3$ 0.002-0.06 wt. %, and/or $Cr_2O_3$ 0.0001-0.06 wt. %. In other contemplated embodiments, composition of the glass-based substrates or articles discussed herein includes $SiO_2$ 60-72 mol. %, $Al_2O_3$ 3.4-8 mol. %, $Na_2O$ 13-16 mol. %, $K_2O_0$-1 mol. %, MgO 3.3-6 mol. %, $TiO_2$ 0-0.2 mol. %, $Fe_2O_3$ 0.01-0.15 mol. %, CaO 6.5-9 mol. %, and/or $SO_3$ 0.02-0.4 mol. %.

Another aspect of this disclosure pertains to a method for strengthening a glass substrate. In one or more embodiments, the method includes cooling a glass substrate (which may be in sheet form) having a transition temperature from a temperature greater than the transition temperature to a temperature less than the transition temperature by transferring thermal energy from the glass sheet to a heat sink by conduction across a gap that is free of solid or liquid matter to provide a thermally strengthened glass article, and then chemically strengthening the thermally strengthened glass article. In one or more embodiments, the method includes transferring thermal energy from the glass sheet to a heat sink by conduction such that more than 20% of the thermal energy leaving the glass sheet crosses the gap and is received by the heat sink to thermally strengthen the glass sheet. In some instances, about 25% or more, about 30% or more, about 35% or more, about 40% or more, about 45% or more, about 50% or more, or about 60% or more of the thermal energy is transferred by conduction from the glass sheet to a heat sink across the gap. In some embodiments, the cooling rate may be about −270° C./second or greater (e.g., −280° C./second or greater, −290° C./second or greater, −300° C./second or greater, −310° C./second or greater, or −320° C./second or greater).

In one or more embodiments, the thermally strengthened glass article is chemically strengthened without removing any portion of the thermally strengthened glass sheet. For example, the thermally strengthened glass article is chemically strengthened without removing 3% or more (or 2% or more, or 1% or more) of the thickness of the thermally strengthened glass article.

In some embodiments, the thermally strengthened glass article comprises a thickness and a DOC greater than or equal to 0.17 times the thickness of the thermally strengthened glass article. In some instances, the thermally and chemically strengthened glass article exhibits a thickness and a DOC greater than or equal to 0.17 times the thickness. In one more embodiments, chemically strengthening the thermally strengthened glass articles comprises generating a surface CS of about 700 MPa or greater, while maintaining the DOC.

In accordance with one or more embodiments, chemically strengthening the thermally strengthened article sheet comprises generating a chemically strengthened region that extends from a first surface of the glass-based layer to a DOL that is greater than or equal to about 10 micrometers.

The method of one or more embodiments, chemically strengthening the thermally strengthened glass article comprises immersing the thermally strengthened glass sheet in a molten salt bath comprising any one or more of $KNO_3$, $NaNO_3$, and $LiNO_3$. In some embodiments, the molten salt bath comprises KNO3 and NaNO3 and has a temperature in the range from about 380° C. to about 430° C.

Another aspect of this disclosure pertains to a consumer electronic product that includes a housing having a front surface, a back surface and side surfaces, electrical components including at least a controller, a memory, a display and a cover article. In one or more embodiments, the electrical components may be housed in or provided at least partially inside to the housing. The display of one or more embodiments may be provided at or adjacent the front surface of the housing. In some embodiments, the cover article is provided at or over the front surface of the housing over the display. The cover glass-based article may include one or more embodiments of the thermally and chemically strengthened glass-based articles described herein. The consumer electronic device of one or more embodiments may be a mobile phone, portable media player, wearable electronic device (e.g. watch, fitness monitor) notebook computer or tablet computer.

Figure 14A:
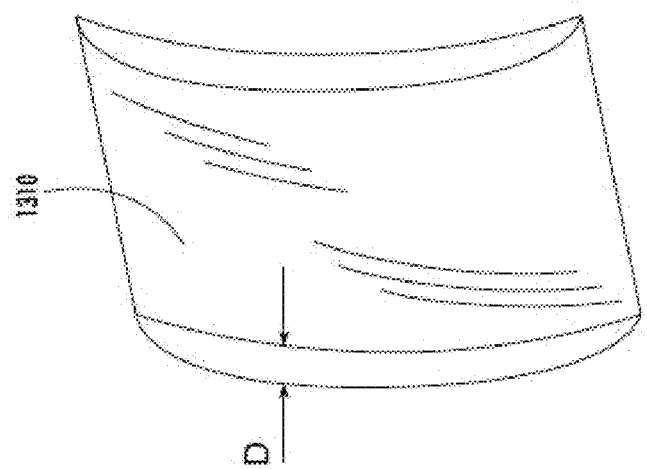
FIG. 14A is a perspective view of a glass-based article according to an exemplary embodiment.

Referring now to FIG. 14A, the glass-based article of one or more embodiments 1310 may have curvature and/or a variable cross-sectional dimension D. Such articles may have thicknesses disclosed herein as an average of dimension D or as a maximum value of dimension D. While the glass-based article 1310 is shown as a curved sheet, other shapes, such as more complex shapes, may be strengthened by processes disclosed herein. In contemplated embodiments, the glass-based article 1310 may be used as a window for an automobile (e.g., sunroof), as a lens, as a container, or for other applications.

In some embodiments, the glass-based articles described herein have one or more coatings that are placed on the glass prior to the thermal strengthening of the glass sheet. The processes discussed herein can be used to produce strengthened glass sheets having one or more coatings, and, in some such embodiments, the coating is placed on the glass prior to thermal strengthening and is unaffected by the thermal strengthening process. Specific coatings that are advantageously preserved on glass sheets of the present disclosure include low E coatings, reflective coatings, antireflective coatings, anti-fingerprint coatings, cut-off filters, pyrolytic coatings, etc.

Figure 14B:
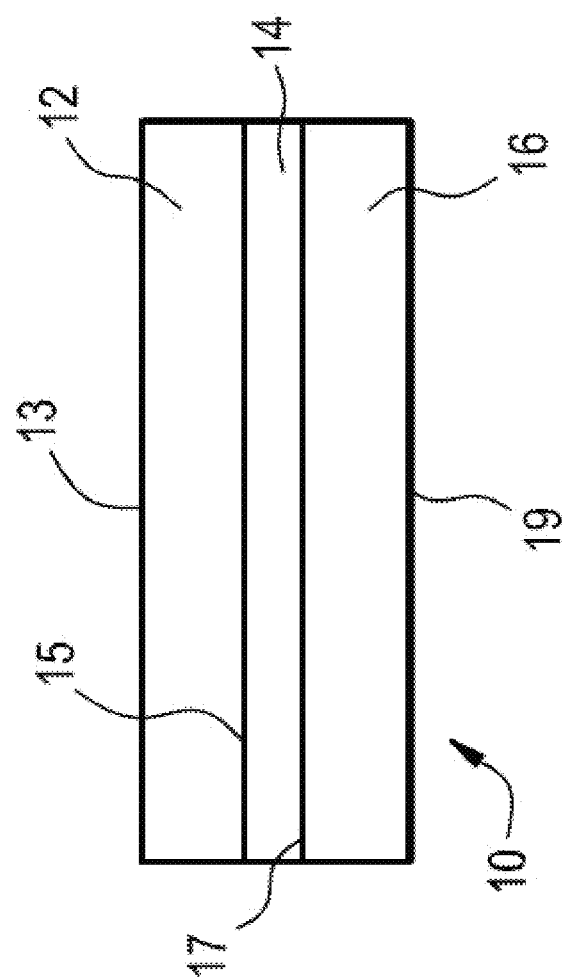
FIG. 14B is a cross sectional illustration of some embodiments of the present disclosure.

Another aspect of this disclosure pertains to laminates that include the glass-based articles described herein. For example, in one or more embodiments, the laminate may include a first glass-based sheet 16, a second glass-based sheet 12 and an interlayer 14 disposed between the first glass-based sheet and the second glass-based sheet, where one or both the first glass-based sheet and the second glass-based sheet is thermally and chemically strengthened as described herein, as shown in FIG. 14B.

Figure 14C:
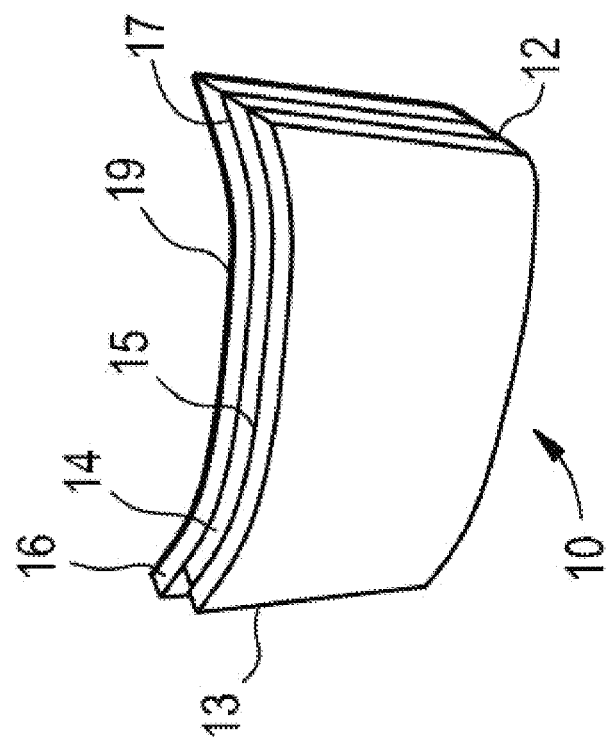
FIG. 14C is a perspective view of additional embodiments of the present disclosure.
Figure 14D:
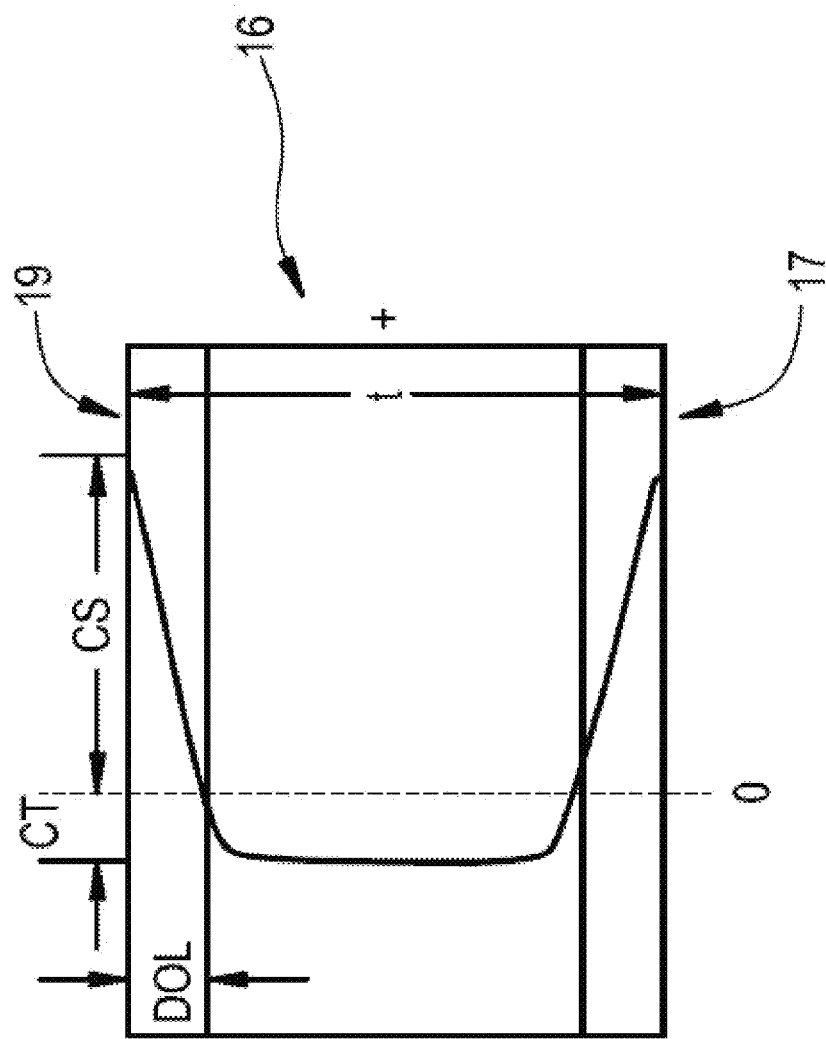
FIGS. 14D and 14E are cross sectional stress profiles of an exemplary glass-based article according to some embodiments of the present disclosure.
Figure 14E:
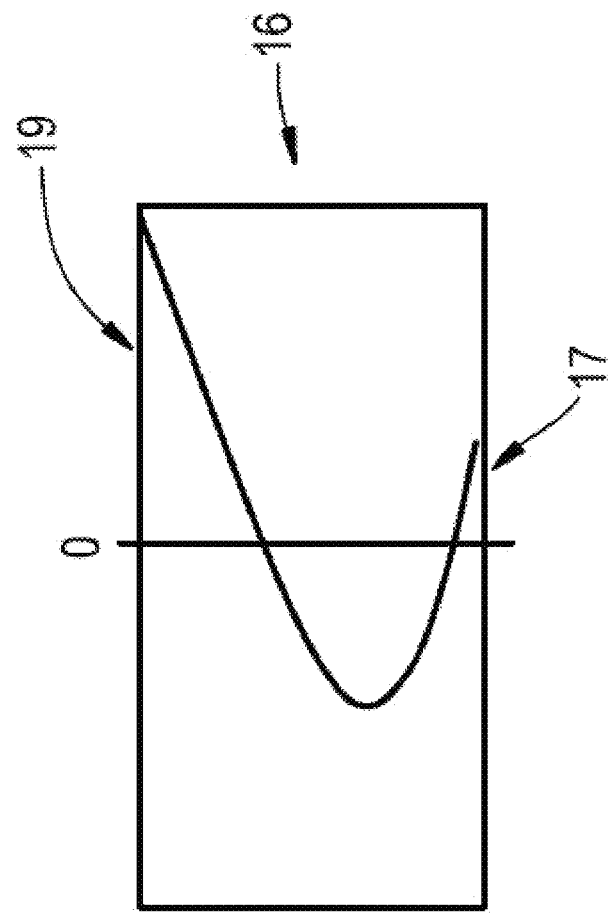

In one or more embodiments, the one of the first glass-based sheet and the second glass-based sheet may be cold-formed. In an exemplary cold forming method shown in FIG. 14C, a glass sheet 16 can be laminated to a relatively thicker and curved glass sheet 12. The result of this cold formed lamination is that the surface of the thin glass sheet 17 adjacent the interlayer 14 will have a reduced level of compression than the opposing surface 19 of the thin glass sheet. Furthermore, this cold form lamination process can result in a high compressive stress level on surface 19 making this surface more resistant to fracture from abrasion and can add further compressive stress on the surface 13 of the thicker, glass sheet 12 also making this surface more resistant to fracture from abrasion. In some non-limiting embodiments, an exemplary cold forming process can occur at or just above the softening temperature of the interlayer material (e.g., about 100° C. to about 120° C.), that is, at a temperature less than the softening temperature of the respective glass sheets. Such a process can occur using a vacuum bag or ring in an autoclave or another suitable apparatus. FIGS. 14D-14E are cross sectional stress profiles of an exemplary inner glass layer according to some embodiments of the present disclosure. It can be observed in FIG. 14D that the stress profile for the thin glass sheet 16 exhibits substantially symmetrical compressive stresses on the surfaces 17, 19 thereof with a central tension region. With reference to FIG. 14E, it can be observed that the stress profile for the thin glass sheet 16, according to an exemplary cold formed embodiment, provides a shift in compressive stress, namely, the surface 17 adjacent the interlayer 14 has a reduced compressive stress in comparison to the opposing surface 19. This difference in stress can be explained using the following relationship:

$$\sigma = Ey/\rho$$

where E represents the modulus of elasticity of the beam material, y represents the perpendicular distance from the centroidal axis to the point of interest (surface of the glass), and $\rho$ represents the radius of curvature to the centroid of the glass sheet. It follows that the bending of the glass sheet 16 via cold forming can induce a mechanical tensile stress or a reduced compressive stress on the surface 17 adjacent the interlayer 14 in comparison to the opposing surface 19 of the glass sheet 16.

In one or more embodiments, the laminates may include an interlayer comprising a polymeric material such as, but not limited to, poly vinyl butyral (PVB), polycarbonate, acoustic PVB, ethylene vinyl acetate (EVA), thermoplastic polyurethane (TPU), ionomer, a thermoplastic material, and combinations thereof.

In some embodiments, the first glass-based sheet is complexly-curved and has at least one concave surface providing a first surface of the laminate and at least one convex surface to provide a second surface of the laminate opposite the first surface with a thickness therebetween, and the second glass-based sheet is complexly-curved and has at least one concave surface to provide a third surface of the laminate and at least one convex surface to provide a fourth surface of the laminate opposite the third surface with a thickness therebetween. In such embodiments, the third and fourth surfaces respectively have CS values such that the fourth surface has a CS value that is greater than the CS value of the third surface.

As used herein "complex curve", "complexly curved", "complex curved substrate" and "complexly curved substrate" mean a non-planar shape having simple or compound curves, also referred to as non-developable shapes, which include but are not limited to a spherical surface, an aspherical surface, and a toroidal surface, where the curvature of two orthogonal axes (horizontal and vertical one) are different, which may be for example a toroidal shape, spheroid, and ellipsoid. The complexly curved laminates according to embodiments may also include segments or portions of such surfaces, or be comprised of a combination of such curves and surfaces. In one or more embodiments, a laminate may have a compound curve including a major radius and a cross curvature. A complexly curved laminate according to embodiments may have a distinct radius of curvature in two independent directions. According to one or more embodiments, complexly curved laminates may thus be characterized as having "cross curvature," where the laminate is curved along an axis that is parallel to a given dimension and also curved along an axis that is perpendicular to the same dimension. The curvature of the laminate can be even more complex when a significant minimum radius is combined with a significant cross curvature, and/or depth of bend. Some laminates may also include bending along axes of bending that are not perpendicular to the longitudinal axis of the flat glass substrate. As a non-limiting example, an automobile sunroof typically measures about 0.5 m by 1.0 m and has a radius of curvature of 2 to 2.5 m along the minor axis, and a radius of curvature of 4 to 5 m along the major axis.

In one or more embodiments, the interlayer may include polyvinyl butyral (PVB) resin, ethylenevinylacetate copolymer or polyurethanes thermoplastic (TPU).

In one or more embodiments, one of the first glass-based substrate or the second glass-based substrate has a thickness in the range of about 0.2 mm to about 0.7 mm. In some embodiments, the fourth surface of the laminate has a greater CS than the fourth surface has in a flat state and the laminate is free from optical distortions. In one or more variations, a peripheral portion of the second glass-based substrate exerts a compressive force against the interlayer, and a center portion of the second glass-based substrate exerts a tensile force against the interlayer. In some instances, the second glass-based substrate conforms to the first glass-based substrate to provide a substantially uniform distance between the convex surface of the second glass-based substrate and the concave surface of the first glass-based substrate, which is filled by the intervening interlayer.

Another aspect of this disclosure pertains to a vehicle comprising an opening; and a laminate as described herein disposed in the opening. The thickness of the laminate may vary according to the vehicle. For example, the vehicle may include a heavy truck and the laminate may have a thickness greater than about 3 mm. In some embodiments, the vehicle may include a passenger car or truck and may have a thickness of about 2.6 mm or less.

EXAMPLES

Various embodiments will be further clarified by the following examples. In the following examples, the glass-based substrate at a specified thickness, t, was thermally strengthened from a desired initial temperature, $T_0$, at the desired heat-transfer coefficient, h.

The thermal strengthening apparatus included three zones—a hot zone, a transition zone, and a cool or quench zone. The apparatus included top and bottom thermal bearings (or heat sinks) and the gaps between the top and bottom thermal bearings in the hot zone and the quench zone are set to the desired spacing. Gas flow rates in the hot zone, transition zone, and quench zone are set to ensure centering of the glass-based substrate on the air-bearing. The hot zone is pre-heated to the desired $T_0$, the temperature from which the glass-based substrate will be subsequently quenched at high heat transfer rates (h, in units of $cal/cm^2$-$s$-$°$ C.). To ensure uniform heating, glass-based substrates are pre-heated in a separate pre-heating apparatus, such as a batch or continuous furnace. Generally, glass-based substrates are pre-heated for greater than 5 minutes prior to loading in the hot zone. For soda-lime glass-based substrates, pre-heating is done around 450° C. After the pre-heat phase, the glass-based substrate is loaded into the hot zone and allowed to equilibrate, where equilibration is where the glass is uniformly at $T_0$. $T_0$ can be determined by the level of thermal strengthening desired, but is generally kept in the range between the softening point and the glass transition temperature. The time to equilibration is dependent at least on the thickness of the glass-based substrate. For example, for glass-based substrates in sheet form having a thickness of approximately 1.1 mm or less, equilibration occurs in approximately 10 seconds. For 3 mm-thick glass-based substrates in sheet form, equilibration occurs in approximately 10 seconds to 30 seconds. For thicker sheets, up to approximately 6 mm, the equilibration time may be on the order of 60 seconds. Once the glass-based substrate has equilibrated to $T_0$, it is rapidly transferred through the transition zone on air bearings and into the cool or quench zone. The glass-based substrate rapidly quenches in the quench zone to a temperature below the glass transition temperature, Tg. The glass-based substrate can be maintained in the quench zone for any period of time from 1 second, 10 seconds, or to several minutes or more, depending on the degree of quench desired and/or the desired temperature of the resulting glass-based article at removal. Upon removal the glass-based article is optionally allowed to cool before handling.

As the examples demonstrate, there is no limit on thickness except for the limitations imposed by the thermal strengthening process (i.e., the chosen heat-transfer coefficient, h). That is, in traditional thermal strengthening processes, the thickness is limited to greater than about 1.5 mm, whereas the following examples demonstrate that embodiments of the present disclosure may be significantly thinner. In the following examples, the initial temperature $T_0$ was typically chosen to be somewhere between the softening point of the glass-based substrate and about 100° C. lower than that softening point.

After being thermally strengthened, the glass-based articles were then subjected to a chemical strengthening process by immersing in a molten salt bath. The molten bath composition and duration of immersion are described below. As is demonstrated herein, in some embodiments, the temperature at which the chemical strengthening process is performed is low enough as to not anneal out or reduce the CS generated by the thermal strengthening process, but high enough to obtain the desired DOL and the desired DOL in a short amount of time. As the thermally strengthened glass-based article has a very high fictive temperature, the viscosity of the glass-based article is non-equilibrium and stress relaxation at elevated temperatures will occur much faster than predicted from the equilibrium viscosity curve.

The resulting thermally strengthened and chemically strengthened glass-based article can be characterized by two simple techniques: 1) the surface CS, CS, and DOL can be measured using the FSM technique; and 2) CT and DOC were measured using SCALP.

In some embodiments, the effects of the thermal strengthening and chemical strengthening processes on the mechanical performance of the glass-based articles described herein can be evaluated by various ways including but not limited to: drop testing, scratch testing, indentation testing, and 4-point bending. Without being bound by theory, the performance of the glass-based articles described herein can be predicted by the CS, CT, DOC, and/or DOL values exhibited. For example, higher surface CS provides significant improvement in bending, scratching, and indentation testing. The high fictive temperature provides improved damage resistance in indentation and scratch testing. Drop testing is a damage-tolerance test and is more strongly affected the DOC, and perhaps even the fictive temperature. Therefore, the glass-based articles of one or more embodiments, which are subjected to thermal strengthening and chemical strengthening described herein, outperform glass-based articles that are strengthened by thermal strengthening or chemical strengthening processes alone or using a combination of known thermal strengthening and chemical strengthening processes. This improved performance is exhibited by a variety of different glass-based compositions.

Example 1

Glass-based substrates having a nominal composition of 69 mol % $SiO_2$, 8.5 mol % $Al_2O_3$, 14 mol % $Na_2O$, 1.2 mol % $K_2O$, 6.5 mol % MgO, 0.5 mol % CaO, and 0.2 mol % $SnO_2$ and having identical thicknesses were activated at various temperatures in the range from about 575° C. to about 725° C. to demonstrate the improved chemical strengthening achievable after the glass-based substrates are thermally strengthened (or strengthened to increase the fictive temperature of such substrates). In other words, the glass-based substrates were heated to a $T_0$ in the range from about 575° C. to about 725° C. for approximately three times the structural relaxation time and then quenched to room temperature to freeze in the high temperature state.

Glass-based substrates having the same nominal composition and thickness were also thermally strengthened by heating to a $T_0$ of 800° C. and then quenching at heat transfer rates (h) of 0.069 $cal/cm^2$-$s$-$°$ C., 0.028 $cal/cm^2$-$s$-$°$ C., and 0.013 $cal/cm^2$-$s$-$°$ C., as shown in Table 4.

The resulting thermally strengthened glass-based articles were then chemically strengthened by ion-exchange by immersing in a molten salt bath of 100% $KNO_3$ having a temperature of about 410° C. for various durations up to about 8 hours. The DOL of each of the thermally and chemically strengthened glass-based articles were evaluated by FSM technique, and ion exchange diffusion coefficients were estimated using the equation: DOL=2*1.4*SQRT(D·t) or 2*1.4*√(D·t), where D is the diffusion coefficient, as shown in Table 4.

As demonstrated in Table 4, the ion exchange diffusion coefficient of the thermally strengthened and chemically strengthened glass-based articles is observed to correspond to a high fictive temperature state. Specifically, more strongly or highly thermally strengthened glass-based articles exhibit a high fictive temperature and a higher diffusion coefficient. The resulting thermally strengthened glass-based-article exhibits a deep DOC and thus, subsequent chemically strengthening does not cause a significant decrease in the DOC (initially generated from the thermal strengthening process).

TABLE 4

Effects of fictive temperature and thermal tempering on the ion exchange diffusion coefficient of the glass-based articles of Example 1.

| Fictive Temperature (° C.) | Diffusion Coefficient at 410° C. (cm$^2$/sec) |
|---|---|
| 575 | 7.30 × 10$^{-11}$ |
| 600 | 7.60 × 10$^{-11}$ |
| 625 | 9.30 × 10$^{-11}$ |
| 650 | 1.03 × 10$^{-10}$ |
| 675 | 1.05 × 10$^{-10}$ |
| 685 | 1.06 × 10$^{-10}$ |
| 700 | 1.09 × 10$^{-10}$ |
| 725 | 1.18 × 10$^{-10}$ |
| Tempered (h = 0.013 cal/cm$^2$-s-° C.) | 8.39 × 10$^{-11}$ |
| Tempered (h = 0.028 cal/cm$^2$-s-° C.) | 8.76 × 10$^{-11}$ |
| Tempered (h = 0.069 cal/cm$^2$-s-° C.) | 1.21 × 10$^{-10}$ |

Example 2

Glass substrates having the same composition as the glass substrates of Example 1 and having a thickness of about 1.1 mm were thermally strengthened at various heat transfer rates and then chemically strengthened, as shown in Table 5.

Specifically, Example 2A-1 included a thermally strengthened glass-based article that was heated to a $T_0$ of about 800° C. and then quenched at h=0.069 cal/cm$^2$-s-° C., Example 2B-1 included a thermally strengthened glass-based article that was heated to a $T_0$ of about 800° C. and then quenched at h=0.028 cal/cm$^2$-s-° C., and Example 2C-1 included a thermally strengthened glass-based article that was heated to a $T_0$ of about 800° C. and then quenched at h=0.013 cal/cm$^2$-s-° C. Examples 2A-2 through 2A-5, 2B-2 through 2B-5, and 2C-2 through 2C-5 included glass articles that included the same glass substrate and were thermally strengthened in the same manner as Examples 2A-1, 2B-1 and 2C-1, respectively, but then were chemically strengthened by ion-exchange by immersing in a molten salt bath of 100% KNO$_3$ having a temperature of 410° C. for various times between 10 minutes and 1 hour, according to Table 5.

TABLE 5

Thermal strengthening and chemical strengthening conditions for Examples 2A-1 through 2A-5, 2B-1 through 2B-5, and 2C-1 through 2C-5.

| | Thermal strengthening conditions ($T_0$, h) | Chemical strengthening duration |
|---|---|---|
| Ex. 2A-1 | $T_0$ = 800° C. h = 0.069 cal/cm$^2$-s-° C. | None |
| Ex. 2A-2 | $T_0$ = 800° C. h = 0.069 cal/cm$^2$-s-° C. | 10 minutes |
| Ex. 2A-3 | $T_0$ = 800° C. h = 0.069 cal/cm$^2$-s-° C. | 15 minutes |
| Ex. 2A-4 | $T_0$ = 800° C. h = 0.069 cal/cm$^2$-s-° C. | 30 minutes |
| Ex. 2A-5 | $T_0$ = 800° C. h = 0.069 cal/cm$^2$-s-° C. | 60 minutes |
| Ex. 2B-1 | $T_0$ = 800° C. h = 0.028 cal/cm$^2$-s-° C. | None |
| Ex. 2B-2 | $T_0$ = 800° C. h = 0.028 cal/cm$^2$-s-° C. | 10 minutes |
| Ex. 2B-3 | $T_0$ = 800° C. h = 0.028 cal/cm$^2$-s-° C. | 15 minutes |
| Ex. 2B-4 | $T_0$ = 800° C. h = 0.028 cal/cm$^2$-s-° C. | 30 minutes |
| Ex. 2B-5 | $T_0$ = 800° C. h = 0.028 cal/cm$^2$-s-° C. | 60 minutes |
| Ex. 2C-1 | $T_0$ = 800° C. h = 0.013 cal/cm$^2$-s-° C. | None |
| Ex. 2C-2 | $T_0$ = 800° C. h = 0.013 cal/cm$^2$-s-° C. | 10 minutes |
| Ex. 2C-3 | $T_0$ = 800° C. h = 0.013 cal/cm$^2$-s-° C. | 15 minutes |
| Ex. 2C-4 | $T_0$ = 800° C. h = 0.013 cal/cm$^2$-s-° C. | 30 minutes |
| Ex. 2C-5 | $T_0$ = 800° C. h = 0.013 cal/cm$^2$-s-° C. | 60 minutes |

Comparative Example 2D included the same glass substrate as Examples 2A-1 through 2A-5, 2B-1 through 2B-5, and 2C-1 through 2C-5, but was subjected only to a known chemical strengthening process (and not thermally strengthened) including immersion in a 100% KNO3 molten salt bath having a temperature of 420° C. for 5.5 hours. The CS, CT, DOL and DOC values (as an absolute measurement and as a percentage of the glass article thickness) of all the resulting glass articles were measured and are shown in Tables 6-8. As shown in Tables 6-8, Comparative Example 2D exhibited a DOL of about 44 micrometers and a surface CS of about 750 MPa. By selecting the instant chemical strengthening conditions, the thermally strengthened and chemically strengthened glass articles of Examples 2A-2C exhibit comparable surface CS values as Comparative Example 2D, but from a significantly shorter immersion (or chemical strengthening duration), while also exhibiting a total DOC that is many times larger than achievable by a chemical strengthening process alone.

TABLE 6

Measured properties of the resulting thermally and chemically strengthened glass articles of Example 2A-1 through 2A-5, and Comparative Example 2D.

| Example | CS (MPa) | CT (MPa) | DOL (in μm) | DOC (in μm) | DOC as % of article thickness |
|---|---|---|---|---|---|
| Ex. 2A-1 | 165 | 71 | 0 | 250 | 22.9 |
| Ex. 2A-2 | 766 | 57 | 9.0 | 240 | 22.0 |
| Ex. 2A-3 | 753 | 57 | 11.3 | 236 | 21.6 |
| Ex. 2A-4 | 760 | 58 | 14.1 | 236 | 21.6 |
| Ex. 2A-5 | 746 | 62 | 20.2 | 215 | 19.7 |
| Comparative Ex. 2D | 752 | 31 | 44.3 | 44 | 4.1 |

TABLE 7

Measured properties of the resulting thermally and chemically strengthened glass articles of Example 2B-1 through 2B-5, and Comparative Example 2D.

| Example | CS (MPa) | CT (MPa) | DOL (in μm) | DOC (in μm) | DOC as % of article thickness |
|---|---|---|---|---|---|
| Ex. 2B-1 | 73 | 48 | 0 | 210 | 19.3 |
| Ex. 2B-2 | 846 | 32 | 8.6 | 205 | 18.8 |
| Ex. 2B-3 | 837 | 33 | 10.0 | 194 | 17.8 |
| Ex. 2B-4 | 826 | 34 | 13.6 | 182 | 16.7 |
| Ex. 2B-5 | 817 | 36 | 17.9 | 167 | 15.3 |
| Comparative Ex. 2D | 752 | 31 | 44.3 | 44 | 4.1 |

TABLE 8

Measured properties of the resulting thermally and chemically strengthened glass articles of Example 2C-1 through 2C-5, and Comparative Example 2D.

| Example | CS (MPa) | CT (MPa) | DOL (in μm) | DOC (in μm) | DOC as % of article thickness |
|---|---|---|---|---|---|
| Ex. 2C-1 | 47 | 33 | 0 | 200 | 18.3 |
| Ex. 2C-2 | 833 | 35 | 8.0 | 181 | 16.6 |
| Ex. 2C-3 | 837 | 37 | 9.5 | 173 | 15.9 |
| Ex. 2C-4 | 831 | 38 | 13.0 | 162 | 14.8 |
| Ex. 2C-5 | 813 | 40 | 17.1 | 142 | 13.0 |
| Comparative Ex. 2D | 752 | 31 | 44.3 | 44 | 4.1 |

Figure 15:
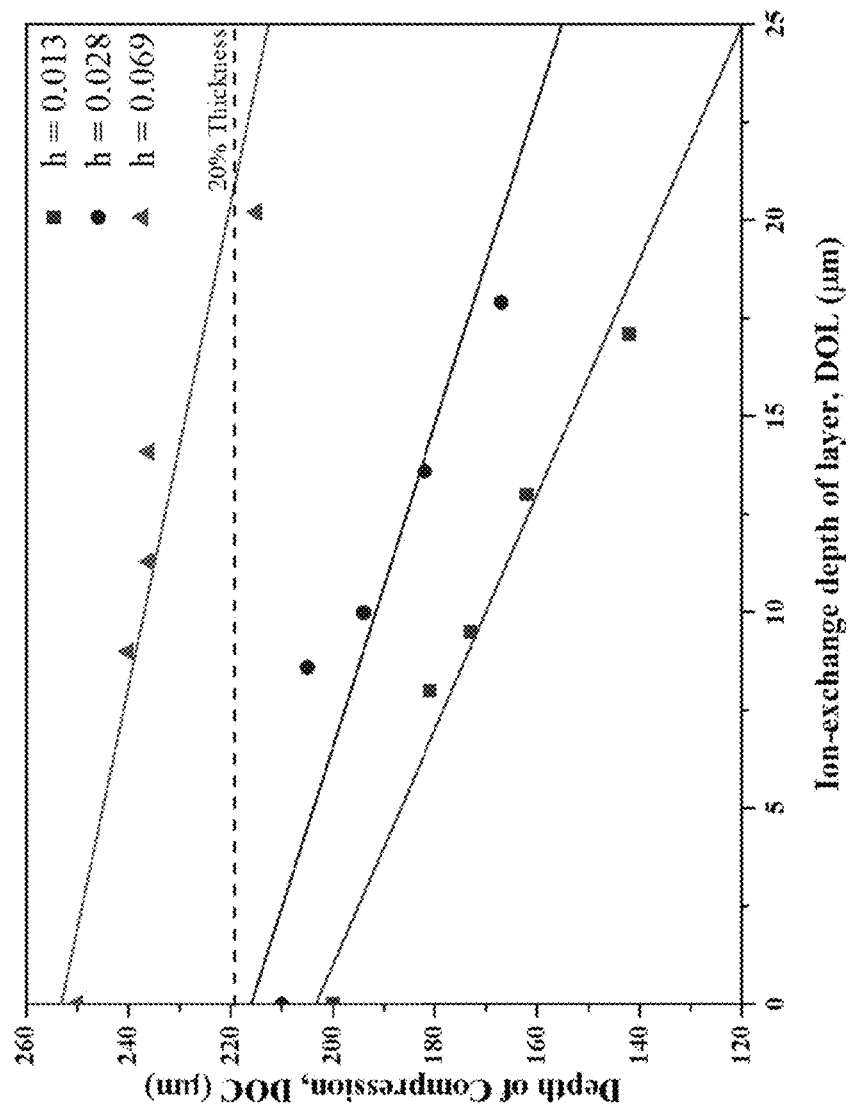
FIG. 15 is a graph showing the DOC for Example 2, as a function of depth of layer.

By thermally strengthening at higher heat transfer rates (or generating a more strongly thermally strengthened glass article), high surface CS values can be generated by subsequent chemical strengthening without significantly decreasing the DOC generated by the thermal strengthening process. As shown in Tables 6-8, the glass articles that were thermally strengthened at higher heat transfer rates (i.e., h=0.069 cal/cm$^2$-s-° C.) maintained DOC values after being chemically strengthened. The maintenance of DOC values is also shown in FIG. 15, which shows the glass articles of Example 2A, which were thermally strengthened at a high heat transfer rate exhibited significantly shallower slope or decrease in DOC, with increasing DOL.

The glass substrates (prior to being thermally and/or chemically strengthened) of Example 2, the thermally strengthened glass articles of Examples 2A-1, 2B-1 and 2C-1, the thermally and chemically strengthened glass articles of Examples 2A-2, 2B-2 and 2C-2, and the chemically strengthened glass article of Comparative Example 2D were compared in terms of mechanical performance. Specifically, samples of these glass substrates or articles were subjected to an incremental drop test (using two different types of sandpaper drop surfaces), a four-point bend test, a Vicker's indentation threshold test and a Knoop scratch threshold test. The results of each test are shown in Table 9.

In incremental drop testing, the glass substrates or articles were sized to have dimensions of approximately 50 mm×110 mm and then glued to identical mobile phone housings. The assemblies were then each successively dropped onto 180 grit sandpaper in 20 cm height intervals starting at 20 cm up to 220 cm. The assemblies were dropped so the glass substrates or articles impacted the sandpaper. Glass which survived all drops to a drop height of 220 cm are then dropped on 30 grit sandpaper from the same height intervals until failure occurs. The average drop height is shown in Table 9. The incremental drop test provides a rough evaluation of the glass performance when repeatedly damaged.

In four-point bending, samples of each of the glass substrates or articles were subjected to a bending load of 5 mm/minute, using an 18 mm load span and 36 mm support span, with tape on the side of compression, and Teflon surface in contact with the side of the sample in tension, and samples were tested until failure. Samples that failed under the loading knife were not considered.

In Vicker's indentation threshold testing, samples of the glass substrates and articles were repeatedly indented with a diamond tip (at 136° angle) at increasing loads. Each indentation has the potential to produce 4 radial cracks, one from each corner of the indent. By counting the average number of radial cracks at each indentation load, the cracking threshold can be defined by the load at which there is an average of 2 cracks per indent (or the 50% cracking threshold).

In Knoop scratch threshold testing, samples of the glass substrates and articles were first scratched with a Knoop indenter under a dynamic or ramped load to identify the lateral crack onset load range for the sample population. Once the applicable load range is identified, a series of increasing constant load scratches (3 minimum or more per load) are performed to identify the Knoop scratch threshold. The Knoop scratch threshold range can be determined by comparing the test specimen to one of the following 3 failure modes: 1) sustained lateral surface cracks that are more than two times the width of the groove, 2) damage is contained within the groove, but there are lateral surface cracks that are less than two times the width of groove and there is damage visible by naked eye, or 3) the presence of large subsurface lateral cracks which are greater than two times the width of groove and/or there is a median crack at the vertex of the scratch.

TABLE 9

Mechanical performance of the unstrengthened glass substrate of Example 2, and the glass articles of Examples 2A-1, 2A-2, 2B-1, 2B-2, 2C-1 and 2C-2 and Comparative Example 2D.

| | 180 grit drop (cm) | 30 grit drop (cm) | 4-PB (MPa) | Vicker's (N) | Knoop (N) |
|---|---|---|---|---|---|
| Unstrengthened glass substrate of Example 2 | — | — | 173 | <2 | 6-8 |
| Comparative Example 2D (chemically strengthened only, at 420° C. for 5.5 hours) | 86 | 24 | 683 | 40-50 | 4-6 |
| Example 2A-1 (thermally strengthened only at T$_0$ = 800° C., h = 0.058) | 196 | 117 | 296 | 20-30 | 4-6 |

TABLE 9-continued

Mechanical performance of the unstrengthened glass substrate of Example 2, and the glass articles of Examples 2A-1, 2A-2, 2B-1, 2B-2, 2C-1 and 2C-2 and Comparative Example 2D.

| | 180 grit drop (cm) | 30 grit drop (cm) | 4-PB (MPa) | Vicker's (N) | Knoop (N) |
|---|---|---|---|---|---|
| Example 2A-2 (thermally strengthened at $T_0$ = 800° C., h = 0.058, and chemically strengthened at 410° C. for 10 min) | 204 | 176 | 717 | 150-200 | 12-14 |
| Example 2B-1 (thermally strengthened only at $T_0$ = 800° C., h = 0.028) | 182 | 120 | 290 | 4-6 | 4-6 |
| Example 2B-2 (thermally strengthened at $T_0$ = 800° C., h = 0.028, and chemically strengthened at 410° C. for 10 min) | 220 | 152 | 661 | 150-200 | 10-12 |
| Example 2C-1 (thermally strengthened only at $T_0$ = 800° C., h = 0.013) | | | | <2 | 4-6 |
| Example 2C-2 (thermally strengthened at $T_0$ = 800° C., h = 0.013, and chemically strengthened at 410° C. for 10 min) | | | | 100-150 | 8-10 |

Example 3

Glass substrates having the same composition as the glass substrates of Example 1 and having a thickness of about 0.7 mm were thermally strengthened at various heat transfer rates and then chemically strengthened, as shown in Table 10.

Specifically, Example 3A-1 included a thermally glass article that was heated to a $T_0$ of about 800° C. and then quenched at h=0.073 cal/cm$^2$-s-° C. Examples 3A-2 through 3A-4 included glass articles that included the same glass substrate and were thermally strengthened in the same manner as Example 3A-1, but were then chemically strengthened by ion-exchange by immersing in a molten salt bath of 100% KNO$_3$ having a temperature of 410° C. for various times between 10 minutes and 1 hour, according to Table 10.

TABLE 10

Thermal strengthening and chemical strengthening conditions for Examples 3A-1 through 3A-4.

| | Thermal strengthening conditions ($T_0$, h) | Chemical strengthening duration |
|---|---|---|
| Ex. 3A-1 | $T_0$ = 800° C. h = 0.073 cal/cm$^2$-s-° C. | None |
| Ex. 3A-2 | $T_0$ = 800° C. h = 0.073 cal/cm$^2$-s-° C. | 10 minutes |
| Ex. 3A-3 | $T_0$ = 800° C. h = 0.073 cal/cm$^2$-s-° C. | 15 minutes |
| Ex. 3A-4 | $T_0$ = 800° C. h = 0.073 cal/cm$^2$-s-° C. | 30 minutes |

Comparative Example 3B included the same glass substrate but was subjected only to a known chemical strengthening process (and not thermally strengthened) including immersion in a 100% KNO$_3$ molten salt bath having a temperature of 420° C. for 5.5 hours. The CS, CT, DOL and DOC values (as an absolute measurement and as a percentage of the glass article thickness) of all the resulting glass articles were measured and are shown in Table 11. As shown in Table 11, Comparative Example 3B exhibited a DOL of about 45 micrometers and a surface CS of about 710 MPa. By selecting the instant chemical strengthening conditions, the thermally strengthened and chemically strengthened glass articles of Examples 3A-1 through 3A-4 exhibit comparable surface CS values as Comparative Example 3B, but from a significantly shorter immersion (or chemical strengthening duration), while also exhibiting a total DOC that is many times larger than achievable by a chemical strengthening process alone.

TABLE 11

Measured properties of the resulting thermally and chemically strengthened glass articles of Example 3A-1 through 3A-4, and Comparative Example 3B.

| Example | CS (MPa) | CT (MPa) | DOL (in μm) | DOC (in μm) | DOC as % of article thickness |
|---|---|---|---|---|---|
| Ex. 3A-1 | 122 | 63 | 0 | 172 | 24.9 |
| Ex. 3A-2 | 737 | 49 | 7.6 | 155 | 22.4 |
| Ex. 3A-3 | 742 | 48 | 10.5 | 135 | 19.5 |
| Ex. 3A-4 | 728 | 52 | 14.1 | 142 | 20.5 |
| Comparative Ex. 3B | 710 | 43 | 44.8 | 44.8 | 6.5 |

The glass substrates (prior to being thermally and/or chemically strengthened) of Example 3, the thermally strengthened glass articles of Examples 3A-1 and 3A-2, and the chemically strengthened glass article of Comparative Example 3B were compared in terms of mechanical performance. Specifically, samples of these glass substrates or articles were subjected to an incremental drop test (using two different types of sandpaper drop surfaces) a four-point bend test, a Vicker's indentation threshold test and a Knoop scratch threshold test, as described above in Example 2. The results of each test are shown in Table 12.

TABLE 12

Mechanical performance of the unstrengthened glass substrate of Example 3, and the glass articles of Examples 3A-1 and 3A-2, and Comparative Example 3B.

| | 180 grit drop (cm) | 4-PB (MPa) | Vicker's (N) | Knoop (N) |
|---|---|---|---|---|
| Unstrengthened glass substrate of Example 3 | — | 121 | 4-6 | 2-4 |
| Comparative Example 3B (chemically strengthened only, at 420° C. for 5.5 hours) | 62 | 578 | 70-80 | 4-6 |
| Example 3A-1 (thermally strengthened only at $T_0 = 800°$ C., h = 0.073) | 116 | 267 | 20-30 | 4-6 |
| Example 3A-2 (thermally strengthened at $T_0 = 800°$ C., h = 0.058, and chemically strengthened at 410° C. for 10 min) | 104 | 628 | 150-200 | 10-12 |

Example 4

Glass substrates having the same composition as the glass substrates of Example 1 and having a thickness of about 0.55 mm were thermally strengthened at various heat transfer rates and then chemically strengthened, as shown in Table 13.

Specifically, Example 4A-1 included a thermally strengthened glass article that was heated to a $T_0$ of about 800° C. and then quenched at h=0.084 cal/cm$^2$-s-° C. Examples 4A-2 through 4A-5 included glass articles that included the same glass substrate and were thermally strengthened in the same manner as Example 4A-1, but were then chemically strengthened by ion-exchange by immersing in a molten salt bath of 100% KNO$_3$ having a temperature of 410° C. for various times between 10 minutes and 1 hour, according to Table 13.

TABLE 13

Thermal strengthening and chemical strengthening conditions for Examples 4A-1 through 4A-5.

| | Thermal strengthening conditions ($T_0$, h) | Chemical strengthening duration |
|---|---|---|
| Ex. 4A-1 | $T_0 = 800°$ C. <br> h = 0.084 cal/cm$^2$-s-° C. | None |
| Ex. 4A-2 | $T_0 = 800°$ C. <br> h = 0.084 cal/cm$^2$-s-° C. | 10 minutes |
| Ex. 4A-3 | $T_0 = 800°$ C. <br> h = 0.084 cal/cm$^2$-s-° C. | 15 minutes |
| Ex. 4A-4 | $T_0 = 800°$ C. <br> h = 0.084 cal/cm$^2$-s-° C. | 30 minutes |
| Ex. 4A-5 | $T_0 = 800°$ C. <br> h = 0.084 cal/cm$^2$-s-° C. | 60 minutes |

Comparative Example 4B included the same glass substrate but was subjected only to a known chemical strengthening process (and not thermally strengthened) including immersion in a 100% KNO$_3$ molten salt bath having a temperature of 420° C. for 5.5 hours. The CS, CT, DOL and DOC values (as an absolute measurement and as a percentage of the glass article thickness) of all the resulting glass articles were measured and are shown in Table 14. As shown in Table 14, Comparative Example 4B exhibited a DOL of about 44 micrometers and a surface CS of about 750 MPa. By selecting the instant chemical strengthening conditions, the thermally strengthened and chemically strengthened glass articles of Examples 4A-1 through 4A-5 exhibit comparable surface CS values as Comparative Example 4B, but from a significantly shorter immersion (or chemical strengthening duration), while also exhibiting a total DOC that is many times larger than achievable by a chemical strengthening process alone.

TABLE 14

Measured properties of the resulting thermally and chemically strengthened glass articles of Example 4A-1 through 4A-5, and Comparative Example 4B.

| Example | CS (MPa) | CT (MPa) | DOL (in μm) | DOC (in μm) | DOC as % of article thickness |
|---|---|---|---|---|---|
| Ex. 4A-1 | 116 | 53 | 0 | 131 | 23.7 |
| Ex. 4A-2 | 832 | 41 | 8.9 | 126 | 22.8 |
| Ex. 4A-3 | 803 | 39 | 9.7 | 119 | 21.5 |
| Ex. 4A-4 | 784 | 38 | 13.3 | 112 | 20.3 |
| Ex. 4A-5 | 770 | 38 | 19.3 | 106 | 19.2 |
| Comparative Ex. 4B | 754 | 60 | 43.6 | 43.6 | 7.9 |

The glass substrates (prior to being thermally and/or chemically strengthened) of Example 4, the thermally strengthened glass articles of Examples 4A-1 and 4A-2, and the chemically strengthened glass article of Comparative Example 4B were compared in terms of mechanical performance. Specifically, samples of these glass substrates or articles were subjected to a Vicker's indentation threshold test and a Knoop scratch threshold test, as described above in Example 2. The results of each test are shown in Table 15.

TABLE 15

Mechanical performance of the unstrengthened glass substrate of Example 4, and the glass articles of Examples 4A-1 and 4A-2, and Comparative Example 4B.

| | Vicker's (N) | Knoop (N) |
|---|---|---|
| Unstrengthened glass substrate of Example 4 | <2 | 8-10 |
| Comparative Example 4B (chemically strengthened only, at 420° C. for 5.5 hours) | 60-70 | 4-6 |
| Example 4A-1 (thermally strengthened only at $T_0 = 800°$ C., h = 0.073) | 4-6 | 2-4 |
| Example 4A-2 (thermally strengthened at $T_0 = 800°$ C., h = 0.058, and chemically strengthened at 410° C. for 10 min) | 100-150 | 4-6 |

Example 5

Glass substrates having a soda-lime silicate composition and having a thickness of about 1.1 mm were thermally strengthened at various heat transfer rates and then chemically strengthened, as shown in Table 16.

Specifically, Example 5A-1 included a thermally strengthened glass article that was heated to a $T_0$ of about 710° C. and then quenched at h=0.086 cal/cm$^2$-s-° C. Examples 5A-2 through 5A-9 were glass articles that included the same glass substrate and were thermally strengthened in the same manner as Example 5A-1, but were then chemically strengthened by ion-exchange by immersing in a molten salt bath of 100% KNO$_3$ having a temperature in the range from about 380° C. to about 420° C. for various times between 30 minutes and 4 hours, according to Table 16.

TABLE 16

Thermal strengthening and chemical strengthening conditions for Examples 5A-1 through 5A-9.

| | Thermal strengthening conditions ($T_0$, h) | Chemical strengthening duration and temperature |
|---|---|---|
| Ex. 5A-1 | $T_0$ = 710° C.<br>h = 0.086 cal/cm$^2$-s-° C. | None |
| Ex. 5A-2 | $T_0$ = 710° C.<br>h = 0.086 cal/cm$^2$-s-° C. | 4 hours<br>380° C. |
| Ex. 5A-3 | $T_0$ = 710° C.<br>h = 0.086 cal/cm$^2$-s-° C. | 4 hours<br>390° C. |
| Ex. 5A-4 | $T_0$ = 710° C.<br>h = 0.086 cal/cm$^2$-s-° C. | 2 hours<br>400° C. |
| Ex. 5A-5 | $T_0$ = 710° C.<br>h = 0.086 cal/cm$^2$-s-° C. | 4 hours<br>400° C. |
| Ex. 5A-6 | $T_0$ = 710° C.<br>h = 0.086 cal/cm$^2$-s-° C. | 2 hours<br>410° C. |
| Ex. 5A-7 | $T_0$ = 710° C.<br>h = 0.086 cal/cm$^2$-s-° C. | 4 hours<br>410° C. |
| Ex. 5A-8 | $T_0$ = 710° C.<br>h = 0.086 cal/cm$^2$-s-° C. | 2 hours<br>420° C. |
| Ex. 5A-9 | $T_0$ = 710° C.<br>h = 0.086 cal/cm$^2$-s-° C. | 4 hours<br>420° C. |

The CS, CT, DOL and DOC values (as an absolute measurement and as a percentage of the glass article thickness) of all the resulting glass articles were measured and are shown in Table 17. As shown in Table 17, by selecting the instant chemical strengthening conditions, the thermally strengthened and chemically strengthened glass articles of Examples 5A-2 through 5A-9 exhibit high surface CS values from a relatively short immersion (or chemical strengthening duration), while also exhibiting a total DOC that is greater than 19% and even greater than 21% of the thickness (i.e., greater than 0.19·t or greater than about 0.21·t) of the glass article.

TABLE 17

Measured properties of the resulting thermally and chemically strengthened glass articles of Example 5A-1 through 5A-9.

| Example | CS (MPa) | CT (MPa) | DOL (in μm) | DOC (in μm) | DOC as % of article thickness |
|---|---|---|---|---|---|
| Ex. 5A-1 | 188 | 89 | 0 | 234 | 21.7 |
| Ex. 5A-2 | 700 | 48 | 5.5 | 227 | 21.0 |
| Ex. 5A-3 | 643 | 39 | 6.1 | 217 | 20.1 |
| Ex. 5A-4 | 665 | 36 | 5.7 | 224 | 20.7 |
| Ex. 5A-5 | 574 | 33 | 7.3 | 216 | 20.0 |
| Ex. 5A-6 | 623 | 32 | 6.0 | 226 | 20.9 |
| Ex. 5A-7 | 556 | 28 | 8.5 | 212 | 19.6 |
| Ex. 5A-8 | 603 | 25 | 6.4 | 217 | 20.1 |
| Ex. 5A-9 | 538 | 24 | 9.2 | 213 | 19.7 |

Figure 16:
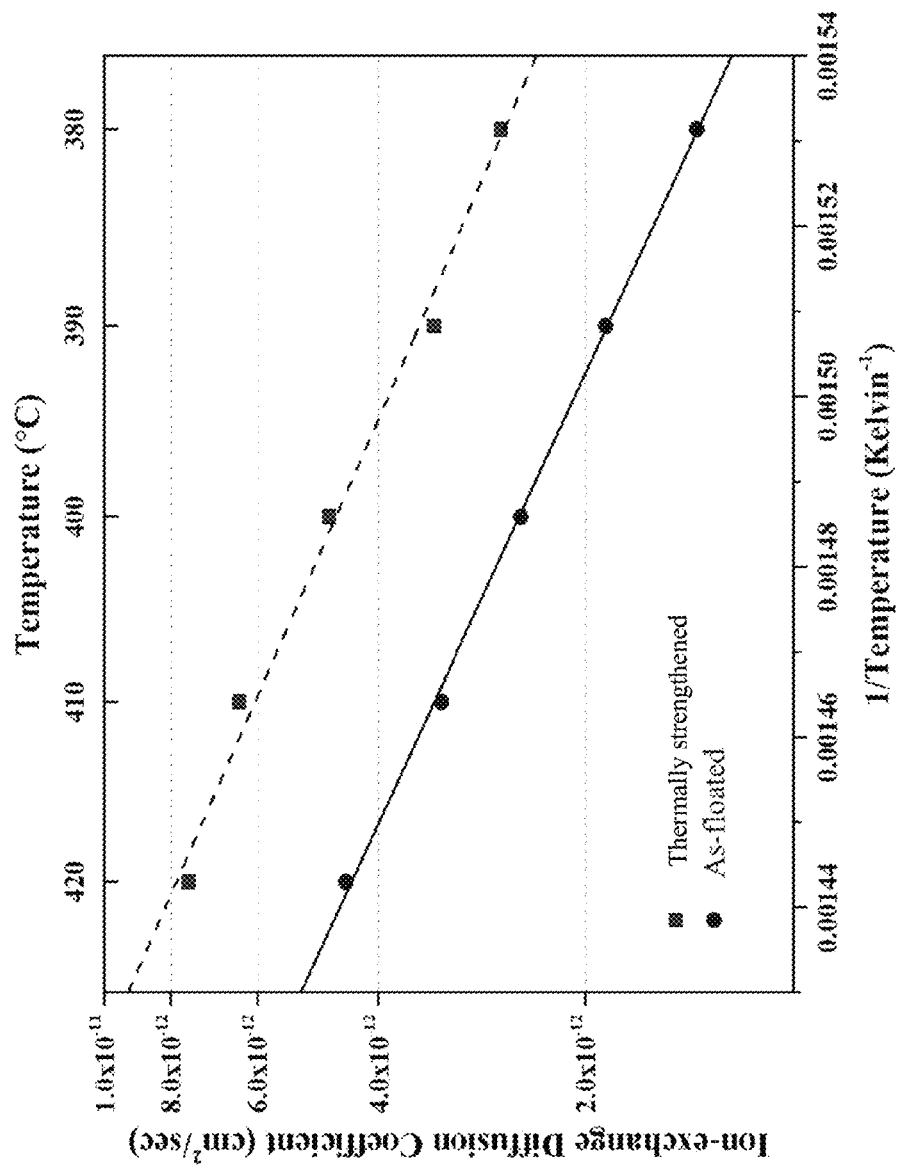
FIG. 16 is a graph showing the ion exchange diffusion coefficient for Example 5, a function of temperature.

The ion exchange diffusion coefficients (in units of cm$^2$/second) were estimated from the equation DOL=2*1.4*SQRT(D·t) or 2*1.4*√(D·t), where D is the diffusion coefficient, using stress data obtained from FSM (and the DOL information from Table 17). The ion-exchange diffusion coefficient of the same the glass substrate before thermal strengthening and in the as-float conditions (Tf of approximately 550° C.) was also estimated by the same method and equation. The results of the comparison are shown in Table 18 and FIG. 16. As shown in Table 18 and FIG. 16, at any given temperature, the ion exchange diffusion coefficient of the soda-lime glass substrate has been increased by a factor of 2 after the glass substrate has been thermally strengthened, as described herein.

TABLE 18

Ion exchange diffusion coefficient of the glass substrates and thermally strengthened glass articles of Example 5.

| Ion Exchange Temperature (° C.) | As-Floated ($T_f \approx$ 550° C.) | After Thermally Strengthening (h = 0.086 and $T_f \approx$ 660° C.) |
|---|---|---|
| 380 | 1.38 × 10$^{-12}$ | 2.65 × 10$^{-12}$ |
| 390 | 1.87 × 10$^{-12}$ | 3.33 × 10$^{-12}$ |
| 400 | 2.48 × 10$^{-12}$ | 4.72 × 10$^{-12}$ |
| 410 | 3.24 × 10$^{-12}$ | 6.38 × 10$^{-12}$ |
| 420 | 4.46 × 10$^{-12}$ | 7.55 × 10$^{-12}$ |

Example 6

Glass substrates having a nominal composition of 57.5 mol % SiO$_2$, 16.5 mol % Al$_2$O$_3$, 16 mol % Na$_2$O, 2.8 mol % MgO and 6.5 mol % P$_2$O$_5$, and having a thickness of about 0.8 mm were thermally strengthened at various heat transfer rates and then chemically strengthened, as shown in Table 19.

Specifically, Example 6A-1 included a thermally strengthened glass article that was heated to a $T_0$ of about 830° C. and then quenched at h=0.025 cal/cm$^2$-s-° C., Example 6B-1 included a thermally strengthened glass article that was heated to a $T_0$ of about 830° C. and then quenched at h=0.045 cal/cm$^2$-s-° C., and Example 6C-1 included a thermally strengthened glass article that was heated to a $T_0$ of about 830° C. and then quenched at h=0.080 cal/cm$^2$-s-° C. Examples 6A-2 through 6A-4, 6B-2 through 6B-4, and 6C-2 through 6C-4 included glass articles that included the same glass substrate and were thermally strengthened in the same manner as Examples 6A-1, 6B-1 and 6C-1, respectively, but were then chemically strengthened by ion-exchange by immersing in a molten salt bath of 100% KNO$_3$ having a temperature of about 390° C. for 15 minutes, 30 minutes and 60 minutes, according to Table 19.

TABLE 19

Thermal strengthening and chemical strengthening conditions for Example 6.

| | Thermal strengthening conditions ($T_0$, h) | Chemical strengthening duration and temperature |
|---|---|---|
| Ex. 6A-1 | $T_0$ = 830° C.<br>h = 0.025 cal/cm$^2$-s-° C. | None |
| Ex. 6A-2 | $T_0$ = 830° C.<br>h = 0.025 cal/cm$^2$-s-° C. | 15 minutes<br>390° C. |
| Ex. 6A-3 | $T_0$ = 830° C.<br>h = 0.025 cal/cm$^2$-s-° C. | 30 minutes<br>390° C. |
| Ex. 6A-4 | $T_0$ = 830° C.<br>h = 0.025 cal/cm$^2$-s-° C. | 60 minutes<br>390° C. |
| Ex. 6B-1 | $T_0$ = 830° C.<br>h = 0.045 cal/cm$^2$-s-° C. | None |
| Ex. 6B-2 | $T_0$ = 830° C.<br>h = 0.045 cal/cm$^2$-s-° C. | 15 minutes<br>390° C. |
| Ex. 6B-3 | $T_0$ = 830° C.<br>h = 0.045 cal/cm$^2$-s-° C. | 30 minutes<br>390° C. |
| Ex. 6B-4 | $T_0$ = 830° C.<br>h = 0.080 cal/cm$^2$-s-° C. | 60 minutes<br>390° C. |
| Ex. 6C-1 | $T_0$ = 830° C.<br>h = 0.080 cal/cm$^2$-s-° C. | None |
| Ex. 6C-2 | $T_0$ = 830° C.<br>h = 0.080 cal/cm$^2$-s-° C. | 15 minutes<br>390° C. |
| Ex. 6C-3 | $T_0$ = 830° C.<br>h = 0.080 cal/cm$^2$-s-° C. | 30 minutes<br>390° C. |
| Ex. 6C-4 | $T_0$ = 830° C.<br>h = 0.080 cal/cm$^2$-s-° C. | 60 minutes<br>390° C. |

Figure 17:
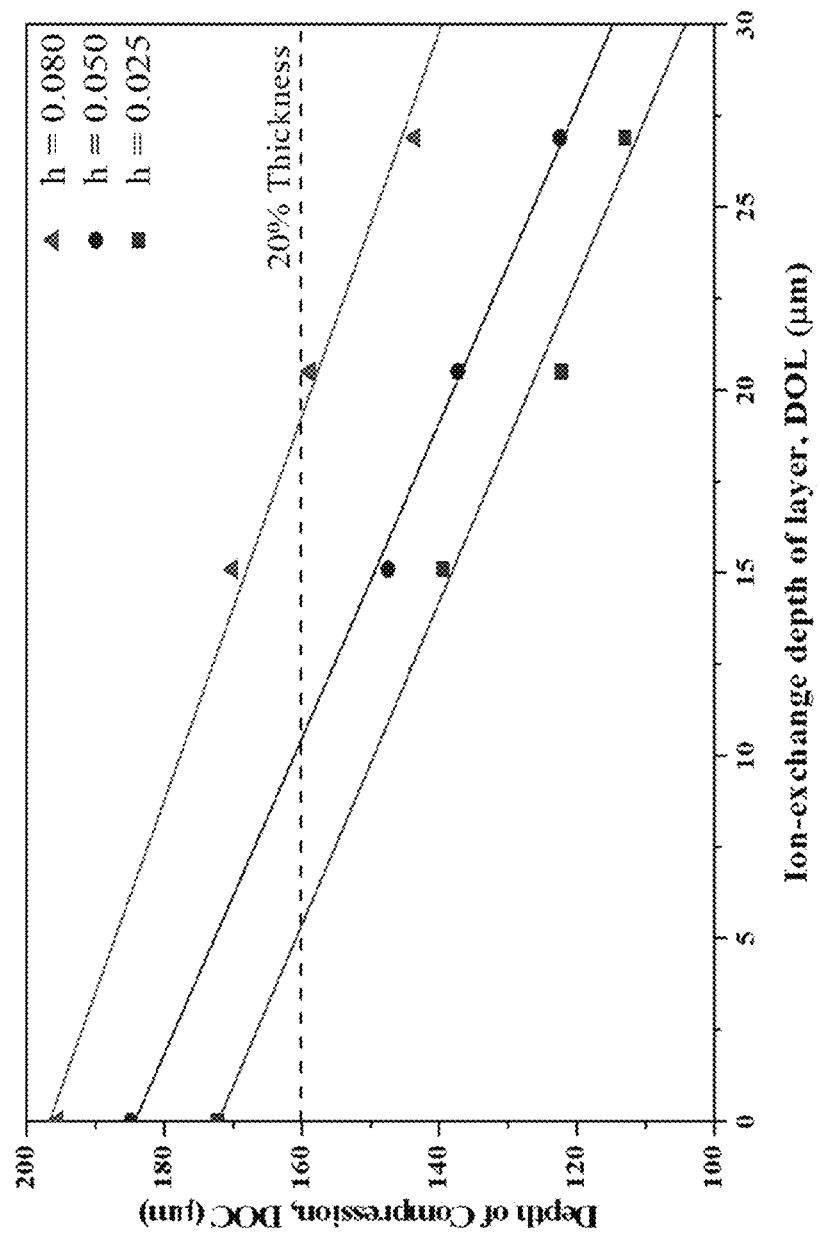
FIG. 17 is a graph showing the DOC of Example 6, as a function of the square root of ion exchange time and DOL.

The CS, CT, DOL and DOC values (as an absolute measurement and as a percentage of the glass article thickness) of all the resulting glass articles were measured and are shown in Table 20. As demonstrated in Table 20 and FIG. 17, a greater the level of thermal strengthening results in a deeper DOC, which in turn is substantially maintained even after subsequent chemical strengthening. Accordingly, by thermally strengthening to a greater degree, deeper DOL values and higher surface CS values can be achieved without sacrificing DOC.

TABLE 20

Measured properties of the resulting thermally and chemically strengthened glass articles of Example 6A-1 through 6A-4, 6B-1 through 6B-4 and 6C-1 through 6C-4.

| Example | CS (MPa) | CT (MPa) | DOL (in μm) | DOC (in μm) | DOC as % of article thickness |
|---|---|---|---|---|---|
| Ex. 6A-1 | 72 | 36 | — | 172 | 21.5 |
| Ex. 6A-2 | 910 | 46 | 15.1 | 140 | 17.5 |
| Ex. 6A-3 | 880 | 49 | 20.5 | 122 | 15.3 |
| Ex. 6A-4 | 872 | 52 | 26.9 | 113 | 14.1 |
| Ex. 6B-1 | 100 | 49 | — | 185 | 23.1 |
| Ex. 6B-2 | 929 | 55 | 15.1 | 148 | 18.5 |
| Ex. 6B-3 | 887 | 57 | 20.7 | 137 | 17.1 |
| Ex. 6B-4 | 871 | 61 | 26.9 | 123 | 15.4 |
| Ex. 6C-1 | 115 | 59 | — | 196 | 24.5 |
| Ex. 6C-2 | 891 | 65 | 15.2 | 170 | 21.3 |
| Ex. 6C-3 | 878 | 67 | 20.6 | 159 | 19.9 |
| Ex. 6C-4 | 857 | 67 | 27.2 | 144 | 18.0 |

The ion exchange diffusion coefficients (in units of cm$^2$/second) were estimated from the equation DOL=2*1.4*SQRT(D·t) or 2*1.4*√(D·t), where D is the diffusion coefficient, using stress data obtained from FSM (and the DOL information from Table 19). The ion-exchange diffusion coefficient of the same glass-based substrate was also measured after the glass substrate had been annealed at the glass transition temperature 1 hour (but not thermally strengthened or chemically strengthened). The results of the comparison are shown in Table 21 and in FIG. 17. As shown in Table 21 and FIG. 17, at any given temperature the ion exchange diffusion coefficient of the glass substrate has been increased by approximately a factor of 2 after the glass has undergone thermal strengthening as described herein.

TABLE 21

Ion exchange diffusion coefficient of the glass substrates and thermally strengthened glass articles of Example 6.

| Condition | IOX Diffusion Coefficient at 390° C. (cm$^2$/sec) |
|---|---|
| Annealed | $1.48 \times 10^{-10}$ |
| After Thermally Strengthening h = 0.025 | $2.77 \times 10^{-10}$ |
| After Thermally Strengthening h = 0.050 | $2.9 \times 10^{-10}$ |
| After Thermally Strengthening h = 0.080 | $2.82 \times 10^{-10}$ |

Example 7

Glass substrates having a nominal composition of 64 mol % $SiO_2$, 15.7 mol % $Al_2O_3$, 11 mol % $Na_2O$, 6.25 mol % $Li_2O$, 1.2 mol % ZnO, and 2.5 mol % $P_2O_5$, and having a thickness of about 0.8 mm were thermally strengthened at various heat transfer rates and then chemically strengthened, as shown in Table 22.

Specifically, Example 7A-1 included a thermally strengthened glass article that was heated to a $T_0$ of about 810° C. and then quenched at h=0.078 cal/cm$^2$-s-° C. Examples 7A-2 through 7A-5 were glass articles that included the same glass substrate and were thermally strengthened in the same manner as Example 7A-1 but were then chemically strengthened by ion-exchange by immersing in a molten salt bath of 100% $KNO_3$ having a temperature of about 380° C. and 390° C. for 15 minutes and 30 minutes, according to Table 22.

TABLE 22

Thermal strengthening and chemical strengthening conditions for Example 7.

| | Thermal strengthening conditions ($T_0$, h) | Chemical strengthening duration and temperature |
|---|---|---|
| Ex. 7A-1 | $T_0$ = 810° C.<br>h = 0.078 cal/cm$^2$-s-° C. | None |
| Ex. 7A-2 | $T_0$ = 810° C.<br>h = 0.078 cal/cm$^2$-s-° C. | 15 minutes<br>380° C. |
| Ex. 7A-3 | $T_0$ = 810° C.<br>h = 0.078 cal/cm$^2$-s-° C. | 30 minutes<br>380° C. |
| Ex. 7A-4 | $T_0$ = 810° C.<br>h = 0.078 cal/cm$^2$-s-° C. | 15 minutes<br>390° C. |
| Ex. 7A-5 | $T_0$ = 810° C.<br>h = 0.078 cal/cm$^2$-s-° C. | 30 minutes<br>390° C. |

The CS, CT, DOL and DOC values (as an absolute measurement and as a percentage of the glass article thickness) of all the resulting glass articles were measured and are shown in Table 23. As demonstrated in Table 23, by choosing the appropriate chemical strengthening conditions, a surface CS in excess of 1 GPa and DOC of more than 20% of the thickness can be achieved. In addition, the resulting thermally and chemically strengthened glass articles were not frangible when broken.

TABLE 23

Measured properties of the resulting thermally and chemically strengthened glass articles of Example 7A-1 through 7A-5.

| Example | CS (MPa) | CT (MPa) | DOL (in μm) | DOC (in μm) | DOC as % of article thickness |
|---|---|---|---|---|---|
| Ex. 7A-1 | 128 | 64 | 0 | 198 | 24.4 |
| Ex. 7A-2 | 1009 | 72 | 6.0 | 167 | 20.6 |
| Ex. 7A-3 | 1018 | 70 | 7.3 | 163 | 20.1 |
| Ex. 7A-4 | 1043 | 63 | 6.3 | 161 | 19.9 |
| Ex. 7A-5 | 1055 | 77 | 7.9 | 150 | 18.6 |

Figure 18:
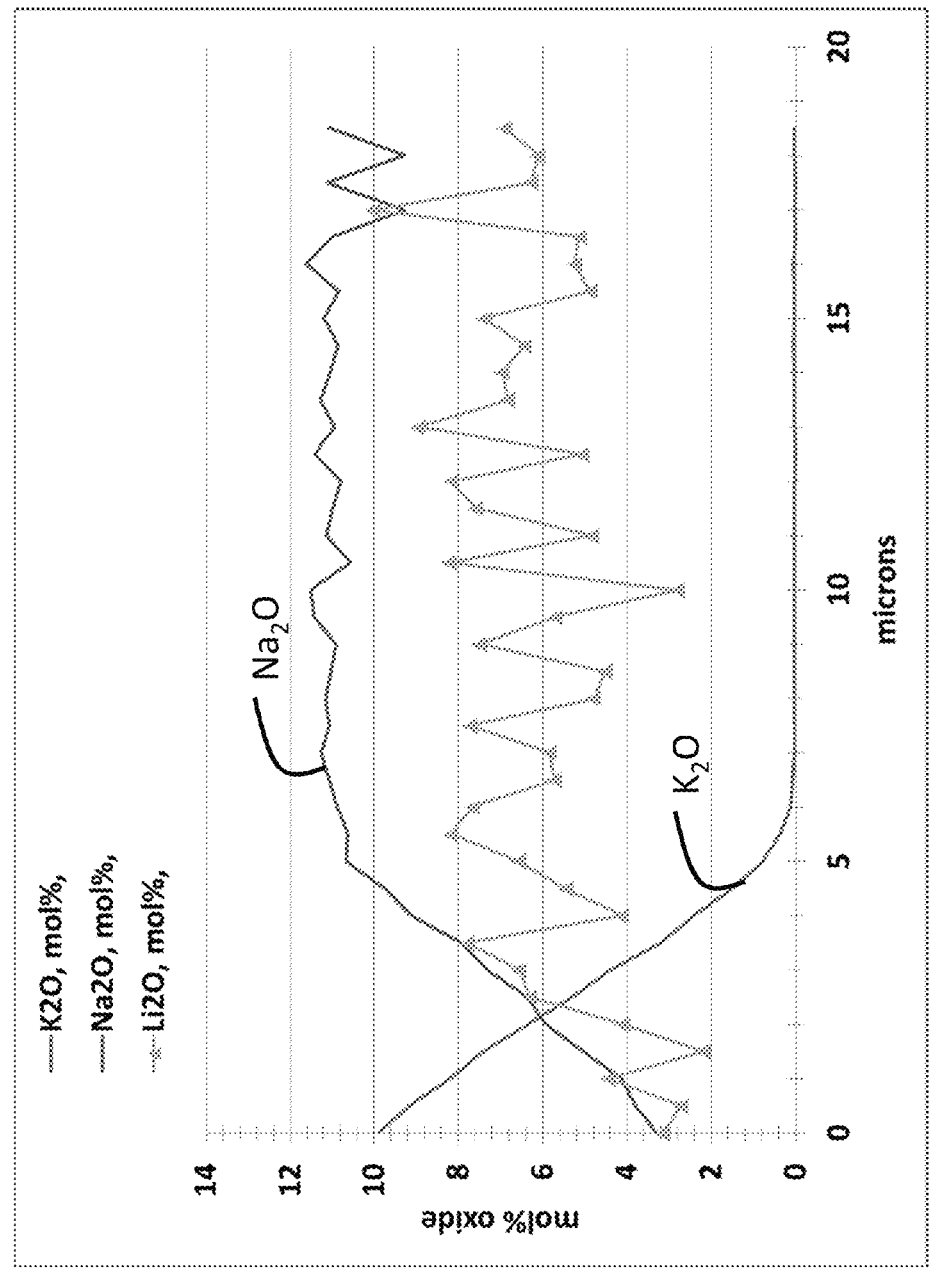
FIG. 18 is a graph showing the concentration of $Na_2O$ and $K_2O$ in mol % of Example 7A-3, as a function of depth.
Figure 19:
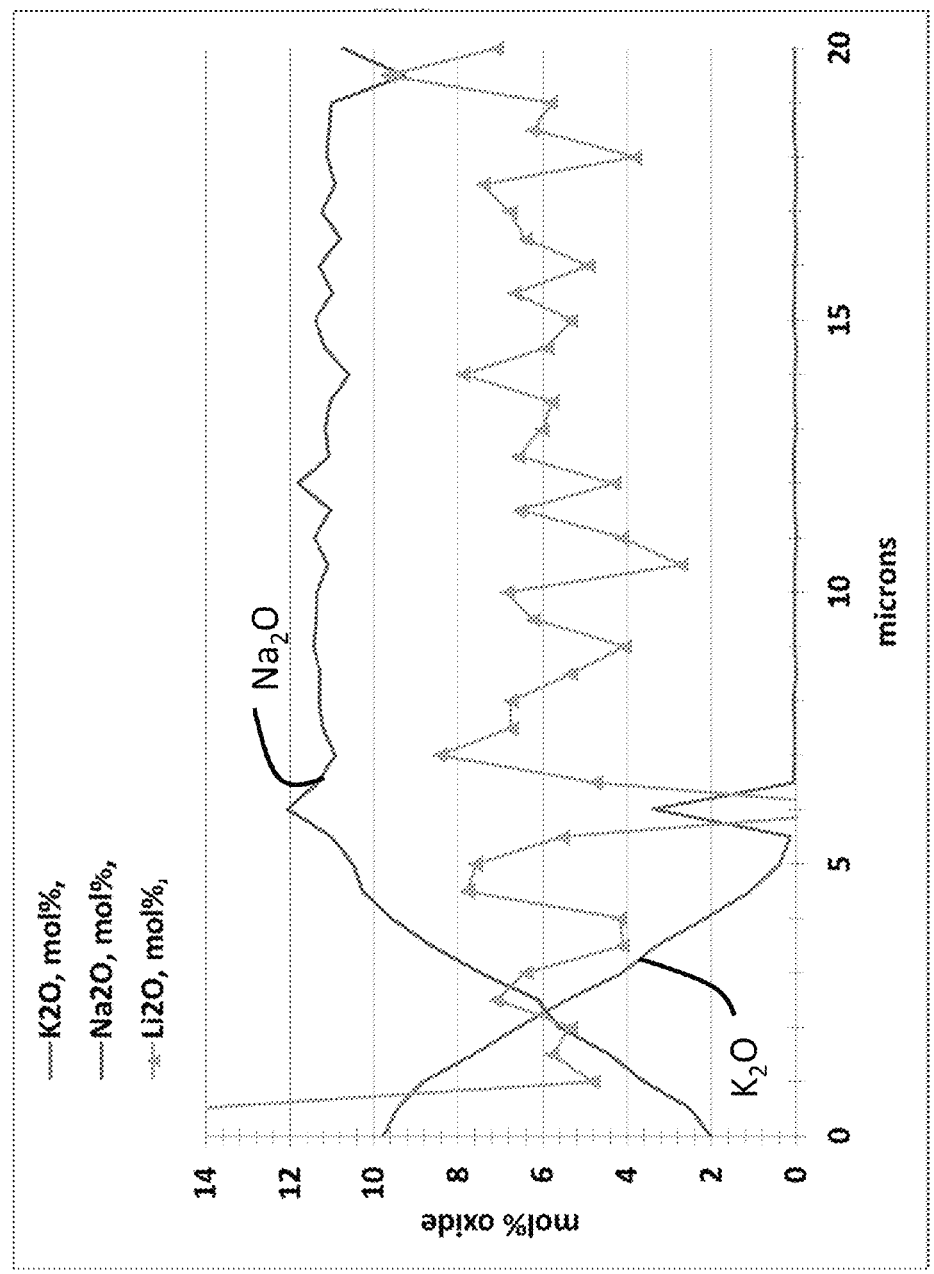
FIG. 19 is a graph showing the concentration of $Na_2O$ and $K_2O$ in mol % of Example 7A-4 as a function of depth.
Figure 20:
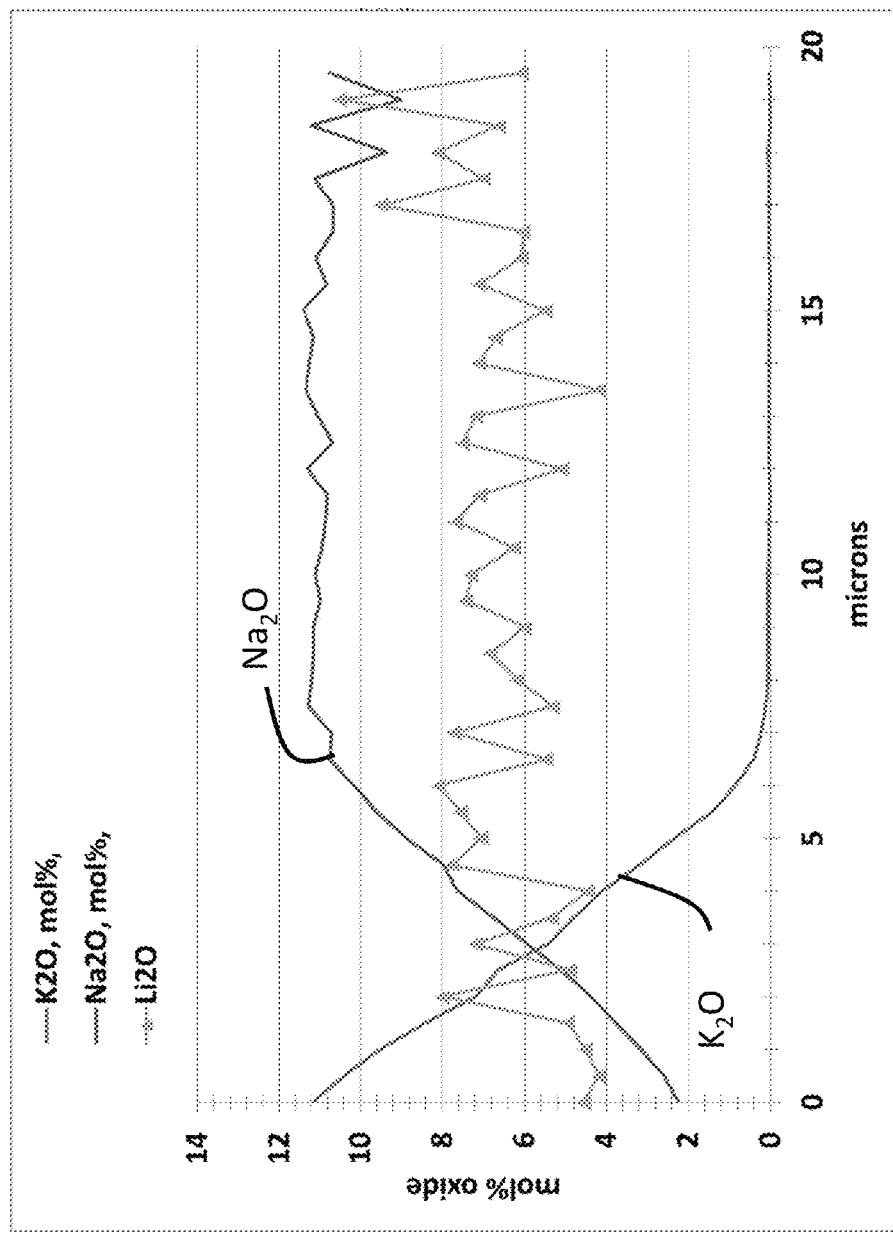
FIG. 20 is a graph showing the concentration of $Na_2O$ and $K_2O$ in mol % of Example 7A-5, as a function of depth.
Figure 21:
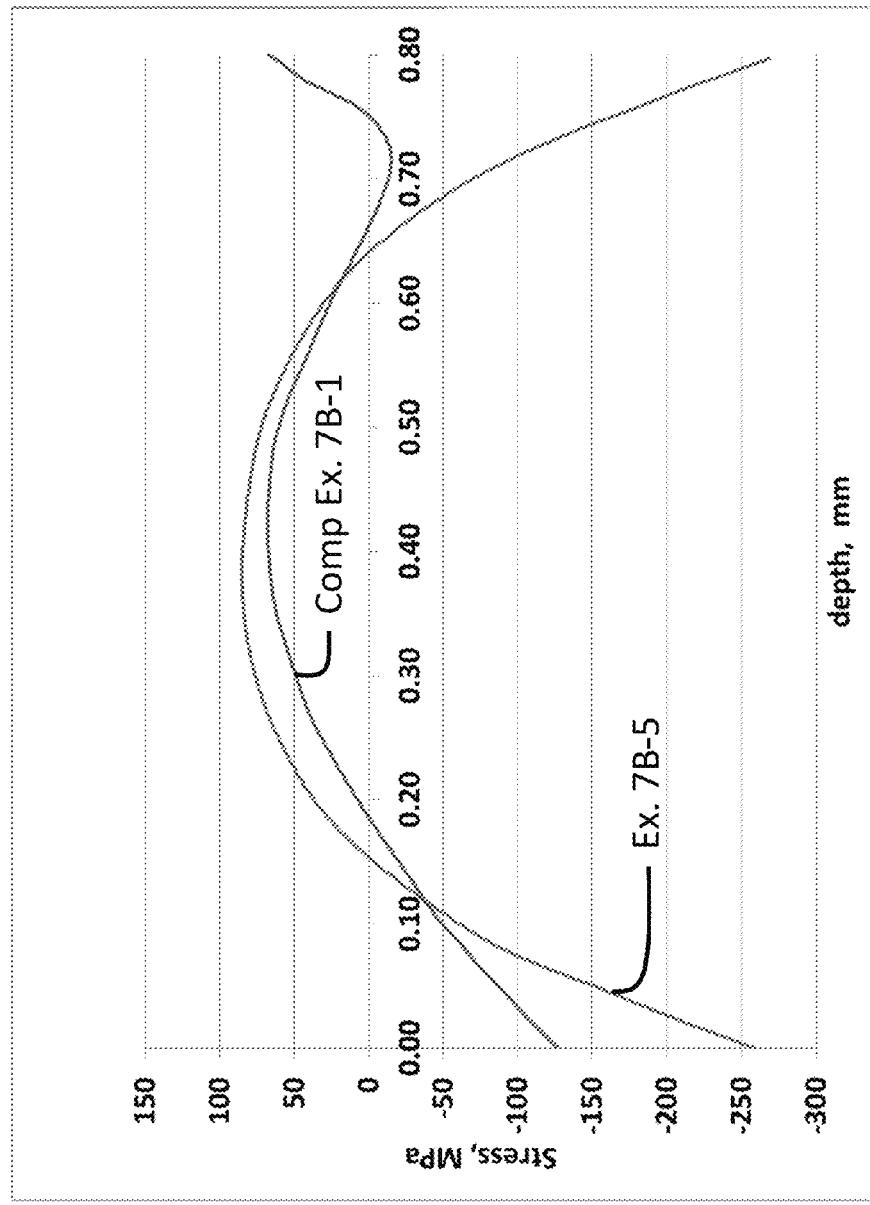
FIG. 21 is a graph showing stress profiles of Comparative Example 7B-1 and Examples 7B-5.
Figure 22:
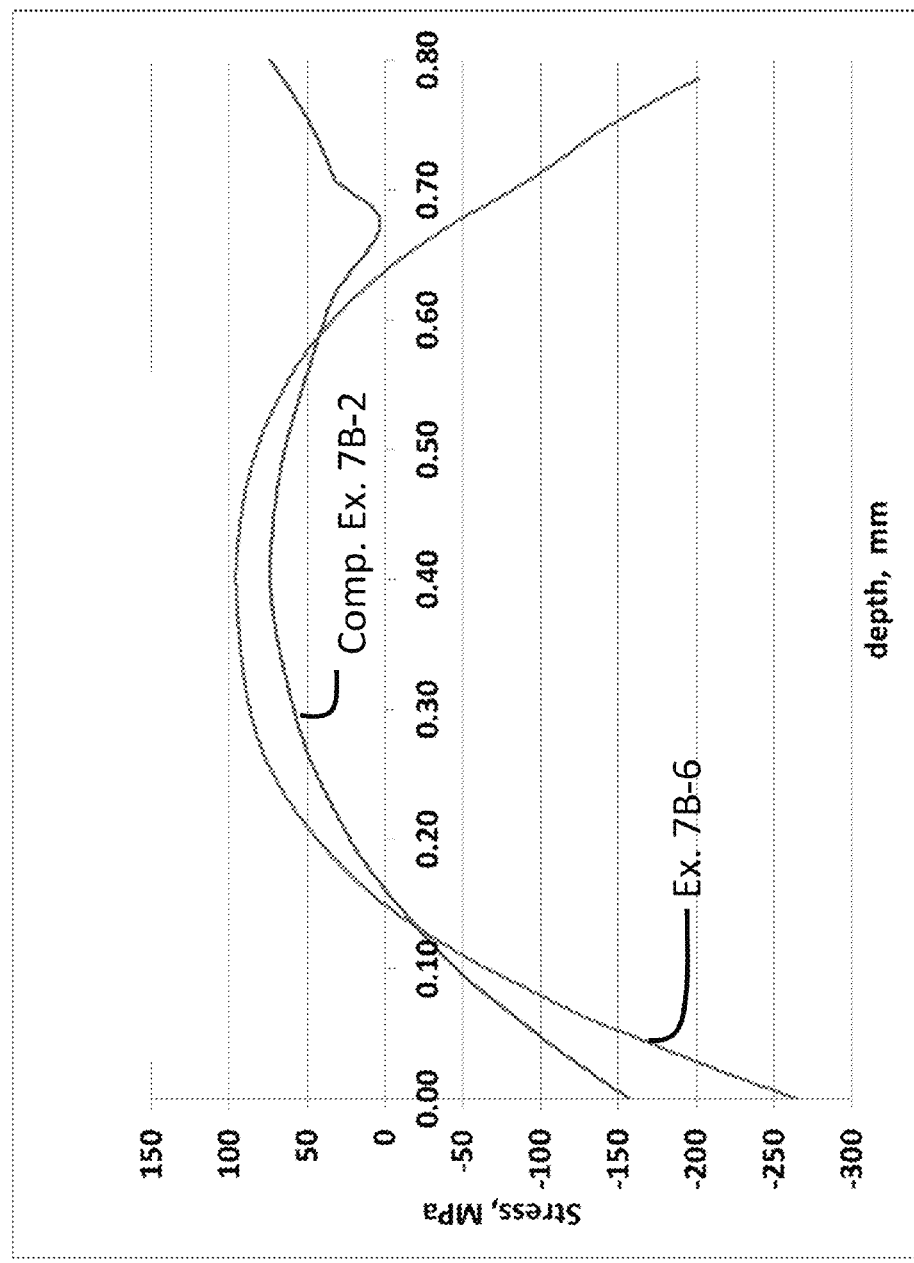
FIG. 22 is a graph showing stress profiles of Comparative Example 7B-2 and Examples 7B-6.
Figure 23:
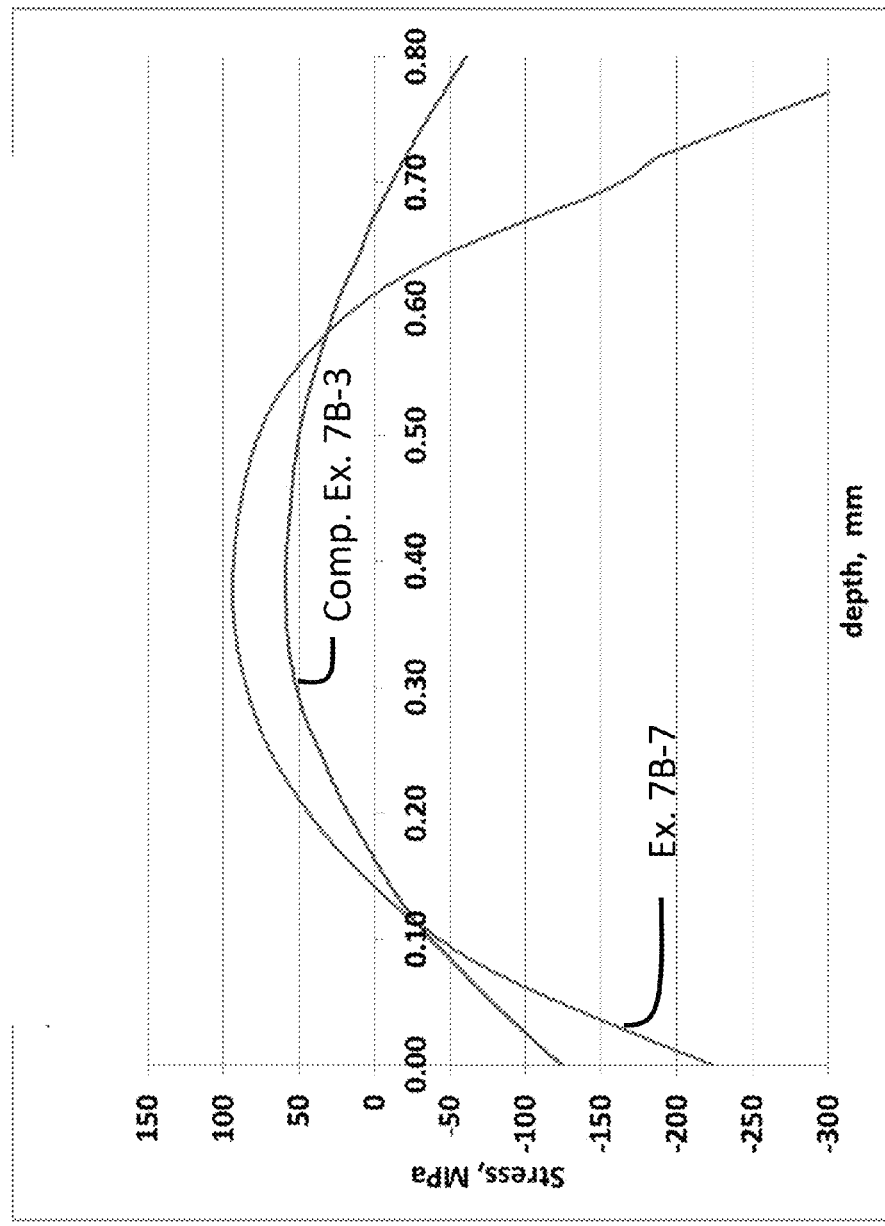
FIG. 23 is a graph showing stress profiles of Comparative Example 7B-3 and Examples 7B-7.
Figure 24:
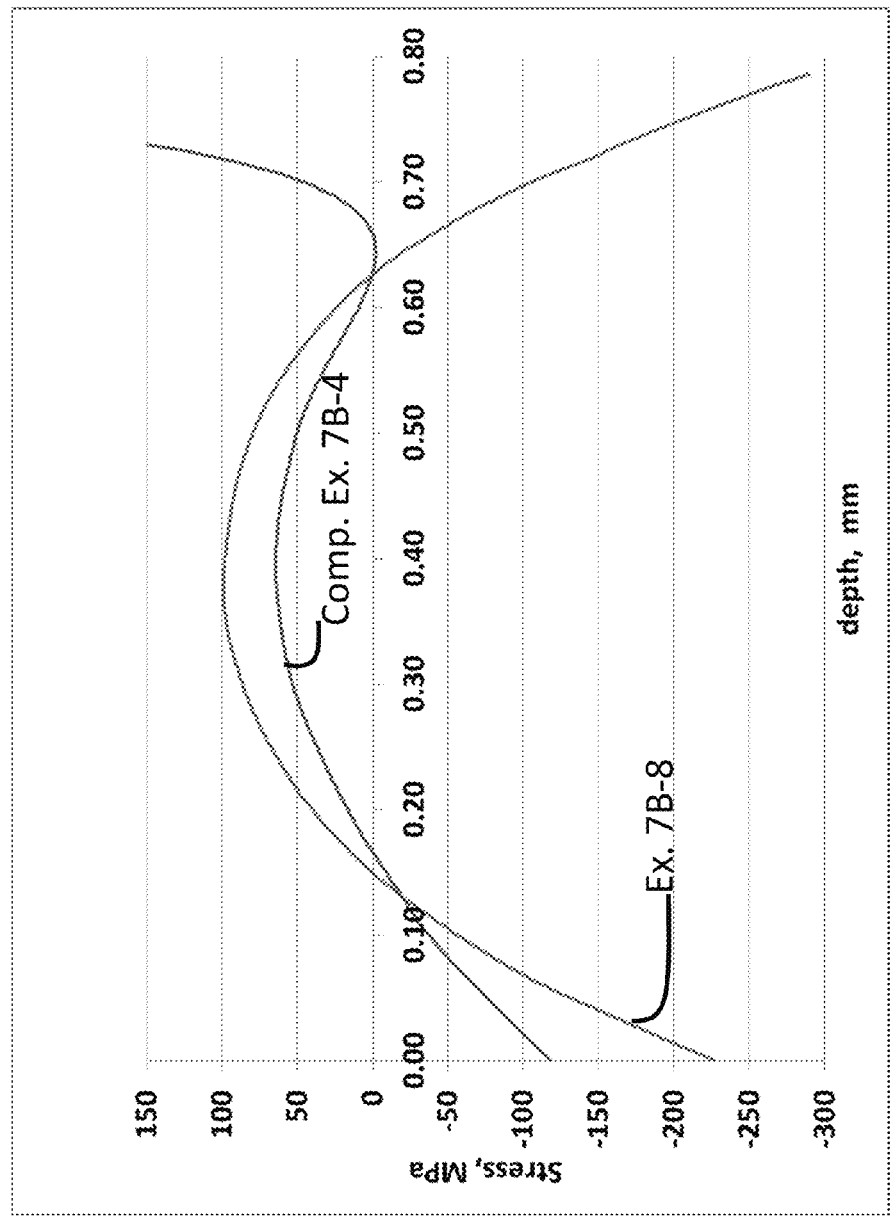
FIG. 24 is a graph showing stress profiles of Comparative Example 7B-4 and Examples 7B-8.

The $K_2O$, $Na_2O$ and $Li_2O$ concentration as a function of depth of the thermally and chemically strengthened glass articles of Example 7A-3, 7A-4 and 7A-5 were analyzed by microprobe. The results are shown in FIGS. 18, 19, and 20, respectively, which show a high concentration of $K_2O$ at the surface that decreases to about a depth of 6 micrometers (FIG. 18), 5.5 micrometers (FIG. 19) and 7.5 micrometers (FIG. 20). The concentration of $Na_2O$ increases correspondingly to the decrease in $K_2O$.

Glass substrates having a nominal composition of 64 mol % $SiO_2$, 15.7 mol % $Al_2O_3$, 11 mol % $Na_2O$, 6.25 mol % $Li_2O$, 1.2 mol % ZnO, and 2.5 mol % $P_2O_5$, and having a thickness of about 0.8 mm were thermally strengthened according the same conditions as Example 7A-1 to provide Comparative Examples 7B-1 through 7B-4. Examples 7A-5 through 7A-8 were glass articles that included the same glass substrates and were thermally strengthened in the same manner as Comparative Examples 7B-1 through 7B-4, but were then chemically strengthened in a mixed molten salt bath including 80% $KNO_3$ and 20% $NaNO_3$ and having a temperature of 390° C. for 0.35 hours (to provide Ex. 7B-5), 1 hour (to provide Ex. 7B-6), 1.5 hours (to provide Ex. 7B-7), and 2 hours (to provide Ex. 7B-8). The stress profiles of Comparative Examples 7B-1 through 7B-4 and Examples 7B-5 through 7B-8 were analyzed by SCALP and shown in FIGS. 21-24. As shown in FIGS. 21-24, the surface CS value can be increased by more than 100 MPa while still maintaining a deep DOC (or minimizing decreases in DOC), by chemically strengthening the thermally strengthened glass articles. Without being bound by theory, the unique properties of the thermally strengthened glass articles permit chemical strengthening in such a manner and the resulting properties in terms of stress profiles (CS, CT, DOL and DOC).

Figure 25:
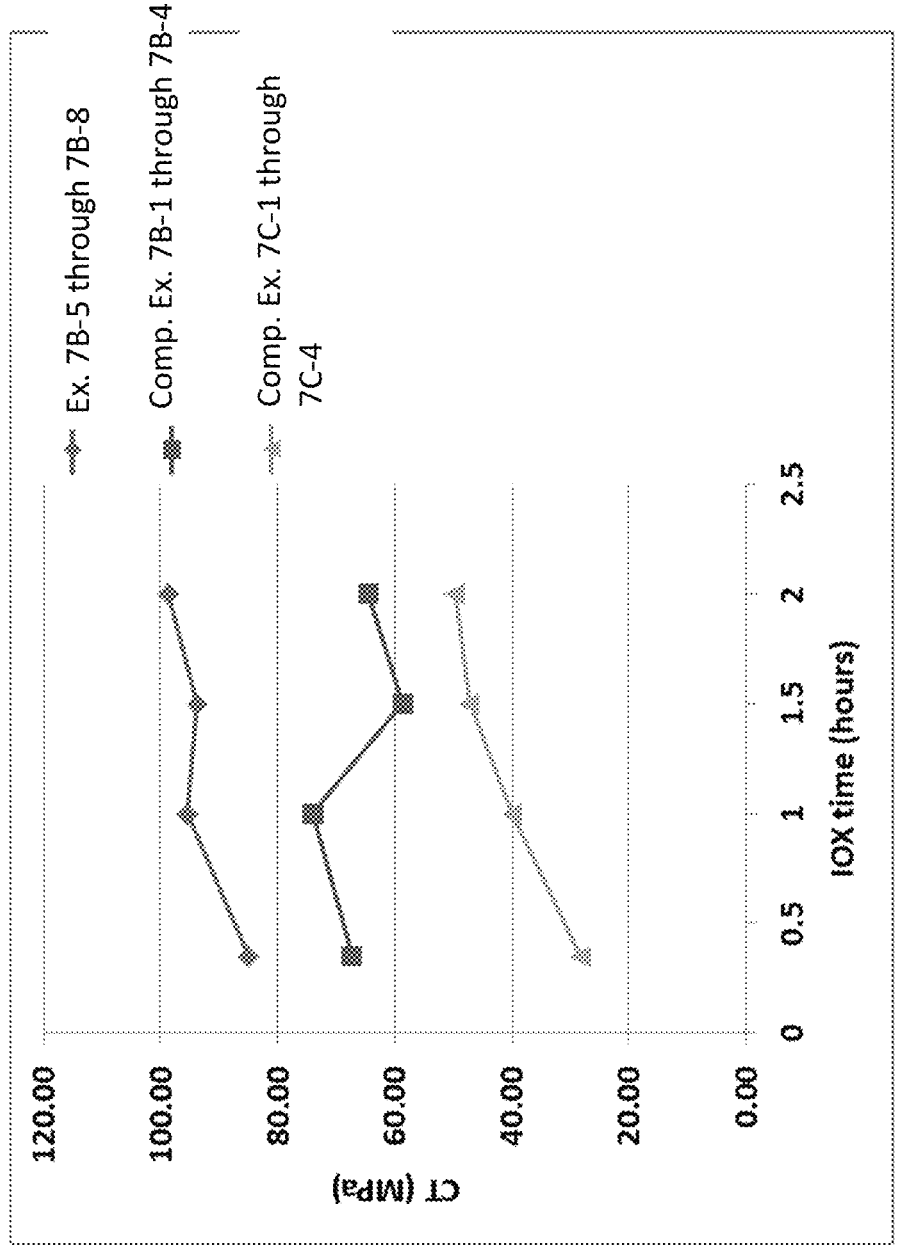
FIG. 25 is a graph showing the CT values as a function of chemical strengthening duration of Comparative Examples 8B-1 through 7B-4, Comparative Examples 7C-1 through 7C-4 and Examples 7B-5 through 7B-8.
Figure 26:
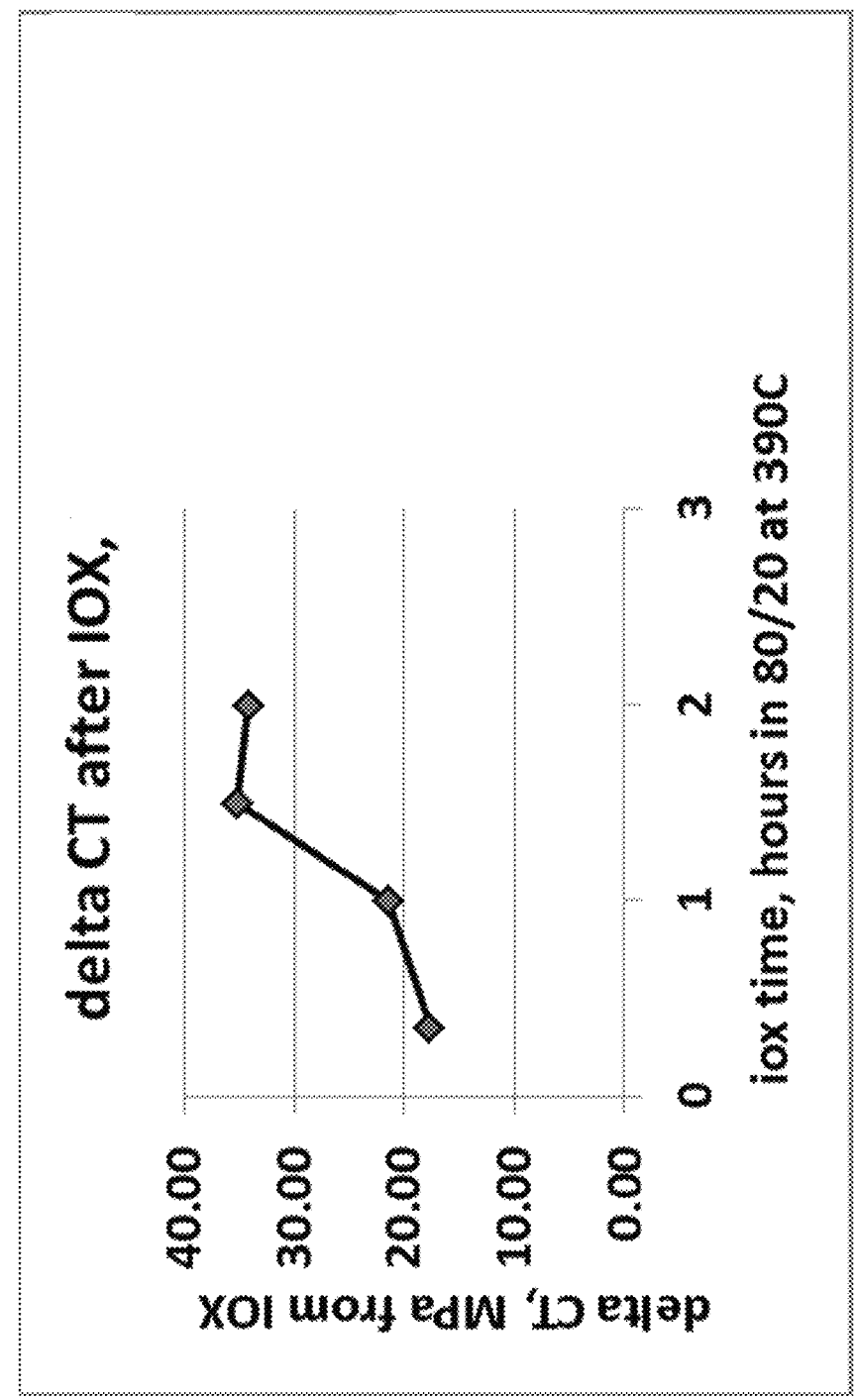
FIG. 26 is a graph plotting the change in CT as a function of chemical strengthening duration between Comparative Example 7B-1 and Example 7B-5, between Comparative Example 7B-2 and Example 7B-6, between Comparative Example 7B-3 and Example 7B-7, between Comparative Example 7B-4 and Example 7B-8.

Glass substrates having the same composition and thickness as Examples 7B-1 through 7B-8 were not thermally strengthened but were only chemically strengthened by immersing in a molten salt bath of 80% $KNO_3$ and 20% NaNO3 and having a temperature of 390° C. for 0.35 hours (Comparative Example 7C-1), 1 hour (Comparative Example 7C-2), 1.5 hours (Comparative Example 7C-3) and 2 hours (Comparative Example 7C-4). The resulting CT was plotted in FIG. 25, along with the CT of each of the thermally strengthened samples of Comparative Examples 7B-1 through 7B-4, and each of thermally and chemically strengthened Examples 7B-5 through 7B-8. FIG. 26 shows the change in CT (or delta CT) between Comparative Example 7B-1 and Example 7B-5, between Comparative Example 7B-2 and Example 7B-6, between Comparative Example 7B-3 and Example 7B-7, between Comparative Example 7B-4 and Example 7B-8. FIG. 26 demonstrates the change in CT before and after chemical strengthening, as a function of chemical strengthening time (or ion exchange time).

Figure 27:
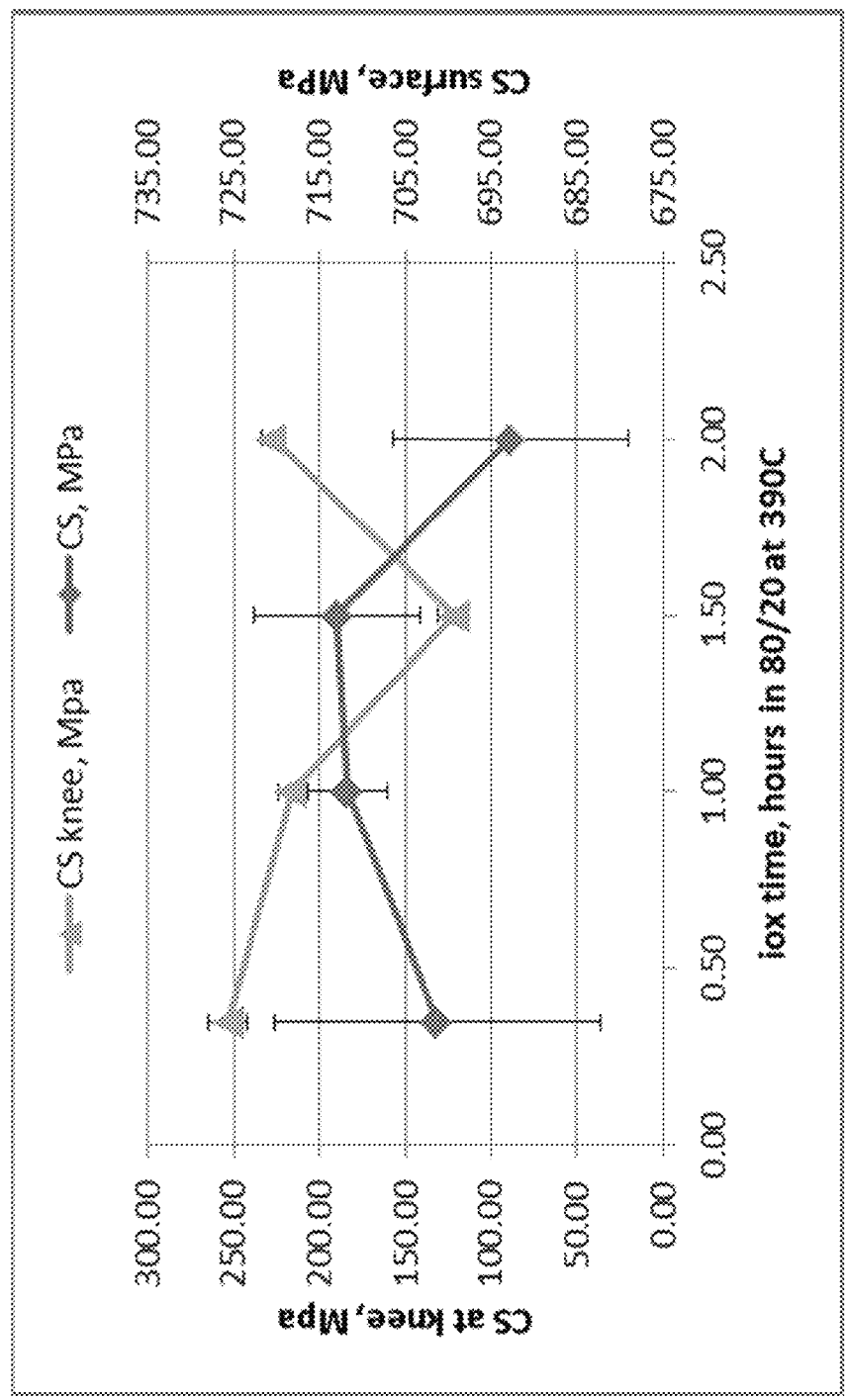
FIG. 27 is a graph plotting the surface CS and the CS at the DOL, as a function of chemical strengthening time for each of Examples 7B-5 through 7B-8.
Figure 28:
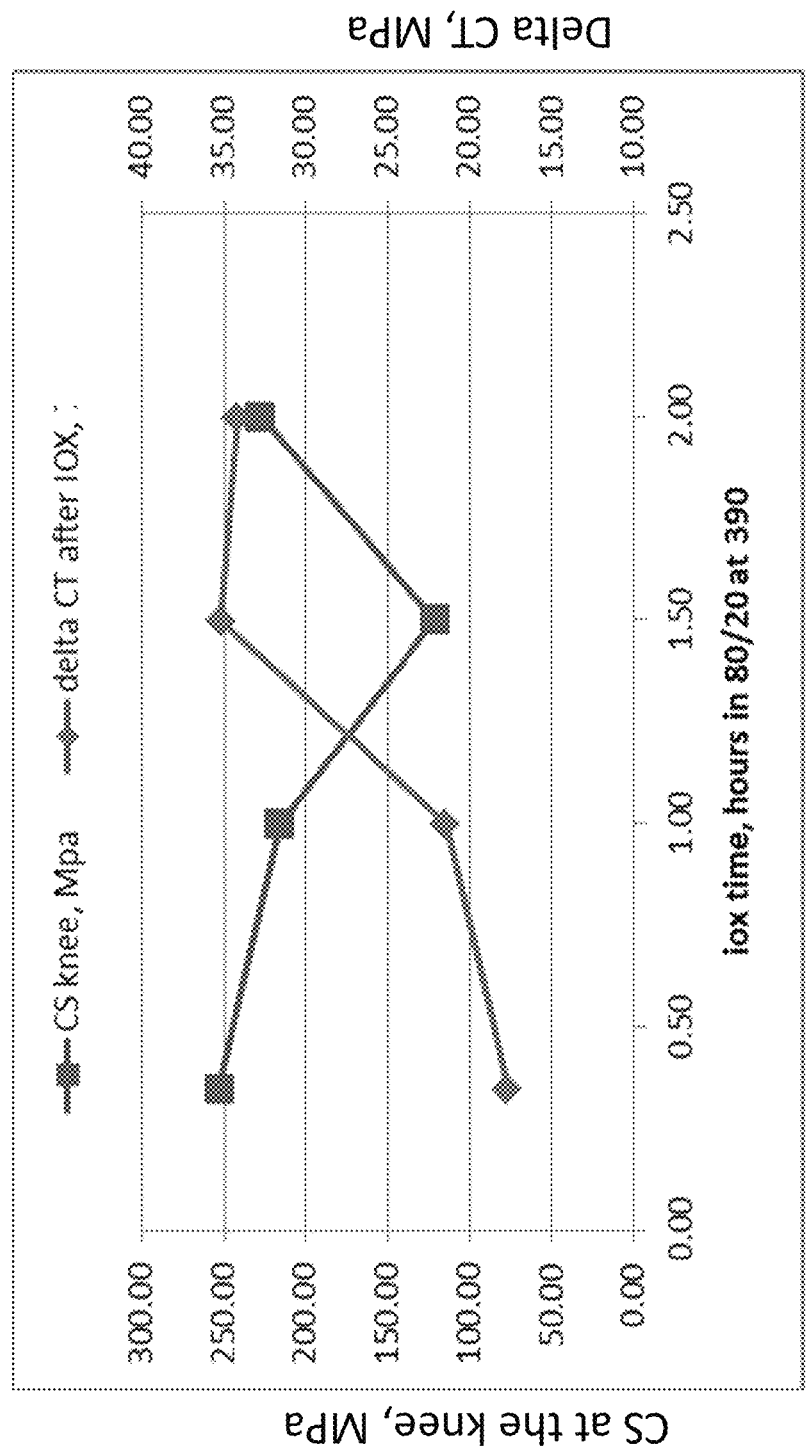
FIG. 28 is a graph showing the CS at the DOL, as a function of as a function of chemical strengthening time for each of Examples 7B-5 through 7B-8, along with the change in CT from FIG. 26.
Figure 29:
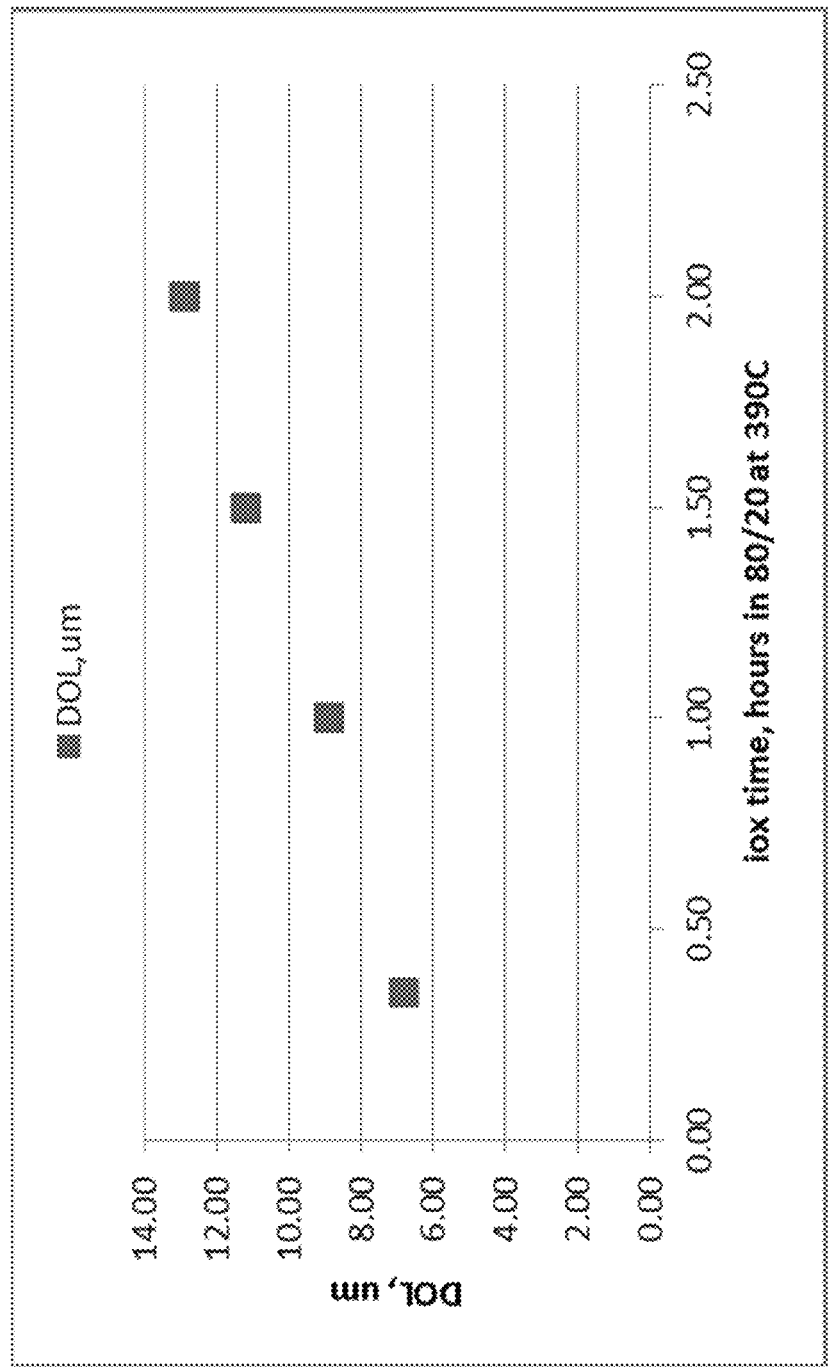
FIG. 29 is a graph showing the change in DOL of each of Examples 7B-5 through 7B-8.

FIG. 27 plots the surface CS and the CS at the DOL, as a function of chemical strengthening time (or ion exchange time) of each of Examples 7B-5 through 7B-8. FIG. 28 shows the CS at the DOL, as a function of as a function of chemical strengthening time (or ion exchange time) of each of Examples 7B-5 through 7B-8, along with the change in CT from FIG. 26. FIG. 29 shows the change in DOL of each of Examples 7B-5 through 7B-8.

Examples 7B-5 through 7B-8 were then fractured by impacting them with a tungsten carbide scribe by hand. Examples 7B-6 through 7B-8 fractured into more and smaller pieces having a smaller aspect ratios than Example 7B-5, which had significantly less CT compared to Examples 7B-6 through 7B-8.

Figure 30:
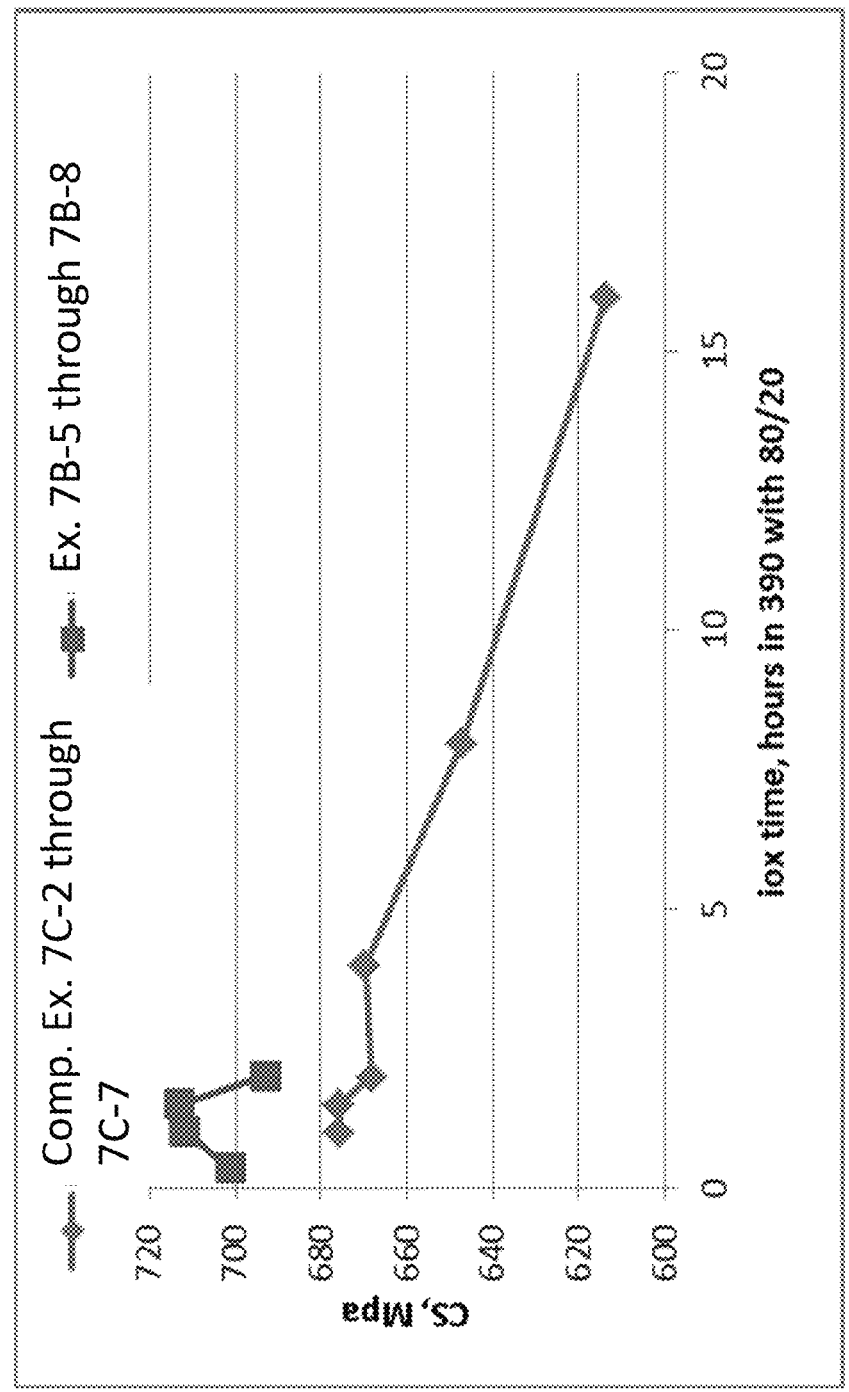
FIG. 30 is a graph showing the surface CS of Comparative Examples 7C-2 through 7C-7 and Examples 7B-5 through 7B-8, as a function of chemical strengthening time.
Figure 31:
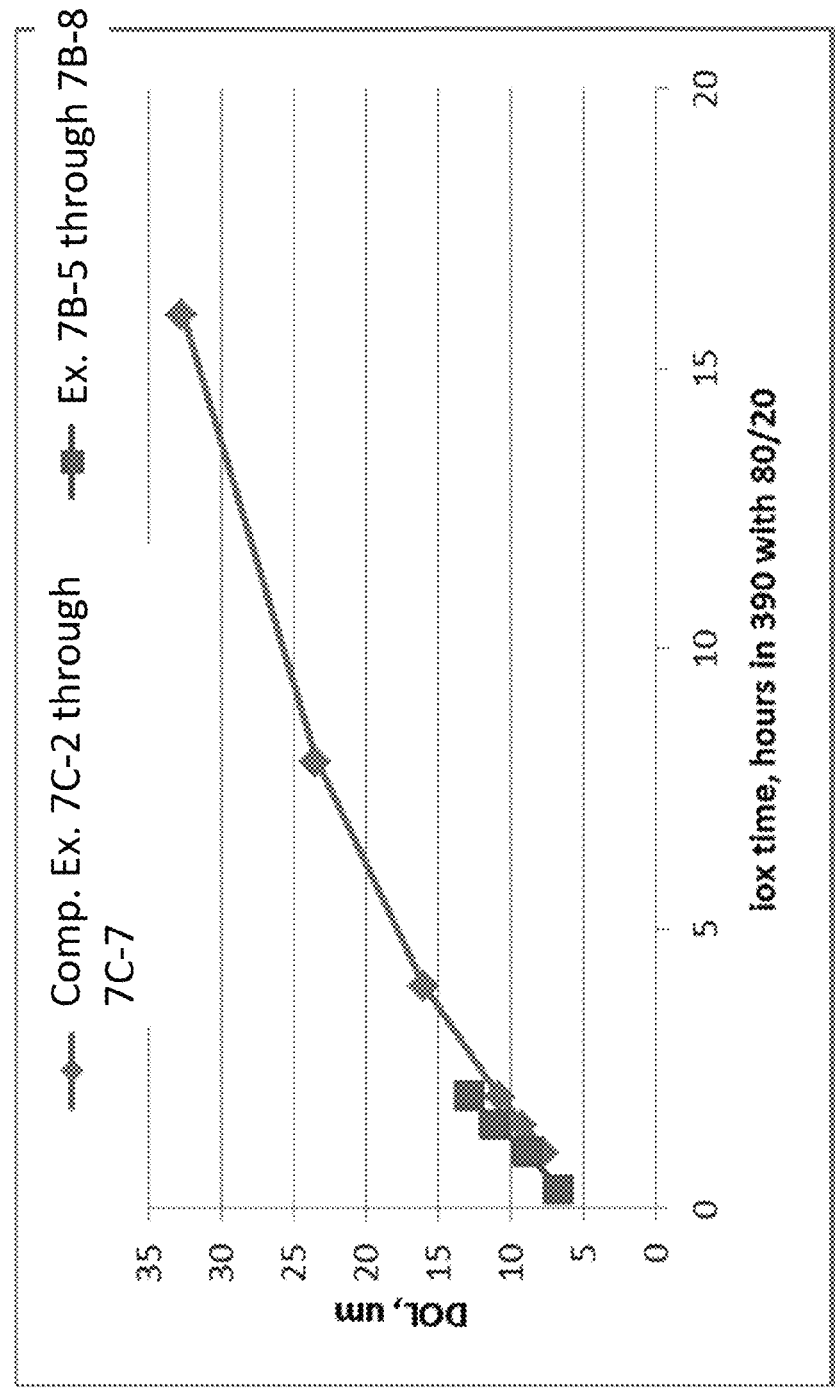
FIG. 31 is a graph plotting the DOL of Comparative Examples 7C-2 through 7C-7 and Examples 7B-5 through 7B-8, as a function of chemical strengthening time.
Figure 32:
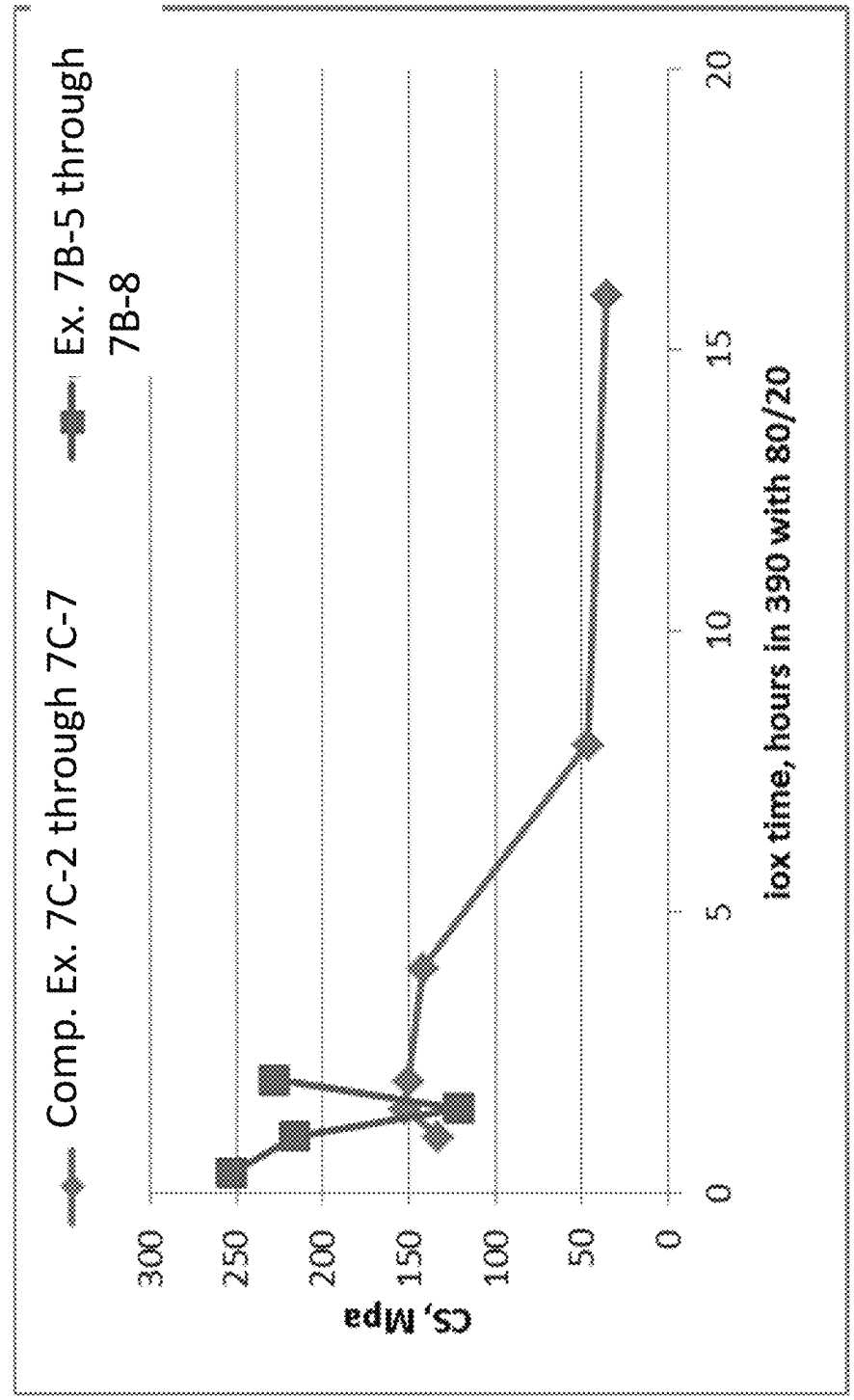
FIG. 32 is a graph plotting the CS at a depth equal to the DOL (or knee stress) of Comparative Examples 7C-2 through 7C-7 and Examples 7B-5 through 7B-8, as a function of chemical strengthening time.

Glass substrates having the same composition and thickness as Examples 7B-1 through 7B-8 were not thermally strengthened but were only chemically strengthened by immersing in a molten salt bath of 80% $KNO_3$ and 20% NaNO3 and having a temperature of 390° C. for 4 hours (Comparative Example 7C-5), 8 hours (Comparative Example 7C-6), and 16 hours (Comparative Example 7C-7). The surface CS of Comparative Examples 7C-2 through 7C-7 and Examples 7B-5 through 7B-8 are plotted in FIG. 30, as a function of chemical strengthening time. The DOL of Comparative Examples 7C-2 through 7C-7 and Examples 7B-5 through 7B-8 are plotted in FIG. 31, as a function of chemical strengthening time. The CS at DOL (or knee stress) of Comparative Examples 7C-2 through 7C-7 and Examples 7B-5 through 7B-8 are plotted in FIG. 32, as a function of chemical strengthening time.

Example 8

Glass substrates having the same composition and thickness as the substrates used in Example 7 were thermally strengthened by heating to the same $T_0$ value (i.e., 810° C.) and then quenching at different h values (i.e., h=0.025 cal/cm²-s-° C., h=0.050 cal/cm²-s-° C. and h=0.080 cal/cm²-s-° C.), providing a high level, thermally strengthened glass article (Comparative Example 8A-1), medium level, thermally strengthened glass article (Comparative Example 8B-1) and a low level thermally strengthened glass article (Comparative Example 8C-1). The surface CS, knee CS, CT and DOC of three samples each of Comparative Examples 8A-1, 8B-1 and 8C-1 were evaluated. Examples 8A-2 through 8A-4, Examples 8B-2 through 8B-4 and Examples 8C-2 through 8C-4 included the same glass substrate as Example 7 and were thermally strengthened in the same manner as Comparative Examples 8A-1, 8B-1 and 8C-1, respectively, but were then chemically strengthened by immersing in a mixed molten salt bath (including $NaNO_3$ and $KNO_3$ having varying concentrations) having a temperature of 390° C. for 2 hours, as shown in Table 24.

TABLE 24

Thermal strengthening and chemical strengthening conditions for Example 8.

| | | Thermal strengthening conditions ($T_0$, h) | Molten salt bath composition |
|---|---|---|---|
| High level, thermally strengthened | Comparative Ex. 8A-1 | $T_0$ = 810° C. h = 0.080 cal/cm²-s-° C. | Not chemically strengthened |
| | Ex. 8A-2 | $T_0$ = 810° C. h = 0.080 cal/cm²-s-° C. | 80% KNO3 20% NaNO3 |
| | Ex. 8A-3 | $T_0$ = 810° C. h = 0.080 cal/cm²-s-° C. | 50% KNO3 50% NaNO3 |
| | Ex. 8A-4 | $T_0$ = 810° C. h = 0.080 cal/cm²-s-° C. | 0% KNO3 100% NaNO3 |

TABLE 24-continued

Thermal strengthening and chemical strengthening conditions for Example 8.

| | | Thermal strengthening conditions ($T_0$, h) | Molten salt bath composition |
|---|---|---|---|
| Medium level, thermally strengthened | Comparative Ex. 8B-1 | $T_0$ = 810° C.<br>h = 0.050 cal/cm$^2$-s-° C. | Not chemically strengthened |
| | Ex. 8B-2 | $T_0$ = 810° C.<br>h = 0.050 cal/cm$^2$-s-° C. | 80% KNO3<br>20% NaNO3 |
| | Ex. 8B-3 | $T_0$ = 810° C.<br>h = 0.050 cal/cm$^2$-s-° C. | 50% KNO3<br>50% NaNO3 |
| | Ex. 8B-4 | $T_0$ = 810° C.<br>h = 0.050 cal/cm$^2$-s-° C. | 0% KNO3<br>100% NaNO3 |
| Low level, thermally strengthened | Comparative Ex. 8C-1 | $T_0$ = 810° C.<br>h = 0.025 cal/cm$^2$-s-° C. | Not chemically strengthened |
| | Ex. 8C-2 | $T_0$ = 810° C.<br>h = 0.025 cal/cm$^2$-s-° C. | 80% KNO3<br>20% NaNO3 |
| | Ex. 8C-3 | $T_0$ = 810° C.<br>h = 0.025 cal/cm$^2$-s-° C. | 50% KNO3<br>50% NaNO3 |
| | Ex. 8C-4 | $T_0$ = 810° C.<br>h = 0.025 cal/cm$^2$-s-° C. | 0% KNO3<br>100% NaNO3 |

Figure 33:
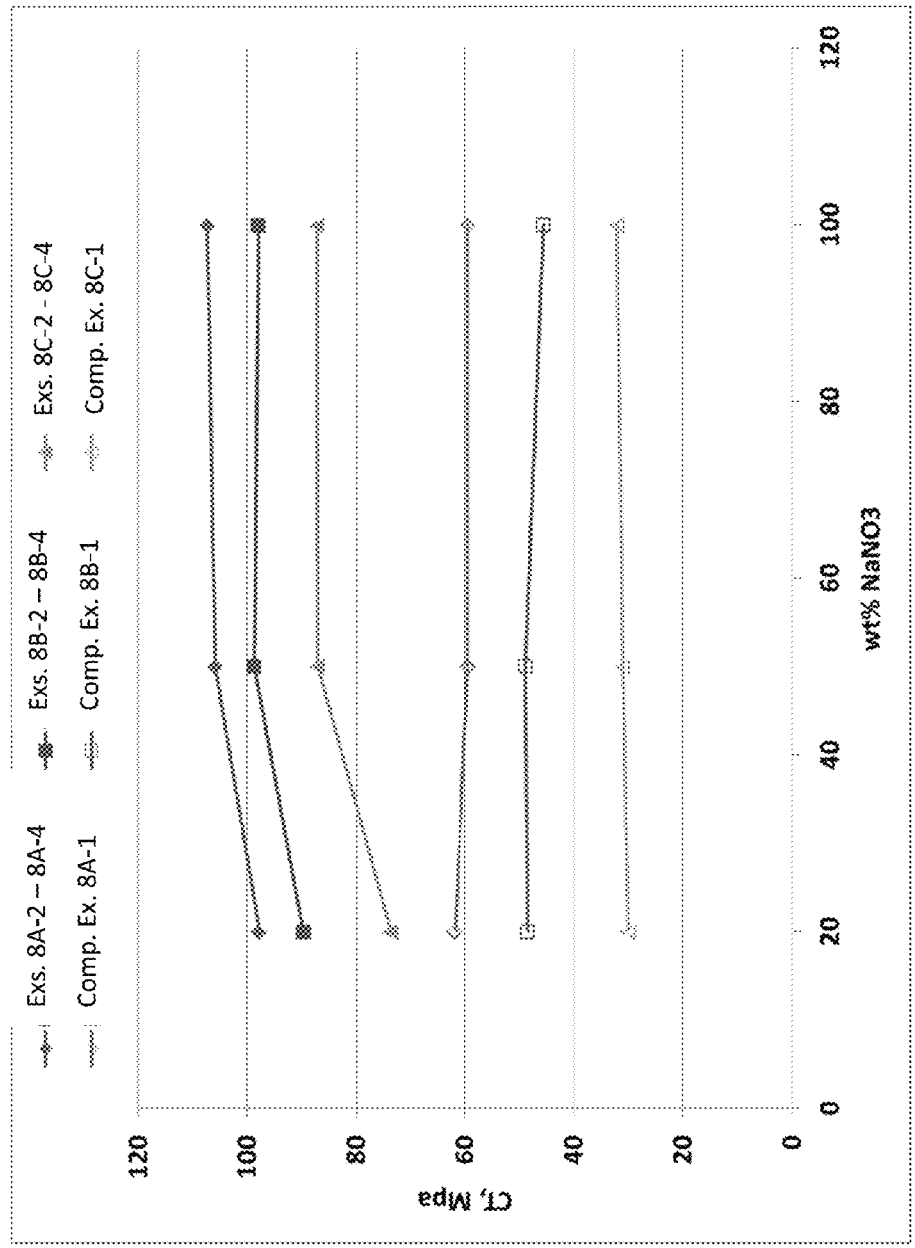
FIG. 33 shows the measured CT values of Examples 8A-2 through 8A-4, Examples 8B-2 through 8B-4 and Examples 8C-2 through 8C-4, shown as a function of $NaNO_3$ concentration in the molten salt bath, and the initial CT values of each of the three samples of Comparative Examples 8A-1, 8B-1 and 8C-1.

FIG. 33 shows the measured CT values (measured by SCALP) of Examples 8A-2 through 8A-4, Examples 8B-2 through 8B-4 and Examples 8C-2 through 8C-4, shown as a function of NaNO$_3$ concentration in the molten salt bath. FIG. 33 also includes the initial CT values (measured by SCALP) of each of the three samples of Comparative Examples 8A-1, 8B-1 and 8C-1, which were later chemically strengthened to provide Examples 8A-2 through 8A-4, Examples 8B-2 through 8B-4 and Examples 8C-2 through 8C-4, even though Comparative Examples 8A-1, 8B-1 and 8C-1 were not chemically strengthened to show "control" values and conditions.

Figure 34:
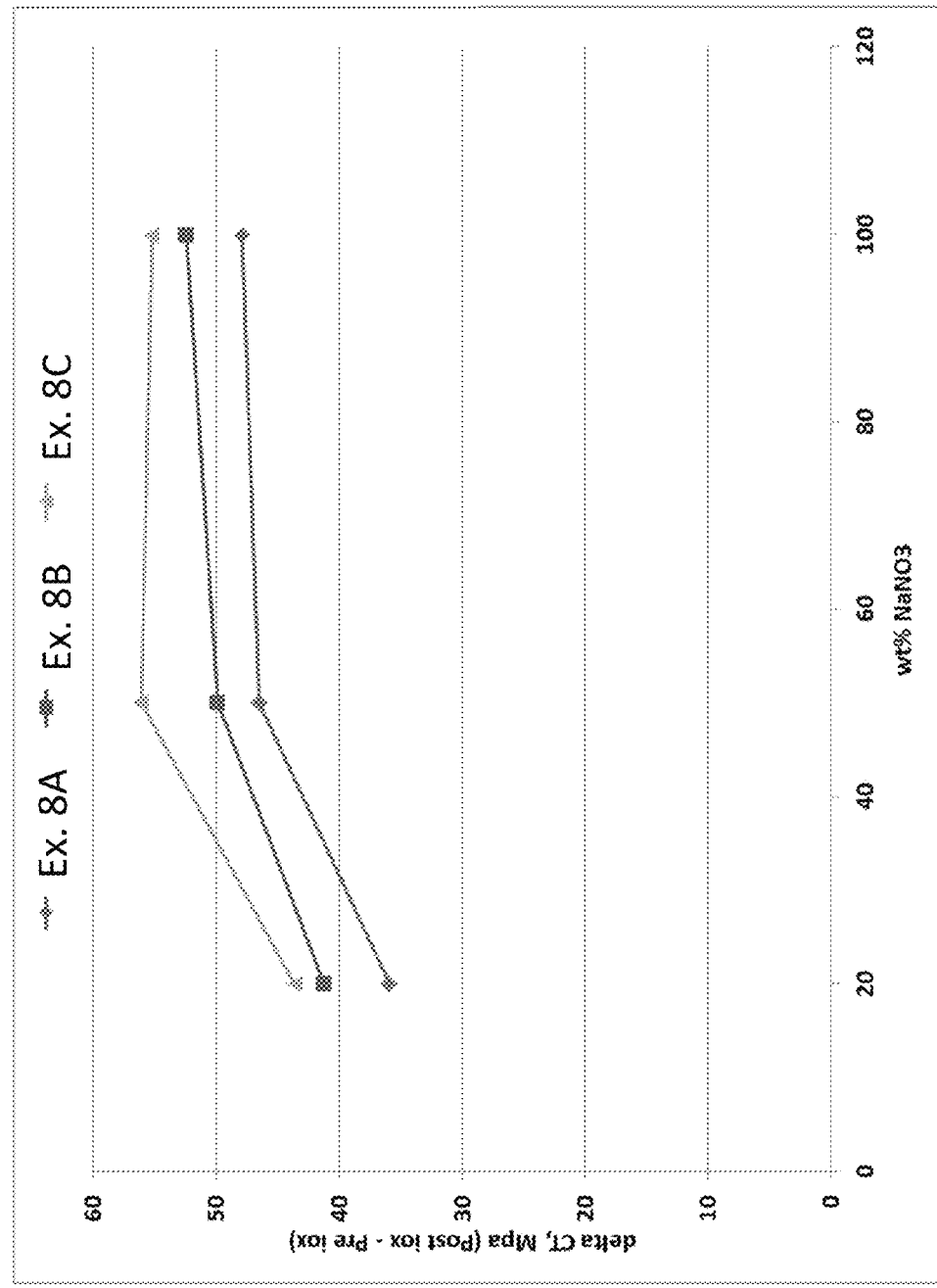
FIG. 34 is a graph showing the change in CT in absolute terms of Examples 8A-2 through 8A-4, 8B-2 through 8B-4 and 8C-2 through 8C-4.
Figure 35:
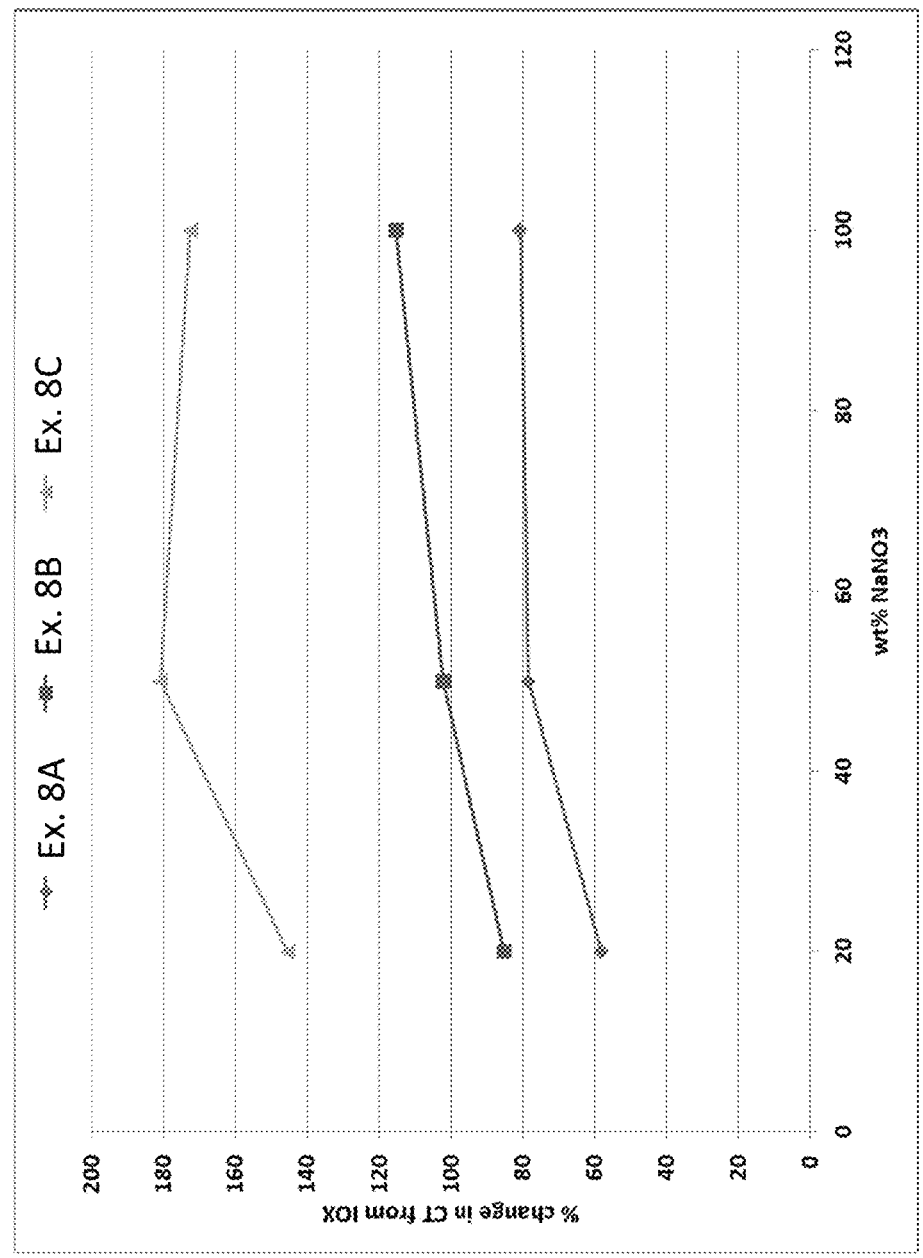
FIG. 35 is a graph showing the change in CT as a percent between Comparative Example 8A-1 and Examples 8A-2 through 8A-4, between Comparative Example 8B-1 and Examples 8B-2 through 8B-4, and between Comparative Example 8C-1 and Examples 8C-2 through 8C-4.

FIG. 34 shows the change in CT or delta CT in absolute terms and FIG. 35 shows the change in CT as a percent, between Comparative Example 8A-1 and Examples 8A-2 through 8A-4, between Comparative Example 8B-1 and Examples 8B-2 through 8B-4, and between Comparative Example 8C-1 and Examples 8C-2 through 8C-4. As shown in FIGS. 34 and 35, Examples 8C-2 through 8C-4 exhibit the greatest percentage change in CT after being chemically strengthened. These articles were formed from the low level, thermally strengthened glass article (Comparative Ex. 8C-1). Without being bound by theory, the thermally glass articles exhibiting the lowest fictive temperature can build up the greatest amount of surface compressive stress when subsequently chemically strengthened.

Figure 36:
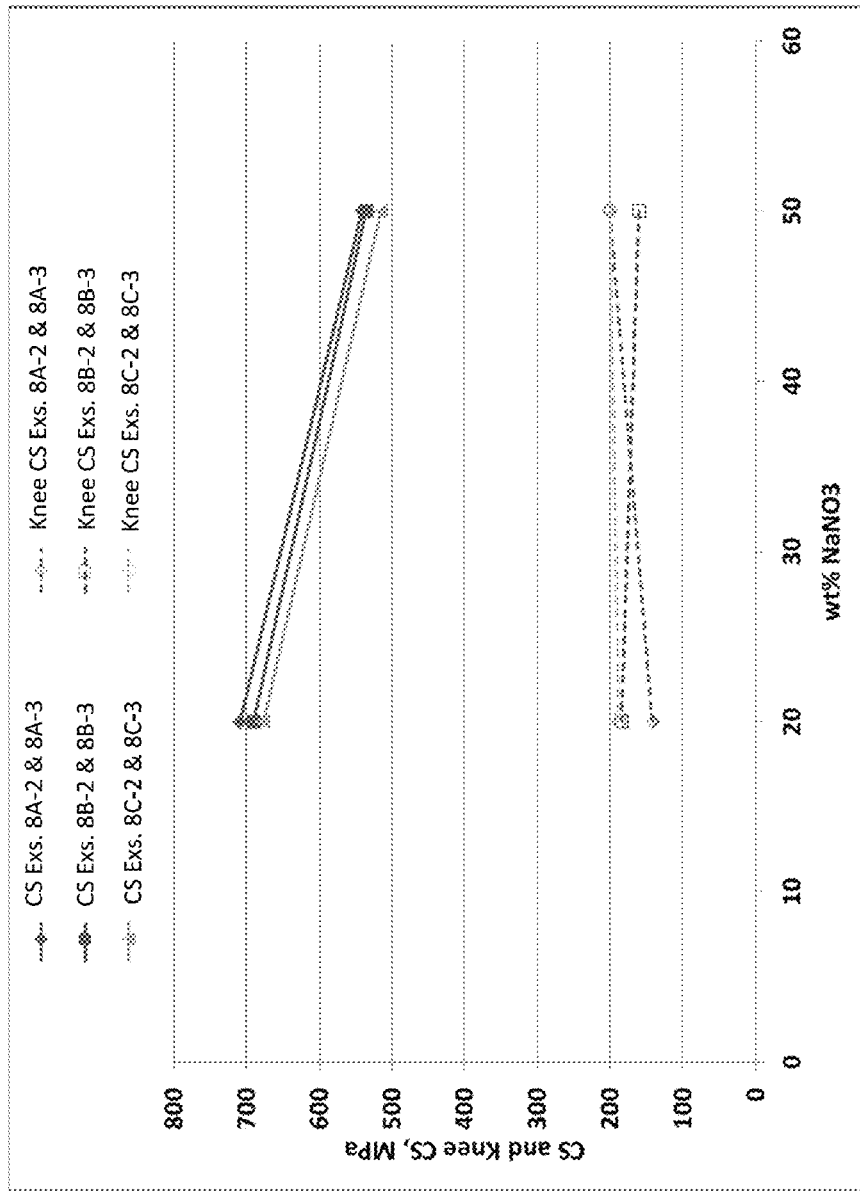
FIG. 36 is a graph showing the surface CS and CS at a depth equal to the DOL (or knee CS) of Examples 8A-2 through 8A-3, Examples 8B-2 through 8B-3 and Examples 8C-2 through 8C-3, as a function of $NaNO_3$ concentration.

The surface CS and CS at DOL (or knee CS) of Examples 8A-2 through 8A-3, Examples 8B-2 through 8B-3 and Examples 8C-2 through 8C-3 was measured and plotted in FIG. 36, as a function of NaNO$_3$ concentration. As shown in FIG. 36, surface CS decreased with higher concentrations of NaNO$_3$ in the molten salt bath used during chemical strengthening. FIG. 36 also shows the similarly in surface CS values between Examples 8A-2, 8B-2 and 8C-2, and between Examples 8A-3, 8B-3 and 8C-3.

Figure 37:
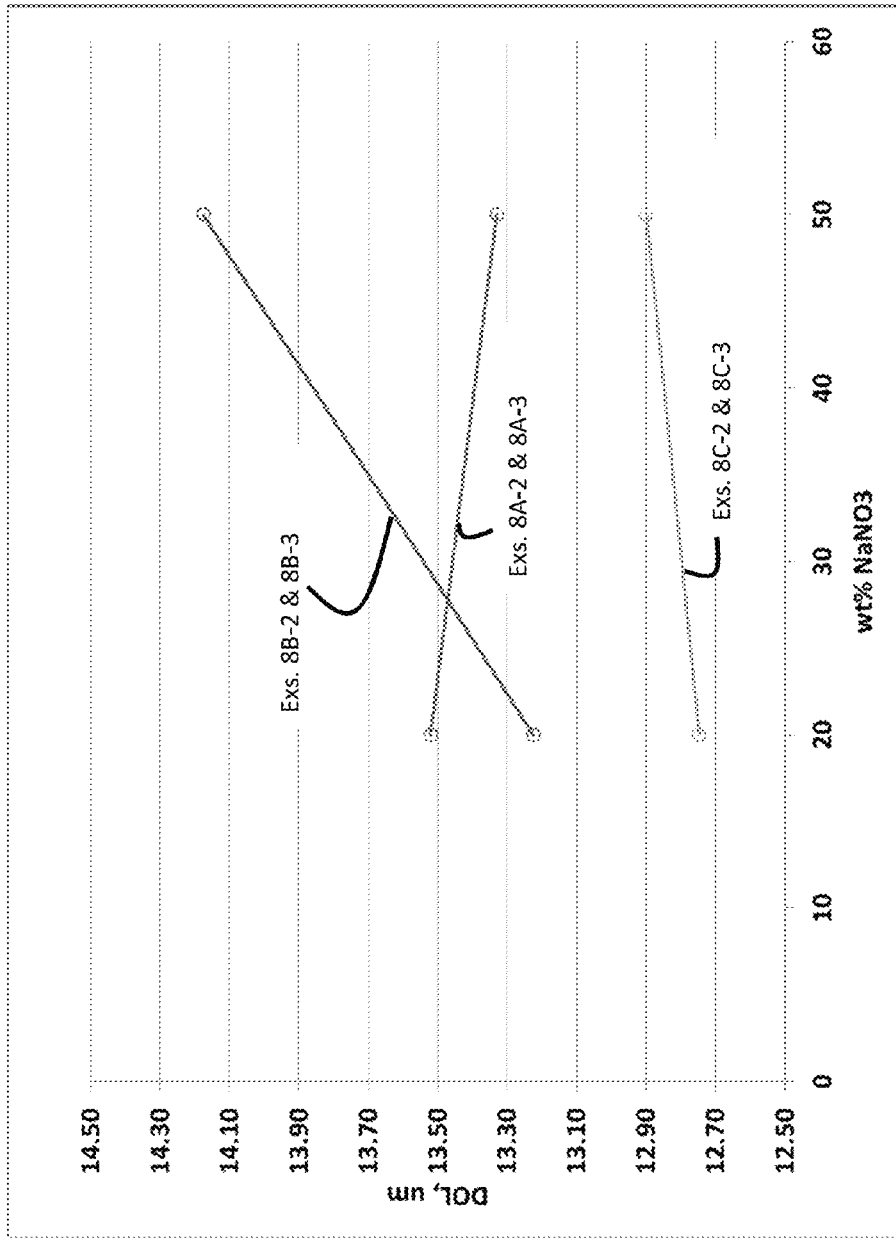
FIG. 37 is a graph showing the measured DOL values of Examples 8A-2 through 8A-3, Examples 8B-2 through 8B-3 and Examples 8C-2 through 8C-3, plotted as a function of $NaNO_3$ concentration.

FIG. 37 shows the measured DOL values of Examples 8A-2 through 8A-3, Examples 8B-2 through 8B-3 and Examples 8C-2 through 8C-3, plotted as a function of NaNO$_3$ concentration.

CT and stored tensile energy values of Examples 8A-2 through 8A-4, Examples 8B-2 through 8B-4 and Examples 8C-2 through 8C-4 are shown in Table 25.

TABLE 25

CT and stored tensile energy values of Examples 8A-2 through 8A-4, Examples 8B-2 through 8B-4 and Examples 8C-2 through 8C-4.

| Example | CT (MPa) | Stored Tensile Energy (J/m$^2$) |
|---|---|---|
| Ex. 8A-2 | 97.75 | 13.46 |
| Ex. 8A-3 | 105.88 | 17.15 |
| Ex. 8A-4 | 107.26 | 16.60 |
| Ex. 8B-2 | 89.73 | 12.79 |
| Ex. 8B-3 | 98.73 | 13.32 |
| Ex. 8B-4 | 97.97 | 13.47 |
| Ex. 8C-2 | 73.63 | 8.84 |
| Ex. 8C-3 | 87.12 | 9.21 |
| Ex. 8C-4 | 87.24 | 10.68 |

Examples 8A-2 through 8A-4, Examples 8B-2 through 8B-4 and Examples 8C-2 through 8C-4 were fractured in the same manner as described in Example 7. The Examples with lower stored tensile energy values exhibited fracturing with higher aspect ratios and/or fewer pieces. Without being bound by theory, these Examples may be described as exhibiting less dicing when fractured.

Figure 38:
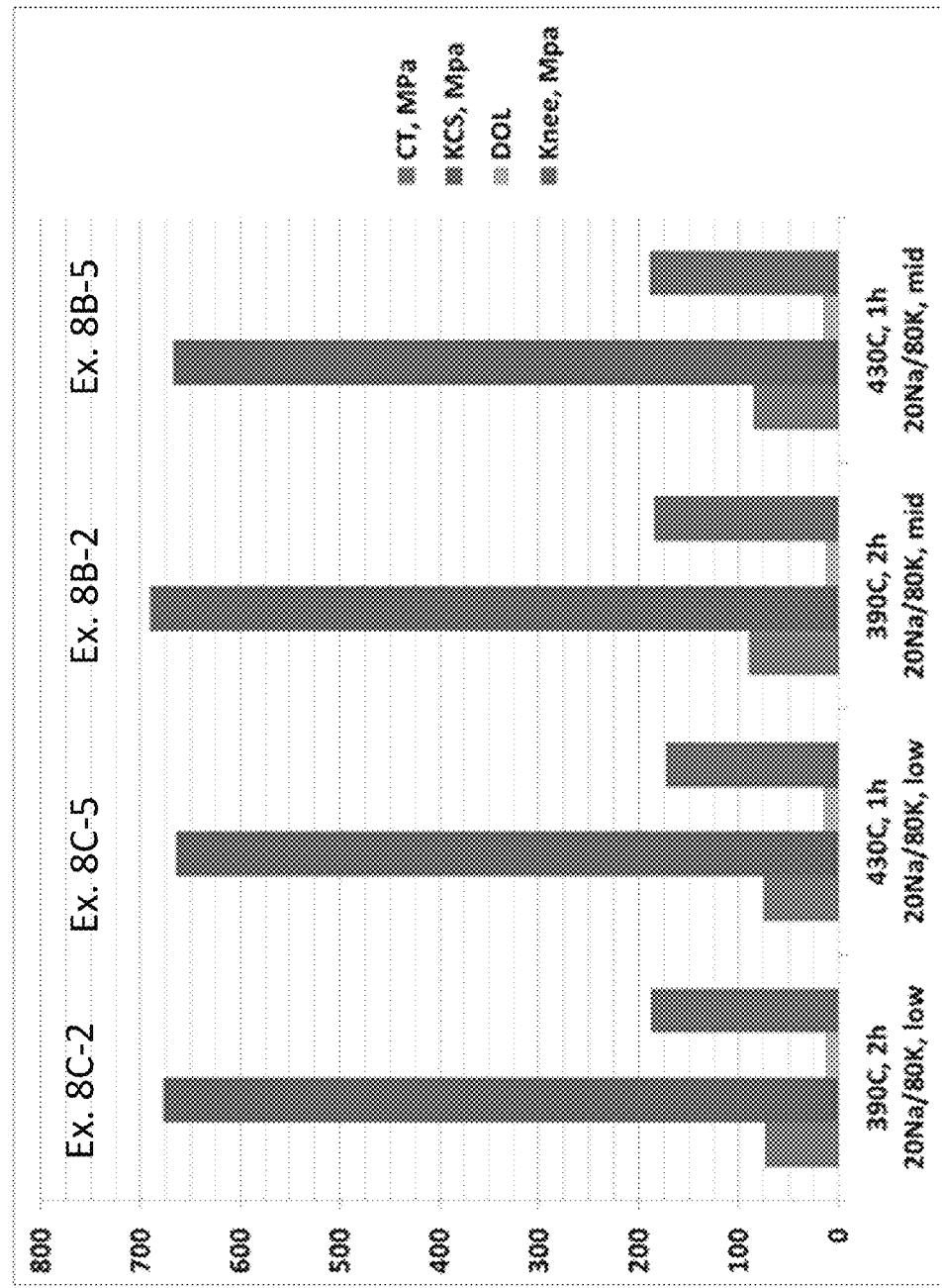
FIG. 38 is a bar graph showing (from left to right) the measured CT, surface CS, DOL and CS at DOL (or knee stress) of Examples 8B-2, 8B-5, 8C-2 and 8C-5.

Examples 8B-5 and 8C-5 included identical glass substrates that were thermally strengthened in the same manner as Comparative Examples 8B-1 and 8C-1, but were then chemically strengthened by immersing in a mixed molten salt bath including 20% NaNO$_3$ and 80% KNO$_3$ and having a temperature of 430° C. for 1 hour. FIG. 38 is a bar graph showing (from left to right) the measured CT, surface CS, DOL and CS at DOL (or knee stress) of Examples 8B-2 (chemically strengthened at 390° C. for 2 hours), 8B-5, 8C-2 (chemically strengthened at 390° C. for 2 hours) and 8C-5. These values, along with the stored tensile energy, are shown in Table 26.

TABLE 26

Measures stress-related properties of Examples 8B-2, 8B-5, 8C-2 and 8C-5.

| | Example | CT (MPa) | Stored Tensile Energy (J/m$^2$) | Surface CS (MPa) | DOL (microm-eters) | CS at DOL (MPa) |
|---|---|---|---|---|---|---|
| Medium level, thermally strengthened | Ex. 8B-2 | 89.73 | 12.79 | 690.41 | 13.22 | 184.63 |
| | Ex. 8B-5 | 84.95 | 8.58 | 666.92 | 15.49 | 188.64 |
| Low level, thermally strengthened | Ex. 8C-2 | 73.63 | | 677.44 | 12.75 | 188.1 |
| | Ex. 8C-5 | 75.60 | 7.36 | 664.42 | 15.12 | 173.14 |

As shown in Table 26, the DOL values for Examples 8B-5 and 8C-5 were greater than Examples 8B-2 and 8C-2, which were chemically strengthened using a lower temperature bath (i.e., 390° C.).

Figure 39:
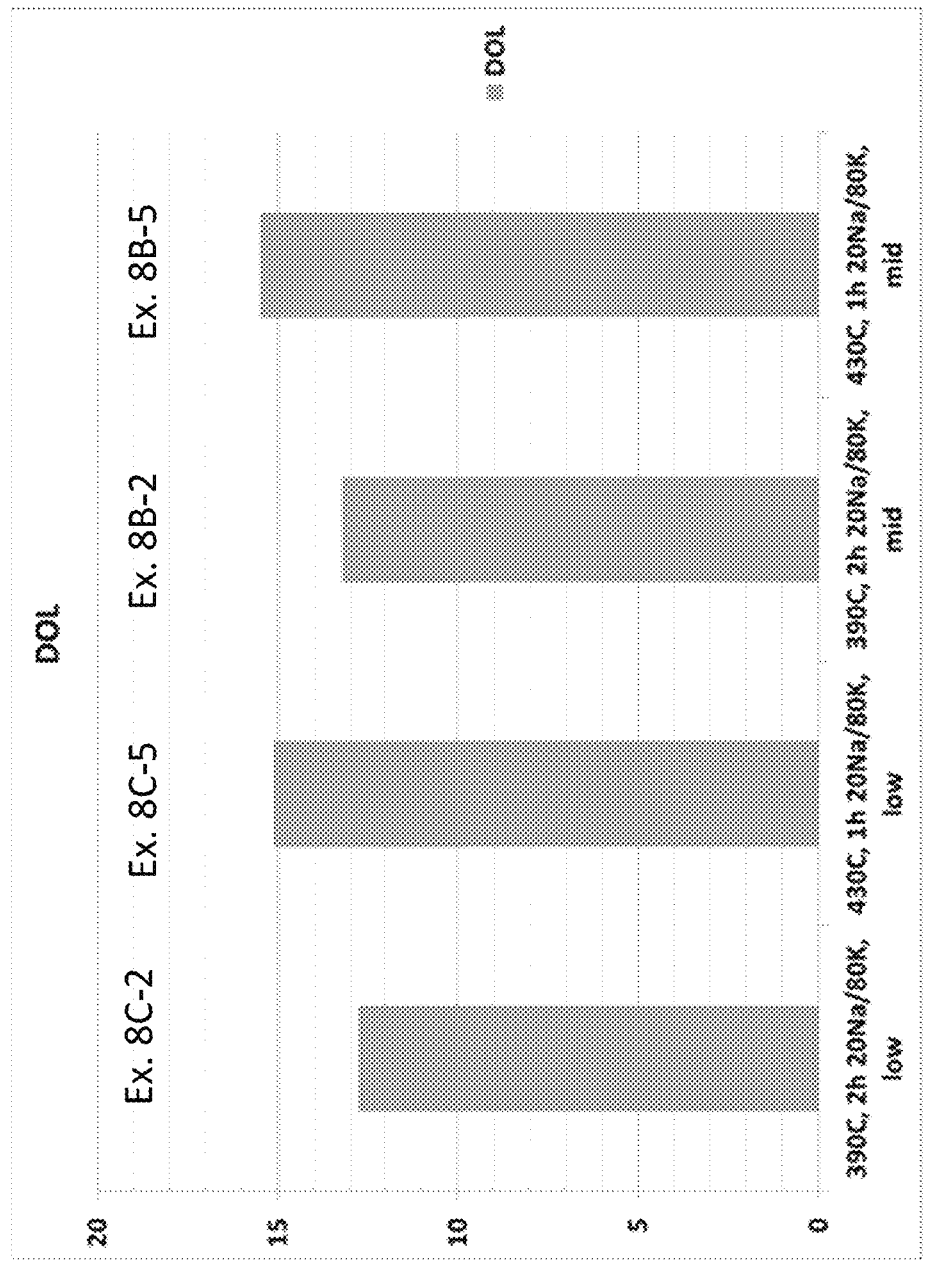
FIG. 39 is a graph showing the measured DOL for Examples 8B-2, 8B-5, 8C-2 and 8C-5.

FIG. 39 shows the measured DOL alone for Examples 8B-2 (chemically strengthened at 390° C. for 2 hours), 8B-5, 8C-2 (chemically strengthened at 390° C. for 2 hours) and 8C-5.

Examples 8B-6 through 8B-8 and 8C-6 through 8C-8 included the same glass substrate and were thermally strengthened in the same manner as Comparative Examples 8B-1 and 8C-1, but were then chemically strengthened by immersing in a mixed molten salt bath including NaNO$_3$ and KNO$_3$ at varying concentrations and having a temperature of 430° C. for 1 hour (to provide Examples 8B-6 through 8B-8 and 8C-6 through 8C-8), as shown in Table 27.

TABLE 27

Thermal strengthening and chemical strengthening conditions for Example 8.

| | | Thermal strengthening conditions ($T_0$, h) | Molten salt bath composition |
|---|---|---|---|
| Medium level, thermally strengthened | Ex. 8B-6 | $T_0$ = 810° C.<br>h = 0.050 cal/cm$^2$-s-° C. | 100% KNO3<br>0% NaNO3 |
| | Ex. 8B-7 | $T_0$ = 810° C.<br>h = 0.050 cal/cm$^2$-s-° C. | 95% KNO3<br>5% NaNO3 |
| | Ex. 8B-8 | $T_0$ = 810° C.<br>h = 0.050 cal/cm$^2$-s-° C. | 90% KNO3<br>10% NaNO3 |
| Low level, thermally strengthened | Ex. 8C-6 | $T_0$ = 810° C.<br>h = 0.025 cal/cm$^2$-s-° C. | 100% KNO3<br>0% NaNO3 |
| | Ex. 8C-7 | $T_0$ = 810° C.<br>h = 0.025 cal/cm$^2$-s-° C. | 95% KNO3<br>5% NaNO3 |
| | Ex. 8C-8 | $T_0$ = 810° C.<br>h = 0.025 cal/cm$^2$-s-° C. | 90% KNO3<br>10% NaNO3 |

The CT, stored tensile energy, surface CS, DOL and CS at DOL of Examples 8B-6 through 8B-8 and Examples 8C-6 through 8C-8 were measured and are shown in Table 28. Table 28 also includes the measured values for Example 8B-5 and 8C-5, which were chemically strengthened in a 80% KNO$_3$ and 20% NaNO3 bath having a temperature of 430° C. for 1 hour for comparison.

TABLE 28

Measures stress-related properties of Examples 8B-5 through 8B-9 and Examples 8C-5 through 8C-9.

| | Example | CT (MPa) | Stored Tensile Energy (J/m$^2$) | Surface CS (MPa) | DOL (micrometers) | CS at DOL (MPa) |
|---|---|---|---|---|---|---|
| Medium level, thermally strengthened | Ex. 8B-5 | 84.95 | 8.48 | 667 | 15.5 | 189 |
| | Ex. 8B-6 | 59.70 | 5.87 | 948 | 19.5 | 106 |
| | Ex. 8B-7 | 68.06 | 7.48 | 829 | 16 | 130 |
| | Ex. 8B-8 | 76.12 | 8.51 | 762 | 16 | 50 |
| Low level, thermally strengthened | Ex. 8C-5 | 75.6 | 7.35 | 664 | 15 | 173 |
| | Ex. 8C-6 | 55.53 | 4.21 | 945 | 19.5 | 108 |
| | Ex. 8C-7 | 62.62 | 6.63 | 831 | 15 | 94 |
| | Ex. 8C-8 | 69.87 | 6.98 | 751 | 16 | 100 |

Figure 40:
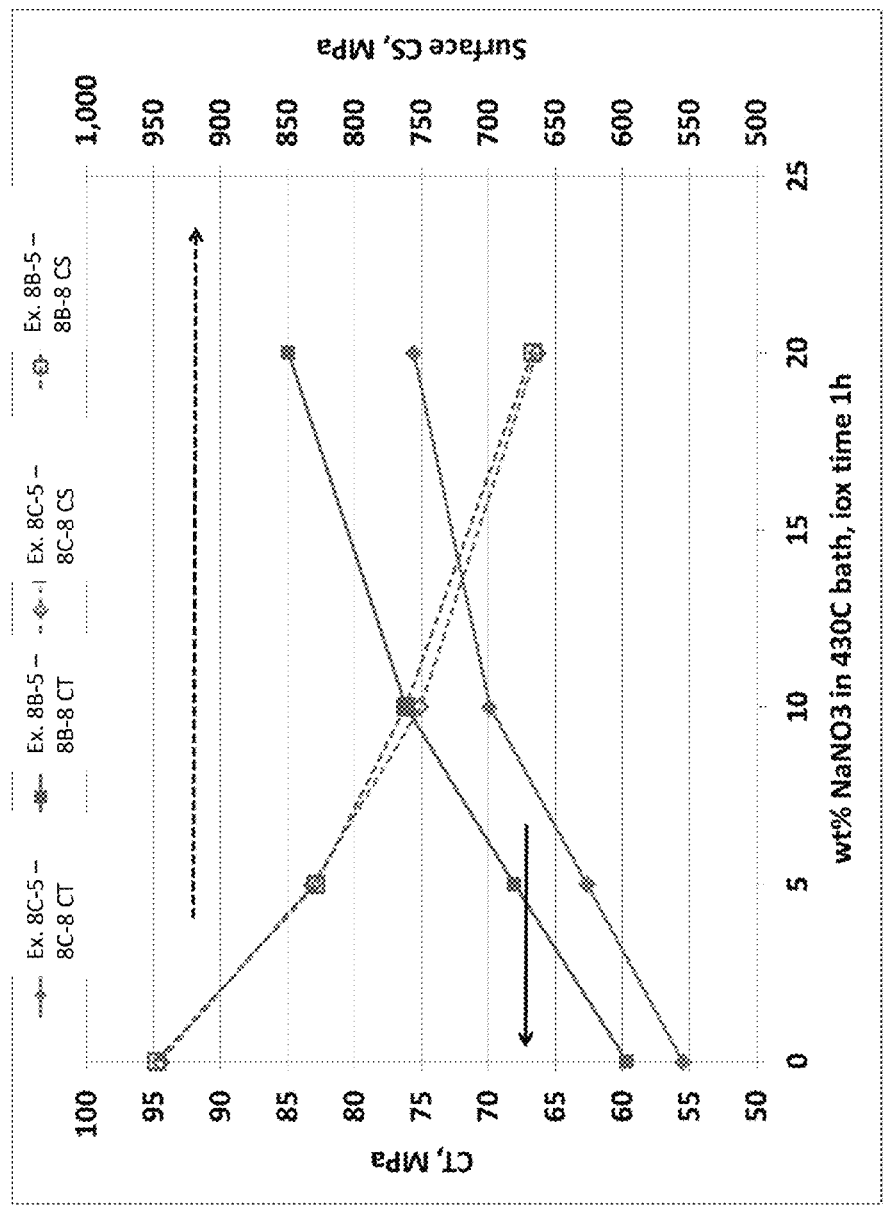
FIG. 40 is a graph showing the CT and surface CS of Examples 8B-5 through 8B-8 and Examples 8C-5 through 8C-8, as a function of $NaNO_3$ concentration.
Figure 41:
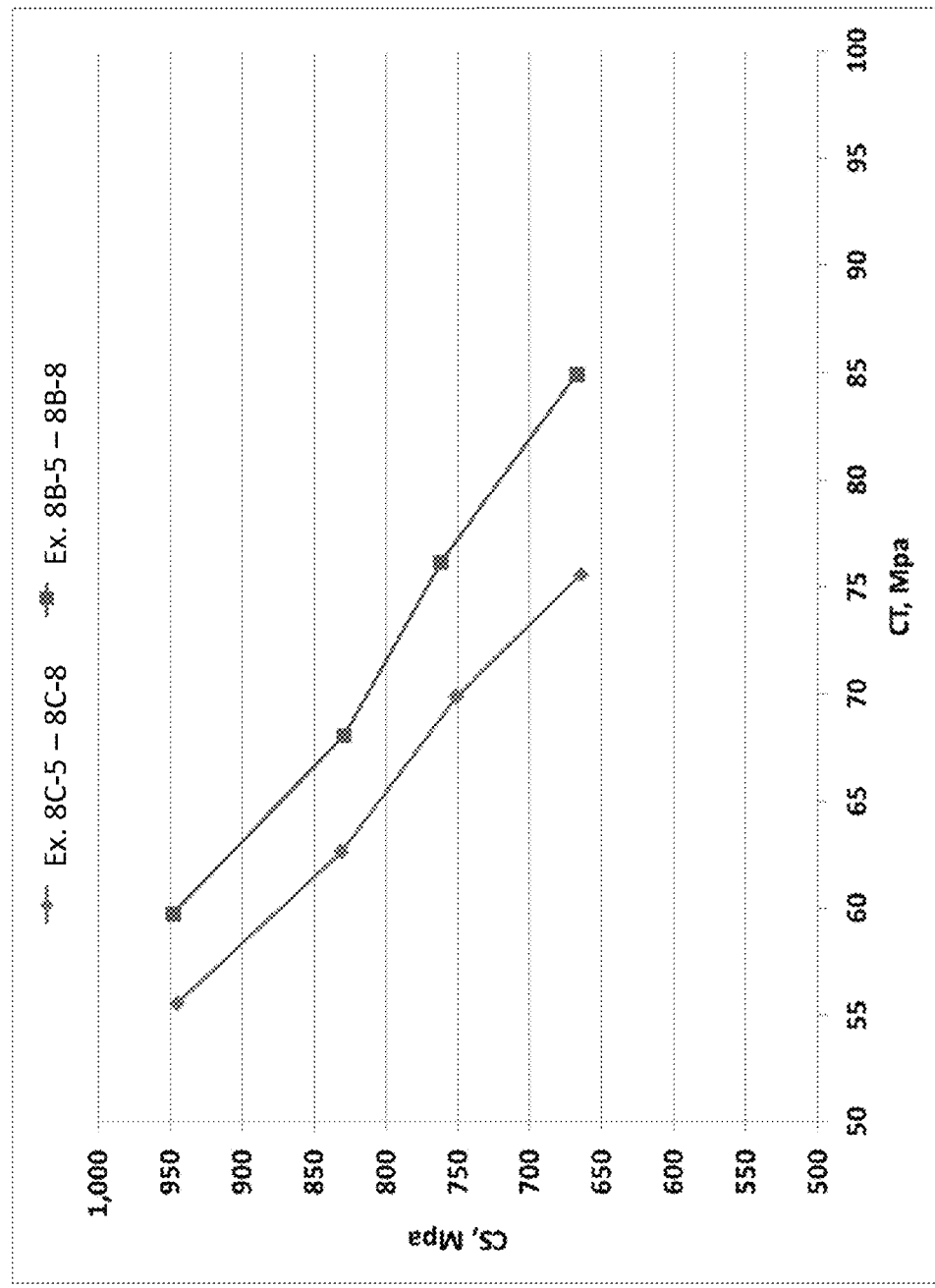
FIG. 41 is a graph showing the surface CS as a function of CT of Examples 8B-5 through 8B-8 and Examples 8C-5 through 8C-8.

FIG. 40 plots the CT and surface CS of Examples 8B-5 through 8B-8 and Examples 8C-5 through 8C-8, as a function of NaNO$_3$ concentration. FIG. 41 plots the surface CS as a function of CT. As shown in FIGS. 40 and 41, surface CS is reduced when a molten salt bath with higher NaNO$_3$ concentration is used, while CT increases.

Figure 42:
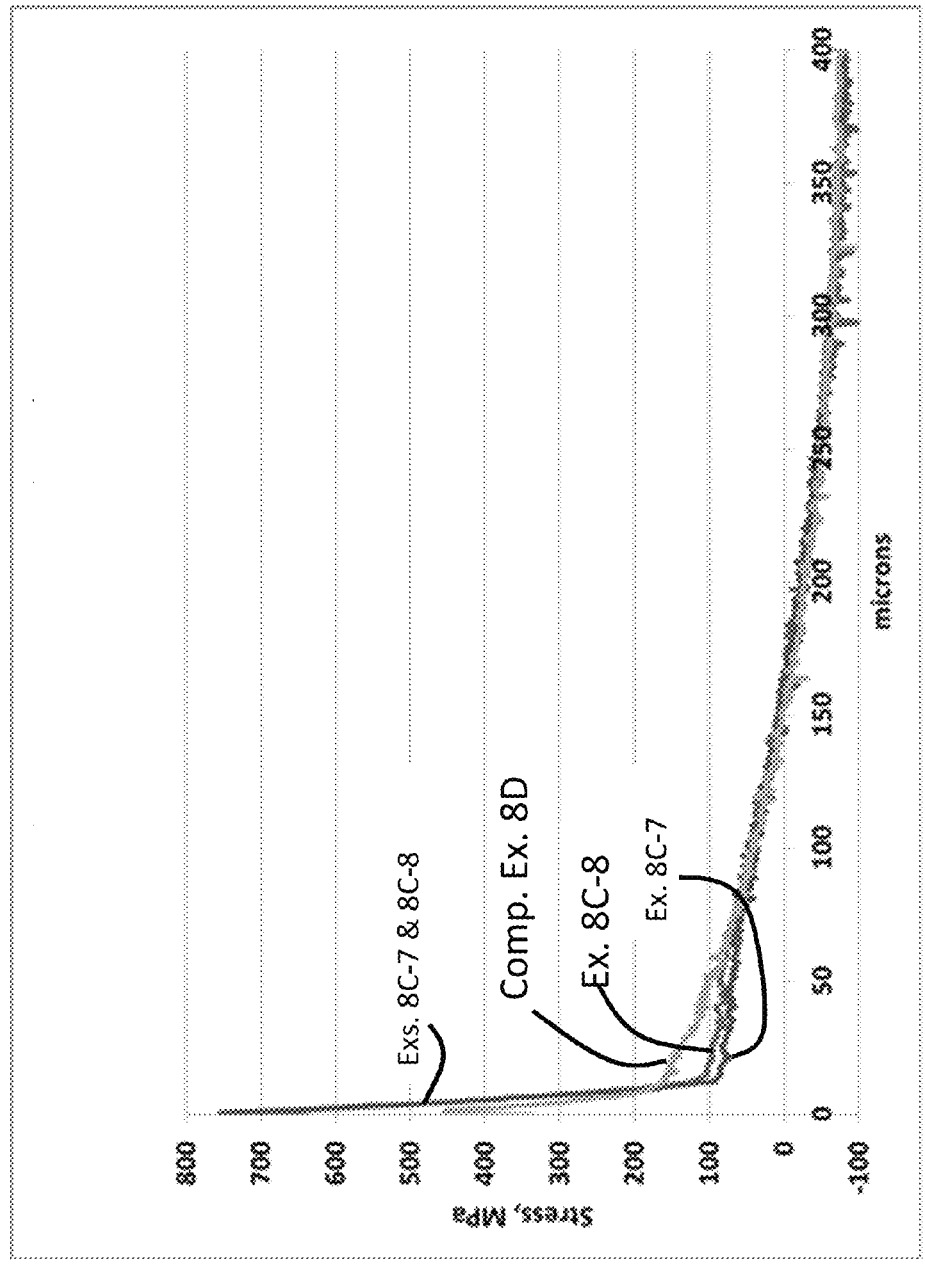
FIG. 42 is a graph showing the measured stress as a function of depth of Examples 8C-7 and 8C-8 and the stress profile of Comparative Example 8D.

The stress profiles for Examples 8C-7 and 8C-9 were measured using a RNF. FIG. 42 shows the measured stress as a function of depth extending from the surface of the thermally and chemically strengthened glass articles of Examples 8C-7 and 8C-8 into the glass article. The stress profile of a known glass article that was only chemically strengthened by immersing in a mixed molten salt bath of 51% KNO$_3$ and 49% NaNO$_3$, having a temperature of 380° C. for 3 hours and 45 minutes (Comparative Example 8D) is also shown in FIG. 42.

Example 9

Substrates made of Glaverbel SLG, having a nominal composition of 70.9 mol % SiO$_2$, 0.8 mol % Al$_2$O$_3$, 13.2 mol % Na$_2$O, 0.11 mol % K$_2$O, 6.6 mol % MgO, 8.2 mol % CaO, 0.03 Fe$_2$O$_3$ and 0.22 mol % SO$_3$, and having a thickness of about 0.73 mm, were thermally strengthened, chemically strengthened without prior thermal strengthening, or thermally and then chemically strengthened.

Specifically, Comparative Example 9A included a thermally strengthened glass article that was heated to a $T_0$ of about 690° C. and then quenched at h=0.051 cal/cm$^2$-s-° C., no chemical strengthening was performed. Comparative Example 9B was a glass substrate that was not thermally strengthened, but that was chemically strengthened by immersing in a molten salt bath of 100% KNO$_3$ having a temperature of 420° C. for 5.5 hours. Example 9C was a glass substrate that was thermally strengthened in the same manner as Example 9A, but was then chemically strengthened by ion-exchange by immersing in a molten salt bath of 100% KNO$_3$ having a temperature of 420° C. for 5.5 hours, i.e., the same conditions as in Comparative Example 9B. See Table 29.

TABLE 29

Thermal strengthening and chemical strengthening conditions for Comparative Examples 9A and 9B, and Example 9C.

| | Thermal strengthening conditions ($T_0$, h) | Chemical strengthening |
|---|---|---|
| Comparative Ex. 9A | $T_0$ = 690° C.<br>h = 0.051 cal/cm$^2$-s-° C. | None |
| Comparative Ex. 9B | None | 100% KNO3, 420° C., 5.5 hours |
| Ex. 9C | $T_0$ = 690° C.<br>h = 0.051 cal/cm$^2$-s-° C. | 100% KNO3, 420° C., 5.5 hours |

The CS, CT, DOL and DOC values (as an absolute measurement and as a percentage of the glass article thickness) of all the resulting glass articles were measured and are shown in Table 30. As shown in Table 30, Example 9C exhibited a DOL of about 10 micrometers and a surface CS of about 600 MPa. By selecting appropriate thermal and chemical strengthening conditions, the thermally and chemically strengthened glass articles of Example 9C exhibit slightly less surface CS values as Example 9B (536 MPa versus 604 MPa), slightly better DOL values (11.7 microns versus 10 microns), but a total DOC that is many times larger than achievable by a chemical strengthening process alone (144 microns versus 10 microns). That is, thermally conditioned samples that are then subject to the same IOX conditions as samples that did not have a prior thermal treatment, have an increased DOL. Additionally, by selecting appropriate thermal and chemical strengthening conditions, the thermally and chemically strengthened glass articles of Example 9C exhibit a similar DOC as the thermally-only strengthened articles of Comparative Example 9A (144 microns versus 154 microns), but a much higher surface CS than those of Comparative Example 9A (i.e., 536 MPa versus 100 MPa).

TABLE 30

Measured properties of the resulting thermally and chemically strengthened glass articles of Comparative Examples 9A and 9B, and Example 9C.

| Example | CS (MPa) | CT (MPa) | DOL (in μm) | DOC (in μm) | DOC as % of article thickness |
|---|---|---|---|---|---|
| Comparative Ex. 9A | 100 | 49 | 0 | 154 | 21.1 |
| Comparative Ex. 9B | 604 | 9 | 10 | 10 | 1.4 |
| Ex. 9C | 536 | 21 | 11.7 | 144 | 19.7 |

The glass substrates of Comparative Examples 9A, 9B, and of Example 9C were compared in terms of mechanical performance. Specifically, samples of these glass substrates or articles were subjected to a Vicker's indentation threshold test and a Knoop scratch threshold test, as described above in Example 2. The results of each test are shown in Table 31. As is seen from Table 31, the use of thermal and chemical strengthening leads to an improvement in the Vickers indentation threshold over that of only-chemically strengthened substrates. As further seen from Table 31, the use of thermal and chemical strengthening also leads to an improvement in the Knoop scratch threshold over that of only-thermally strengthened substrates; Knoop values for Example 9C are lower than those in Comparative Example 9A, and are similar to those achieved in Comparative Example 9B. Also, it is seen that the Comparative Examples 9A had sustained surface cracking (i.e., failure mode 1), whereas Comparative Example 9B and Examples 9C had surface cracks and/or a median crack (mode 3). Thus, the combination of thermally and chemically strengthening leads to glass substrates having advantaged properties over those having been subject to only thermal or only chemical strengthening.

TABLE 31

Mechanical performance of the substrates in Comparative Examples 9A and 9B, and in Example 9C.

|  | Vicker's (N) | Knoop (N) | Failure Mode |
|---|---|---|---|
| Comparative Example 9A (thermally strengthened only at $T_0 = 690°$ C., h = 0.051) | 4-6 | 6-8 | 1 |
| Comparative Example 9B (chemically strengthened only, at 420° C. for 5.5 hours) | 0-2 | 2-4 | 3 |
| Example 9C (thermally strengthened at $T_0 = 690°$ C., h = 0.051, and chemically strengthened at 420° C. for 5.5 hours) | 2-4 | 2-4 | 3 |

Figure 43:
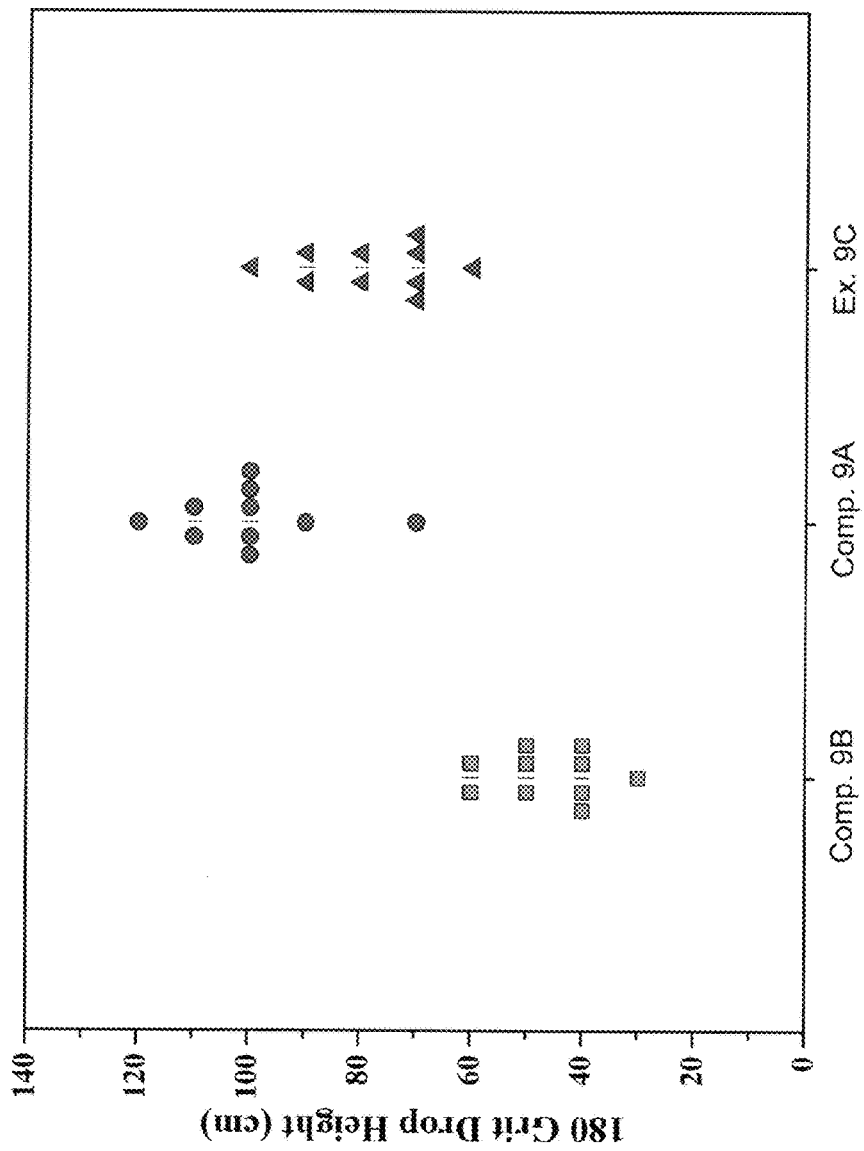
FIG. 43 is a graph showing drop height test results for Comparative Examples 9A, 9B, and Example 9C.
Figure 44:
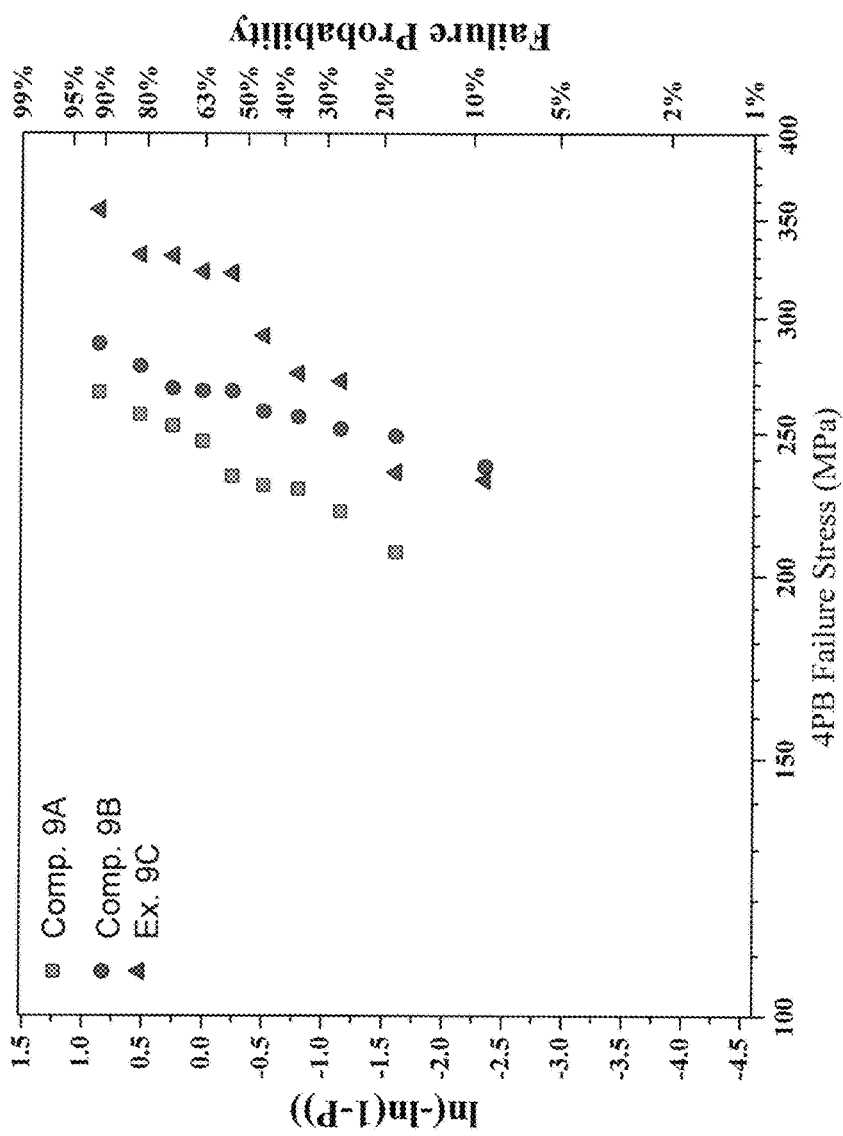
FIG. 44 is a graph showing failure probability for Comparative Examples 9A, 9B, and Example 9C when subject to four point bend stress to failure.

Glass substrates prepared as in Comparative Examples 9A and 9B, and Example 9C, were subject to incremental drop testing as set forth in Example 2, above, except that only 180 grit sandpaper drop surface was used, and were also subject to a four-point bend test (to test edge strength), again as set forth in Example 2. The results of the drop testing are shown in FIG. 43, whereas results of the four-point bend test are shown in FIG. 44. From FIG. 43, it is seen that the articles of Example 9C (which retain much of the DOC as Comparative Example 9A) show drop performance which is much better than that of Comparative Examples 9B, albeit not quite as high as the highest values from Comparative Examples 9A. From FIG. 44, it is seen that the articles of Example 9C have a better edge strength despite having a lower surface CS than those of Comparative Example 9B; they also have a better edge strength than the samples of Comparative Example 9A.

Figure 45:
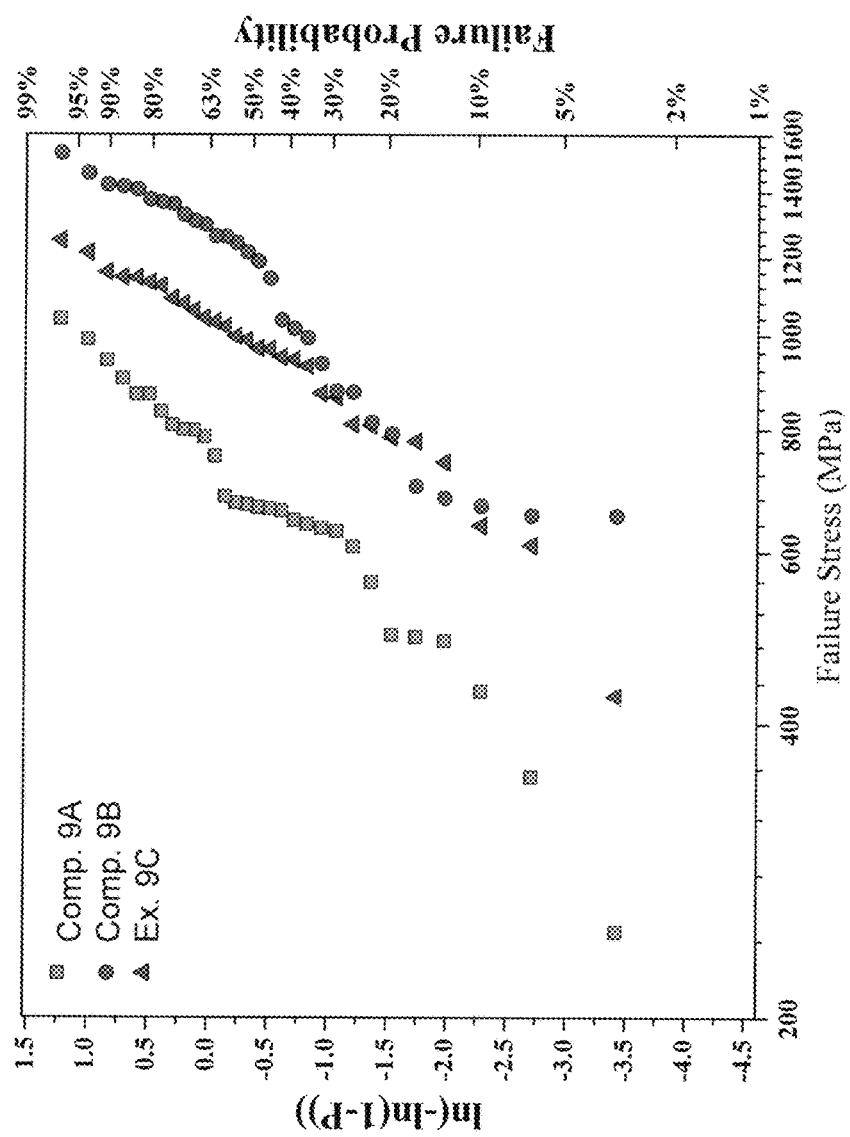
FIG. 45 is a graph showing failure probability for Comparative Examples 9A, 9B, and Example 9C when subject to ring-on-ring stress to failure.
Figure 46:
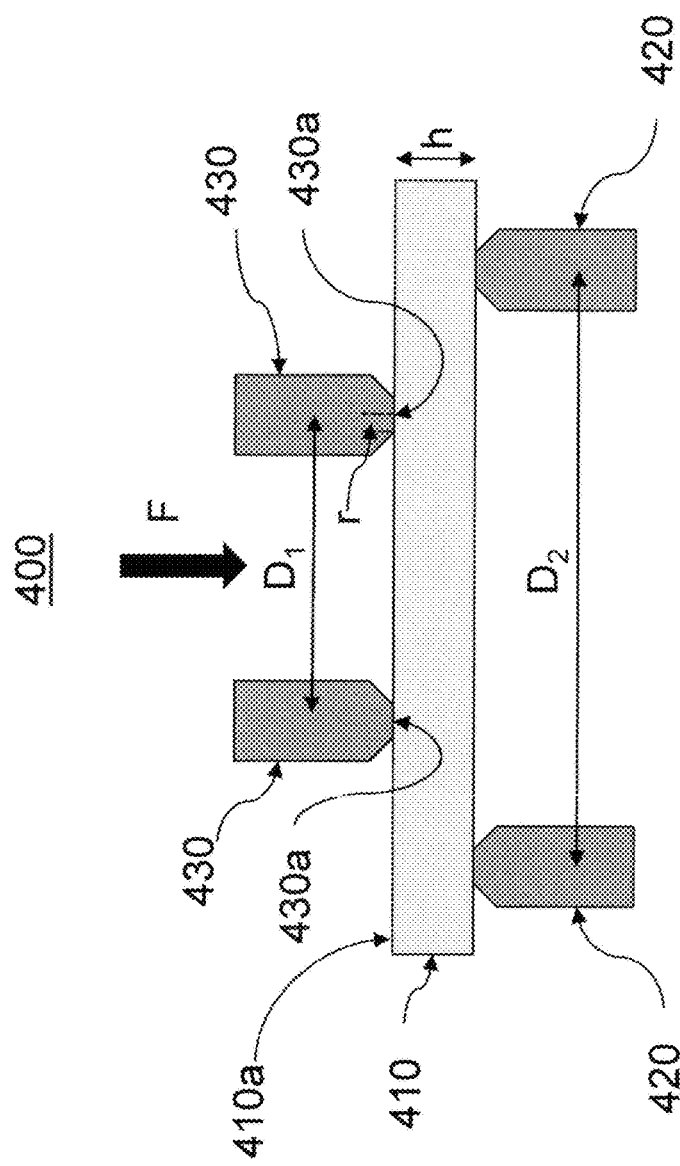
FIG. 46 is a schematic drawing of a ring-on-ring test set-up.

Further, glass substrates prepared as in Comparative Examples 9A and 9B, and Example 9C, were also subject to ring-on-ring testing to test surface strength. Ring-on-ring testing was carried out as explained below for abraded ring-on-ring (AROR) testing, except that the samples were not abraded prior to testing. The results of the ring-on-ring testing are shown in FIG. 45. As seen from FIG. 45, as expected, the samples of Comparative Example 9B (having the highest surface CS) performed the best. However, the samples of Example 9C, having a slightly lower surface CS than those of Example 9B, had a better surface strength than those of Comparative Example 9A, and slightly lower surface strength than that of the samples of Comparative Example 9B.

In order to test surface strength of already damaged (as by scratching) glass samples, i.e., retained strength after damage, an abraded ring-on-ring test (AROR) was used; this test may be more reflective of how the glass samples will perform during real-world use conditions. The strength of a material is the stress at which fracture occurs, and the AROR test is a surface strength measurement for testing flat glass specimens, and ASTM C1499-09(2013), entitled "Standard Test Method for Monotonic Equibiaxial Flexural Strength of Advanced Ceramics at Ambient Temperature," serves as the basis for the AROR test methodology described herein. The contents of ASTM C1499-09 are incorporated herein by reference in their entirety. The glass specimen is abraded prior to ring-on-ring testing with 90 grit silicon carbide (SiC) particles that are delivered to the glass sample using the method and apparatus described in Annex A2, entitled "abrasion Procedures," of ASTM C158-02(2012), entitled "Standard Test Methods for Strength of Glass by Flexure (Determination of Modulus of Rupture). The contents of ASTM C158-02 and the contents of Annex 2 in particular are incorporated herein by reference in their entirety.

Figure 47:
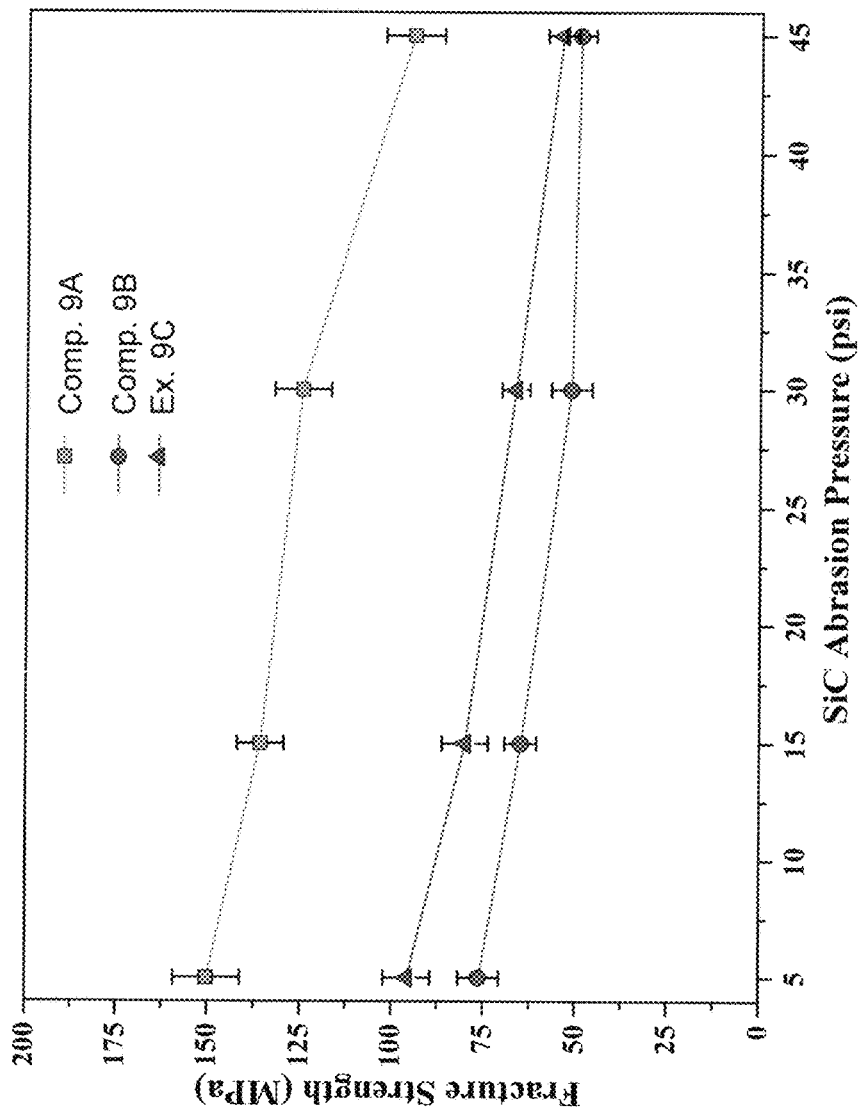
FIG. 47 is a graph showing ring-on-ring fracture strength for Comparative Examples 9A, 9B, and Example 9C when first subject to abrasion with SiC particles using various pressures.

Prior to ring-on-ring testing a spot on the surface of the glass-based article is abraded as described in ASTM C158-02, Annex 2, to normalize and/or control the surface defect condition of the sample using the apparatus shown in Figure A2.1 of ASTM C158-02. To form an abraded spot, the abrasive material is sandblasted onto the surface 410a of the glass-based article at a defined load (herein various loads were used as shown in FIG. 47, e.g., 5, 15, 30, and 45, psi) using an air pressure of 304 kPa (44 psi). After air flow is established, 5 cm³ of abrasive material is dumped into a funnel and the sample is sandblasted for 5 seconds after introduction of the abrasive material. The abraded spot was about 1 cm in diameter and was located in the center of the sample. During testing, the abraded spot is located concentrically with the rings.

For the AROR test, a glass-based article having an abraded spot on surface 410a as shown in FIG. 10 is placed between two concentric rings of differing size to determine equibiaxial flexural strength (i.e., the maximum stress that a material is capable of sustaining when subjected to flexure between two concentric rings). In the AROR configuration 400, the abraded glass-based article 410 is supported by a support ring 420 having a diameter D2. A force F is applied by a load cell (not shown) to the surface of the glass-based article by a loading ring 430 having a diameter D1.

The ratio of diameters of the loading ring and support ring D1/D2 may be in a range from 0.2 to 0.5. In some embodiments, D1/D2 is 0.5. Loading and support rings 130, 120 should be aligned concentrically to within 0.5% of support ring diameter D2. The load cell used for testing should be accurate to within ±1% at any load within a selected range. Testing is carried out at a temperature of 23±2° C. and a relative humidity of 40±10%.

For fixture design, the radius r of the protruding surface of the loading ring 430 is in a range of h/2≤r≤3h/2, where h is the thickness of glass-based article 410. Loading and support rings 430, 420 are made of hardened steel with hardness HRc>40. AROR fixtures are commercially available.

The intended failure mechanism for the AROR test is to observe fracture of the glass-based article 410 originating from the surface 430a within the loading ring 430. Failures that occur outside of this region—i.e., between the loading ring 430 and support ring 420—are omitted from data analysis. Due to the thinness and high strength of the glass-based article 410, however, large deflections that exceed ½ of the specimen thickness h are sometimes observed. It is therefore not uncommon to observe a high percentage of failures originating from underneath the loading ring 430. Stress cannot be accurately calculated without knowledge of stress development both inside and under the ring (collected via strain gauge analysis) and the origin of failure in each specimen. AROR testing therefore focuses on peak load at failure as the measured response.

The strength of glass-based article depends on the presence of surface flaws. However, the likelihood of a flaw of a given size being present cannot be precisely predicted, as the strength of glass is statistical in nature. A probability distribution can therefore be used as a statistical representation of the data obtained.

The results of the abraded ring-on-ring test are shown in FIG. 47. As seen from FIG. 47, the substrates of Example 9C had a better retained strength than did the samples of Comparative Example 9B, likely due to their deeper DOC, albeit not as high as the retained strength of the samples of Comparative Example 9A. And this was true over a range of flaw sizes as evidenced by the differing pressure used for the abrasive particles.

In summary for Example 9, it was possible to use thermally and chemically strengthening together, in a soda-lime glass to produce a combination profile that had a higher DOL and DOC but slightly lower CS. The combination profile showed, as compared to the profile achieved by chemically strengthening alone: deeper DOL and DOC; lower surface CS, but such will not always be the case, depending on the temper level and IOX conditions for the tempered glass; better drop performance (on 180 grit sandpaper drop surface); improved edge strength (as by four-point bend); comparable warp (as by Flatmaster); lower surface strength (as by ring-on-ring), but again this will not always be true depending on the level of surface CS that can be attained in the combination profile; better retained strength (as by abraded ring-on-ring); improved Vickers indentation threshold; and comparable Knoop scratch performance.

Example 10

Substrates made of Glaverbel SLG, having a nominal composition of 70.9 mol % $SiO_2$, 0.8 mol % $Al_2O_3$, 13.2 mol % $Na_2O$, 0.11 mol % $K_2O$, 6.6 mol % MgO, 8.2 mol % CaO, 0.03 $Fe_2O_3$ and 0.22 mol % $SO_3$, and having a thickness of about 1.08 mm, were thermally strengthened, chemically strengthened without prior thermal strengthening, or thermally and then chemically strengthened.

Specifically, Comparative Example 10A included a thermally strengthened glass article that was heated to a $T_0$ of about 690° C. and then quenched at h=0.035 cal/cm²-s-° C., no chemical strengthening was performed. Comparative Example 10B was a glass substrate that was not thermally strengthened, but that was chemically strengthened by immersing in a molten salt bath of 100% $KNO_3$ having a temperature of 420° C. for 5.5 hours. Example 10C was a glass substrate that was thermally strengthened in the same manner as Example 10A, but was then chemically strengthened by ion-exchange by immersing in a molten salt bath of 100% $KNO_3$ having a temperature of 420° C. for 5.5 hours, i.e., the same conditions as in Comparative Example 10B. See Table 32.

TABLE 32

Thermal strengthening and chemical strengthening conditions for Comparative Examples 10A and 10B, and Example 10C.

|  | Thermal strengthening conditions ($T_0$, h) | Chemical strengthening |
|---|---|---|
| Comparative Ex. 9A | $T_0$ = 690° C.<br>h = 0.035 cal/cm²-s-° C. | None |
| Comparative Ex. 9B | None | 100% KNO3, 420° C., 5.5 hours |
| Ex. 9C | $T_0$ = 690° C.<br>h = 0.035 cal/cm²-s-° C. | 100% KNO3, 420° C., 5.5 hours |

The CS, CT, DOL and DOC values (as an absolute measurement and as a percentage of the glass article thickness) of all the resulting glass articles were measured and are shown in Table 33. As shown in Table 33, Example 10C exhibited a DOL of about 11 micrometers and a surface CS of about 525 MPa. By selecting appropriate thermal and chemical strengthening conditions, the thermally and chemically strengthened glass articles of Example 10C exhibit slightly less surface CS values as Example 10B (525 MPa versus 550 MPa), about the same DOL values (10.9 microns versus 10.6 microns), but a total DOC that is many times larger than achievable by a chemical strengthening process alone (217 microns versus about 11 microns). Additionally, by selecting appropriate thermal and chemical strengthening conditions, the thermally and chemically strengthened glass articles of Example 10C exhibit a similar DOC as the thermally-only strengthened articles of Comparative Example 10A (217 microns versus 230 microns), but a much higher surface CS than those of Comparative Example 10A (i.e., 525 MPa versus 118 MPa).

TABLE 33

Measured properties of the resulting thermally and chemically strengthened glass articles of Comparative Examples 10A and 10B, and Example 10C.

| Example | CS (MPa) | CT (MPa) | DOL (in µm) | DOC (in µm) | DOC as % of article thickness |
|---|---|---|---|---|---|
| Comparative Ex. 10A | 118 | 62 | 0 | 230 | 21.3 |
| Comparative Ex. 10B | 550 | 5.5 | 10.6 | 10.6 | 1 |
| Ex. 10C | 525 | 22.4 | 10.9 | 217 | 20.1 |

The glass substrates of Comparative Examples 10A, 10B, and of Example 10C were compared in terms of mechanical performance. Specifically, samples of these glass substrates or articles were subjected to a Vicker's indentation threshold test and a Knoop scratch threshold test, as described above in Example 2. The results of each test are shown in Table 34. As is seen from Table 34, the use of thermal and chemical strengthening leads to an improvement in the Vickers indentation threshold over that of only-chemically strengthened substrates. As further seen from Table 34, the use of thermal and chemical strengthening also leads to an improvement in the Knoop scratch threshold over that of only-thermally strengthened substrates; Knoop values for Example 10C are lower than those in Comparative Example 10A, and are similar to those achieved in Comparative Example 10B. Also, it is seen that the Comparative Examples 10A had sustained surface cracking (i.e., failure mode 1), whereas Comparative Example 10B and Examples 10C similarly had surface cracks and/or a median crack (mode 3). Thus, the combination of thermally and chemically strengthening leads to glass substrates having advantaged properties over those having been subject to only thermal or only chemical strengthening. Another thing that can be seen from Table 34 is that the values for the Vicker's and Knoop tests were very similar when performed on the tin side of the substrate and on the air side of the substrate (the tin side being that in contact with a tin bath during forming of the glass substrate as in a "float" process, the air side being the non-tin side).

TABLE 34

Mechanical performance of the substrates in Comparative Examples 10A and 10B, and in Example 10C.

| | Vicker's (kg) | Knoop (N) | Failure Mode |
|---|---|---|---|
| Comparative Example 10A (thermally strengthened only at $T_0 = 690°$ C., h = 0.035) | 0.6-0.8 (air) 0.6-0.8 (tin) | 4-6 (air) 4-6 (tin) | 1 |
| Comparative Example 10B (chemically strengthened only, at 420° C. for 5.5 hours) | 0-0.2 (air) 0-0.2 (tin) | 2-4 (air) 2-4 (tin) | 3 |
| Example 10C (thermally strengthened at $T_0$ = 690° C., h = 0.035, and chemically strengthened at 420° C. for 5.5 hours) | 0.2-0.4 (air) 0 to 0.2 (tin) | 2-4 (air) 2-4 (tin) | 3 |

Figure 48:
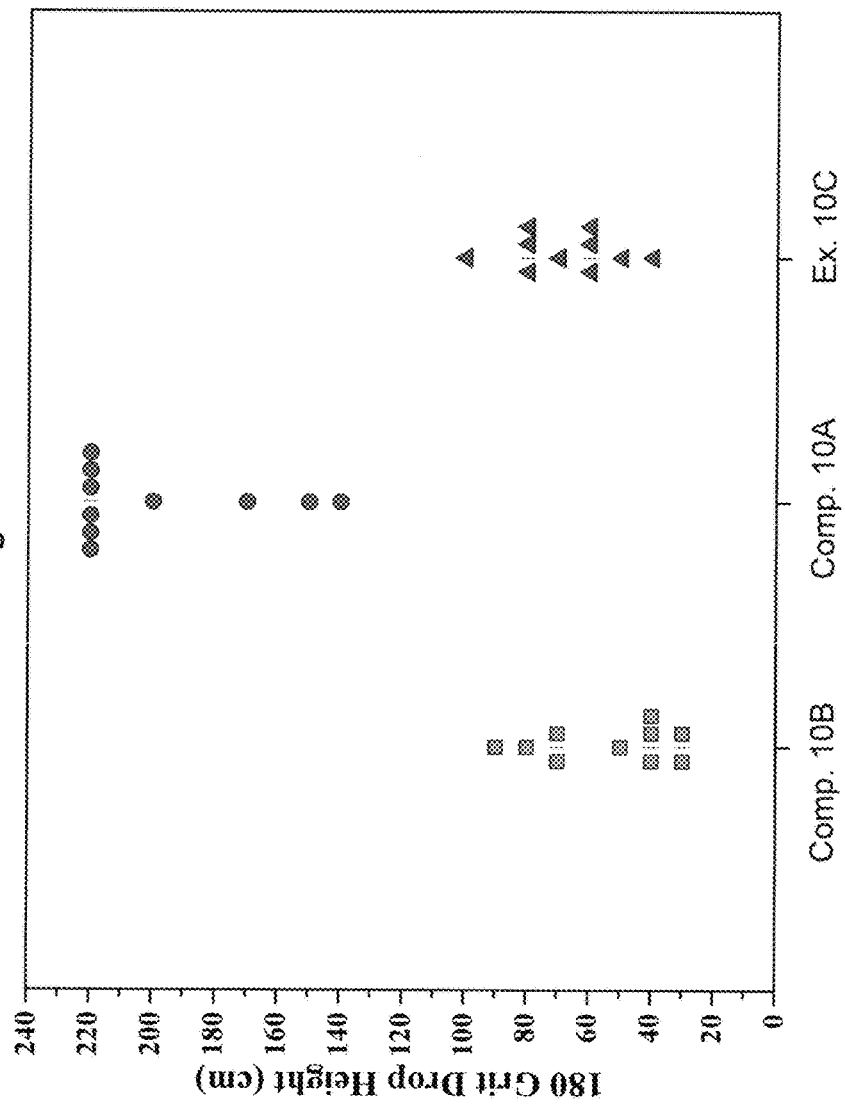
FIG. 48 is a graph showing drop height test results for Comparative Examples 10A, 10B, and Example 10C.
Figure 49:
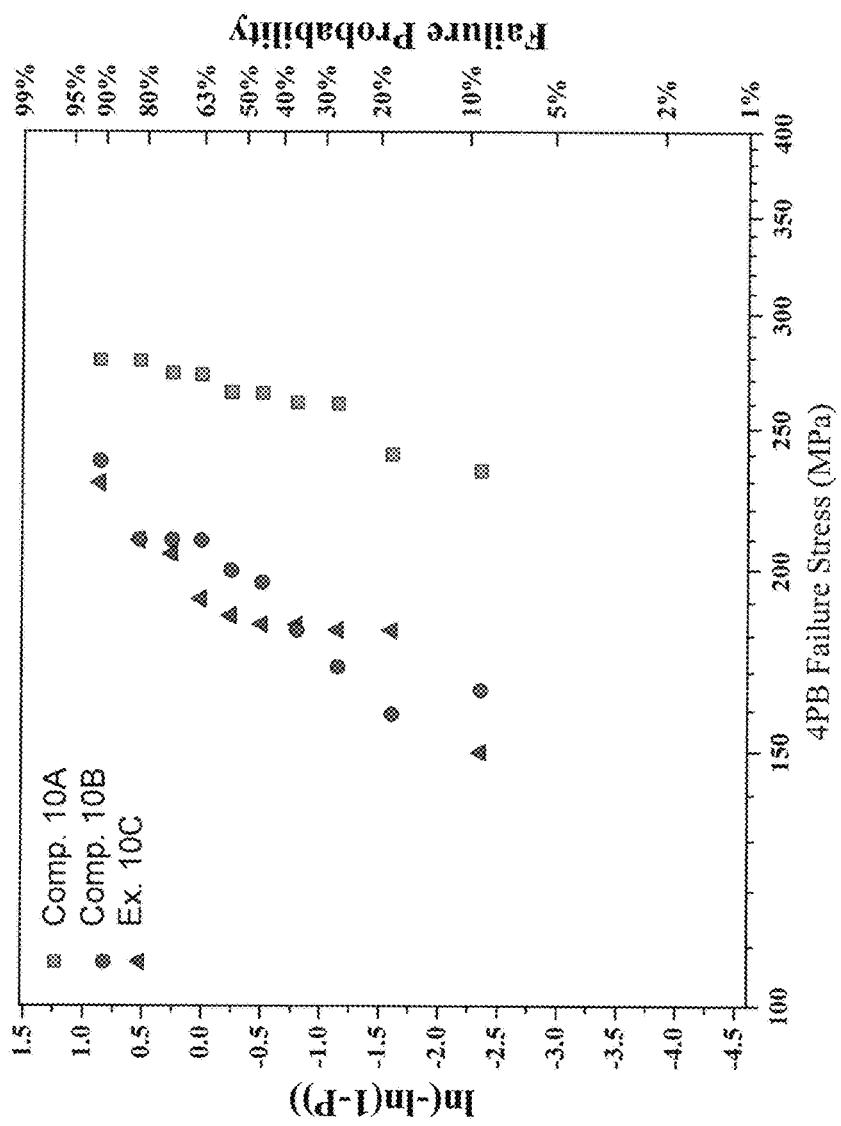
FIG. 49 is a graph showing failure probability for Comparative Examples 10A, 10B, and Example 10C when subject to four point bend stress to failure.

Glass substrates prepared as in Comparative Examples 10A and 10B, and Example 10C, were subject to incremental drop testing as set forth in Example 2, above, except that only 180 grit sandpaper drop surface was used, and were also subject to a four-point bend test (to test edge strength), again as set forth in Example 2. The results of the drop testing are shown in FIG. 48, whereas results of the four-point bend test are shown in FIG. 49. From FIG. 48, it is seen that the articles of Example 10C (which retain much of the DOC as Comparative Example 10A) show drop performance which is similar to, but slightly better than, that of Comparative Examples 10B, albeit not as high as the values from Comparative Examples 10A. From FIG. 49, it is seen that the articles of Example 10C have a similar edge strength despite having a lower surface CS than those of Comparative Example 10B.

Figure 50:
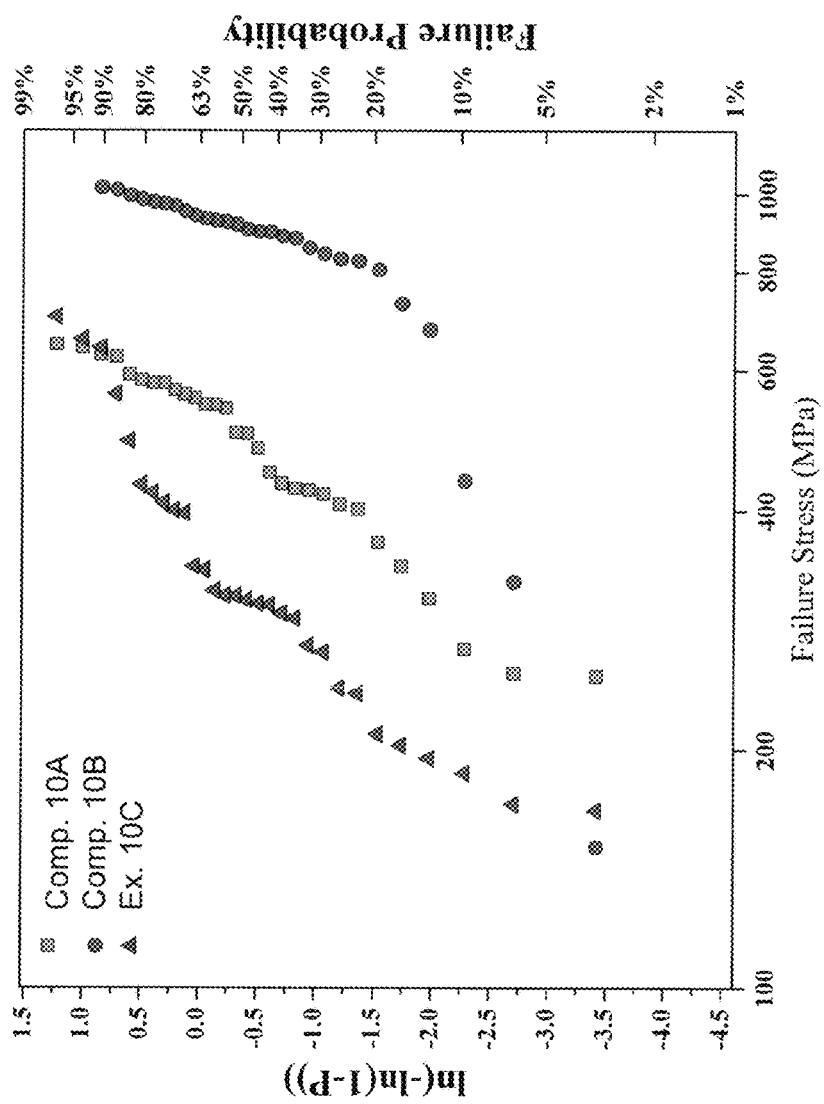
FIG. 50 is a graph showing failure probability for Comparative Examples 10A, 10B, and Example 10C when subject to ring-on-ring stress to failure.
Figure 51:
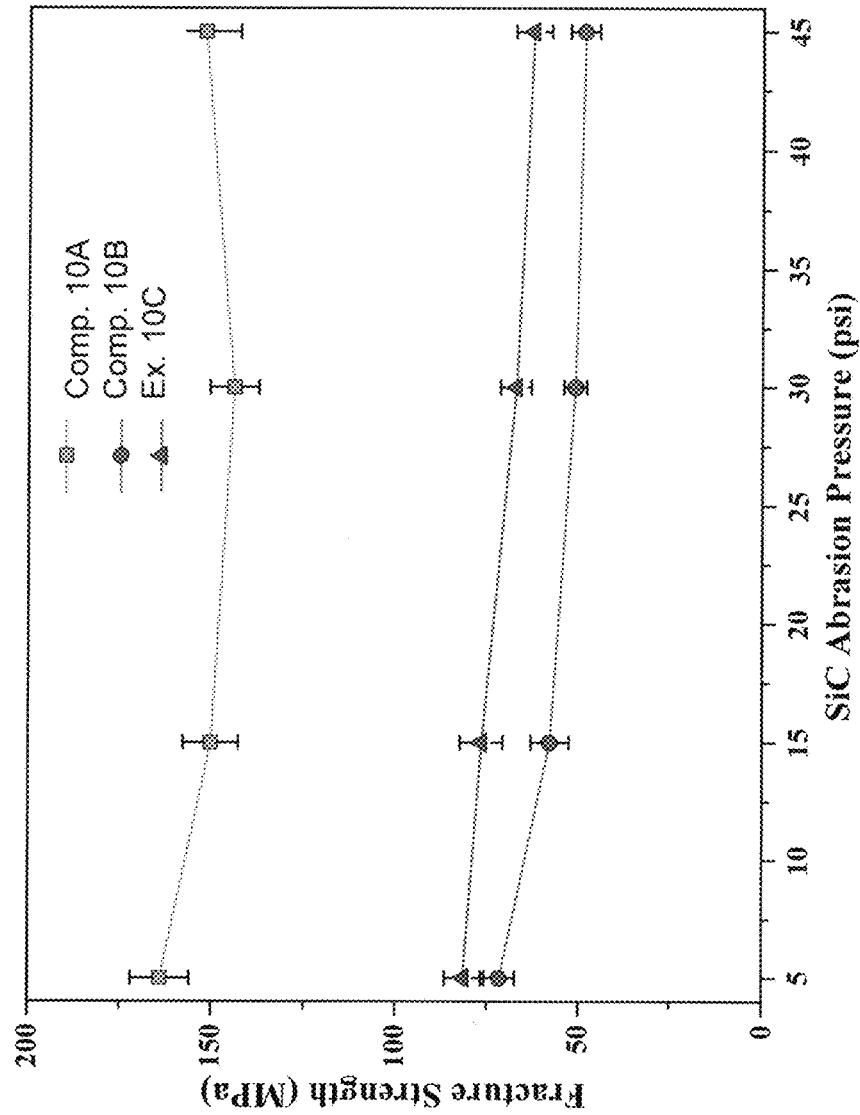
FIG. 51 is a graph showing ring-on-ring fracture strength for Comparative Examples 10A, 10B, and Example 10C when first subject to abrasion with SiC particles using various pressures.

Further, glass substrates prepared as in Comparative Examples 10A and 10B, and Example 10C, were also subject to ring-on-ring testing to test surface strength. Ring-on-ring testing was carried out as explained above in connection with Example 9. The results of the ring-on-ring testing are shown in FIG. 50. As seen from FIG. 50, as expected, the samples of Comparative Example 10B (having the highest surface CS) performed the best. However, the samples of Example 10C, having a slightly lower surface CS than those of Example 9B, but higher than those of Comparative Example 10A, had an unexpectedly lower surface strength than those of Comparative Example 9A. It is believed that the parts of Example 10C were scratched in handling which affected their performance in this test.

In order to test surface strength of already damaged (as by scratching) glass samples, i.e., retained strength after damage, an abraded ring-on-ring test (AROR) was used; this test may be more reflective of how the glass samples will perform during real-world use conditions. The results of the abraded ring-on-ring test are shown in FIG. 50. As seen from FIG. 50, the substrates of Example 10C had a better retained strength than did the samples of Comparative Example 10B, likely due to their deeper DOC, albeit not as high as the retained strength of the samples of Comparative Example 10A. And this was true over a range of flaw sizes as evidenced by the differing pressure used for the abrasive particles.

In summary for Example 10, it was possible to use thermal and chemical strengthening together, in a soda-lime glass to produce a combination profile that had a higher DOL and DOC but slightly lower CS. The combination profile showed, as compared to the profile achieved by chemically strengthening alone: deeper DOL and DOC; lower surface CS, but such will not always be the case, depending on the temper level and IOX conditions for the tempered glass; slightly better drop performance (on 180 grit sandpaper drop surface); similar edge strength (as by four-point bend); comparable warp; lower surface strength (as by ring-on-ring), but again this will not always be true depending on the level of surface CS that can be attained in the combination profile; comparable Vickers indentation threshold; and comparable Knoop scratch performance.

Example 11

The object of this Example 11 was to see whether thermal and chemical tempering could be used to create a predetermined a thermally achieved surface CS (from about 70 to about 100 MPa), a thermally achieved CT (from about 35 to about 50 MPa), chemically achieved surface CS of about 800 MPa or higher, and DOL (about 12 microns or more) in a particular glass composition. The glass composition was Corning Code 2320 (available from Corning Incorporated, Corning, N.Y.), having a nominal composition of 61.9 wt % $SiO_2$, 3.9 wt % $B_2O_3$, 19.7 wt % $Al_2O_3$, 12.9 wt % $Na_2O$, 1.4 wt % MgO, and 0.22 wt % $SO_3$, and having a thickness of about 0.7 mm. Further, the glass samples had a Young's modulus of 70 GPa, a low-temperature CTE of about $75.8 \times 10^{-7}$ (wherein low-temperature CTS is over the range of about 20 to about 300° C.), a softening point of 900° C., and a strain point of about 580° C. Samples of the glass were thermally strengthened, and then chemically strengthened using various different chemical strengthening conditions.

Figure 52:
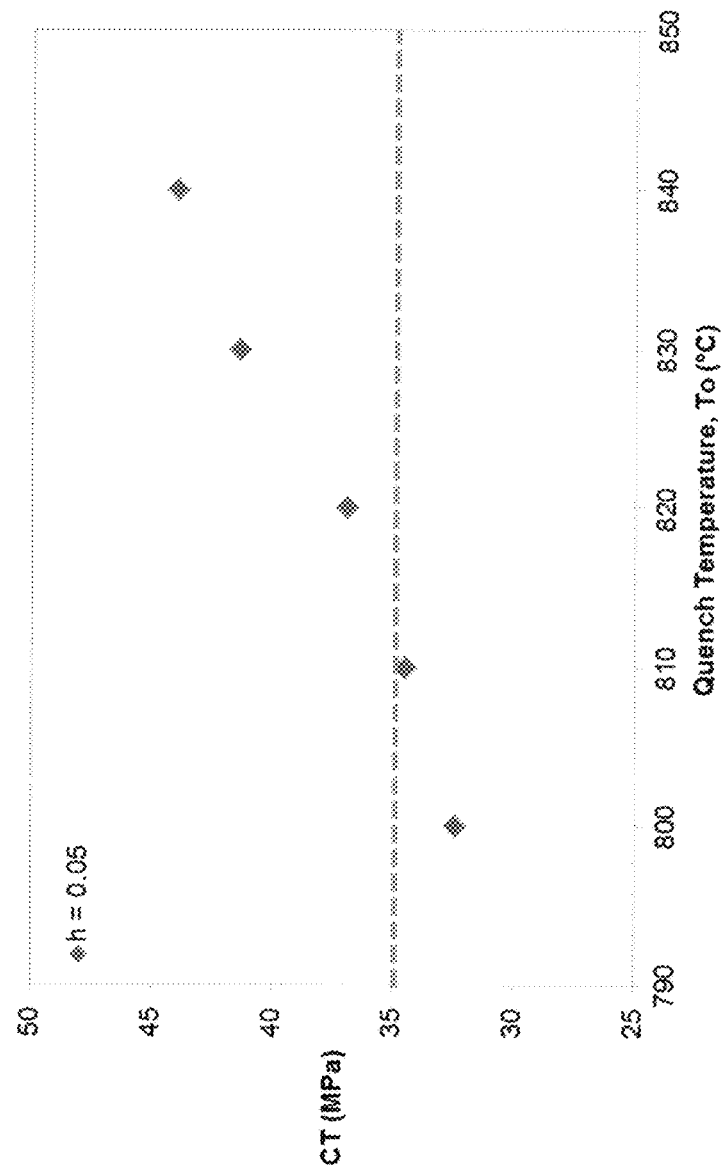
FIG. 52 is a plot of CT versus various initial temperature ($T_0$) for the same heat transfer rate (h)

At first, samples of the glass were thermally treated from a $T_0$ of 800° C., 810° C., 820° C., 830° C., and 840° C., with h=0.05 cal/cm²-s-° C. These samples were measured with SCALP to obtain the CT and DOC. The CT values are shown as a function of temperature in FIG. 52. From FIG. 52 it is seen that with the selected h, any $T_0$ of 810° C. or more should achieve a CT of about 35 MPa or more. The DOC was found to be relatively invariant and had an average of 152 microns.

From the above initial experiment, a $T_0$ of 830° C. and h=0.05 cal/cm²-s-° C. were chosen for further exploration. Thus, using a $T_0$ of 830° C. and h=0.05 cal/cm²-s-° C., samples were thermally strengthened, and were then further subject to chemical strengthening (by ion-exchange by immersing in a molten salt bath of 100% $KNO_3$) at temperatures between 390° C. and 430° C. for times ranging from 15 minutes to 1 hour. FSM was used to characterize the CS and the DOL. The samples were also measured by SCALP to obtain the CT and DOC after chemical strengthening. The chemical strengthening conditions, CS, CT, DOL, DOC, and DOC as a percent of thickness are shown in Table 35.

Specifically, Comparative Example 11A included a thermally strengthened glass article that was heated to a $T_0$ of about 830° C. and then quenched at h=0.05 cal/cm²-s-° C. Examples 11B-1 through 11B-3, 11C-1 through 11C-3, 11D-1 through 11D-3, 11E-1 through 11E-3, 11F-1 through 11F-3, included glass articles that included the same glass substrate and that were thermally strengthened in the same manner as Comparative Examples 11A, but were then chemically strengthened by ion-exchange by immersing in a molten salt bath of 100% $KNO_3$ having a temperature of about 390° C., of about 400° C., of about 410° C., of about 420° C., and about 430° C., for 15 minutes, 30 minutes, and 60 minutes, according to Table 35.

TABLE 35

Thermal strengthening and chemical strengthening conditions for Example 11.

| | Thermal strengthening conditions ($T_0$, h) | Chemical strengthening duration and temperature |
|---|---|---|
| Comp. Ex. 11A | $T_0$ = 830° C.<br>h = 0.05 cal/cm²-s-° C. | None |
| Ex. 11B-1 | $T_0$ = 830° C.<br>h = 0.05 cal/cm²-s-° C. | 15 minutes<br>390° C. |
| Ex. 11B-2 | $T_0$ = 830° C.<br>h = 0.05 cal/cm²-s-° C. | 30 minutes<br>390° C. |
| Ex. 11B-3 | $T_0$ = 830° C.<br>h = 0.05 cal/cm²-s-° C. | 60 minutes<br>390° C. |
| Ex. 11C-1 | $T_0$ = 830° C.<br>h = 0.05 cal/cm²-s-° C. | 15 minutes<br>400° C. |
| Ex. 11C-2 | $T_0$ = 830° C.<br>h = 0.05 cal/cm²-s-° C. | 30 minutes<br>400° C. |
| Ex. 11C-3 | $T_0$ = 830° C.<br>h = 0.05 cal/cm²-s-° C. | 60 minutes<br>400° C. |
| Ex. 11D-1 | $T_0$ = 830° C.<br>h = 0.05 cal/cm²-s-° C. | 15 minutes<br>410° C. |
| Ex. 11D-2 | $T_0$ = 830° C.<br>h = 0.05 cal/cm²-s-° C. | 30 minutes<br>410° C. |
| Ex. 11D-3 | $T_0$ = 830° C.<br>h = 0.05 cal/cm²-s-° C. | 60 minutes<br>410° C. |
| Ex. 11E-1 | $T_0$ = 830° C.<br>h = 0.05 cal/cm²-s-° C. | 15 minutes<br>420° C. |
| Ex. 11E-2 | $T_0$ = 830° C.<br>h = 0.05 cal/cm²-s-° C. | 30 minutes<br>420° C. |
| Ex. 11E-3 | $T_0$ = 830° C.<br>h = 0.05 cal/cm²-s-° C. | 60 minutes<br>420° C. |
| Ex. 11F-1 | $T_0$ = 830° C.<br>h = 0.05 cal/cm²-s-° C. | 15 minutes<br>430° C. |
| Ex. 11F-2 | $T_0$ = 830° C.<br>h = 0.05 cal/cm²-s-° C. | 30 minutes<br>430° C. |
| Ex. 11F-3 | $T_0$ = 830° C.<br>h = 0.05 cal/cm²-s-° C. | 60 minutes<br>430° C. |

Figure 53:
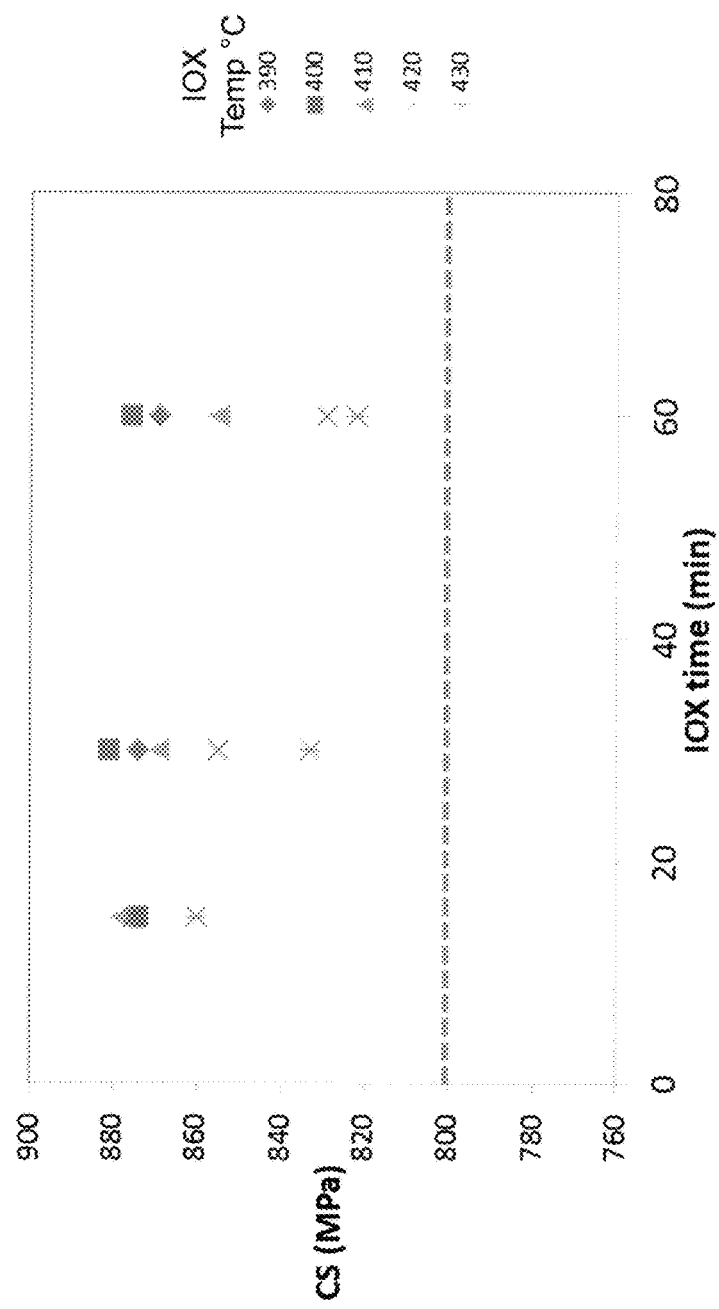
FIG. 53 is a plot of CS for various ion-exchange times and temperatures with the same molten bath composition.
Figure 54:
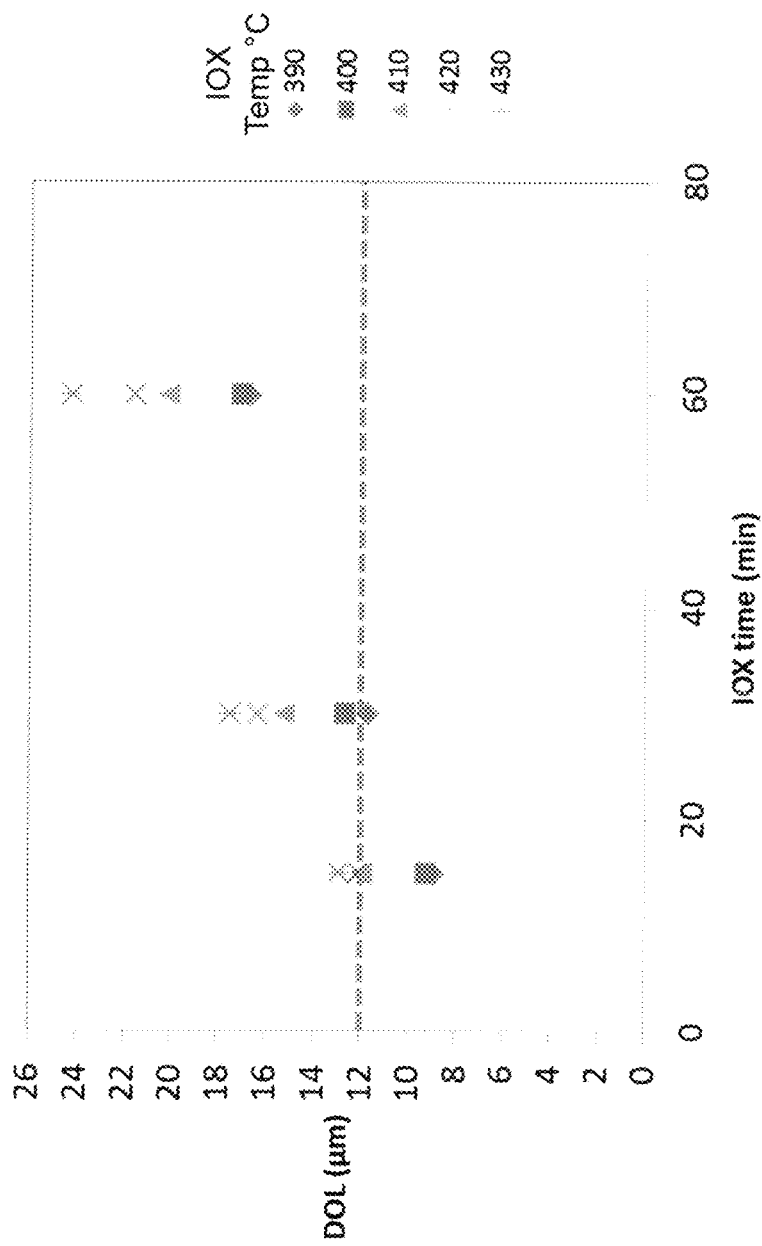
FIG. 54 is a plot of DOL for various ion-exchange times and temperatures with the same molten bath composition.

The CS, CT, DOL and DOC values (as an absolute measurement and DOC as a percentage of the glass article thickness) of all the resulting glass articles were measured and are shown in Table 36. As shown in FIG. 53, showing average CS as a function of IOX time, it is seen that at ion-exchange bath temperatures less than about 420° C., the CS is relatively constant at about 870 MPa in the time range of from about 15 minutes to about 60 minutes. As shown in FIG. 54, showing DOL as a function of IOX time, at times of 15 minutes and greater, a DOL of 12 microns or greater can be achieved with bath temperatures ranging from about 410° C. to about 430° C., and at times of about 30 minutes and greater, a DOL of 12 microns or greater can be achieved with bath temperatures ranging from about 390° C. and greater, for example from about 390° C. to about 430° C. In all cases shown in FIG. 54, the CS was greater than 800 MPa.

TABLE 36

Measured properties of the resulting thermally and chemically strengthened glass articles of Comparative Example 11A, Examples 11B-1 through 11B-3, Examples 11C-1 through 11C-3, Examples 11D-1 through 11D-3, Examples 11E-1 through 11E-3, Examples 11F-1 through 11F-3.

| Example | CS (MPa) | CT (MPa) | DOL (in μm) | DOC (in μm) | DOC as % of article thickness |
|---|---|---|---|---|---|
| Comp. Ex. 11A | 90 | 44 | — | 152 | 21.7 |
| Ex. 11B-1 | 874 | 51 | 8.9 | 137 | 19.6 |
| Ex. 11B-2 | 874 | 54 | 11.7 | 122 | 17.4 |
| Ex. 11B-3 | 869 | 56 | 16.7 | 120 | 17.1 |
| Ex. 11C-1 | 874 | 52 | 9.2 | 130 | 18.6 |
| Ex. 11C-2 | 881 | 54 | 12.7 | 119 | 17.0 |
| Ex. 11C-3 | 876 | 56 | 17.1 | 110 | 15.7 |
| Ex. 11D-1 | 878 | 50 | 11.9 | 137 | 19.6 |
| Ex. 11D-2 | 869 | 53 | 15.2 | 124 | 17.7 |
| Ex. 11D-3 | 855 | 58 | 20.2 | 111 | 15.9 |
| Ex. 11E-1 | 875 | 50 | 12.0 | 129 | 18.4 |
| Ex. 11E-2 | 855 | 53 | 16.3 | 121 | 17.3 |
| Ex. 11E-3 | 829 | 60 | 21.6 | 106 | 15.1 |
| Ex. 11F-1 | 860 | 48 | 12.9 | 130 | 18.6 |
| Ex. 11F-2 | 833 | 52 | 17.5 | 122 | 17.4 |
| Ex. 11F-3 | 822 | 58 | 24.2 | 110 | 15.7 |

Accordingly, with Corning code 2320 glass, the target profile (a thermally achieved surface CS from about 70 to about 100 MPa, a thermally achieved CT from about 35 to about 50 MPa, chemically achieved surface CS of about 800 MPa or higher, and DOL of about 12 microns or more) can be achieved using thermal strengthening conditions of $T_0$ greater than or equal to 830° C., and h of about 0.05 cal/cm²-s-° C. These thermal strengthening conditions will not significantly change the chemical strengthening behavior because the fictive temperature is relatively constant for all conditions. The subsequent chemical strengthening conditions (in a molten salt bath of 100% KNO3) can be a temperature of 390° C. for greater than 30 minutes, a temperature of 400° C. for greater than or equal to 30 minutes, a temperature of 410° C. for greater than or equal to 30 minutes, a temperature of 420° C. for greater than or equal to 15 minutes, or a temperature of 430° C. for greater than or equal to 15 minutes. The fictive temperature of the resultant glass will be relatively high, e.g. about 775° C., or about 150° C. above the glass transition temperature. The use of thermal strengthening prior to chemical strengthening (as exemplified by the conditions noted above for this Example 11) is expected to translate into further improved scratch performance compared with chemical strengthening alone.

The strengthened articles disclosed herein may be incorporated into another article such as an article with a display (or display articles) (e.g., consumer electronics, including mobile phones, tablets, computers, navigation systems, and the like), architectural articles, transportation articles (e.g., automotive, trains, aircraft, sea craft, etc.), appliance articles, or any article that requires some transparency, scratch-resistance, abrasion resistance or a combination thereof. An exemplary article incorporating any of the strengthened articles disclosed herein is shown in FIGS. 55A and 55B. Specifically, FIGS. 55A and 55B show a consumer electronic device 5100 including a housing 5102 having front 5104, back 5106, and side surfaces 5108; electrical components (not shown) that are at least partially inside or entirely within the housing and including at least a controller, a memory, and a display 5110 at or adjacent to the front surface of the housing; and a cover substrate 5112 at or over the front surface of the housing such that it is over the display. In some embodiments, the cover substrate 5112 may include any of the strengthened articles disclosed herein.

It will be apparent to those skilled in the art that various modifications and variations can be made without departing from the spirit or scope of the disclosure. Also, the various features and characteristics of the disclosure may be combined in any and all combinations as exemplified by the following embodiments.

Embodiment 1

A glass-based article comprising:
a first surface and a second surface opposing the first surface defining a thickness (t);
a first compressive stress (CS) region comprising a concentration of a metal oxide that is both non-zero and varies along a portion of the thickness; and
a second CS region being substantially free of the metal oxide of the first CS region, the second CS region extending from the first CS region to a depth of compression (DOC) of about 0.17·t or greater, as measured from the first surface.

Embodiment 2

The glass-based article of embodiment 1, wherein the metal oxide comprises any one of $Na_2O$, $K_2O$, $Rb_2O$ and $Cs_2O$.

Embodiment 3

The glass-based article of embodiment 2, wherein the metal oxide comprises $K_2O$.

Embodiment 4

The glass-based article of embodiment 2, wherein the metal oxide comprises $Na_2O$.

Embodiment 5

The glass-based article of any one of embodiments 1-4, further comprising a central tension (CT) region, wherein the second CS region and at least a portion of the CT region comprise an identical glass composition.

Embodiment 6

The glass-based article of any one of embodiments 1-5, wherein the concentration of the metal oxide is both non-zero and varies along the portion of the thickness from the first surface to a depth in the range from greater than about 0·t to less than about 0.17·t.

Embodiment 7

The glass-based article of any one of embodiments 1-6, wherein the concentration of the metal oxide is both non-zero and varies along the portion of the thickness from the first surface to a depth in the range from greater than about 0.01·t to about 0.1·t.

Embodiment 8

The glass-based article of any one of embodiments 1-7, wherein the thickness t is less than about 2 mm.

Embodiment 9

The glass-based article of embodiment 8, wherein the thickness t is less than about 1.2 mm.

Embodiment 10

The glass-based article of any one of embodiments 1-9, further comprising a surface CS of about 400 MPa or greater.

Embodiment 11

The glass-based article of embodiment 10, further comprising a surface CS of about 600 MPa or greater.

Embodiment 12

The glass-based article of any one of the preceding embodiments, further exhibiting a Knoop scratch threshold of about 8 N or greater.

Embodiment 13

The glass-based article of any one of the preceding embodiments, further exhibiting a Vicker's crack initiation threshold of about 120 N or greater.

Embodiment 14

A glass-based article comprising:
a first surface and a second surface opposing the first surface defining a thickness (t);
a thermally strengthened region extending from the first surface to a DOC, the thermally strengthened region comprising a chemically strengthened region extending from the first surface to a depth of layer (DOL);
wherein the DOC is greater than the DOL and the DOC is greater than or equal to about 0.17t.

Embodiment 15

The glass-based article of embodiment 14, wherein the thickness t is less than about 2 mm.

Embodiment 16

The glass-based article of embodiment 15, wherein the thickness t is less than about 1.2 mm.

Embodiment 17

The glass-based article of any one of embodiments 14-16, further comprising a surface CS of about 400 MPa or greater.

Embodiment 18

The glass-based article of embodiment 17, further comprising a maximum CT of about 25 MPa or greater.

Embodiment 19

The glass-based article of embodiment 18, further comprising a surface CS of about 1 GPa or greater and a maximum central tension (CT) of about 75 MPa or greater.

Embodiment 20

The glass-based article of embodiment 19, wherein the maximum CT is about 80 MPa or greater.

Embodiment 21

The glass-based article of any one of embodiments 14-20, wherein the glass-based article comprises a composition including any one or more of $P_2O_5$, $Li_2O$, and $B_2O_3$.

Embodiment 22

The glass-based article of any one of embodiments 14-21, wherein the glass-based article comprises a composition including any two or more of $P_2O_5$, $Li_2O$, and $B_2O_3$.

Embodiment 23

The glass-based article of any one of embodiments 14-22, wherein the glass-based article comprises a stored tensile energy of about 6 $J/m^2$ or greater.

Embodiment 24

The glass-based article of embodiment 23, wherein the stored tensile energy is about 10 $J/m^2$ or greater.

Embodiment 25

The glass-based article of any one of embodiments 14-24, further comprising a CS value at the DOL of about 150 MPa or greater.

Embodiment 26

The glass-based article of any one of embodiments 14-25, wherein the DOL is about 10 micrometers or greater.

Embodiment 27

The glass-based article of any one of embodiments 14-26, further exhibiting a Knoop scratch threshold of about 8 N or greater.

Embodiment 28

The glass-based article of any one of embodiments 14-27, further exhibiting a Vicker's crack initiation threshold of about 120 N or greater.

Embodiment 29

A glass-based article comprising:
a first surface and a second surface opposing the first surface defining a thickness (t);
a first compressive stress (CS) region comprising a concentration of a first metal oxide that is both non-zero and varies along a portion of the thickness and a second metal oxide; and
a second CS region comprising the second metal oxide and being substantially free of the first metal oxide of the first CS region, the second CS region extending from the first CS region to a depth of compression (DOC) of about 0.17·t or greater, as measured from the first surface.

Embodiment 30

The glass-based article of embodiment 29, wherein the first metal oxide comprises a first metal ion comprising a first diameter, and the second metal oxide comprising a second metal ion comprising a second diameter, wherein the second diameter is less than the first diameter.

Embodiment 31

The glass-based article of embodiment 30, wherein the first metal oxide comprises $K_2O$ and the second metal oxide comprises $Na_2O$.

Embodiment 32

The glass-based article of any one of embodiments 29-31, further comprising a central tension (CT) region, wherein the second CS region and at least a portion of the CT region comprise an identical glass composition.

Embodiment 33

The glass-based article of any one of embodiments 29-32, wherein the concentration of the first metal oxide is both non-zero and varies along the portion of the thickness from the first surface to a depth in the range from greater than about 0·t to less than about 0.17·t.

Embodiment 34

The glass-based article of any one of embodiments 29-33, wherein the concentration of the first metal oxide is both non-zero and varies along the portion of the thickness from the first surface to a depth in the range from greater than about 0.01·t to about 0.1·t.

Embodiment 35

The glass-based article of any one of embodiments 29-34, wherein the thickness t is less than about 2 mm.

Embodiment 36

The glass-based article of embodiment 35, wherein the thickness t is less than about 1.2 mm.

Embodiment 37

The glass-based article of any one of embodiments 29-36, further comprising a surface CS of about 400 MPa or greater.

Embodiment 38

The glass-based article of embodiment 37, further comprising a surface CS of about 600 MPa or greater.

Embodiment 39

The glass-based article of any one of embodiments 29-38, further exhibiting a Knoop scratch threshold of about 8 N or greater.

Embodiment 40

The glass-based article of any one of embodiments 29-39, further exhibiting a Vicker's crack initiation threshold of about 120 N or greater.

Embodiment 41

A chemically strengthened glass-based article comprising:

a first surface and a second surface opposing the first surface defining a thickness (t); and a thermally strengthened region, wherein the first surface is flat to 100 μm total indicator run-out (TIR) along any 50 mm or less profile of the first surface, wherein the glass-based article comprises a glass having a softening temperature, expressed in units of ° C., of $T_{soft}$ and an annealing temperature, expressed in units of ° C., of $T_{anneal}$, and a surface fictive temperature measured on the first surface of the glass sheet represented by Tfs, when expressed in units of ° C. and a non-dimensional surface fictive temperature parameter θs given by $(Tfs-T_{anneal})/(T_{soft}-T_{anneal})$, wherein the parameter θs is in the range of from 0.20 to 0.9.

Embodiment 42

The glass-based article of embodiment 41, wherein the glass-based article comprises a glass sheet having a length, expressed in millimeters, of l, and a width, expressed in millimeters, of w, wherein t is less than l and less than w, and l and w are each at least 10 mm.

Embodiment 43

The glass-based article of embodiment 42, wherein either one or both l and w are at least 40 mm.

Embodiment 44

The glass-based article of embodiment 41 or 42, wherein the ratio l/t and the ratio w/t each are equal to 10/1 or greater.

Embodiment 45

The glass-based article of any one of embodiments 41-44, wherein the first surface has a roughness in the range of from 0.2 to 1.5 nm Ra over an area of 10×10 μm.

Embodiment 46

The glass-based article of any one of embodiments 41-45, wherein t is less than 2 mm.

Embodiment 47

The glass-based article of any one of embodiments 41-46, wherein t is about 1.2 mm or less.

Embodiment 48

The glass-based article of any one of embodiments 41-47, wherein the surface fictive temperature measured on the first surface is at least 50° C. above a glass transition temperature of the glass.

Embodiment 49

The glass-based article of embodiment 48, wherein the surface fictive temperature measured on the first surface is at least 75° C. above a glass transition temperature of the glass.

Embodiment 50

The glass-based article of any one of embodiments 41-49, further comprising a chemically strengthened region that extends from the first surface to a DOL, wherein the thermally strengthened region extends from the first surface to a DOC, wherein the DOC is greater than the DOL and the DOC is greater than or equal to about 0.17t.

Embodiment 51

The glass-based article of any one of embodiments 41-50, further comprising a surface CS of about 1 GPa or greater and a maximum CT of about 75 MPa or greater.

Embodiment 52

The glass-based article of embodiment 51, wherein the maximum CT is about 80 MPa or greater.

Embodiment 53

The glass-based article of any one of embodiments 41-52, wherein the glass-based article comprises a composition including $P_2O_5$.

Embodiment 54

The glass-based article of any one of embodiments 41-53, wherein the glass-based article comprises a composition including $Li_2O$ Embodiment 55

The glass-based article of any one of embodiments 41-54, wherein the glass-based article comprises a stored tensile energy of about 6 J/m² or greater.

Embodiment 56

The glass-based article of embodiment 55, wherein the stored tensile energy is about 10 J/m² or greater.

Embodiment 57

The glass-based article of any one of embodiments 41-56, further comprising a CS value at the DOL of about 150 MPa or greater.

Embodiment 58

The glass-based article of any one of embodiments 41-57, wherein the DOL is about 10 micrometers or greater.

Embodiment 59

The glass-based article of any one of embodiments 41-58, further exhibiting a Knoop scratch threshold of about 8 N or greater.

Embodiment 60

The glass-based article of any one of embodiments 41-59, further exhibiting a Vicker's crack initiation threshold of about 120 N or greater.

Embodiment 61

A method for strengthening a glass sheet comprising:
cooling a glass sheet having a transition temperature, from a temperature greater than the transition temperature to a temperature less than the transition temperature by transferring thermal energy from the glass sheet to a heat sink by conduction across a gap that is free of solid or liquid matter such that more than 20% of the thermal energy leaving the glass sheet crosses the gap and is received by the heat sink to provide a thermally strengthened glass article; and chemically strengthening the thermally strengthened glass article.

Embodiment 62

The method of embodiment 61, wherein the thermally strengthened glass article is chemically strengthened without removing any portion of the thermally strengthened glass sheet.

Embodiment 63

The method of embodiment 62, wherein the thermally strengthened glass article is chemically strengthened without removing 3% or more of the thickness of the thermally strengthened glass sheet.

Embodiment 64

The method of any one of embodiments 61-63, wherein cooling the glass sheet comprises cooling at a rate of about −270° C./second or greater.

Embodiment 65

The method of any one of embodiments 61-64, wherein the thermally strengthened glass article comprises a thickness and a DOC greater than or equal to 0.17 times the thickness of the thermally strengthened glass article.

Embodiment 66

The method of any one of embodiments 61-65, wherein chemically strengthening the thermally strengthened glass sheet comprises generating a surface CS of about 700 MPa or greater, while maintaining the DOC.

Embodiment 67

The method of embodiment 66, wherein chemically strengthening the thermally strengthened glass article comprises generating a chemically strengthened region that extends from a first surface of the glass-based layer to a DOL that is greater than or equal to about 10 micrometers.

Embodiment 68

The method of any one of embodiments 61-66, wherein chemically strengthening the thermally strengthened glass article comprises immersing the thermally strengthened glass sheet in a molten salt bath comprising any one or more of $KNO_3$, $NaNO_3$, and $LiNO_3$.

Embodiment 69

The method of embodiment 68, wherein the molten salt bath comprises KNO3 and NaNO3 and has a temperature in the range from about 380° C. to about 430° C.

Embodiment 70

A consumer electronic product, comprising:
a housing having a front surface, a back surface and side surfaces;
electrical components provided at least partially internal to the housing, the electrical components including at least a controller, a memory, and a display, the display being provided at or adjacent the front surface of the housing; and
a cover article provided at or over the front surface of the housing such that it is provided over the display, the cover glass-based article being thermally and chemically strengthened and including first surface and a second surface opposing the first surface defining a thickness (t), a first CS region comprising a concentration of a metal oxide that is both non-zero and varies along a portion of the thickness, and a second CS region being substantially free of the metal oxide of the first CS region, the second CS region extending from the first CS region to a DOC of about 0.17·t or greater, and
wherein the consumer electronic product is a mobile phone, portable media player, notebook computer or tablet computer.

Embodiment 71

A consumer electronic product, comprising:
a housing having a front surface, a back surface and side surfaces;
electrical components provided at least partially internal to the housing, the electrical components including at least a controller, a memory, and a display, the display being provided at or adjacent the front surface of the housing; and
a cover article provided at or over the front surface of the housing such that it is provided over the display, the cover glass-based article comprising the glass-based article of any one of embodiments 1-60.

Embodiment 72

A laminate comprising a first glass-based sheet, a second glass-based sheet and an interlayer disposed between the first glass-based sheet and the second glass-based sheet,
wherein either one or both the first and second glass-based sheet comprises a first surface and a second surface opposing the first surface defining a thickness (t), a first CS region comprising a concentration of a metal oxide that is both non-zero and varies along a portion of the thickness, and a second CS region being substantially free of the metal oxide of the first CS region, the second CS region extending from the first CS region to a DOC of about 0.17·t or greater.

Embodiment 73

The laminate of embodiment 71, wherein one of the first glass-based sheet and the second glass-based sheet is cold-formed.

Embodiment 74

A laminate comprising a first glass-based sheet, a second glass-based sheet and an interlayer disposed between the first glass-based sheet and the second glass-based sheet,
wherein either one or both the first and second glass-based sheet comprises the glass-based article of any one of embodiments 1-60.

Embodiment 75

The laminate of embodiment 74, wherein one of the first glass-based sheet and the second glass-based sheet is cold-formed.

Embodiment 76

A vehicle comprising an opening; and a laminate disposed in the opening, wherein the laminate comprises a first glass-based sheet, a second glass-based sheet and an interlayer disposed between the first glass-based sheet and the second glass-based sheet, and wherein either one or both the first and second glass-based sheet comprises a first surface and a second surface opposing the first surface defining a thickness (t), a first CS region comprising a concentration of a metal oxide that is both non-zero and varies along a portion of the thickness, and a second CS region being substantially free of the metal oxide of the first CS region, the second CS region extending from the first CS region to a DOC of about 0.17·t or greater.

Embodiment 77

The vehicle of embodiment 65, wherein one of the first glass-based sheet and the second glass-based sheet is cold-formed.

Embodiment 78

The vehicle of embodiment 65 or embodiment 66, wherein the first glass-based sheet is complexly-curved and has at least one concave surface providing a first surface of the laminate and at least one convex surface to provide a second surface of the laminate opposite the first surface with a thickness therebetween, wherein and the second glass-based sheet is complexly-curved and has at least one concave surface to provide a third surface of the laminate and at least one convex surface to provide a fourth surface of the laminate opposite the third surface with a thickness therebetween; and wherein the third and fourth surfaces respectively have CS values such that the fourth surface has a CS value that is greater than the CS value of the third surface.

Embodiment 79

The vehicle of embodiment 67, wherein one of the first glass-based substrate or the second glass-based substrate has a thickness in the range of about 0.2 mm to about 0.7 mm.

Embodiment 80

The vehicle of any one of embodiments 67-68, wherein the fourth surface of the laminate has a greater CS than the fourth surface has in a flat state and the laminate is free from optical distortions.

Embodiment 81

The vehicle of embodiment 69, wherein a peripheral portion of the second glass-based substrate exerts a compressive force against the interlayer, and a center portion of the second glass-based substrate exerts a tensile force against the interlayer.

Embodiment 82

The vehicle of embodiment 70, wherein the second glass-based substrate conforms to the first glass-based substrate to provide a substantially uniform distance between the convex surface of the second glass-based substrate and the concave surface of the first glass-based substrate, which is filled by the intervening interlayer.

Embodiment 83

A vehicle comprising an opening; and a laminate disposed in the opening, wherein the laminate comprises a first glass-based sheet, a second glass-based sheet and an interlayer disposed between the first glass-based sheet and the second glass-based sheet, and wherein either one or both the first and second glass-based sheet comprises the glass-based article of any one of embodiments 1-60.

Embodiment 84

The vehicle of embodiment 83, wherein one of the first glass-based sheet and the second glass-based sheet is cold-formed.

Embodiment 85

The vehicle of embodiment 83 or embodiment 84, wherein the first glass-based sheet is complexly-curved and has at least one concave surface providing a first surface of the laminate and at least one convex surface to provide a second surface of the laminate opposite the first surface with a thickness therebetween, wherein and the second glass-based sheet is complexly-curved and has at least one concave surface to provide a third surface of the laminate and at least one convex surface to provide a fourth surface of the laminate opposite the third surface with a thickness therebetween; and wherein the third and fourth surfaces respectively have CS values such that the fourth surface has a CS value that is greater than the CS value of the third surface.

Embodiment 86

The vehicle of embodiment 85, wherein one of the first glass-based substrate or the second glass-based substrate has a thickness in the range of about 0.2 mm to about 0.7 mm.

Embodiment 87

The vehicle of any one of embodiments 83-86, wherein the fourth surface of the laminate has a greater CS than the fourth surface has in a flat state and the laminate is free from optical distortions.

Embodiment 88

The vehicle of embodiment 87, wherein a peripheral portion of the second glass-based substrate exerts a compressive force against the interlayer, and a center portion of the second glass-based substrate exerts a tensile force against the interlayer.

Embodiment 89

The vehicle of embodiment 88, wherein the second glass-based substrate conforms to the first glass-based substrate to provide a substantially uniform distance between the convex surface of the second glass-based substrate and the concave surface of the first glass-based substrate, which is filled by the intervening interlayer.

Embodiment 90

The vehicle of any one of embodiments 83-89, further exhibiting a Knoop scratch threshold of about 8 N or greater, as measured on a surface of the glass-based article.

Embodiment 91

The glass-based article of any one of embodiments 83-90, further exhibiting a Vicker's crack initiation threshold of about 120 N or greater, as measured on a surface of the glass-based article.

What is claimed is:

1. A glass-based article comprising:
a first surface and a second surface opposing the first surface defining a thickness (t);
a first compressive stress (CS) region comprising a concentration of a metal oxide that is both non-zero and varies along a portion of the thickness; and
a second CS region being substantially free of the metal oxide of the first CS region, the second CS region extending from the first CS region to a depth of compression (DOC) of about 0.17·t or greater, as measured from the first surface,
wherein the first surface is flat to 100 μm total indicator run-out (TIR) along any 50 mm or less profile of the first surface.

2. The glass-based article of claim 1, wherein the metal oxide comprises any one of $Na_2O$, $K_2O$, $Rb_2O$ and $Cs_2O$.

3. The glass-based article of claim 2, wherein the metal oxide comprises $K_2O$.

4. The glass-based article of claim 2, wherein the metal oxide comprises $Na_2O$.

5. The glass-based article of claim 1, further comprising a central tension (CT) region, wherein the second CS region and at least a portion of the CT region comprise an identical glass composition.

6. The glass-based article of claim 1, wherein the concentration of the metal oxide is both non-zero and varies along the portion of the thickness from the first surface to a depth in the range from greater than about 0·t to less than about 0.17·t.

7. The glass-based article of claim 1, wherein the concentration of the metal oxide is both non-zero and varies along the portion of the thickness from the first surface to a depth in the range from greater than about 0.01·t to about 0.1·t.

8. The glass-based article of claim 1, wherein the thickness t is less than 1.2 mm.

9. The glass-based article of claim 1, further comprising a surface CS of about 400 MPa or greater.

10. The glass-based article of claim 1, further exhibiting a Knoop scratch threshold of about 8 N or greater.

11. The glass-based article of claim 1, further exhibiting a Vicker's crack initiation threshold of about 120 N or greater.

12. The glass-based article of claim 1, wherein the glass-based article comprises a glass having a softening temperature, expressed in units of ° C., of $T_{soft}$ and an annealing temperature, expressed in units of ° C., of $T_{anneal}$, and a surface fictive temperature measured on the first surface of the glass sheet represented by Tfs, when expressed in units of ° C. and a non-dimensional surface fictive temperature parameter θs given by $(Tfs-T_{anneal})/(T_{soft}-T_{anneal})$, wherein the parameter θs is in the range of from 0.20 to 0.9.

13. The glass-based article of claim 1, wherein the surface fictive temperature measured on the first surface is at least 50° C. above a glass transition temperature of the glass.

14. The glass-based article of claim 1, wherein the first surface has a roughness in the range of from 0.2 to 1.5 nm Ra over an area of 10×10 μm.

15. The glass-based article of claim 1, further comprising a CS value at the DOL of about 150 MPa or greater.

16. A glass-based article comprising:
a first surface and a second surface opposing the first surface defining a thickness (t);
a first compressive stress (CS) region comprising a concentration of a first metal oxide that is both non-zero and varies along a portion of the thickness and a second metal oxide; and
a second CS region comprising the second metal oxide and being substantially free of the first metal oxide of the first CS region, the second CS region extending from the first CS region to a depth of compression (DOC) of about 0.17·t or greater, as measured from the first surface,
wherein the first surface is flat to 100 μm total indicator run-out (TIR) along any 50 mm or less profile of the first surface.

17. The glass-based article of claim 16, wherein the first metal oxide comprises a first metal ion comprising a first diameter, and the second metal oxide comprising a second metal ion comprising a second diameter, wherein the second diameter is less than the first diameter.

18. The glass-based article of claim 17, wherein the first metal oxide comprises $K_2O$ and the second metal oxide comprises $Na_2O$.

19. The glass-based article of claim 16, further comprising a central tension (CT) region, wherein the second CS region and at least a portion of the CT region comprise an identical glass composition.

20. The glass-based article of claim 16, wherein the concentration of the first metal oxide is both non-zero and varies along the portion of the thickness from the first surface to a depth in the range from greater than about 0·t to less than about 0.17·t.

21. The glass-based article of claim 16, wherein the concentration of the first metal oxide is both non-zero and varies along the portion of the thickness from the first surface to a depth in the range from greater than about 0.01·t to about 0.1·t.

22. The glass-based article of claim 16, wherein the thickness t is less than about 2 mm.

23. The glass-based article of claim 16, further comprising a surface CS of about 600 MPa or greater.

24. The glass-based article of claim 16, further exhibiting a Knoop scratch threshold of about 8 N or greater.

25. The glass-based article of claim 16, further exhibiting a Vicker's crack initiation threshold of about 120 N or greater.

26. The glass-based article of claim 16, wherein the glass-based article comprises a glass having a softening temperature, expressed in units of ° C., of $T_{soft}$ and an annealing temperature, expressed in units of ° C., of $T_{anneal}$, and a surface fictive temperature measured on the first surface of the glass sheet represented by Tfs, when expressed in units of ° C. and a non-dimensional surface fictive temperature parameter θs given by $(T_{fs}-T_{anneal})/(T_{soft}-T_{anneal})$, wherein the parameter θs is in the range of from 0.20 to 0.9.

27. The glass-based article of claim 16, wherein the surface fictive temperature measured on the first surface is at least 50° C. above a glass transition temperature of the glass.

28. The glass-based article of claim 16, wherein the first surface has a roughness in the range of from 0.2 to 1.5 nm Ra over an area of 10×10 μm.

29. The glass-based article of claim 16, further comprising a CS value at the DOL of about 150 MPa or greater.

30. A consumer electronic product, comprising:
a housing having a front surface, a back surface and side surfaces;
electrical components provided at least partially internal to the housing, the electrical components including at least a controller, a memory, and a display, the display being provided at or adjacent the front surface of the housing; and
a cover article provided at or over the front surface of the housing such that it is provided over the display, the cover glass-based article being thermally and chemically strengthened and including first surface and a second surface opposing the first surface defining a thickness (t), a first CS region comprising a concentration of a metal oxide that is both non-zero and varies along a portion of the thickness, and a second CS region being substantially free of the metal oxide of the first CS region, the second CS region extending from the first CS region to a DOC of about 0.17·t or greater, wherein the first surface is flat to 100 μm total indicator run-out (TIR) along any 50 mm or less profile of the first surface, and
wherein the consumer electronic product is a mobile phone, portable media player, notebook computer or tablet computer.

* * * * *